(12) United States Patent
Kim et al.

(10) Patent No.: US 12,288,805 B2
(45) Date of Patent: Apr. 29, 2025

(54) INTEGRATED CIRCUIT DEVICE AND METHOD OF MANUFACTURING THE SAME

(71) Applicant: SAMSUNG ELECTRONICS CO., LTD., Suwon-si (KR)

(72) Inventors: Jinbum Kim, Seoul (KR); Gyeom Kim, Hwaseong-si (KR); Hyojin Kim, Hwaseong-si (KR); Haejun Yu, Osan-si (KR); Seunghun Lee, Hwaseong-si (KR); Kyungin Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/667,417

(22) Filed: May 17, 2024

(65) Prior Publication Data
US 2024/0304666 A1 Sep. 12, 2024

Related U.S. Application Data

(63) Continuation of application No. 17/479,424, filed on Sep. 20, 2021, now Pat. No. 12,034,043.

(30) Foreign Application Priority Data

Mar. 10, 2021 (KR) .................. 10-2021-0031467

(51) Int. Cl.
H01L 29/06 (2006.01)
H01L 29/66 (2006.01)
H01L 29/786 (2006.01)

(52) U.S. Cl.
CPC ...... *H01L 29/0665* (2013.01); *H01L 29/0653* (2013.01); *H01L 29/6656* (2013.01); *H01L 29/78618* (2013.01); *H01L 29/78696* (2013.01)

(58) Field of Classification Search
CPC ......... H01L 21/02603; H01L 21/28141; H01L 21/823431; H01L 21/823821; H01L 21/845; H01L 27/0886; H01L 27/0924; H01L 27/1211; H01L 29/0653; H01L 29/0665; H01L 29/0669; H01L 29/0973;
(Continued)

(56) References Cited

U.S. PATENT DOCUMENTS 7,700,449 B2   4/2010 Lee
9,515,156 B2   12/2016 Besser et al.
(Continued)

*Primary Examiner* — David C Spalla
(74) *Attorney, Agent, or Firm* — Sughrue Mion, PLLC

(57) ABSTRACT

An integrated circuit device is provided and includes: a fin-type active region extending in a first horizontal direction on a substrate, a channel region on the fin-type active region, a gate line surrounding the channel region on the fin-type active region and extending in a second horizontal direction crossing the first horizontal direction, an insulating spacer covering a sidewall of the gate line, a source/drain region connected to the channel region on the fin-type active region and including a first portion facing the sidewall of the gate line with the insulating spacer therebetween, an air gap between the insulating spacer and the first portion of the source/drain region, and an insulating liner including a portion in contact with the source/drain region and a portion defining a size of the air gap. A method of manufacturing the integrated circuit device is further provided.

20 Claims, 107 Drawing Sheets

(58) Field of Classification Search
CPC ......... H01L 29/41791; H01L 29/66439; H01L 29/6653; H01L 29/66553; H01L 29/6656; H01L 29/66795; H01L 29/775; H01L 29/785; H01L 29/7851; H01L 29/7853; H01L 29/7855; H01L 29/78618; H01L 29/78696; H01L 2029/7858
See application file for complete search history.

(56) References Cited

U.S. PATENT DOCUMENTS

| | | |
|---|---|---|
| 9,559,184 B2 | 1/2017 | Ching et al. |
| 10,164,104 B2 | 12/2018 | Zhang et al. |
| 10,177,227 B1 | 1/2019 | Yoshida et al. |
| 10,249,762 B2 | 4/2019 | Bergendahl et al. |
| 10,269,983 B2 | 4/2019 | Frougier et al. |
| 10,361,202 B2 | 7/2019 | Suh et al. |
| 10,411,114 B2 | 9/2019 | Zhang et al. |
| 10,510,860 B2 | 12/2019 | Lin et al. |
| 10,553,696 B2 | 2/2020 | Ando et al. |
| 10,636,891 B2 | 4/2020 | Yang et al. |
| 10,651,314 B2 | 5/2020 | Chen et al. |
| 10,692,991 B2 | 6/2020 | Chanemougame et al. |
| 10,777,650 B2 | 9/2020 | Sun et al. |
| 2015/0091089 A1 | 4/2015 | Niebojewski et al. |
| 2017/0309719 A1* | 10/2017 | Sun ..................... H01L 29/0653 |
| 2020/0212192 A1 | 7/2020 | Xie et al. |
| 2020/0286992 A1 | 9/2020 | Song et al. |
| 2020/0381530 A1 | 12/2020 | Chung et al. |
| 2021/0050429 A1* | 2/2021 | Lin ..................... H01L 29/4991 |
| 2021/0202712 A1* | 7/2021 | Chen ..................... H01L 29/785 |
| 2023/0154921 A1* | 5/2023 | Huang ................ H01L 29/0653 257/401 |

* cited by examiner

Y1B – Y1B'

Y2B – Y2B'

Y1D − Y1D'

Y2C – Y2C'

Y1A – Y1A'

Y2A – Y2A'

Y1A - Y1A'

Y2B – Y2B'

Y1A – Y1A'

Y1B – Y1B'

Y2B – Y2B'

Y1A – Y1A'

Y1B – Y1B'

Y2B − Y2B'

Y1A – Y1A'

Y2A – Y2A'

Y1A – Y1A'

Y1C − Y1C'

Y2C − Y2C'

Y1A – Y1A'

Y2A – Y2A'

Y1B – Y1B'

Y1C – Y1C'

Y2C - Y2C'

Y1A – Y1A'

Y1B – Y1B'

Y1C – Y1C'

Y2C – Y2C'

Y1A − Y1A'

Y2B − Y2B'

Y1C – Y1C'

Y1A – Y1A'

Y2A - Y2A'

Y1B – Y1B'

Y2B – Y2B'

Y1A – Y1A'

INTEGRATED CIRCUIT DEVICE AND METHOD OF MANUFACTURING THE SAME

CROSS-REFERENCE TO THE RELATED APPLICATIONS

This application is a Continuation of U.S. application Ser. No. 17/479,424, filed on Sep. 20, 2021, which is based on and claims priority under 35 U.S.C. § 119 to Korean Patent Application No. 10-2021-0031467, filed on Mar. 10, 2021, in the Korean Intellectual Property Office, the disclosures of which are incorporated by reference herein in their entireties.

BACKGROUND

Embodiments of the present disclosure relate to an integrated circuit device and a method of manufacturing the integrated circuit device, and more particularly, to an integrated circuit device having a field-effect transistor and a method of manufacturing the integrated circuit device.

In recent years, as the downscaling of integrated circuit devices has progressed rapidly, it may be necessary to secure not only high operating speed but also operation accuracy in integrated circuit devices. Accordingly, there is a need to develop a technology for an integrated circuit device capable of improving reliability by reducing unwanted parasitic capacitance between conductive regions.

SUMMARY

Embodiments of the present disclosure provide an integrated circuit device capable of improving reliability by reducing unwanted parasitic capacitance while having a device region with a reduced area due to downscaling.

Embodiments of the present disclosure provide a method of manufacturing an integrated circuit device capable of improving reliability by reducing unwanted parasitic capacitance while having a device region with a reduced area due to downscaling.

According to one or more embodiments, an integrated circuit device is provided. The integrated circuit device includes: a fin-type active region extending in a first horizontal direction on a substrate; a channel region on the fin-type active region; a gate line surrounding the channel region on the fin-type active region and extending in a second horizontal direction crossing the first horizontal direction; an insulating spacer covering a sidewall of the gate line; a source/drain region connected to the channel region on the fin-type active region and including a first portion facing the sidewall of the gate line with the insulating spacer therebetween; an air gap between the insulating spacer and the first portion of the source/drain region; and an insulating liner including a portion in contact with the source/drain region and a portion defining a size of the air gap.

According to one or more embodiments, an integrated circuit device is provided. The integrated circuit device includes: a first fin-type active region extending in a first horizontal direction in a first device region on a substrate; a first channel region on the first fin-type active region; a first gate line surrounding the first channel region on the first fin-type active region and extending in a second horizontal direction crossing the first horizontal direction; a first source/drain region connected to the first channel region on the first fin-type active region and including a first portion facing a sidewall of the first gate line; a first air gap between the first gate line and the first portion of the first source/drain region; a second fin-type active region extending in the first horizontal direction in a second device region on the substrate; a second channel region on the second fin-type active region; a second gate line surrounding the second channel region on the second fin-type active region and extending in the second horizontal direction; a second source/drain region connected to the second channel region on the second fin-type active region and including a second portion facing a sidewall of the second gate line; and a second air gap between the second gate line and the second portion of the second source/drain region and having a size different from that of the first air gap.

According to one or more embodiments, an integrated circuit device is provided. The integrated circuit device includes: a fin-type active region extending in a first horizontal direction on a substrate and having a fin top surface; a nanosheet stack including a plurality of nanosheets facing the fin top surface at a position vertically apart from the fin top surface and having different vertical distances from the fin top surface; a gate line surrounding the plurality of nanosheets on the fin-type active region and extending in a second horizontal direction crossing the first horizontal direction; an insulating spacer covering a sidewall of the gate line; a source/drain region connected to the plurality of nanosheets on the fin-type active region and including a first portion facing the sidewall of the gate line with the insulating spacer therebetween; an air gap between the insulating spacer and the first portion of the source/drain region; and an insulating liner including a portion in contact with the source/drain region, a portion in contact with the insulating spacer, and a portion defining a size of the air gap, the insulating liner including a material different from that of the insulating spacer.

According to one or more embodiments, a method of manufacturing an integrated circuit device is provided. The method includes: forming a structure including a fin-type active region, extending in a first horizontal direction on a substrate, and a channel region on the fin-type active region; forming a dummy gate layer extending in a second horizontal direction crossing the first horizontal direction on the channel region; forming an insulating spacer layer covering a sidewall of the dummy gate layer; forming a sacrificial insulating layer conformally covering the insulating spacer layer; forming a recess exposing the channel region on the fin-type active region by removing a portion of each of the sacrificial insulating layer and the insulating spacer layer, and forming an insulating spacer including a portion covering the sidewall of the dummy gate layer; forming a source/drain region connected to the channel region in the recess and including a first portion facing the sidewall of the dummy gate layer with the sacrificial insulating layer and the insulating spacer therebetween; forming a first space between the insulating spacer and the first portion of the source/drain region by removing the sacrificial insulating layer; forming an insulating liner covering the insulating spacer and the source/drain region and defining an air gap including at least a portion of the first space; forming a gate space on the channel region by removing the dummy gate layer; and forming a gate line in the gate space.

According to one or more embodiments, a method of manufacturing an integrated circuit device is provided. The method includes: forming a plurality of structures, each of the plurality of structures including a fin-type active region extending in a first horizontal direction on a substrate and further including a channel region on the fin-type active region, the substrate including a first device region and a second device region; forming a dummy gate layer extending in a second horizontal direction crossing the first horizontal direction on the channel region in each of the first device region and the second device region; forming an insulating spacer layer covering a sidewall of the dummy gate layer in each of the first device region and the second device region; forming a first sacrificial insulating layer conformally covering the insulating spacer layer in each of the first device region and the second device region; in a state in which the first device region is covered with a first mask pattern, forming a second region recess exposing the channel region on the fin-type active region by removing a portion of each of the first sacrificial insulating layer, the insulating spacer layer, and the fin-type active region in the second device region, and forming a second region insulating spacer covering the sidewall of the dummy gate layer in the second device region; forming a first conductivity-type source/drain region connected to the channel region in the second region recess and including a first portion facing the sidewall of the dummy gate layer with the first sacrificial insulating layer and the second region insulating spacer therebetween in the second device region; exposing the insulating spacer layer in the first device region and forming a first space between the first portion of the first conductivity-type source/drain region and the second region insulating spacer in the second device region by removing the first sacrificial insulating layer in each of the first device region and the second device region; and forming an insulating liner conformally covering the second region insulating spacer and the first conductivity-type source/drain region in the second device region and defining a second region air gap including at least a portion of the first space.

According to one or more embodiments, a method of manufacturing an integrated circuit device is provided. The method includes: forming, on a substrate, a fin-type active region extending in a first horizontal direction, and a multilayer in which a plurality of sacrificial semiconductor layers and a plurality of nanosheet semiconductor layers are alternately stacked one by one; forming a dummy gate layer extending in a second horizontal direction crossing the first horizontal direction on the multilayer; forming an insulating spacer covering sidewalls of the dummy gate layer; etching a portion of the multilayer on two sides of the dummy gate layer and the insulating spacer to thereby form a pair of recesses, arranged on the fin-type active region, and a plurality of nanosheets including remaining portions of the plurality of nanosheet semiconductor layers; forming a pair of source/drain regions connected to the plurality of nanosheets in the pair of recesses, the pair of source/drain regions including a first portion facing sidewalls of the dummy gate layer with a first space and the insulating spacer therebetween on two sides of the dummy gate layer; forming an insulating liner covering the insulating spacer and the pair of source/drain regions and defining a pair of air gaps including at least a portion of the first space; removing the dummy gate layer and the plurality of sacrificial semiconductor layers remaining on the fin-type active region to thereby form a gate space between each two of the plurality of nanosheet semiconductor layers and above the plurality of nanosheet semiconductor layers; and forming a gate line in the gate space.

BRIEF DESCRIPTION OF THE DRAWINGS

Embodiments of the present disclosure will be more clearly understood from the following detailed description taken in conjunction with the accompanying drawings in which.

DETAILED DESCRIPTION

Figure 1:
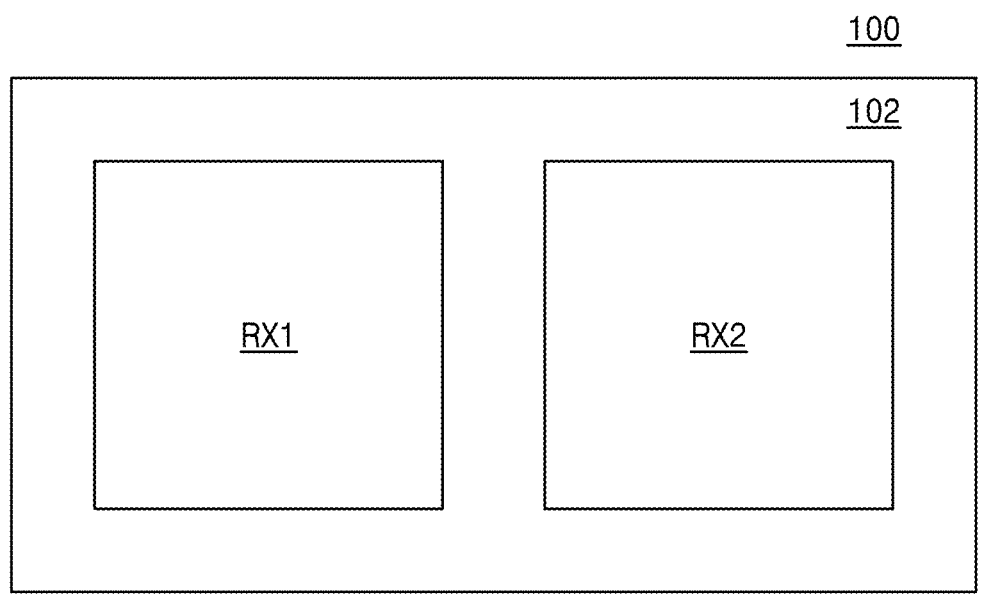
FIG. 1 is a block diagram of an integrated circuit device according to embodiments of the present disclosure.

Hereinafter, embodiments of the present disclosure will be described in detail with reference to the accompanying drawings. The same reference numerals are used for the same components in the drawings, and duplicate descriptions thereof are omitted.

FIG. 1 is a block diagram of an integrated circuit device 100 according to embodiments of the present disclosure.

Referring to FIG. 1, the integrated circuit device 100 includes a substrate 102 having a first device region RX1 and a second device region RX2. The first device region RX1 and the second device region RX2 of the substrate 102 refer to different regions of the substrate 102, and may be regions in which different operations are performed on the substrate 102. The first device region RX1 and the second device region RX2 may be apart from each other or may be connected to each other.

The first device region RX1 and the second device region RX2 may be regions requiring different threshold voltages. For example, the first device region RX1 may be an N-channel metal oxide semiconductor (NMOS) transistor region, and the second device region RX2 may be a P-channel metal oxide semiconductor (PMOS) transistor region.

In example embodiments, each of the first device region RX1 and the second device region RX2 may be a region selected from a memory region and a non-memory region. The memory region may be a region constituting a volatile memory device such as dynamic random access memory (DRAM) or static RAM (SRAM), or a nonvolatile memory devices such as read only memory (ROM), mask ROM (MROM), programmable ROM (PROM), erasable ROM (EPROM), electrically erasable ROM (EEPROM), ferromagnetic RAM (FRAM), phase change RAM (PRAM), magnetic RAM (MRAM), resistive RAM (RRAM), or flash memory. The non-memory region may include a logic region. The logic region may include standard cells that perform desired logical functions such as a counter and a buffer. The standard cells may include various types of logic cells including a plurality of circuit elements such as transistors and resistors. The logic cells may constitute, for example, an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), AND/OR (AO), an AND/OR/INVERTER (AOI), a D flip-flop, a reset flip-flop, a master-slaver flip-flop, a latch, etc.

Figure 2A:
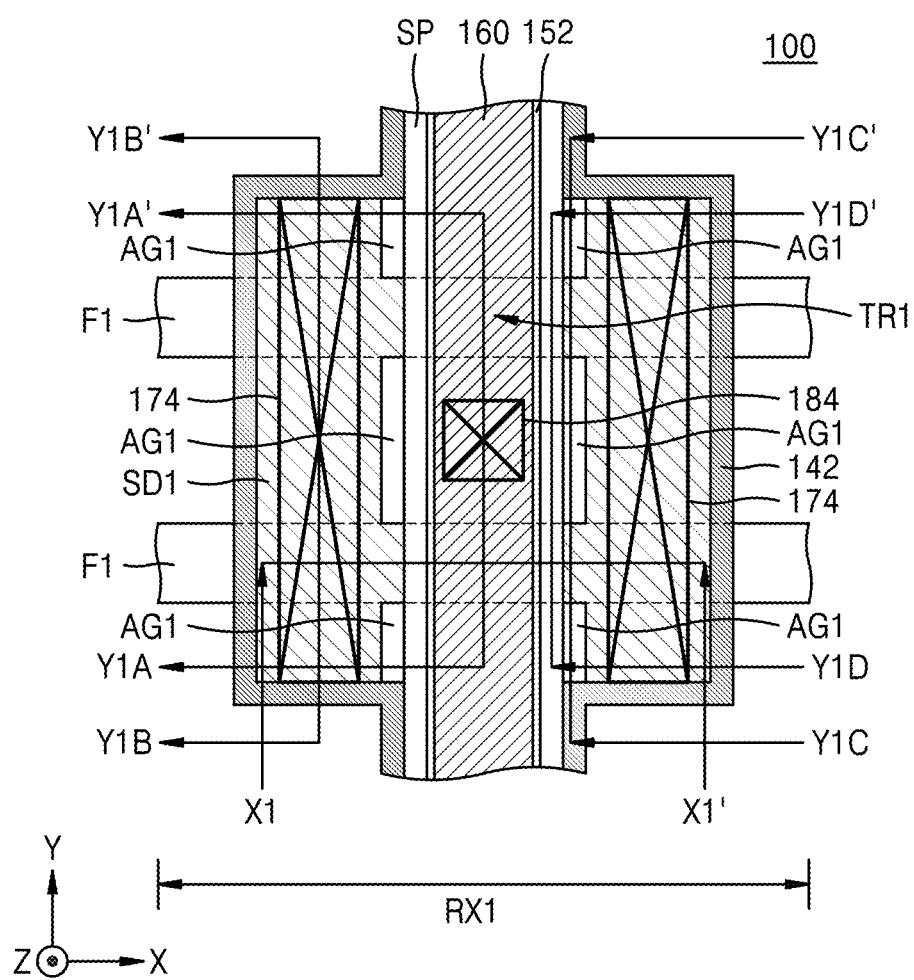
FIG. 2A is a plan layout diagram of some components of a first device region of the integrated circuit device of FIG. 1.
Figure 5A:
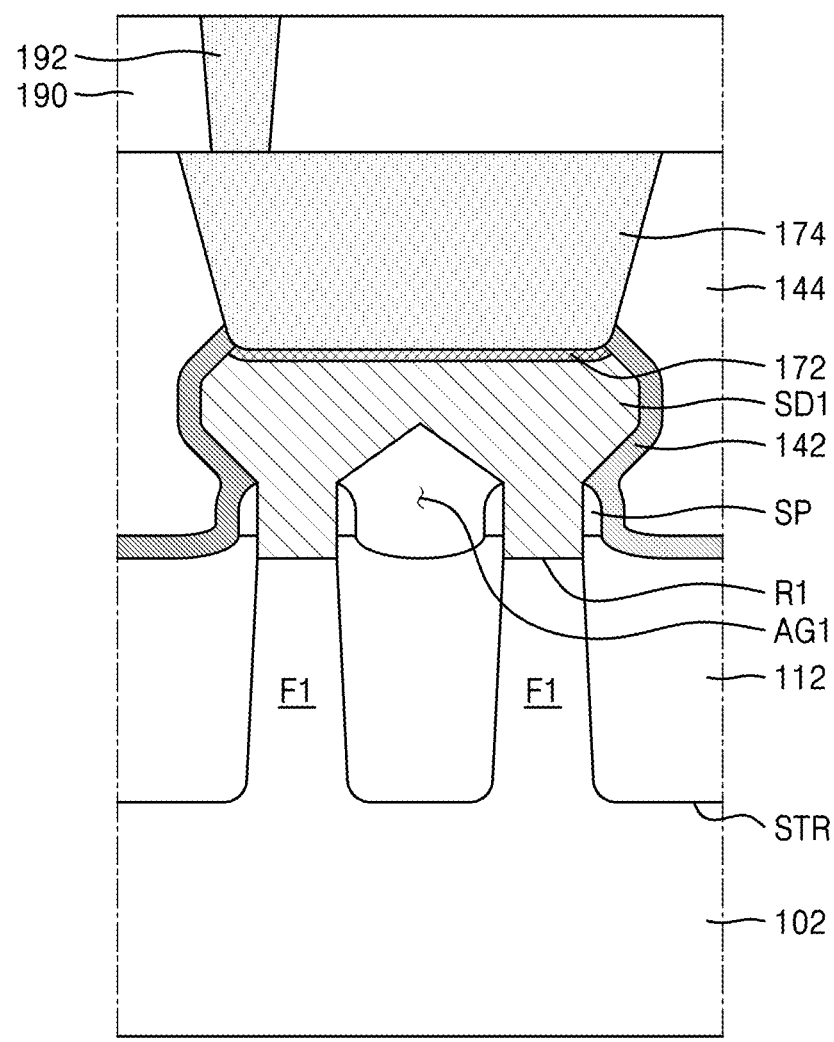
FIG. 5A is a cross-sectional view illustrating a partial configuration of a cross-section taken along line Y1B-Y1B' of FIG. 2A.
Figure 5B:
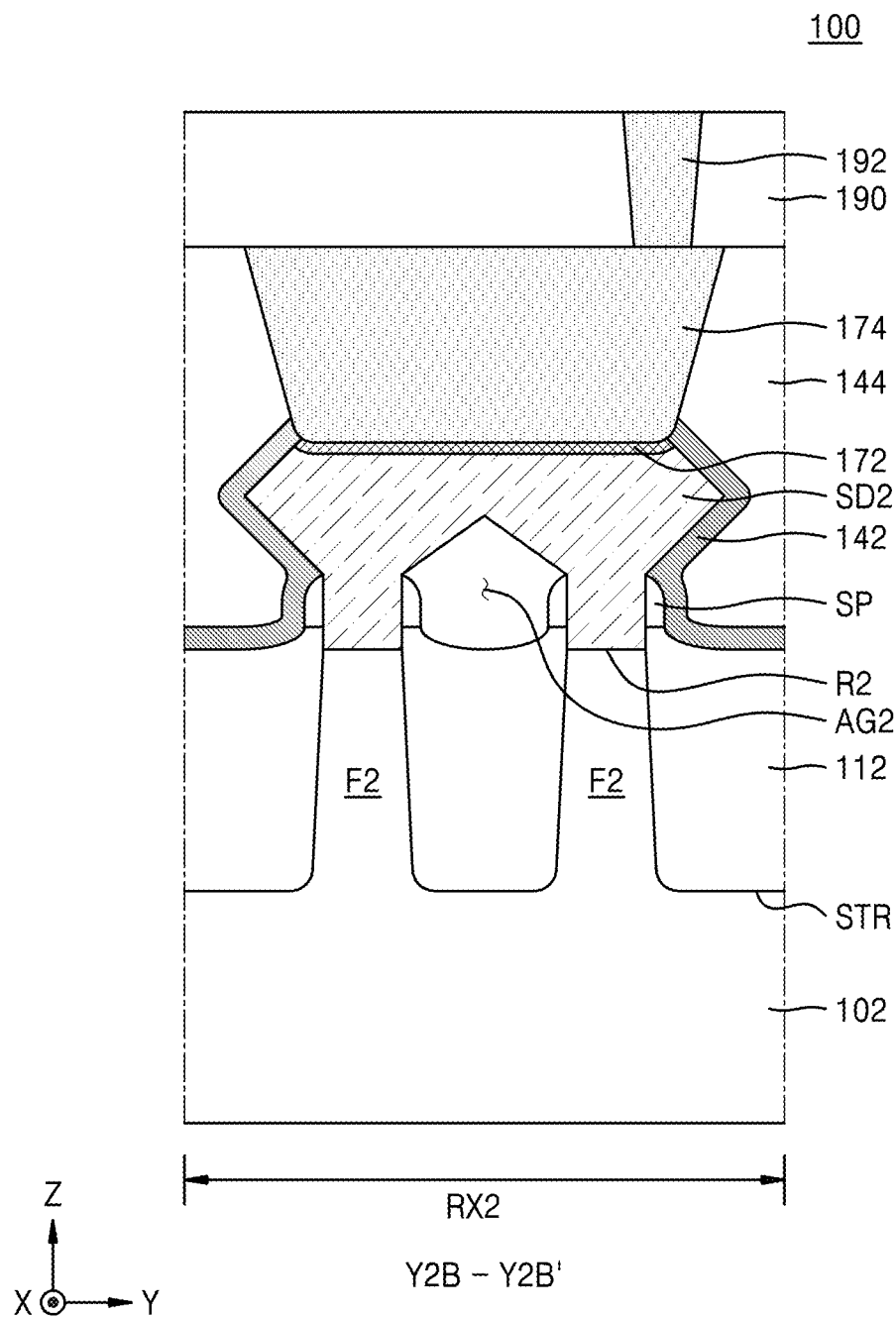
FIG. 5B is a cross-sectional view illustrating a partial configuration of a cross-section taken along line Y2B-Y2B' of FIG. 2B.
Figure 6A:
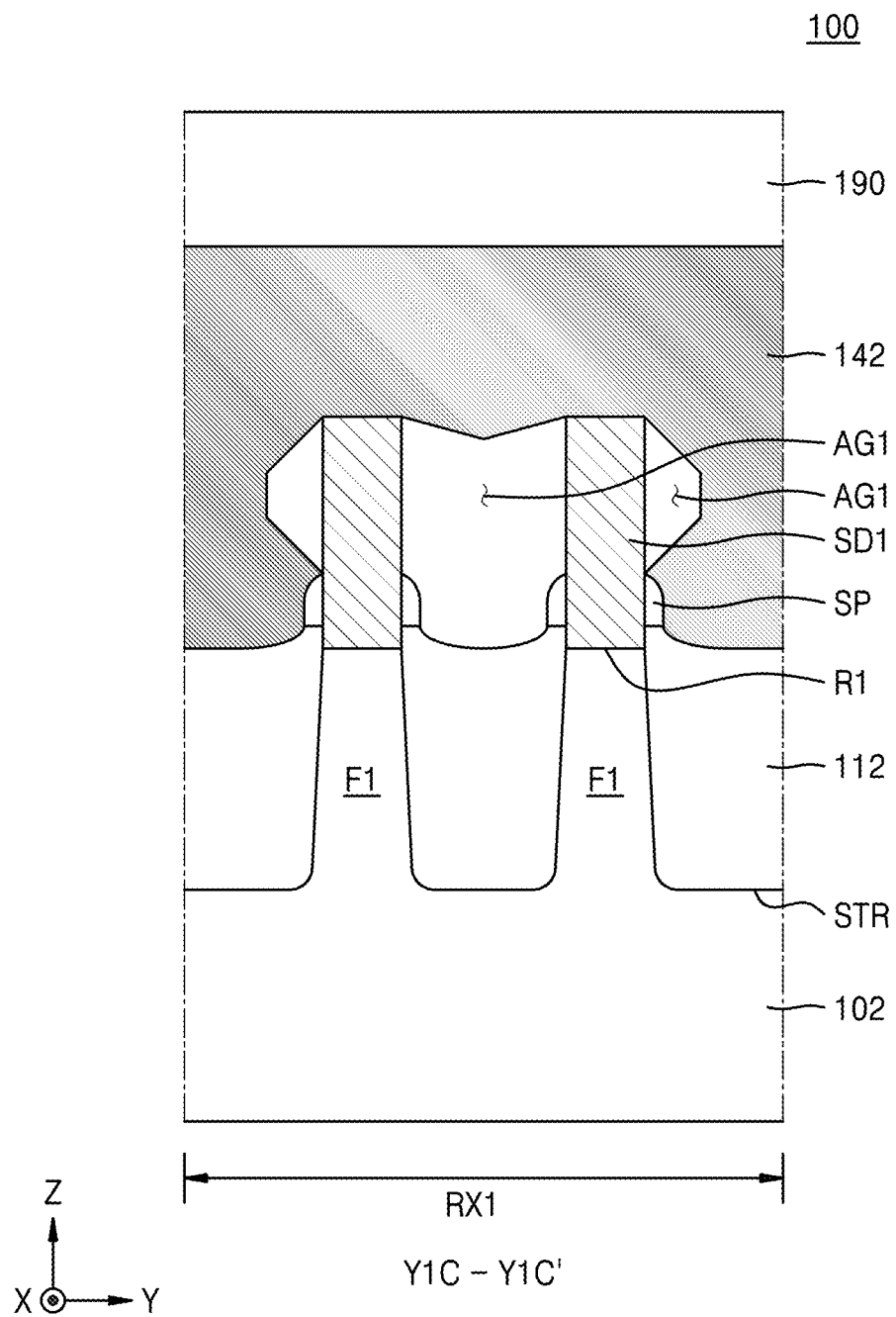
FIG. 6A is a cross-sectional view illustrating a partial configuration of a cross-section taken along line Y1C-Y1C' of FIG. 2A.
Figure 6B:
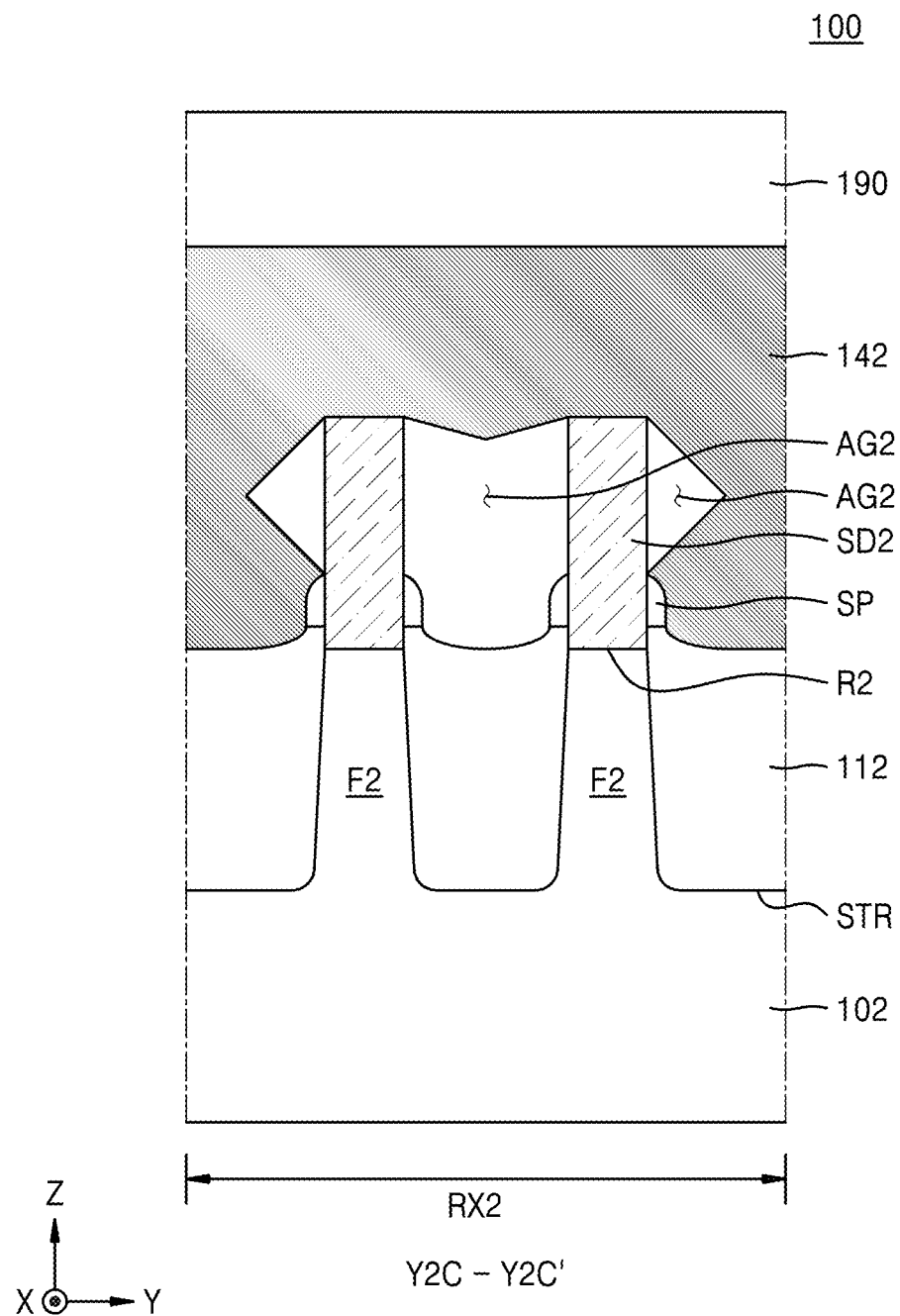
FIG. 6B is a cross-sectional view illustrating a partial configuration of a cross-section taken along line Y2C-Y2C' of FIG. 2B.
Figure 7A:
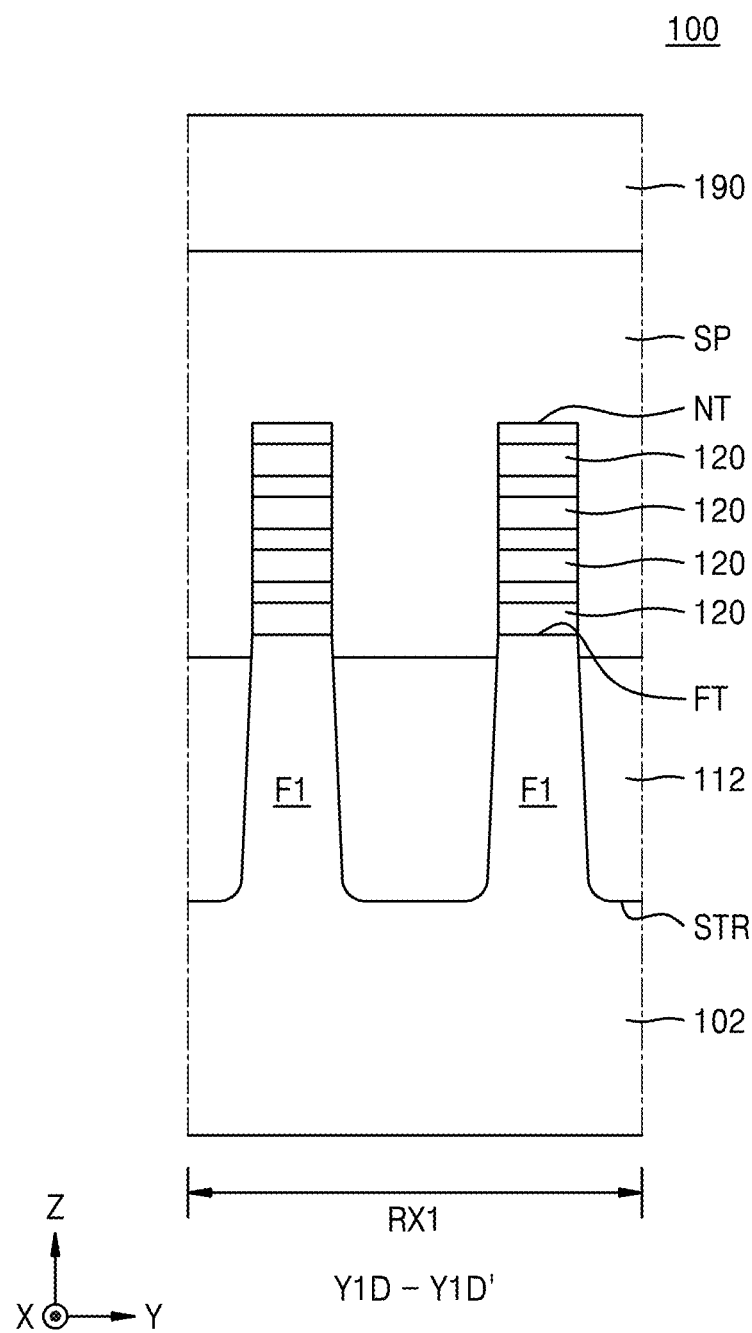
FIG. 7A is a cross-sectional view illustrating a partial configuration of a cross-section taken along line Y1D-Y1D' of FIG. 2A.
Figure 7B:
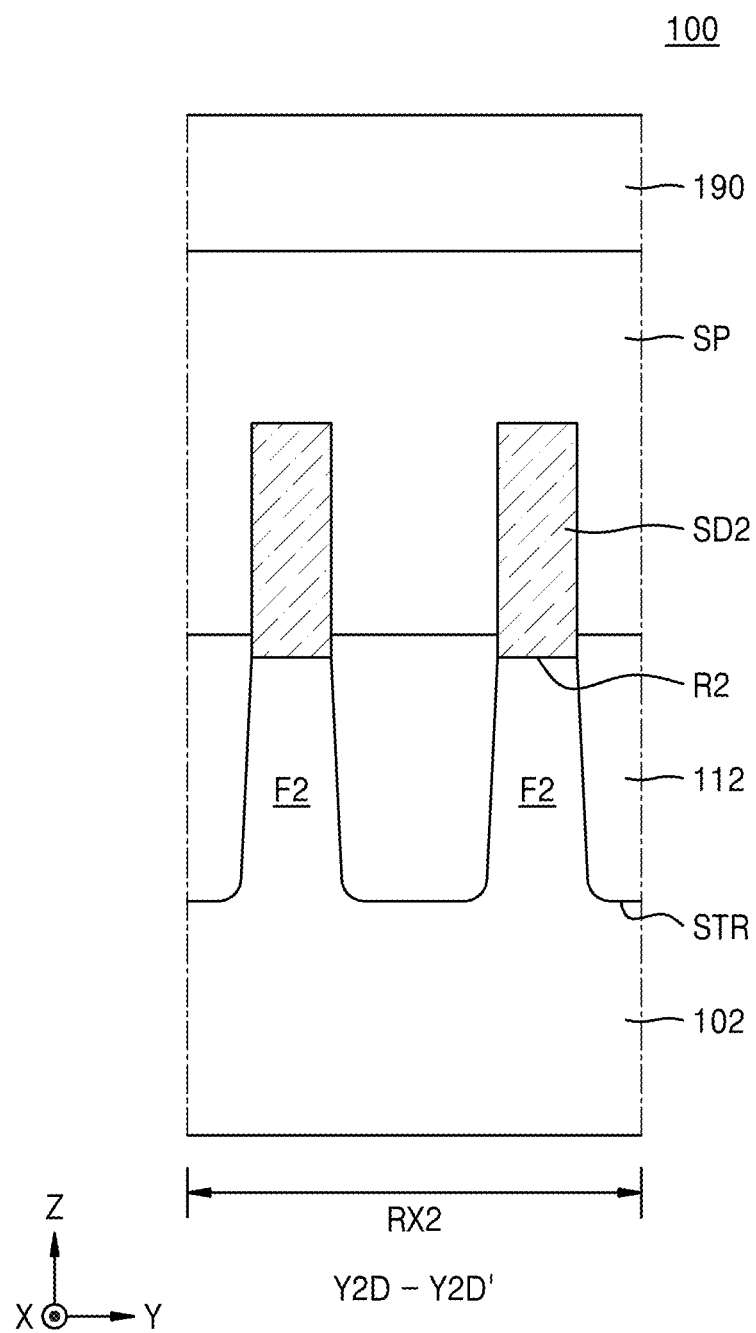
FIG. 7B is a cross-sectional view illustrating a partial configuration of a cross-section taken along line Y2D-Y2D' of FIG. 2B.

FIGS. 2A to 7B are diagrams illustrating an integrated circuit device 100 according to embodiments of the present disclosure. More specifically, FIG. 2A is a plan layout diagram of some components of a first device region RX1 of the integrated circuit device 100, and FIG. 2B is a plan layout diagram of some components of a second device region RX2 of the integrated circuit device 100. FIG. 3A is a cross-sectional view illustrating a partial configuration of a cross-section taken along line X1-X1' of FIG. 2A, and FIG. 3B is a cross-sectional view illustrating a partial configuration of a cross-section taken along line X2-X2' of FIG. 2B. FIG. 4A is a cross-sectional view illustrating a partial configuration of a cross-section taken along line Y1A-Y1A' of FIG. 2A, and FIG. 4B is a cross-sectional view illustrating a partial configuration of a cross-section taken along line Y2A-Y2A' of FIG. 2B. FIG. 5A is a cross-sectional view illustrating a partial configuration of a cross-section taken along line Y1B-Y1B' of FIG. 2A, and FIG. 5B is a cross-sectional view illustrating a partial configuration of a cross-section taken along line Y2B-Y2B' of FIG. 2B. FIG. 6A is a cross-sectional view illustrating a partial configuration of a cross-section taken along line Y1C-Y1C' of FIG. 2A, and FIG. 6B is a cross-sectional view illustrating a partial configuration of a cross-section taken along line Y2C-Y2C' of FIG. 2B. FIG. 7A is a cross-sectional view illustrating a partial configuration of a cross-section taken along line Y1D-Y1D' of FIG. 2A, and FIG. 7B is a cross-sectional view illustrating a partial configuration of a cross-section taken along line Y2D-Y2D' of FIG. 2B.

Referring to FIGS. 2A to 7B, the integrated circuit device 100 includes a substrate 102 having a first device region RX1 and a second device region RX2. The substrate 102 may include a semiconductor such as Si or Ge, or a compound semiconductor such as SiGe, SiC, GaAs, InAs, InGaAs, or InP. The terms "SiGe", "SiC", "GaAs", "InAs", "InGaAs", and "InP" used herein refer to materials including elements included in the respective terms, and are not chemical formulas representing stoichiometric relationships. The substrate 102 may include a conductive region, for example, a well doped with an impurity, or a structure doped with an impurity.

In the first device region RX1 and the second device region RX2, a plurality of fin-type active regions (e.g. first fin-type active region F1 and second fin-type active region F2) may protrude in a vertical direction (Z direction) from the substrate 102. The plurality of fin-type active regions may extend parallel to each other in a first horizontal direction (X direction). The plurality of fin-type active regions may be defined by device isolation trenches STR formed in the substrate 102 in the first device region RX1 and the second device region RX2, respectively. A specific example of the constituent material of each of the plurality of fin-type active regions are as described above with respect to the constituent material of the substrate 102.

Figure 2B:
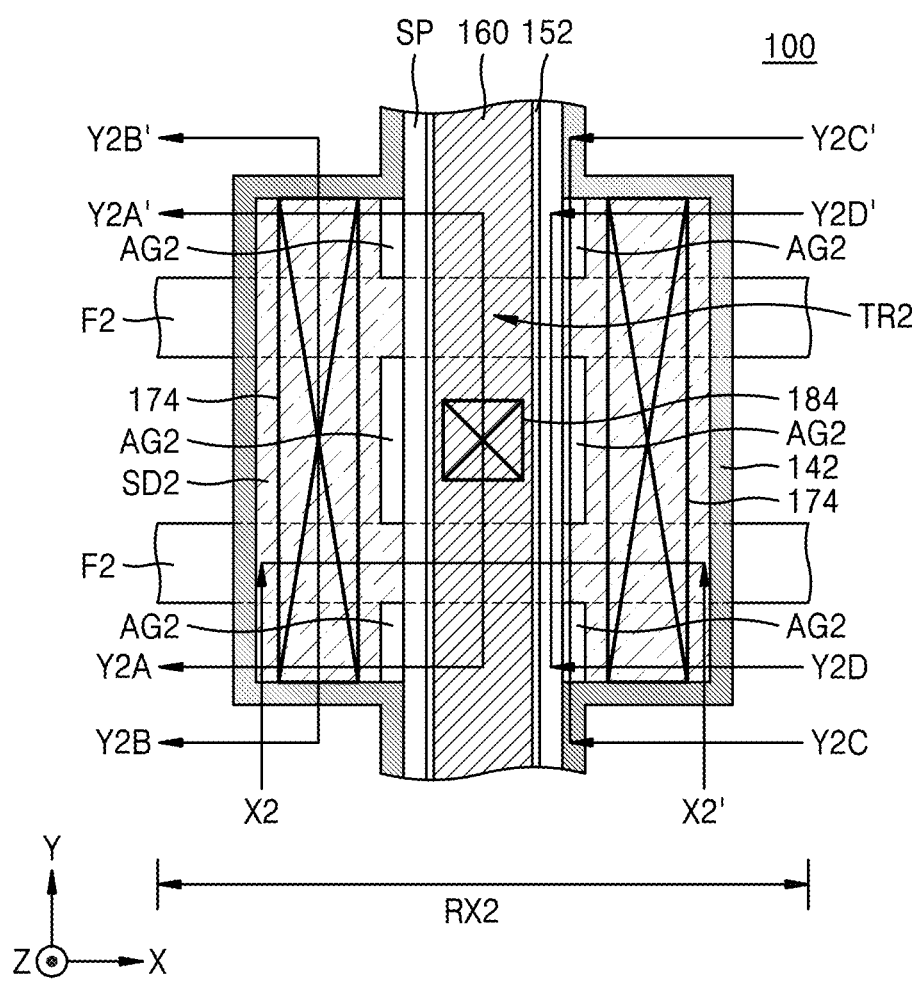
FIG. 2B is a plan layout diagram of some components of a second device region of the integrated circuit device of FIG. 1.

The plurality of fin-type active regions include a plurality of a first fin-type active region F1 arranged in the first device region RX1 and a plurality of a second fin-type active region F2 arranged in the second device region RX2. Each of the plurality of fin-type active regions may have a fin top surface FT. FIG. 2A illustrates two of the first fin-type active region F1 arranged in the first device region RX1, and FIG. 2B illustrates two of the second fin-type active region F2 arranged in the second device region RX2. However, one or three or more of the first fin-type active region F1 and second fin-type active region F2 may be arranged in the first device region RX1, and one or three or more of the second fin-type active region F2 may be arranged in the second device region RX2.

On the plurality of fin-type active regions, a gate line 160 extends long in a second horizontal direction (Y direction) crossing the first horizontal direction (X direction). FIGS. 2A and 2B illustrate a configuration in which one gate line 160 is on each of the plurality of the first fin-type active region F1 and second fin-type active region F2. However, the number of the gate line 160 on the plurality of the first fin-type active region F1 and second fin-type active region F2 is not particularly limited. For example, at least two of the gate line 160 may be arranged on each of the plurality of the first fin-type active region F1 and second fin-type active region F2.

As illustrated in FIGS. 5A to 7B, the device isolation trenches STR in the first device region RX1 and the second device region RX2 may be filled with a device isolation layer 112. The device isolation layer 112 may be arranged between the substrate 102 and a plurality of the gate line 160 and may cover a sidewall of each of the plurality of the first fin-type active region F1 and second fin-type active region F2. The device isolation layer 112 may include an oxide layer, a nitride layer, or a combination thereof. The device isolation layer 112 may be in contact with a sidewall of each of the plurality of the first fin-type active region F1 and second fin-type active region F2. The level of the top surface of the device isolation layer 112 may be equal to or lower than the level of the fin top surface FT. The term "level" as used herein refers to a height in a vertical direction (Z direction or −Z direction) from the top surface of the substrate 102.

Each of the plurality of the gate line 160 may extend long in the second horizontal direction (Y direction) on the plurality of the first fin-type active region F1 and second fin-type active region F2 and the device isolation layer 112. A plurality of nanosheet stacks NSS may be arranged on the fin top surface FT of each of the plurality of the first fin-type active region F1 and second fin-type active region F2 in regions where the plurality of the first fin-type active region F1 and second fin-type active region F2 cross the plurality of the gate line 160. Each of the plurality of nanosheet stacks NSS may constitute a channel region. The plurality of nanosheet stacks NSS may face the fin top surface FT at positions apart from the plurality of the first fin-type active region F1 and second fin-type active region F2 in the vertical direction (Z direction), respectively.

The plurality of nanosheet stacks NSS may include a plurality of nanosheets N1, N2, N3, and N4 overlapping each other in the vertical direction (Z direction) on the fin top surface FT of each of the first fin-type active region F1 and the second fin-type active region F2. The term "nanosheet" as used herein refers to a conductive structure having a cross-section substantially perpendicular to a direction in which a current flows. It should be understood that the nanosheets may include nanowires. The plurality of nanosheets N1, N2, N3, and N4 may have different vertical distances (Z-direction distances) from the fin top surface FT.

The number of nanosheet stacks NSS and the gate line 160 arranged on the first fin-type active region F1 or the second fin-type active region F2 is not particularly limited. For example, one or a plurality of nanosheet stacks NSS and one or a plurality of the gate line 160 may be arranged on the first fin-type active region F1 or the second fin-type active region F2.

FIGS. 3A to 4B illustrate a case in which each of the plurality of nanosheet stacks NSS includes four nanosheets N1, N2, N3, and N4, but the number of nanosheets included in the nanosheet stacks NSS is not particularly limited. For example, each of the plurality of nanosheet stacks NSS may include one nanosheet, two nanosheet, three nanosheets, or five or more nanosheets. Each of the plurality of nanosheets N1, N2, N3, and N4 may have a channel region.

In example embodiments, the plurality of nanosheets N1, N2, N3, and N4 may have substantially the same thickness in the vertical direction (Z direction). In other example embodiments, at least some of the plurality of nanosheets N1, N2, N3, and N4 may have different thicknesses in the vertical direction (Z direction).

In example embodiments, the plurality of nanosheets N1, N2, N3, and N4 included in one of the nanosheet stacks NSS in the first device region RX1 and the second device region RX2 may have the same size in the horizontal direction (X direction). In other example embodiments, at least some of the plurality of nanosheets N1, N2, N3, and N4 included in one of the nanosheet stacks NSS have different sizes in the first horizontal direction (X direction). For example, the length of the lowermost nanosheet N1 closest to the fin top surface FT from among the plurality of nanosheets N1, N2, N3, and N4 in the first horizontal direction (X direction) may be less or greater than the length of the nanosheet N4 farthest from the fin top surface FT.

Figure 3A:
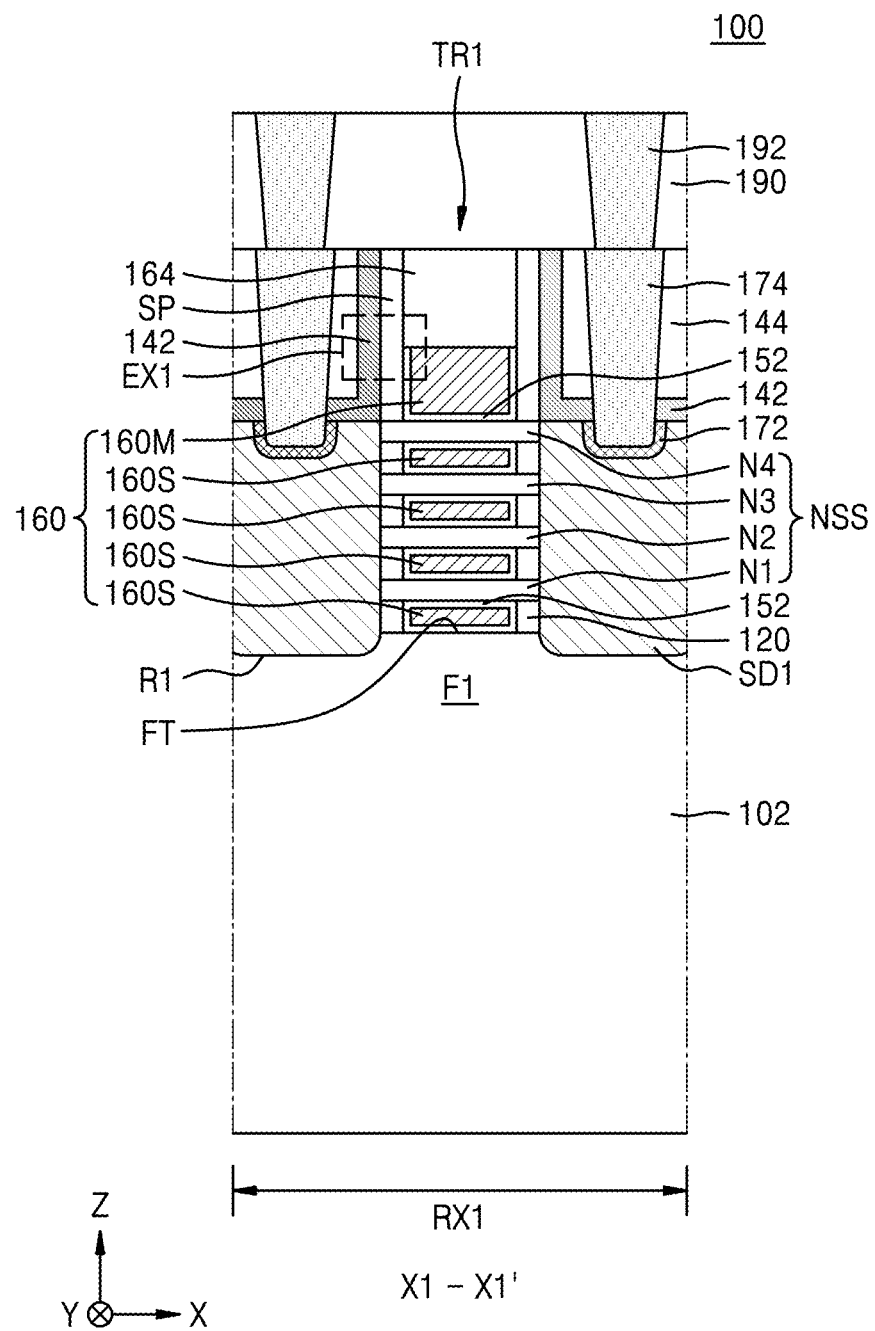
FIG. 3A is a cross-sectional view illustrating a partial configuration of a cross-section taken along line X1-X1' of FIG. 2A.
Figure 4A:
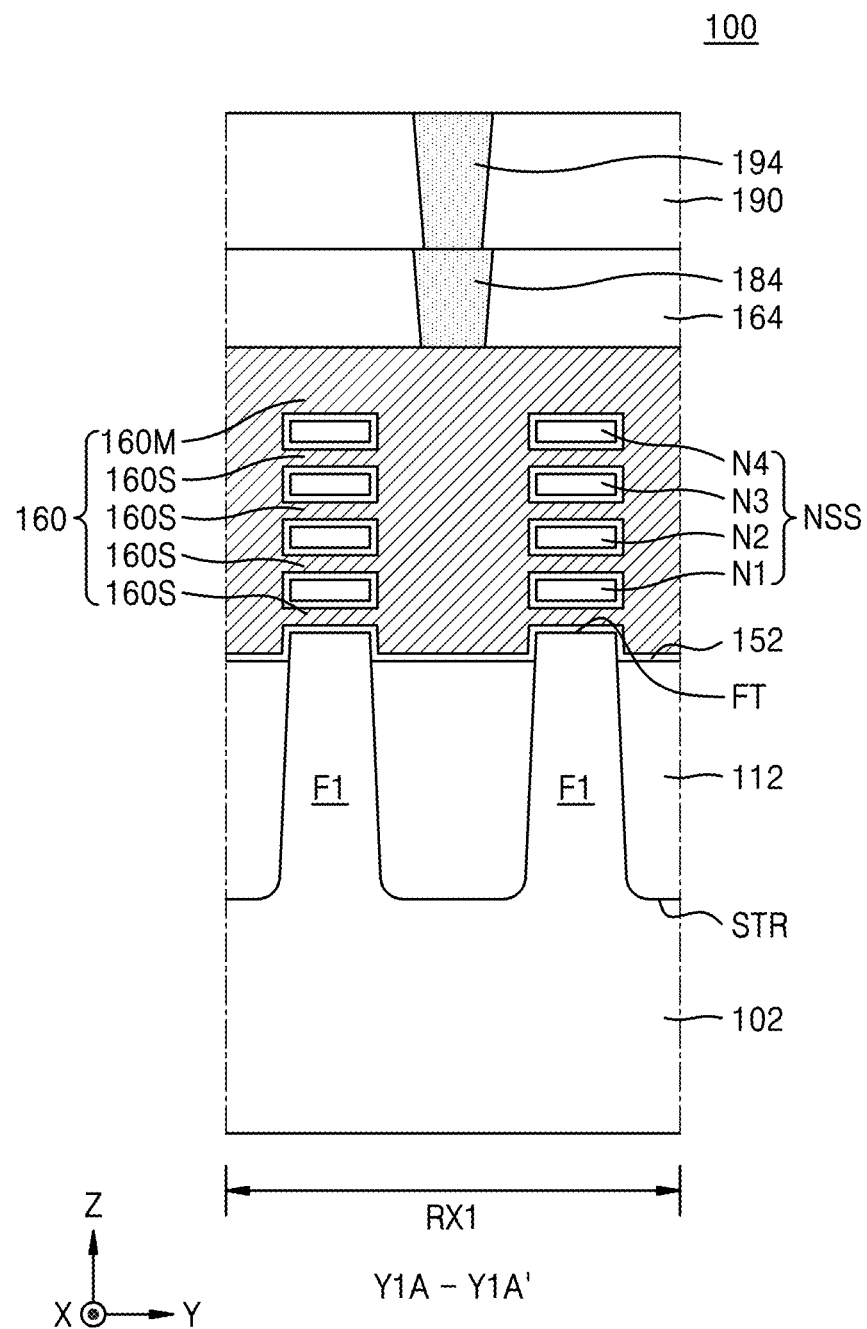
FIG. 4A is a cross-sectional view illustrating a partial configuration of a cross-section taken along line Y1A-Y1A' of FIG. 2A.
Figure 4B:
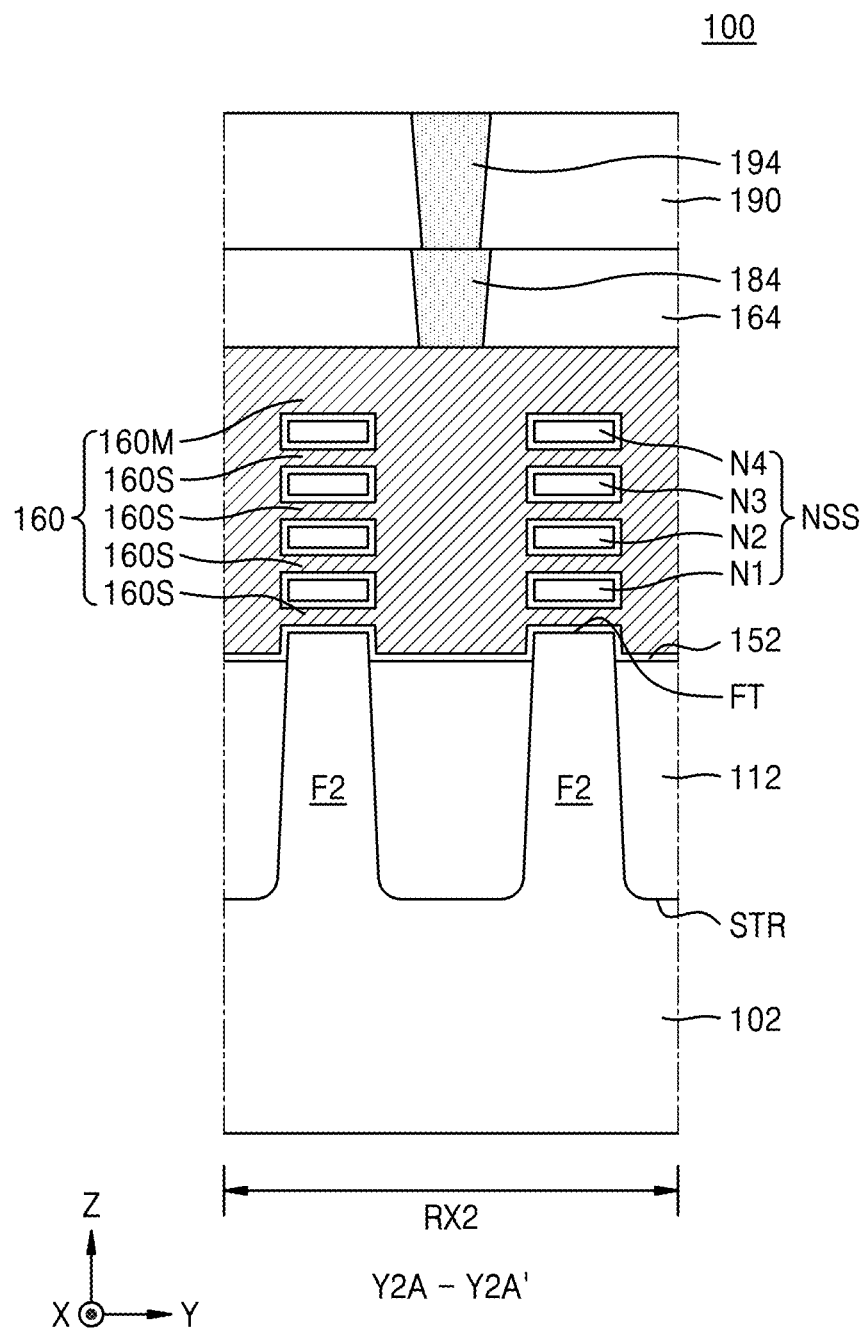
FIG. 4B is a cross-sectional view illustrating a partial configuration of a cross-section taken along line Y2A-Y2A' of FIG. 2B.

As illustrated in FIGS. 3A, 5A, and 6A, a plurality of first recesses R1 may be formed in the top surface of the first fin-type active region F1 in the first device region RX1. As illustrated in FIGS. 3B, 5B, 6B, and 7B, a plurality of second recesses R2 may be formed in the top surface of the second fin-type active region F2 in the second device region RX2. FIGS. 3A to 7B illustrate a case where the level of the lowermost surface of each of the plurality of the first recesses R1 and the second recesses R2 is lower than the level of the fin top surface FT of each of the plurality of the first fin-type active region F1 and second fin-type active region F2. However, embodiments of the present disclosure are not limited thereto. The level of the lowermost surface of each of the plurality of first recesses R1 and second recesses R2 may be the same as or similar to the level of the fin top surface FT of each of the plurality of the first fin-type active region F1 and second fin-type active region F2.

As illustrated in FIGS. 3A, 5A, and 6A, a plurality of a first source/drain region SD1 may be formed on the plurality of first recesses R1 in the first device region RX1. As illustrated in FIG. 5A, a plurality of a first source/drain region SD1 adjacent to each other in the second horizontal direction (Y direction) from among the plurality of the first source/drain region SD1 may be integrally connected to each other.

As illustrated in FIGS. 3B, 5B, 6B, and 7B, a plurality of a second source/drain region SD2 may be formed on the plurality of second recesses R2 in the second device region RX2. As illustrated in FIG. 5B, a plurality of a second source/drain region SD2 adjacent to each other in the second horizontal direction (Y direction) from among the plurality of the second source/drain region SD2 may be integrally connected to each other.

The plurality of the gate line 160 may surround each of the plurality of nanosheets N1, N2, N3, and N4 while covering the plurality of nanosheet stacks NSS on the first fin-type active region F1 and the second fin-type active region F2, respectively. Transistors may be formed in regions where the plurality of the first fin-type active region F1 and second fin-type active region F2 and the gate line 160 cross each other on the substrate 102. In example embodiments, the first device region RX1 may be an NMOS transistor region and an NMOS transistor TR1 may be formed in regions where the first fin-type active region F1 and the gate line 160 cross each other in the first device region RX1. The second device region RX2 may be a PMOS transistor region, and a PMOS transistor TR2 may be formed at regions where the second fin-type active region F2 and the gate line 160 cross each other in the second device region RX2.

The gate line 160 may include a main gate portion 160M and a plurality of sub-gate portions 160S. The main gate portion 160M may cover the top surface of the nanosheet stack NSS and may extend long in the second horizontal direction (Y direction). The plurality of sub-gate portions 160S may be integrally connected to the main gate portion 160M and may be arranged between each two of the plurality of nanosheets N1, N2, N3, and N4, and between the first fin-type active region F1 and the second fin-type active region F2 and the lowermost nanosheets N1.

The plurality of the gate line 160 may include a metal, a metal nitride, a metal carbide, or a combination thereof. The metal may be selected from Ti, W, Ru, Nb, Mo, Hf, Ni, Co, Pt, Yb, Tb, Dy, Er, and Pd. The metal nitride may be selected from TiN and TaN. The metal carbide may be TiAlC. In example embodiments, the gate line 160 may have a structure in which a metal nitride layer, a metal layer, a conductive capping layer, and a gap-fill metal layer are sequentially stacked. The metal nitride layer and the metal layer may include at least one metal selected from Ti, Ta, W, Ru, Nb, Mo, and Hf. The gap-fill metal layer may include a W layer or an Al layer. The plurality of the gate line 160 may include at least one work function metal-containing layer. The at least one work function metal-containing layer may include at least one metal selected from Ti, W, Ru, Nb, Mo, Hf, Ni, Co, Pt, Yb, Tb, Dy, Er, and Pd.

In example embodiments, each of the plurality of the gate line 160 may have a stacked structure of a plurality of metal-containing layers, and among the plurality of the gate line 160, a gate line 160 arranged in the first device region RX1 and a gate line 160 arranged in the second device region RX2 may have different stacked structures. For example, a gate line 160 arranged in the first device region RX1 and a gate line 160 arranged in the second device region RX2 may have different stacked structures selected from a TiAlC/TiN/W structure, a TiN/TaN/TiAlC/TiN/W structure, and a TiN/TaN/TiN/TiAlC/TiN/W structure, but are not limited thereto.

A gate dielectric layer 152 may be between the plurality of nanosheets N1, N2, N3, and N4 and the gate line 160 in the first device region RX1 and the second device region RX2. The gate dielectric layer 152 may include portions covering the surface of each of the plurality of nanosheets N1, N2, N3, and N4, portions covering sidewalls of the main gate portion 160M, portions covering the fin top surface FT of each of the plurality of the first fin-type active region F1 and second fin-type active region F2, and portions covering the top surface of the device isolation layer 112.

In example embodiments, the gate dielectric layer 152 may include a high-k dielectric layer. The high-k dielectric layer may include a material having a higher dielectric constant than that of a silicon oxide layer. For example, the high-k dielectric layer may have a dielectric constant of about 10 to about 25. The high-k dielectric layer may include hafnium oxide, but is not limited thereto.

The plurality of nanosheets N1, N2, N3, and N4 may include semiconductor layers including the same element. In an example, each of the plurality of nanosheets N1, N2, N3, and N4 may include a Si layer. The plurality of nanosheets N1, N2, N3, and N4 in the first device region RX1 may be doped with a dopant having the same conductivity-type as that of the first source/drain region SD1. The plurality of nanosheets N1, N2, N3, and N4 in the second device region RX2 may be doped with a dopant having the same conductivity-type as that of the second source/drain region SD2. For example, the plurality of nanosheets N1, N2, N3, and N4 in the first device region RX1 may include a Si layer doped with an n-type dopant, and the plurality of nanosheets N1, N2, N3, and N4 in the second device region RX2 may include a Si layer doped with a p-type dopant.

In the first device region RX1 and the second device region RX2, sidewalls (hereinafter, referred to as gate sidewalls) of the gate line 160 may be covered with a plurality of the insulating spacer SP. As illustrated in FIGS. 3A, 3B, 7A and 7B, the plurality of the insulating spacer SP may be arranged on the top surface of each of the nanosheet stack NSS and the device isolation layer 112 in the first device region RX1 and the second device region RX2 and include portions covering gate sidewalls of the gate line 160.

In the first device region RX1, the plurality of the insulating spacer SP may be arranged on the top surface of the device isolation layer 112, as illustrated in FIGS. 5A and 6A, and include portions covering sidewalls of each of the plurality of the first source/drain region SD1. As illustrated in FIG. 7A, in the first device region RX1, the plurality of the insulating spacer SP may be in contact with sidewalls of each of the plurality of nanosheets N1, N2, N3, and N4 and a top surface NT of the nanosheet stack NSS.

In the second device region RX2, the plurality of the insulating spacer SP may be arranged on the top surface of the device isolation layer 112, as illustrated in FIGS. 5B and 6B, and include portions covering sidewalls of each of the plurality of the second source/drain region SD2.

The plurality of the insulating spacer SP may include portions covering both sidewalls of the main gate portion 160M in the first horizontal direction (X direction) on the top surface of the nanosheet stack NSS. A portion of each of the plurality of the insulating spacer SP, the portion covering the top surface of the nanosheet stack NSS, may be apart from the gate line 160 in the first horizontal direction (X direction) with the gate dielectric layer 152 therebetween.

Each of the plurality of the insulating spacer SP may include a nitride layer containing oxygen atoms. For example, each of the plurality of the insulating spacer SP may include at least one of a SiOCN layer and a SiON layer. The terms "SiON" and "SiOCN" as used herein refer to materials including elements included in the respective terms, and are not chemical formulas representing stoichiometric relationships.

Figure 3B:
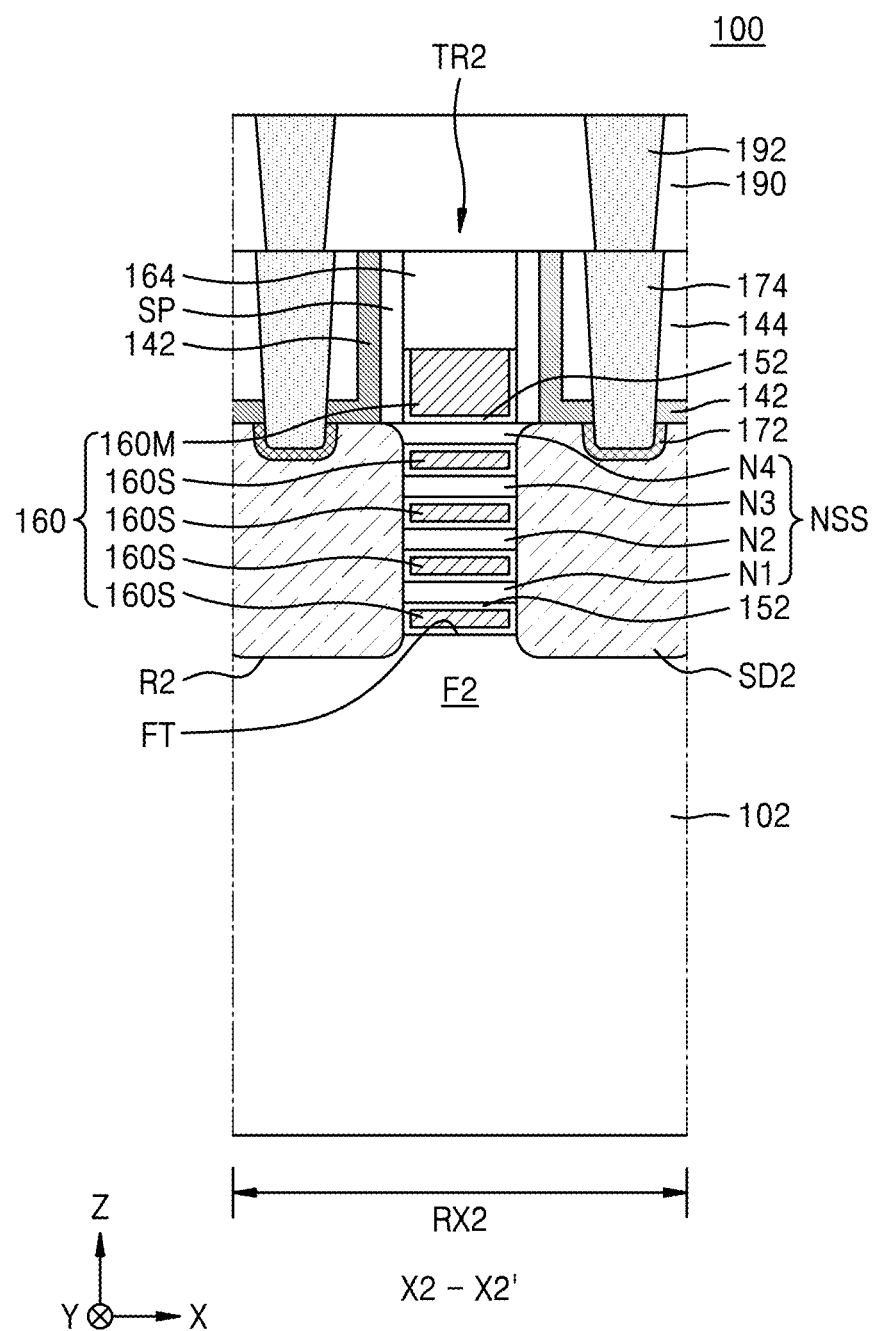
FIG. 3B is a cross-sectional view illustrating a partial configuration of a cross-section taken along line X2-X2' of FIG. 2B.

As illustrated in FIG. 3A, in the first device region RX1, the source/drain region SD1 may not include a portion overlapped by the main gate portion 160M of the gate line 160 and the insulating spacer SP in the vertical direction (Z direction). As illustrated in FIG. 3B, in the second device region RX2, the second source/drain region SD2 may include a portion overlapped by the insulating spacer SP in the vertical direction (Z direction) and may not include a portion overlapped by the main gate portion 160M of the gate line 160 in the vertical direction (Z direction). However, the cross-sectional shapes of the plurality of first source/drain region SD1 and second source/drain region SD2 illustrated in FIGS. 3A and 3B are only examples and are not limited to those illustrated in FIGS. 3A and 3B. That is, the cross-sectional shapes of the plurality of the first source/drain region SD1 and second source/drain region SD2 may be variously modified and changed.

As illustrated in FIGS. 3A and 7A, in the first device region RX1, a plurality of an inner insulating spacer 120 may be between each two of the plurality of nanosheets N1, N2, N3, and N4 and between the fin top surface FT of the first fin-type active region F1 and the lowermost nanosheet N1. The plurality of the inner insulating spacer 120 may be between the plurality of sub-gate portions 160S and the first source/drain region SD1 in the first horizontal direction (X-direction). As illustrated in FIG. 7A, in the first device region RX1, the plurality of the inner insulating spacer 120 and the plurality of nanosheets N1, N2, N3, and N4 may respectively have surfaces in contact with the insulating spacer SP.

As illustrated in FIG. 3A, in the first device region RX1, both sidewalls of each of the plurality of sub-gate portions 160S in the first horizontal direction (X direction) may be covered with the inner insulating spacer 120 with the gate dielectric layer 152 therebetween. Each of the plurality of sub-gate portions 160S in the first device region RX1 may be apart from the first source/drain region SD1 with the gate dielectric layer 152 and the inner insulating spacer 120 therebetween. Each of the plurality of the inner insulating spacer 120 may be in contact with the first source/drain region SD1. At least some of the plurality of the inner insulating spacer 120 may be overlapped by the insulating spacer SP in the vertical direction (Z direction).

The inner insulating spacer 120 may include silicon nitride (SiN), silicon oxide, SiCN, SiBN, SION, SIOCN, SiBCN, SiOC, or a combination thereof. The terms "SiN", "SiCN", "SiBN", and "SiBCN" as used herein refer to materials including elements included in the respective terms, and are not chemical formulas representing stoichiometric relationships. The inner insulating spacer 120 may further include an air gap. The term "air" as used herein may refer to the atmosphere or other gases that may be present during a process of manufacturing the integrated circuit device 100.

As illustrated in FIG. 3A, in the first device region RX1, each of the plurality of the first source/drain region SD1 may include a portion in contact with the plurality of nanosheets N1, N2, N3, and N4 and a portion in contact with the inner insulating spacer 120. Each of the plurality of the first source/drain region SD1 may be apart from the gate dielectric layer 152 with the inner insulating spacer 120 therebetween. In the first device region RX1, the gate dielectric layer 152 may include portions, which are respectively between each two of the plurality of nanosheets N1, N2, N3, and N4 and between the first fin-type active region F1 and the lowermost nanosheet N1 and vertically overlap the plurality of nanosheets N1, N2, N3, and N4.

As illustrated in FIG. 3B, in the second device region RX2, each of the plurality of the second source/drain region SD2 may have a portion in contact with the plurality of nanosheets N1, N2, N3, and N4 and a portion in contact with the gate dielectric layer 152. In the second device region RX2, the gate dielectric layer 152 may include portions, which are respectively between each two of the plurality of nanosheets N1, N2, N3, and N4 and between one of the second fin-type active region F2 and the lowermost nanosheet N1 and vertically overlap the plurality of nanosheets N1, N2, N3, and N4.

As illustrated in FIGS. 3A to 4B, the gate line 160 and the gate dielectric layer 152 may be covered with a capping insulating pattern 164. The capping insulating pattern 164 may include a silicon nitride layer.

In the first device region RX1, the main gate portion 160M of the gate line 160 may be apart from the first source/drain region SD1 with the insulating spacer SP therebetween. In the second device region RX2, the main gate portion 160M of the gate line 160 may be apart from the second source/drain region SD2 with the insulating spacer SP therebetween.

When the first device region RX1 is an NMOS transistor region and the second device region RX2 is a PMOS transistor region, the plurality of the first source/drain region SD1 in the first device region RX1 may include a Si layer doped with an n-type dopant or a SiC layer doped with an n-type dopant, and the plurality of the second source/drain region SD2 in the second device region RX2 may include a SiGe layer doped with a p-type dopant. The n-type dopant may be selected from phosphorus (P), arsenic (As), and antimony (Sb). The p-type dopant may be selected from boron (B) and gallium (Ga).

The plurality of the first source/drain region SD1 in the first device region RX1 and the plurality of the second source/drain region SD2 in the second device region RX2 may have different shapes and sizes. In example embodiments, the size of each of the plurality of the second source/drain region SD2 may be greater than the size of each of the plurality of the first source/drain region SD1. The shapes of the plurality of the first source/drain region SD1 and second source/drain region SD2 are not limited to those illustrated in FIGS. 3A to 7B and may be various shapes and sizes.

As illustrated in FIGS. 3A, 3B, 5A, 5B, 6A, and 6B, in the first device region RX1 and the second device region RX2, a portion of the surface of each of the plurality of the first source/drain region SD1 and second source/drain region SD2 may be covered with an insulating liner 142. The insulating liner 142 may be in contact with a portion of the surface of each of the plurality of the first source/drain region SD1 and second source/drain region SD2, a portion of the surface of the sidewall of the insulating spacer SP, and a portion of the surface of the device isolation layer 112 and conformally cover the portions of the surfaces.

The insulating liner 142 may include SiN, SiCN, SiBN, SiON, SiOCN, SiBCN, SiOC, or a combination thereof. In example embodiments, the constituent material of the insulating spacer SP and the constituent material of the insulating liner 142 may be different from each other. For example, the insulating spacer SP may include a SiOCN layer, a SiON layer, or a combination thereof, and the insulating liner 142 may include a SiN layer.

As illustrated in FIGS. 2A and 6A, in the first device region RX1, a first air gap AG1 may be between the insulating spacer SP and the first source/drain region SD1. In the first device region RX1, the insulating liner 142 may include a portion defining the size of the first air gap AG1. As illustrated in FIG. 2A, the first air gap AG1 may include portions between a portion of the insulating spacer SP, which covers the sidewall of the main gate portion 160M, and a portion of the first source/drain region SD1. As illustrated in FIG. 6A, the first air gap AG1 may include a portion in which the height thereof in the vertical direction (Z direction) is defined by the insulating liner 142, and a portion in which the width thereof in the second horizontal direction (Y direction) is defined by the insulating liner 142. As illustrated in FIG. 5A, in the first device region RX1, the first air gap AG1 may further include a portion between the top surface of the device isolation layer 112 and the first source/drain region SD1.

As illustrated in FIG. 2A, a portion of the first source/drain region SD1 facing the sidewall of the gate line 160 may be exposed to the first air gap AG1. As illustrated in FIGS. 5A and 6A, a portion of the top surface of the device isolation layer 112 may be exposed to the first air gap AG1 between two adjacent ones of the first fin-type active region F1.

As illustrated in FIG. 5A, portions of the first source/drain region SD1 facing the device isolation layer 112 may be exposed to the first air gap AG1. As illustrated in FIG. 6A, both sidewalls of a portion of the first source/drain region SD1 in the second horizontal direction (Y direction), the portion being adjacent to the plurality of nanosheets N1, N2, N3, and N4, may be exposed to the first air gap AG1. As illustrated in FIG. 6A, in the first device region RX1, a lower portion region of the insulating spacer SP may be in contact with the device isolation layer 112 and the first source/drain region SD1. In the first device region RX1, the lower portion region of the insulating spacer SP and an upper portion region of the insulating spacer SP, which covers the sidewall of the main gate portion 160M, may each be exposed to the first air gap AG1. The insulating liner 142 may include a portion that vertically overlaps the lower portion region of the insulating spacer SP in the first device region RX1.

As illustrated in FIG. 6A, the size and shape of a cross-section of a portion of the first air gap AG1 in the second horizontal direction (Y direction), the portion being adjacent to the first source/drain region SD1, may correspond to the size and shape of a cross-section of the first source/drain region SD1 in the second horizontal direction (Y direction), the first source/drain region SD1 being adjacent to the first air gap AG1.

As illustrated in FIGS. 2B and 6B, in the second device region RX2, a second air gap AG2 may be between the insulating spacer SP and the second source/drain region SD2. In the second device region RX2, the insulating liner 142 may include a portion defining the size of the second air gap AG2. As illustrated in FIG. 2B, the second air gap AG2 may include portions between a portion of the insulating spacer SP, which covers the sidewall of the main gate portion 160M, and a portion of the second source/drain region SD2. As illustrated in FIG. 6B, the second air gap AG2 may include a portion in which the height thereof in the vertical direction (Z direction) is defined by the insulating liner 142, and a portion in which the width thereof in the second horizontal direction (Z direction) is defined by the insulating liner 142. As illustrated in FIG. 5B, in the second device region RX2, the second air gap AG2 may further include a portion between the top surface of the device isolation layer 112 and the second source/drain region SD2.

As illustrated in FIG. 2B, a portion of the second source/drain region SD2 facing the sidewall of the gate line 160 may be exposed to the second air gap AG2. As illustrated in FIGS. 5B and 6B, a portion of the top surface of the device isolation layer 112 may be exposed to the second air gap AG2 between two adjacent ones of the second fin-type active region F2.

As illustrated in FIG. 5B, portions of the second source/drain region SD2 facing the device isolation layer 112 may be exposed to the second air gap AG2. As illustrated in FIG. 6B, both sidewalls of a portion of the second source/drain region SD2 in the second horizontal direction (Y direction), the portion being adjacent to the plurality of nanosheets N1, N2, N3, and N4, may be exposed to the second air gap AG2. As illustrated in FIG. 6B, in the second device region RX2, a lower portion region of the insulating spacer SP may be in contact with the device isolation layer 112 and the second source/drain region SD2. In the second device region RX2, the lower portion region of the insulating spacer SP and an upper portion region of the insulating spacer SP, which covers the sidewall of the main gate portion 160M, may each be exposed to the second air gap AG2. The insulating liner 142 may include a portion that vertically overlaps the lower portion region of the insulating spacer SP in the second device region RX2.

As illustrated in FIG. 6B, the size and shape of a cross-section of a portion of the second air gap AG2, which is adjacent to the second source/drain region SD2 in the second horizontal direction (Y direction), may correspond to the size and shape of a cross-section of the second source/drain region SD2 adjacent to the second air gap AG2 in the second horizontal direction (Y direction).

The first air gap AG1 and the second air gap AG2 may have different shapes and sizes. In example embodiments, the size of the first air gap AG1 and the size of the second air gap AG2 may be different from each other when viewing the cross-sections in the second horizontal direction (Y direction), illustrated in FIGS. 6A and 6B. For example, the size of the second air gap AG2 may be greater than the size of the first air gap AG1. In the plan views illustrated in FIGS. 2A and 2B, the width of each of the first air gap AG1 and the second air gap AG2 in the first horizontal direction (X direction) may be about 1 nm to about 10 nm, for example, about 1 nm to about 3 nm, but is not limited thereto.

As illustrated in FIGS. 3A, 3B, 5A, and 5B, in the first device region RX1 and the second device region RX2, the first source/drain region SD1 and the first source/drain region SD2 may be covered with an inter-gate insulating layer 144. In the first device region RX1, the insulating liner 142 may be between the first source/drain region SD1 and the inter-gate insulating layer 144. In the second device region RX2, the insulating liner 142 may be between the second source/drain region SD2 and the inter-gate insulating layer 144. The inter-gate insulating layer 144 may include silicon oxide, silicon nitride, SiON, SiOCN, or a combination thereof. In example embodiments, the inter-gate insulating layer 144 may include a silicon oxide layer.

In the first device region RX1 and the second device region RX2, a plurality of the capping insulating pattern 164, the insulating spacer SP, the insulating liner 142, and the inter-gate insulating layer 144 may be covered with an interlayer insulating layer 190. The interlayer insulating layer 190 may include an oxide layer, a nitride layer, an ultra low-k (ULK) layer having an ultra low dielectric constant of about 2.2 to about 2.4, or a combination thereof. For example, the interlayer insulating layer 190 may include a tetraethylorthosilicate (TEOS) layer, a high density plasma (HDP) layer, a boro-phospho-silicate glass (BPSG) layer, a SiON layer, a SiN layer, a SiOC layer, a SiCOH layer, or a combination thereof.

As illustrated in FIGS. 2A, 2B, 3A, 3B, 5A, and 5B, in the first device region RX1 and the second device region RX2, a plurality of source/drain contacts 174 may be formed on the plurality of the first sources/drain region SD1 and second sources/drain region SD2. Each of the plurality of source/drain contacts 174 may pass through the inter-gate insulating layer 144 and the insulating liner 142 in the vertical direction (Z direction) and be connected to any one of the first source/drain region SD1 and the second source/drain region SD2. As illustrated in FIGS. 3A, 3B, 5A, and 5B, a plurality of source/drain via contacts 192 may be respectively formed on the plurality of source/drain contacts 174. Each of the plurality of source/drain via contacts 192 may pass through the interlayer insulating layer 190 in the vertical direction (Z direction) and be connected to one of the source/drain contacts 174. Each of the plurality of the first source/drain region SD1 and the second source/drain region SD2 may be connected to an upper conductive line (not shown) through one of the source/drain contacts 174 and one of the source/drain via contacts 192.

As illustrated in FIGS. 3A, 3B, 5A, and 5B, a metal silicide layer 172 may be between the first source/drain region SD1 (and second source/drain region SD2) and one of the source/drain contacts 174. In example embodiments, the metal silicide layer 172 may include Ti, W, Ru, Nb, Mo, Hf, Ni, Co, Pt, Yb, Tb, Dy, Er, or Pd. For example, the metal silicide layer 172 may include titanium silicide.

In the first device region RX1 and the second device region RX2, each of the plurality of source/drain contacts 174 may be connected to any one of the first source/drain region SD1 and the second source/drain region SD2 through the metal silicide layer 172. In example embodiments, the metal silicide layer 172 may be omitted. In this case, each of the plurality of source/drain contacts 174 may directly contact any one of the first source/drain region SD1 and the second source/drain region SD2.

As illustrated in FIGS. 2A, 2B, 4A, and 4B, a gate contact 184 may be formed on the gate line 160. As illustrated in FIGS. 4A and 4B, a gate via contact 194 may be formed on the gate contact 184. The gate line 160 may be connected to an upper conductive line (not shown) through the gate contact 184 and the gate via contact 194. The gate contact 184 may pass through the capping insulating pattern 164 in the vertical direction (Z direction) and contact the top surface of the gate line 160. The gate via contact 194 may pass through the interlayer insulating layer 190 in the vertical direction (Z direction) and contact the top surface of the gate contact 184. The position of each of the gate contact 184 and the gate via contact 194 illustrated in FIGS. 2A, 2B, 4A, and 4B is merely an example and may be variously changed.

In example embodiments, the plurality of source/drain contacts 174, the gate contact 184, the plurality of source/drain via contacts 192, and the gate via contact 194 may each include a metal plug and a conductive barrier layer surrounding the metal plug. The metal plug may include W, Co, Cu, Ru, Mn, or a combination thereof, and the conductive barrier layer may include Ti, Ta, TiN, TaN, or a combination thereof. However, embodiments of the present disclosure are not limited thereto.

In example embodiments, a sidewall of each of the plurality of source/drain contacts 174, the gate contact 184, the plurality of source/drain via contacts 192, and the gate via contact 194 may be surrounded by a contact insulating spacer (not shown). The contact insulating spacer may include silicon nitride, SiCN, SiOCN, or a combination thereof, but is not limited thereto.

The integrated circuit device 100 illustrated in FIGS. 1 and 2A to 7D includes an insulating spacer SP covering sidewalls of the gate line 160 in the first device region RX1 and the second device region RX2, and the first air gap AG1 and the second air gap AG2 are between the insulating spacer SP and the first source/drain region SD1 and the second source/drain region SD2 adjacent thereto. Accordingly, in each of the first device region RX1 and the second device region RX2, parasitic capacitance caused by undesirable coupling between the gate line 160 and the plurality of the first source/drain region SD1 and the second source/drain region SD2 arranged relatively adjacent thereto may be reduced. Accordingly, the ON current characteristic and OFF current characteristic of each of the plurality of transistors TR1 and TR2 formed in the first device region RX1 and the second device region RX2 may be improved, and thus, the performance of the transistors TR1 and TR2 may be improved and the reliability of the integrated circuit device 100 may be improved.

Figure 8A:
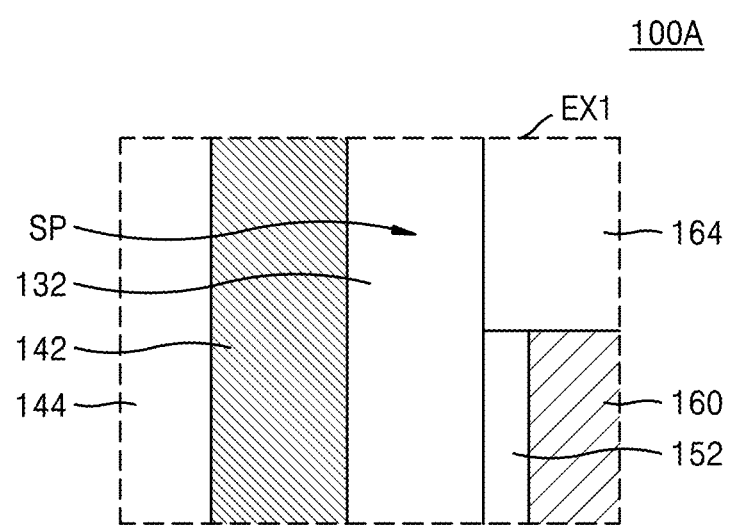
FIGS. 8A and 8B are cross-sectional views illustrating integrated circuit devices according to other embodiments of the present disclosure, respectively.
Figure 8B:
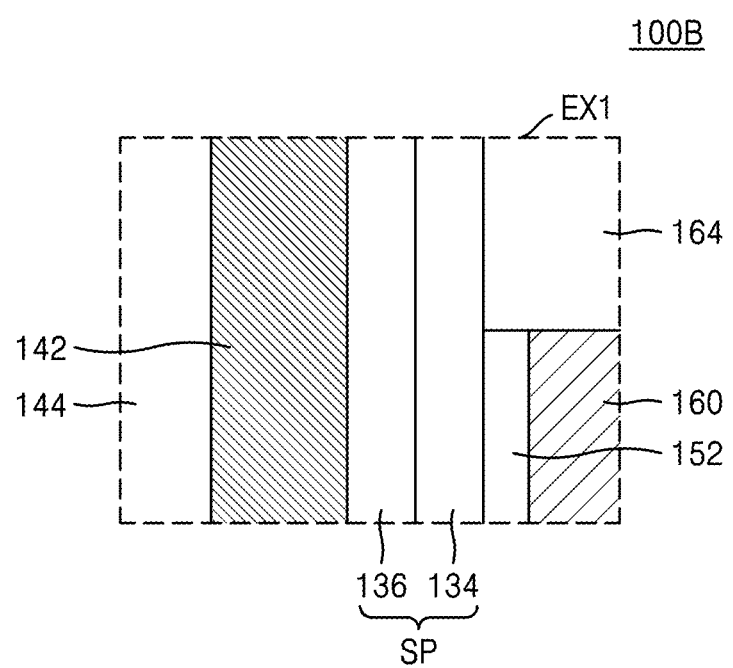

FIGS. 8A and 8B are cross-sectional views illustrating an integrated circuit device 100A and an integrated circuit device 100B according to other embodiments of the present disclosure, respectively, and are enlarged cross-sectional views of a region indicated by "EX1" in FIG. 3A.

Referring to FIG. 8A, the integrated circuit device 100A has substantially the same configuration as the integrated circuit device 100 described with reference to FIGS. 1 and 2A to 7B. However, in the integrated circuit device 100A, each of the plurality of the insulating spacer SP may include a single layer including a first silicon nitride layer 132. In example embodiments, the first silicon nitride layer 132 may include a silicon nitride layer containing oxygen atoms. For example, the first silicon nitride layer 132 may include a SiOCN layer or a SiON layer.

Although a portion of the first device region RX1 is illustrated in FIG. 8A, each of the plurality of the insulating spacer SP in the second device region RX2 may also include a single layer including the first silicon nitride layer 132 in the same manner as described with reference to FIG. 8A.

Similar to the description of the integrated circuit device 100 with reference to FIGS. 5A to 6B, some regions of the first silicon nitride layer 132, which face the first source/drain region SD1 in the first device region RX1 of the integrated circuit device 100A, may be exposed to the first air gap AG1, and some regions of the first silicon nitride layer 132, which face the second source/drain region SD2 in the second device region RX2 of the integrated circuit device 100A, may be exposed to the second air gap AG2.

Referring to FIG. 8B, the integrated circuit device 100B has substantially the same configuration as the integrated circuit device 100 described with reference to FIGS. 1 and 2A to 7B. However, in the integrated circuit device 100B, each of the plurality of the insulating spacer SP may include a double layer including a first silicon nitride layer 134 and a second silicon nitride layer 136, which include different materials. In example embodiments, the first silicon nitride layer 134 may include a silicon nitride layer that does not contain oxygen atoms, and the second silicon nitride layer 136 may include a silicon nitride layer that contains oxygen atoms. For example, the first silicon nitride layer 134 may include a SiN layer such as a $Si_3N_4$ layer, and the second silicon nitride layer 136 may include a SiOCN layer or a SiON layer.

Although a portion of the first device region RX1 is illustrated in FIG. 8B, each of the plurality of the insulating spacer SP in the second device region RX2 may also include a double layer including the first silicon nitride layer 134 and the second silicon nitride layer 136 in the same manner as described with reference to FIG. 8B.

Similar to the description of the integrated circuit device 100 with reference to FIGS. 5A to 6B, some regions of the second silicon nitride layer 136 constituting the insulating spacer SP, the regions facing the first source/drain region SD1 in the first device region RX1 of the integrated circuit device 100B, may be exposed to the first air gap AG1, and some regions of the second silicon nitride layer 136 constituting the insulating spacer SP, the regions facing the second source/drain region SD2 in the second device region RX2 of the integrated circuit device 100B, may be exposed to the second air gap AG2.

The first silicon nitride layer 134 constituting the insulating spacer SP in the first device region RX1 and the second device region RX2 of the integrated circuit device 100B may not be exposed to the first air gap AG1 and the second air gap AG2.

Figure 9:
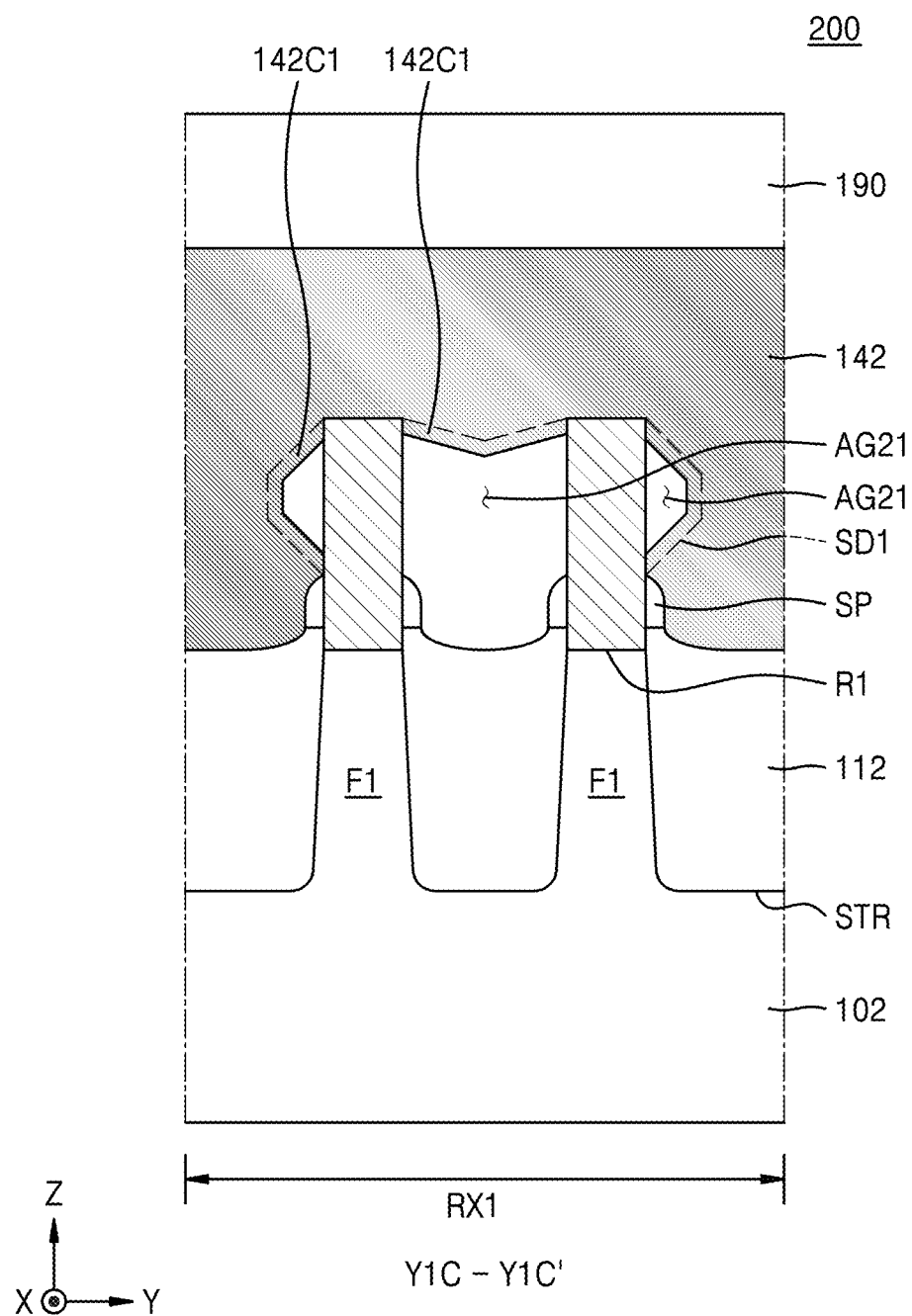
FIGS. 9 and 10 are cross-sectional views illustrating an integrated circuit device according to still other embodiments of the present disclosure.
Figure 10:
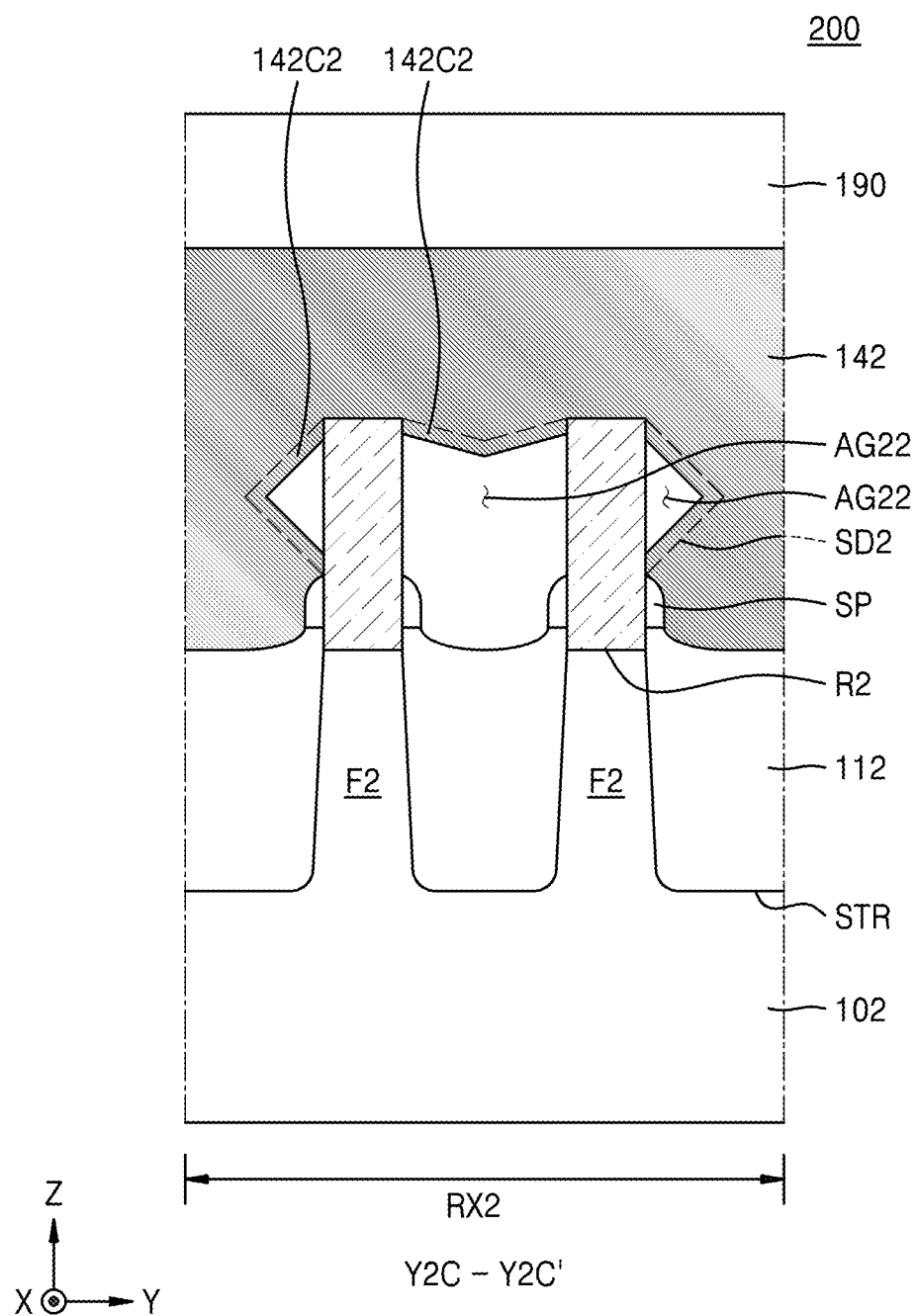

FIGS. 9 and 10 are cross-sectional views illustrating an integrated circuit device 200 according to still other embodiments of the present disclosure. FIG. 9 is a cross-sectional view illustrating a partial configuration of a region corresponding to the cross-section taken along the line Y1C-Y1C' of FIG. 2A, and FIG. 10 is a cross-sectional view illustrating a partial configuration of a region corresponding to the cross-section taken along the line Y2C-Y2C' of FIG. 2B. In FIGS. 9 and 10, reference numerals that are the same as those in FIGS. 1 to 7B denote members that are the same as those in FIGS. 1 to 7B, and detailed descriptions thereof are omitted herein.

Referring to FIGS. 9 and 10, the integrated circuit device 200 has substantially the same configuration as the integrated circuit device 100 described with reference to FIGS. 1 to 7B. However, the integrated circuit device 200 includes a first air gap AG21 and a second air gap AG22 instead of the first air gap AG1 and a second air gap AG2.

As illustrated in FIG. 9, in a first device region RX1 of the integrated circuit device 200, the first air gap AG21 may be arranged in a region adjacent to a first source/drain region SD1 on a device isolation layer 112. A portion of an insulating spacer SP and a portion of the first source/drain region SD1 may be exposed to the first air gap AG21. Similar to the description of the first air gap AG1 with reference to FIG. 2A, the first air gap AG21 may include portions between a portion of the insulating spacer SP, which covers the sidewall of a main gate portion 160M, and a portion of the first source/drain region SD1. Similar to the description of the first air gap AG1 with reference to FIG. 5A, the first air gap AG21 in the first device region RX1 may further include a portion between the top surface of the device isolation layer 112 and the first source/drain region SD1. Similar to the description of the first air gap AG1 with reference to FIG. 6A, the first air gap AG21 may include a portion where the height thereof in the vertical direction (Z direction) is defined by an insulating liner 142, and a portion in which the width thereof in the second horizontal direction (Y direction) is defined by the insulating liner 142. A more detailed configuration of the first air gap AG21 is substantially the same as that described for the first air gap AG1 of the integrated circuit device 100. However, the size of a cross-section of a portion of the first air gap AG21 in the second horizontal direction (Y direction), the portion being adjacent to the first source/drain region SD1, may be less than the size of a cross-section of the first source/drain region SD1 adjacent to the first air gap AG21 in the second horizontal direction (Y direction). In FIG. 9, an outline of a portion having a maximum size in a cross-section of the first source/drain region SD1 in the second horizontal direction (Y direction) is indicated by a dashed line for ease of understanding. In the first device region RX1, the insulating liner 142 may include an insulating spacer insertion portion 142C1 between the first source/drain region SD1 and the insulating spacer SP at a position adjacent to the first source/drain region SD1. In example embodiments, the insulating spacer insertion portion 142C1 may include a portion between two adjacent ones of the first source/drain region SD1. In other example embodiments, the insulating spacer insertion portion 142C1 may include a portion covering a sidewall of each of a plurality of the first source/drain region SD1 at a level between a top level of each of the plurality of the first source/drain region SD1 and a top level of the device isolation layer 112.

As illustrated in FIG. 10, in a second device region RX2 of the integrated circuit device 200, the second air gap AG22 may be located on the device isolation layer 112. A portion of an insulating spacer SP and a portion of a second source/drain region SD2 may be exposed to the second air gap AG22. Similar to the description of the second air gap AG2 with reference to FIG. 2B, the second air gap AG2 may include portions between a portion of the insulating spacer SP, which covers the sidewall of a main gate portion 160M, and a portion of the second source/drain region SD2. Similar to the description of the second air gap AG2 with reference to FIG. 5B, the second air gap AG22 in the second device region RX2 may further include a portion between the top surface of the device isolation layer 112 and the second source/drain region SD1. Similar to the description of the second air gap AG2 with reference to FIG. 6B, the second air gap AG22 may include a portion where the height thereof in the vertical direction (Z direction) is defined by an insulating liner 142, and a portion in which the width thereof in the second horizontal direction (Y direction) is defined by the insulating liner 142. A more detailed configuration of the second air gap AG22 is substantially the same as that described for the second air gap AG2 of the integrated circuit device 100. However, the size of a cross-section of a portion of the second air gap AG22 in the second horizontal direction (Y direction), the portion being adjacent to the second source/drain region SD2, may be less than the size of a cross-section of the second source/drain region SD2 adjacent to the second air gap AG22 in the second horizontal direction (Y direction). In FIG. 10, an outline of a portion having a maximum size in a cross-section of the second source/drain region SD2 in the second horizontal direction (Y direction) is indicated by a dashed line for ease of understanding. In the second device region RX2, the insulating liner 142 may include an insulating spacer insertion portion 142C2 between the second source/drain region SD2 and the insulating spacer SP at a position adjacent to the second source/drain region SD2. In example embodiments, the insulating spacer insertion portion 142C2 may include a portion between two adjacent ones of the second source/drain region SD2. In other example embodiments, the insulating spacer insertion portion 142C2 may include a portion covering a sidewall of each of a plurality of the second source/drain region SD2 at a level between a top level of each of the plurality of the second source/drain region SD2 and a top level of the device isolation layer 112.

More detailed configurations of the first air gap AG21 and the second air gap AG22 of the integrated circuit device 200 are substantially the same as those described for the first air gap AG1 and the second air gap AG2 of the integrated circuit device 100 with reference to FIGS. 1 to 7B.

Figure 11:
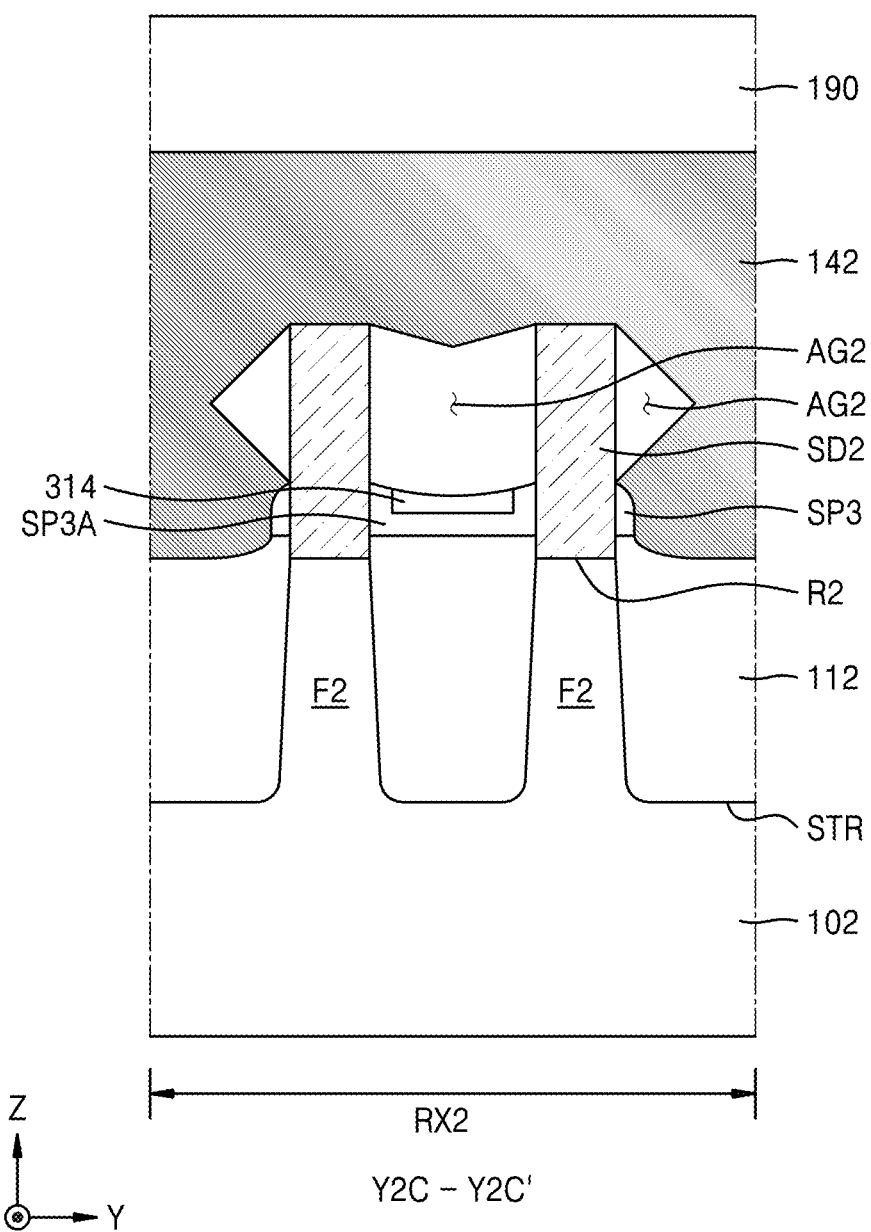
FIG. 11 is a cross-sectional view illustrating an integrated circuit device according to still other embodiments of the present disclosure.

FIG. 11 is a cross-sectional view illustrating an integrated circuit device 300 according to still other embodiments of the present disclosure. FIG. 11 illustrates a partial configuration of a region corresponding to the cross-section taken along the line Y2C-Y2C' of FIG. 2B.

Referring to FIG. 11, the integrated circuit device 300 has substantially the same configuration as the integrated circuit device 100 described with reference to FIGS. 1 to 7B. However, the integrated circuit device 300 includes an insulating spacer SP3 instead of the insulating spacer SP.

The insulating spacer SP3 of the integrated circuit device 300 may have substantially the same configuration as that described for the insulating spacer SP with reference to FIGS. 2A to 3B and 5A to 7B. However, the insulating spacer SP3 may include an insulating spacer connection portion SP3A in contact with the top surface of a device isolation layer 112 between two adjacent ones of the second source/drain region SD2 and in contact with a portion of each of the two of the second source/drain region SD2. The constituent material of the insulating spacer connection portion SP3A may be the same as the constituent materials of the plurality of the insulating spacer SP described with reference to FIGS. 1 to 7B. In example embodiments, the insulating spacer connection portion SP3A may include a single layer including the first silicon nitride layer 132 described with reference to FIG. 8A. In other example embodiments, the insulating spacer connection portion SP3A may include a double layer including the first silicon nitride layer 134 and the second silicon nitride layer 136 described with reference to FIG. 8B.

A residual insulating layer 314 may be between the insulating spacer connection portion SP3A and a second air gap AG2. The residual insulating layer 314 may be exposed to the second air gap AG2 between the two adjacent ones of the second source/drain region SD2. The residual insulating layer 314 may include a material different from that of the insulating spacer connection portion SP3A. For example, the insulating spacer connection portion SP3A may include a SiOCN layer or a SiON layer, and the residual insulating layer 314 may include a SiN layer, for example, a $Si_3N_4$ layer.

Figure 12:
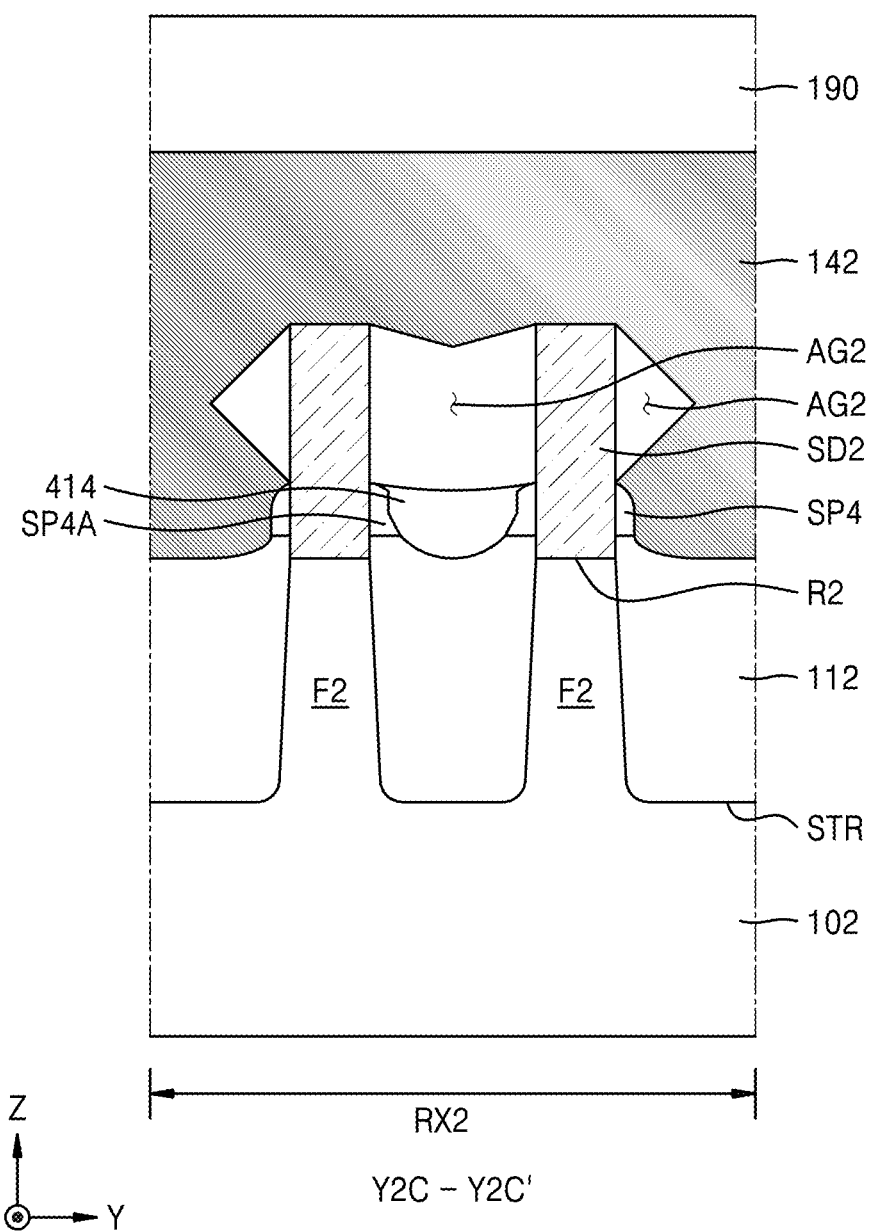
FIG. 12 is a cross-sectional view illustrating an integrated circuit device according to still other embodiments of the present disclosure.

FIG. 12 is a cross-sectional view illustrating an integrated circuit device 400 according to still other embodiments of the present disclosure. FIG. 12 illustrates a partial configuration of a region corresponding to the cross-section taken along the line Y2C-Y2C' of FIG. 2B.

Referring to FIG. 12, the integrated circuit device 400 has substantially the same configuration as the integrated circuit device 100 described with reference to FIGS. 1 to 7B. However, the integrated circuit device 400 includes an insulating spacer SP4 instead of the insulating spacer SP.

The insulating spacer SP4 of the integrated circuit device 400 may have substantially the same configuration as that described for the insulating spacer SP with reference to FIGS. 2A to 3B and 5A to 7B. However, the insulating spacer SP4 may include a local insulating spacer SP4A that is arranged between two adjacent ones of the second source/drain region SD2 on a device isolation layer 112 and in contact with a portion of one of the two adjacent ones of the second source/drain region SD2. The local insulating spacer SP4A may be in contact with the top surface of the device isolation layer 112.

The constituent materials of the local insulating spacer SP4A may be the same as the constituent materials of the plurality of the insulating spacer SP described with reference to FIGS. 1 to 7B. In example embodiments, the local insulating spacer SP4A may include a single layer including the first silicon nitride layer 132 described with reference to FIG. 8A. In other example embodiments, the local insulating spacer SP4A may include a double layer including the first silicon nitride layer 134 and the second silicon nitride layer 136 described with reference to FIG. 8B.

At least a portion of the local insulating spacer SP4A may be covered with a residual insulating layer 414. The residual insulating layer 414 may be exposed to a second air gap AG2 between the two adjacent ones of the second source/drain region SD2. The residual insulating layer 414 may include a material different from that of the local insulating spacer SP4A. For example, the local insulating spacer SP4A may include a SiOCN layer or a SiON layer, and the residual insulating layer 414 may include a SiN layer, for example, a $Si_3N_4$ layer.

Figure 13:
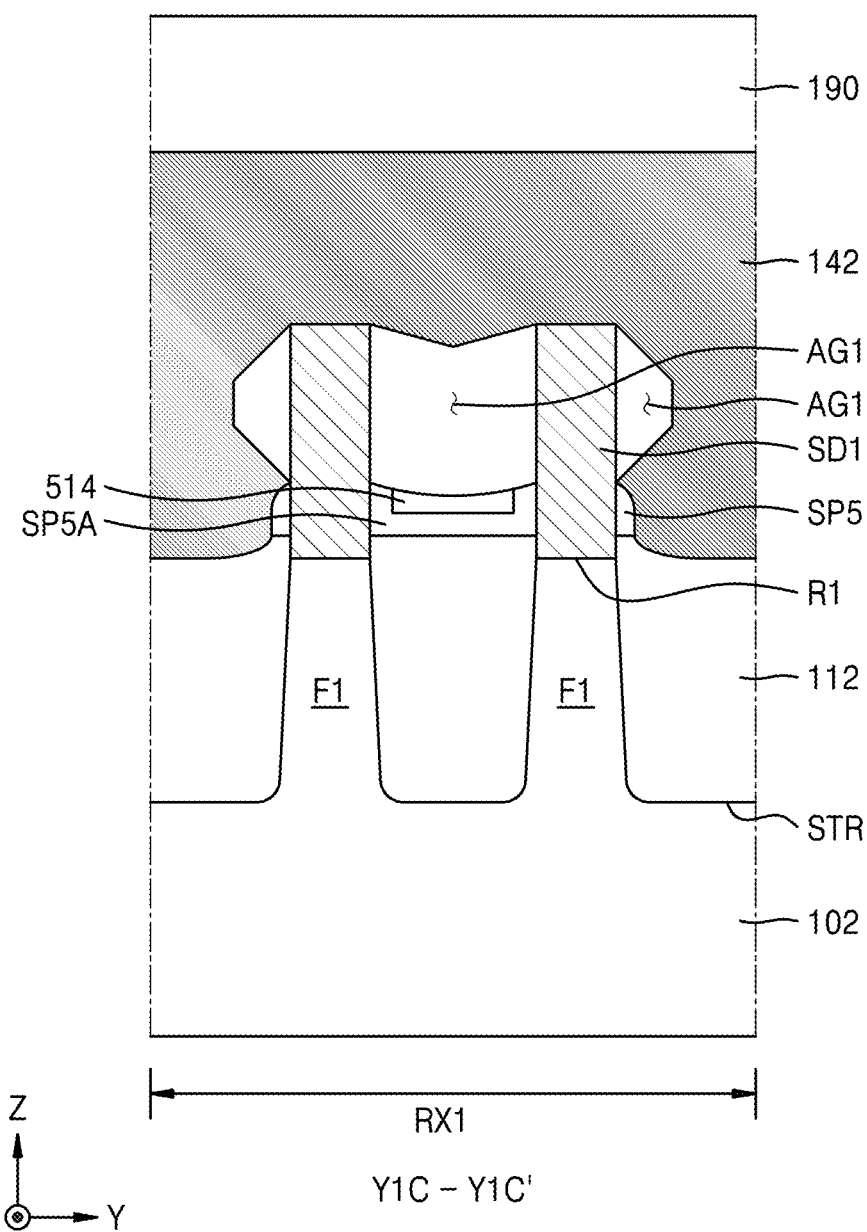
FIG. 13 is a cross-sectional view illustrating an integrated circuit device according to still other embodiments of the present disclosure.

FIG. 13 is a cross-sectional view illustrating an integrated circuit device 500 according to still other embodiments of the present disclosure. FIG. 13 illustrates a partial configuration of a region corresponding to the cross-section taken along the line Y1C-Y1C' of FIG. 2A.

Referring to FIG. 13, the integrated circuit device 500 has substantially the same configuration as the integrated circuit device 100 described with reference to FIGS. 1 to 7B. However, the integrated circuit device 300 includes an insulating spacer SP5 instead of the insulating spacer SP.

The insulating spacer SP5 of the integrated circuit device 500 may have substantially the same configuration as that described for the insulating spacer SP with reference to FIGS. 2A to 3B and 5A to 7B. However, the insulating spacer SP5 may include an insulating spacer connection portion SP5A in contact with the top surface of a device isolation layer 112 between two adjacent ones of the first source/drain region SD1 and in contact with a portion of each of the two of the first source/drain region SD1. The constituent material of the insulating spacer connection portion SP5A may be the same as the constituent materials of the plurality of the insulating spacer SP described with reference to FIGS. 1 to 7B. In example embodiments, the insulating spacer connection portion SP5A may include a single layer including the first silicon nitride layer 132 described with reference to FIG. 8A. In other example embodiments, the insulating spacer connection portion SP5A may include a double layer including the first silicon nitride layer 134 and the second silicon nitride layer 136 described with reference to FIG. 8B.

In example embodiments, a residual insulating layer 514 may be between the insulating spacer connection portion SP5A and a first air gap AG1. The residual insulating layer 514 may be exposed to the first air gap AG1 between the two adjacent ones of the first source/drain region SD1. The residual insulating layer 514 may include a material different from that of the insulating spacer connection portion SP5A. For example, the insulating spacer connection portion SP5A may include a SiOCN layer or a SiON layer, and the residual insulating layer 514 may include a SiN layer, for example, a $Si_3N_4$ layer.

Figure 14:
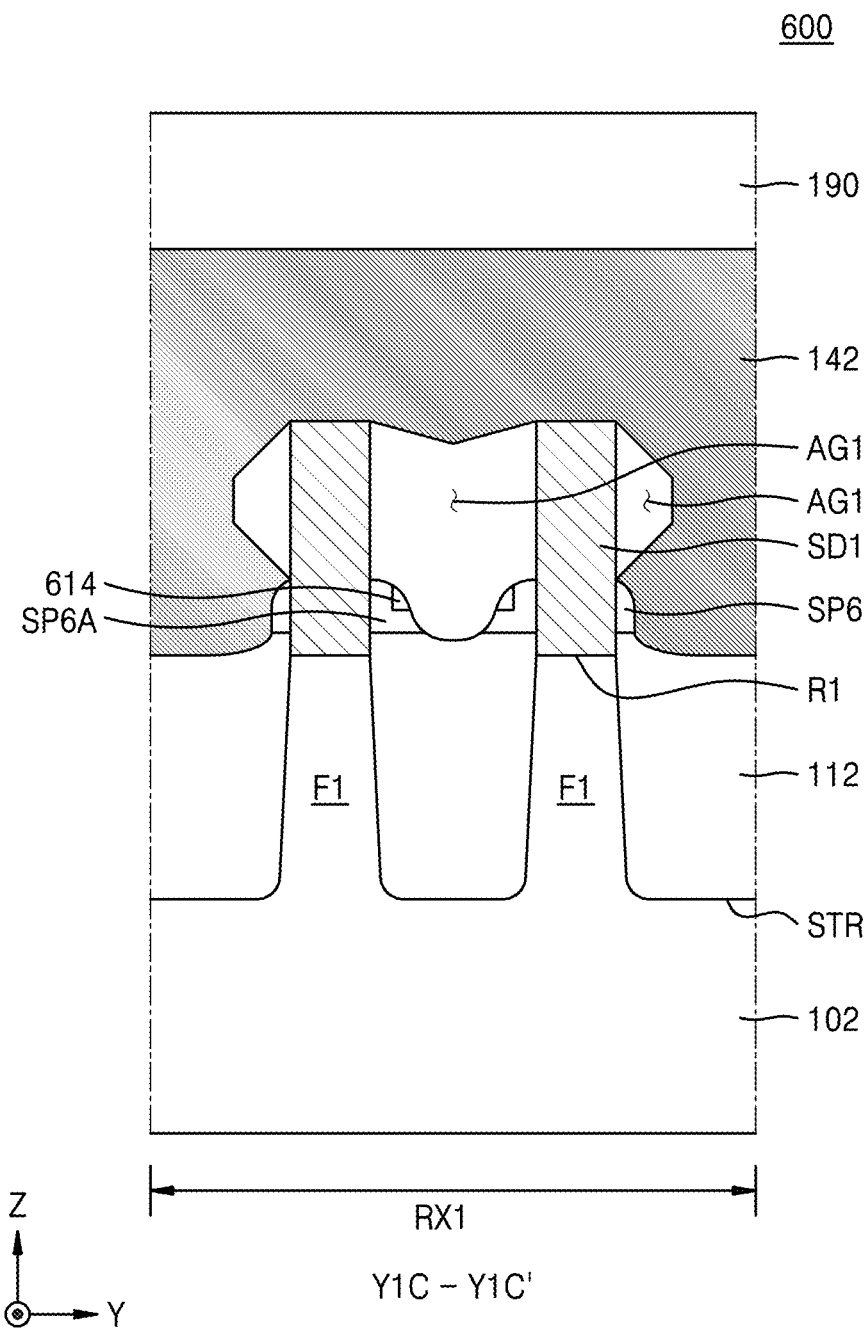
FIG. 14 is a cross-sectional view illustrating an integrated circuit device according to still other embodiments of the present disclosure.

FIG. 14 is a cross-sectional view illustrating an integrated circuit device 600 according to still other embodiments of the present disclosure. FIG. 14 illustrates a partial configuration of a region corresponding to the cross-section taken along the line Y1C-Y1C' of FIG. 2A.

Referring to FIG. 14, the integrated circuit device 600 has substantially the same configuration as the integrated circuit device 100 described with reference to FIGS. 1 to 7B. However, the integrated circuit device 600 includes an insulating spacer SP6 instead of the insulating spacer SP.

The insulating spacer SP6 of the integrated circuit device 600 may have substantially the same configuration as that described for the insulating spacer SP with reference to FIGS. 2A to 3B and 5A to 7B. However, the insulating spacer SP6 may include a local insulating spacer SP6A that is arranged between two adjacent ones of the first source/drain regions SD1 on a device isolation layer 112 and in contact with a portion of one of the two adjacent ones of the first source/drain region SD1. The local insulating spacer SP6A may be in contact with the top surface of the device isolation layer 112.

The constituent materials of the local insulating spacer SP6A may be the same as the constituent materials of the plurality of the insulating spacer SP described with reference to FIGS. 1 to 7B. In example embodiments, the local insulating spacer SP6A may include a single layer including the first silicon nitride layer 132 described with reference to FIG. 8A. In other example embodiments, the local insulating spacer SP6A may include a double layer including the first silicon nitride layer 134 and the second silicon nitride layer 136 described with reference to FIG. 8B.

In example embodiments, at least a portion of the local insulating spacer SP6A may be covered with a residual insulating layer 614. The residual insulating layer 614 may be exposed to a first air gap AG1 between the two adjacent ones of the first source/drain region SD1. The residual insulating layer 614 may include a material different from that of the local insulating spacer SP6A. For example, the local insulating spacer SP6A may include a SiOCN layer or a SiON layer, and the residual insulating layer 614 may include a SiN layer, for example, a $Si_3N_4$ layer.

Figure 15:
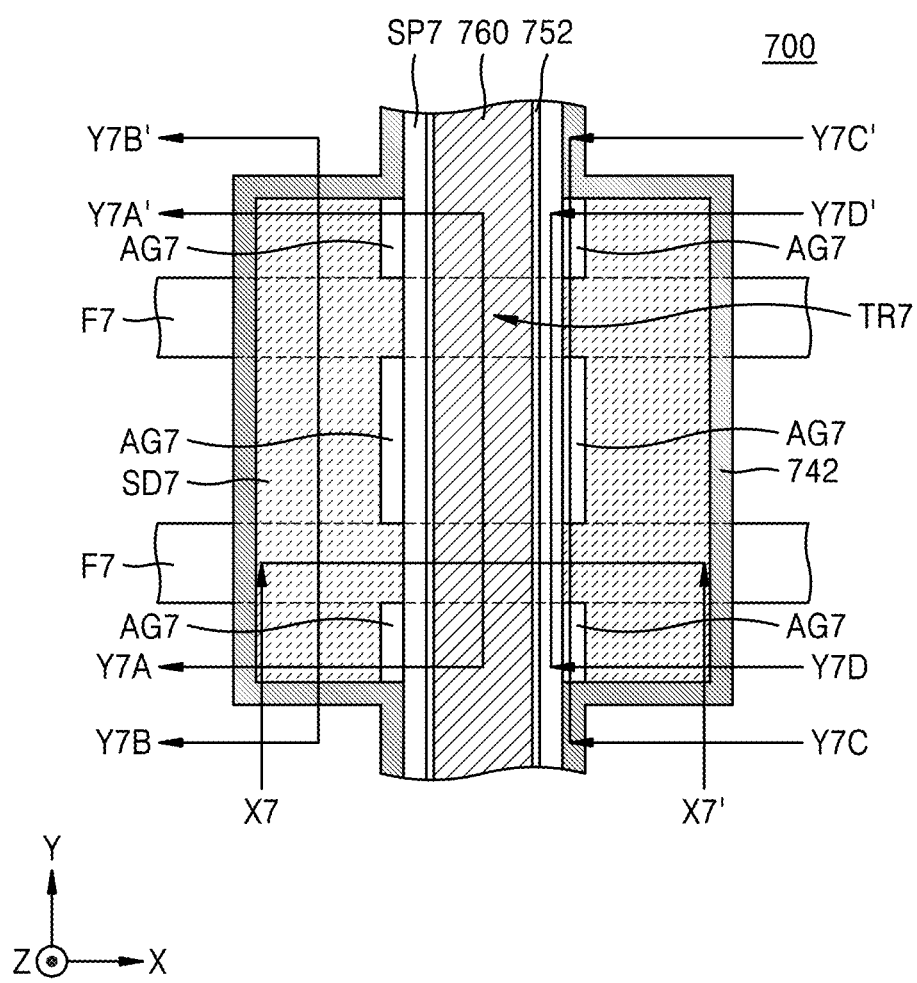
FIG. 15 is a plan layout diagram of some components of an integrated circuit device according to still other embodiments of the present disclosure.
Figure 16:
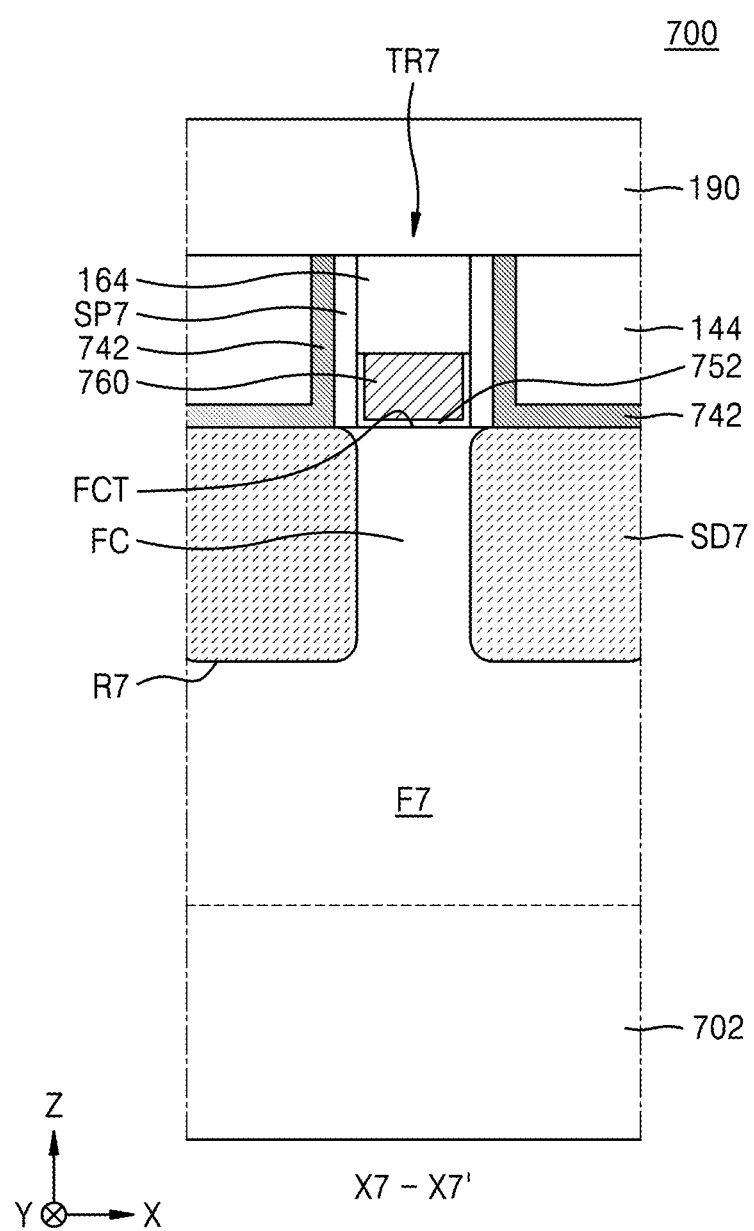
FIG. 16 is a cross-sectional view illustrating a partial configuration of a cross-section taken along line X7-X7' of FIG. 15.
Figure 17:
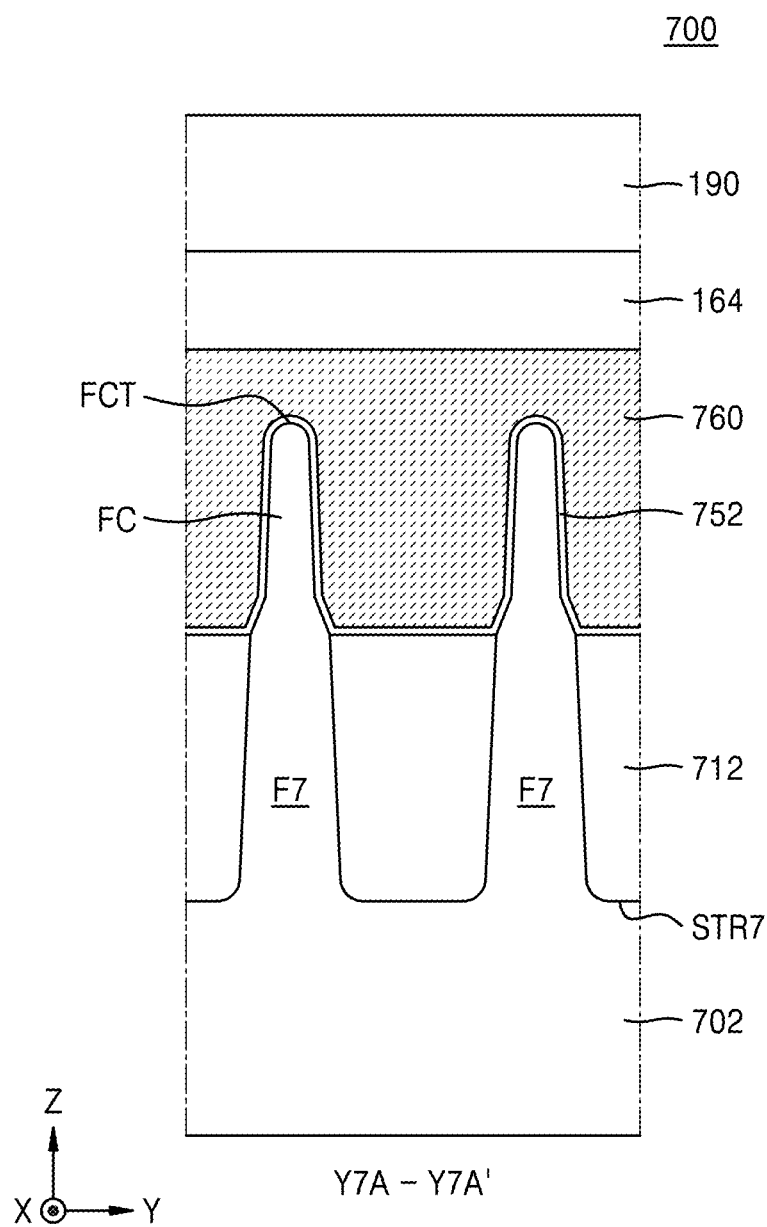
FIG. 17 is a cross-sectional view illustrating a partial configuration of a cross-section taken along line Y7A-Y7A' of FIG. 15.
Figure 18:
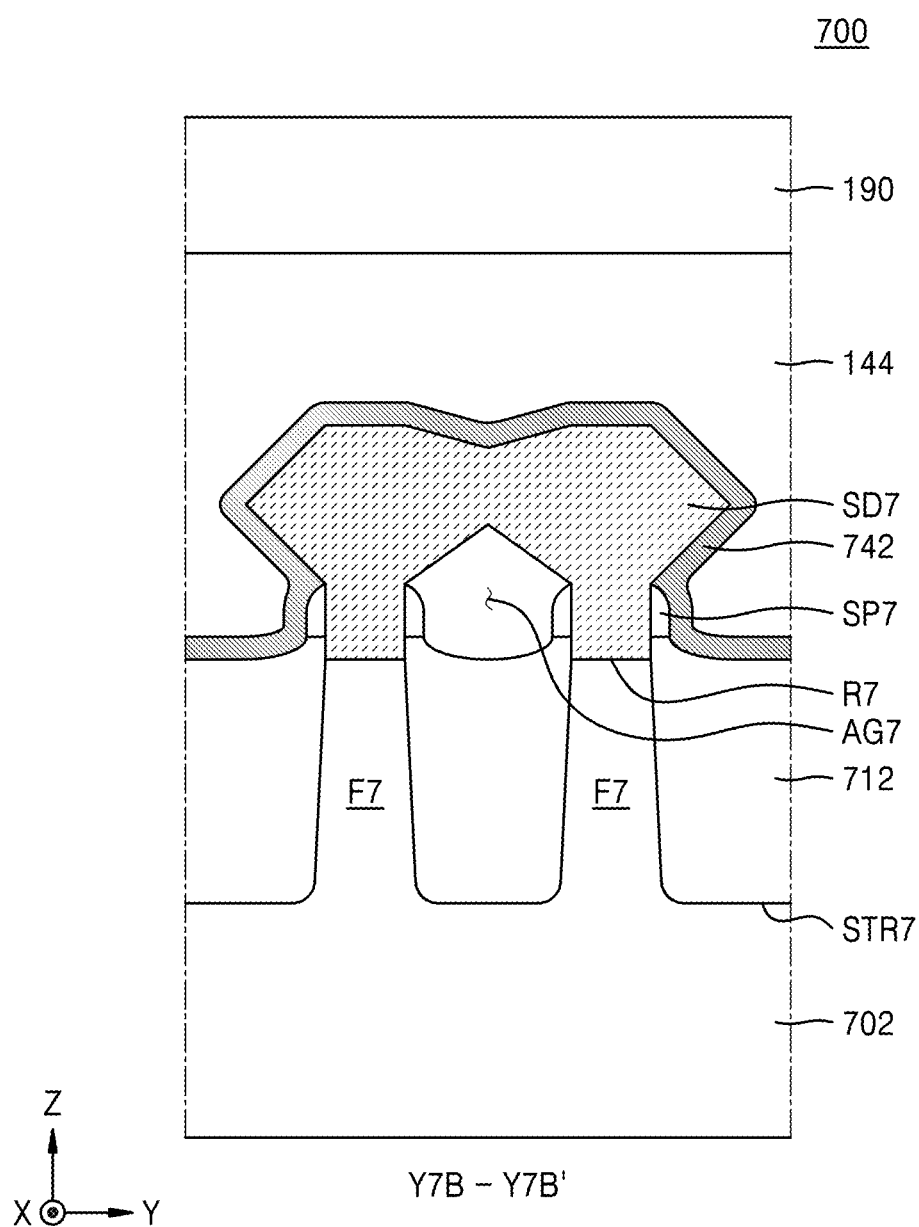
FIG. 18 is a cross-sectional view illustrating a partial configuration of a cross-section taken along line Y7B-Y7B' of FIG. 15.
Figure 19:
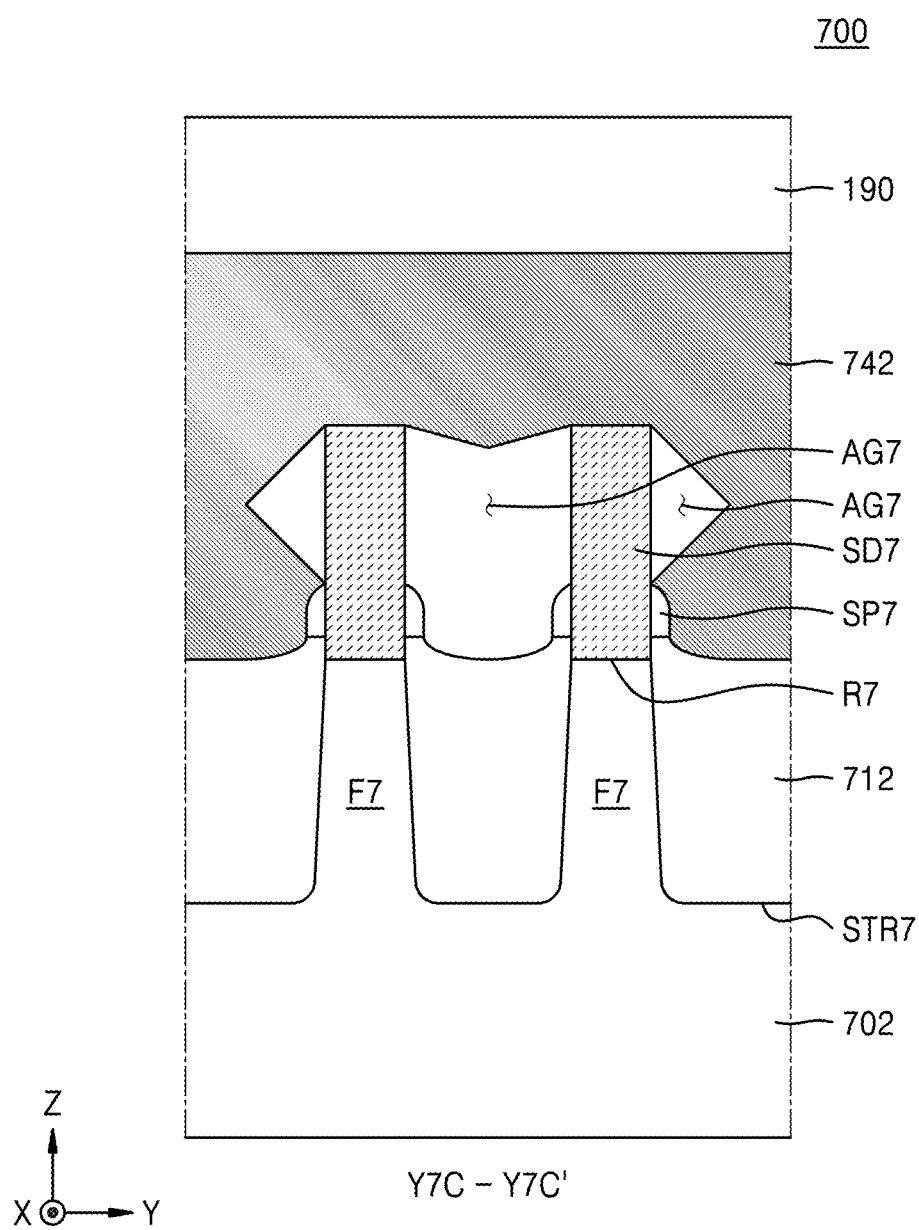
FIG. 19 is a cross-sectional view illustrating a partial configuration of a cross-section taken along line Y7C-Y7C' of FIG. 15.
Figure 20:
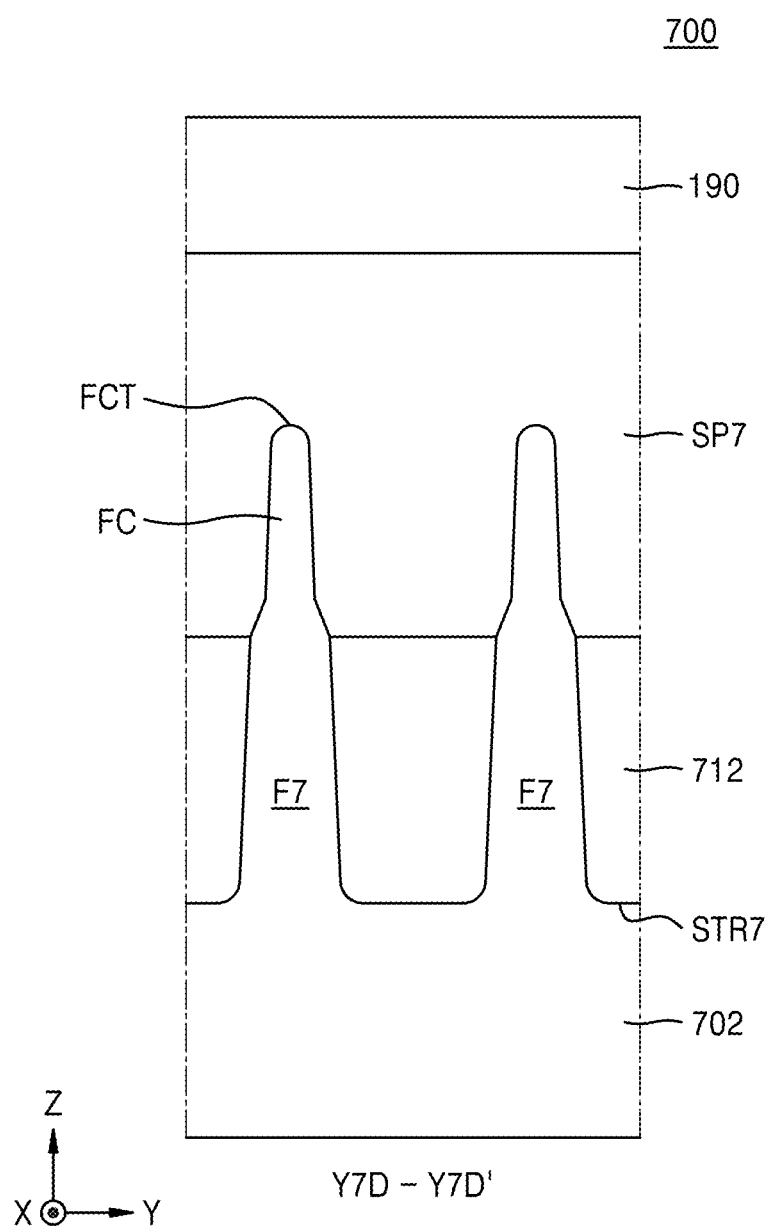
FIG. 20 is a cross-sectional view illustrating a partial configuration of a cross-section taken along line Y7D-Y7D' of FIG. 15.

FIGS. 15 to 20 are diagrams illustrating an integrated circuit device 700 according to still other embodiments of the present disclosure. More specifically, FIG. 15 is a plan layout diagram of some components of the integrated circuit device 700. FIG. 16 is a cross-sectional view illustrating a partial configuration of a cross-section taken along line X7-X7' of FIG. 15. FIG. 17 is a cross-sectional view illustrating a partial configuration of a cross-section taken along line Y7A-Y7A' of FIG. 15. FIG. 18 is a cross-sectional view illustrating a partial configuration of a cross-section taken along line Y7B-Y7B' of FIG. 15. FIG. 19 is a cross-sectional view illustrating a partial configuration of a cross-section taken along line Y7C-Y7C' of FIG. 15. FIG. 20 is a cross-sectional view illustrating a partial configuration of a cross-section taken along line Y7D-Y7D' of FIG. 15. In FIGS. 15 to 19, reference numerals that are the same as those in FIGS. 1 to 7B denote members that are the same as those in FIGS. 1 to 7B, and detailed descriptions thereof are omitted herein.

Referring to FIGS. 15 to 19, the integrated circuit device 700 may include a plurality of a fin-type active region F7 protruding from a substrate 702 in a vertical direction (Z direction). The plurality of the fin-type active region F7 may extend parallel to each other in a first horizontal direction (X direction). Each of the plurality of the fin-type active region F7 may be defined by a device isolation trench STR7 formed in the substrate 702. The device isolation trench STR7 may be filled with a device isolation layer 712. A sidewall of each of the plurality of the fin-type active region F7 may be covered with the device isolation layer 712. Detailed configurations of the substrate 702 and the device isolation layer 712 are substantially the same as those described for the substrate 102 and the device isolation layer 112 with reference to FIGS. 1 to 7B.

A detailed configuration of the plurality of the fin-type active region F7 is substantially the same as that described for the first fin-type active region F1 and the second fin-type active region F2 with reference to FIGS. 1 to 7B. However, as illustrated in FIGS. 16, 17, and 20, a fin channel region FC protruding above the device isolation layer 712 may be arranged on each of the plurality of the fin-type active region F7. The fin channel region FC may be integrally connected to the fin-type active region F7. As illustrate in FIGS. 16 and 17, on the plurality of the fin-type active region F7, a gate line 760 may surround the fin channel region FC and extend long in a second horizontal direction (Y direction). Although FIG. 15 illustrates two of the fin-type active region F7 and one gate line 760 arranged on the two of the fin-type active region F7, the number of the fin-type active region F7 and the number of the gate line 760 are not limited thereto and may be variously selected. The device isolation layer 712 may be arranged between the substrate 702 and the gate line 760 and cover a sidewall of the fin-type active region F7.

As illustrated in FIGS. 16, 18, and 19, a plurality of a recess R7 may be formed in an upper portion of the fin-type active region F7 at both sides of the fin channel region FC. A plurality of the source/drain region SD7 may be arranged on the plurality of the recess R7.

The constituent material of the plurality of the fin-type active region F7, the constituent material of the fin channel region FC, the constituent material of the gate line 760, and the constituent material of the plurality of the source/drain region SD7 are substantially the same as the constituent material of the first fin-type active region F1 and the first fin-type active region F2, the constituent material of the plurality of nanosheets N1, N2, and N3, the constituent material of the gate line 160, and the constituent material of the first source/drain region SD1 and second source/drain region SD2, respectively.

A plurality of a transistor TR7 may be formed in regions where the plurality of the fin-type active region F7 and the gate line 760 cross each other. Each of the plurality of the transistor TR7 may be an NMOS transistor or a PMOS transistor. When the plurality of the transistor TR7 are NMOS transistors, the plurality of the source/drain region SD7 may have the same configuration as described for the first source/drain region SD1 with reference to FIGS. 2A to 7B. When the plurality of the transistor TR7 are PMOS transistors, the plurality of the source/drain region SD7 may have the same configuration as described for the second source/drain region SD2 with reference to FIGS. 2A to 7B. The shapes of the plurality of the source/drain region SD7 illustrated in FIGS. 15, 16, 18 and 19 are merely examples, and are not limited to those illustrated in FIGS. 15, 16, 18 and 19 and may be variously modified and changed. A gate dielectric layer 752 may be between the fin channel region FC and the gate line 760. The gate dielectric layer 752 may include portions covering the surface of the fin channel region FC, portions covering sidewalls of the gate line 760, and portions covering the top surface of the device isolation layer 712. The constituent material of the gate dielectric layer 752 is the same as the constituent material of the gate dielectric layer 152 described with reference to FIGS. 2A to 7B.

As illustrated in FIGS. 15, 16, and 20, sidewalls of the gate line 760 in the integrated circuit device 700 may be covered with an insulating spacer SP7. The insulating spacer SP7 may include portions covering the surface of the fin channel region FC, the top surface of the device isolation layer 112, and the sidewalls of the gate line 760. As illustrated in FIG. 18, a plurality of the insulating spacer SP7 may be arranged on the top surface of the device isolation layer 712 and include a lower portion region covering a sidewall of each of the plurality of the source/drain region SD7. Each of the plurality of the insulating spacer SP7 may include a nitride layer containing oxygen atoms. For example, each of the plurality of the insulating spacer SP7 may include at least one of a SiOCN layer and a SiON layer.

As illustrated in FIGS. 16 and 17, the gate line 760 and the gate dielectric layer 752 may be covered with a capping insulating pattern 164.

As illustrated in FIGS. 15, 16, 18, and 19, a portion of the surface of each of the plurality of the source/drain region SD7 may be covered with an insulating liner 742. The insulating liner 742 may include a portion in contact with the source/drain region SD7, a portion in contact with the insulating spacer SP7, and a portion in contact with the top surface of the device isolation layer 712. The insulating liner 742 may include silicon nitride, SiCN, SiBN, SiON, SiOCN, SiBCN, SiOC, or a combination thereof. In example embodiments, the constituent material of the insulating spacer SP7 and the constituent material of the insulating liner 742 may be different from each other. For example, the insulating spacer SP7 may include a SiOCN layer, a SiON layer, or a combination thereof, and the insulating liner 742 may include a SiN layer.

As illustrated in FIGS. 15 and 19, an air gap AG7 may be between the insulating spacer SP7 and the source/drain region SD7. As illustrated in FIG. 19, the insulating liner 742 may include a portion defining the size of the air gap AG7. As illustrated in FIG. 15, the air gap AG7 may include portions between a portion of the insulating spacer SP7, which covers the sidewall of the gate line 760, and a portion of the source/drain region SD7. As illustrated in FIG. 19, the air gap AG7 may include a portion in which the height thereof in the vertical direction (Z direction) is defined by the insulating liner 742, and a portion in which the width thereof in the second horizontal direction (Y direction) is defined by the insulating liner 742. As illustrated in FIG. 18, the air gap AG7 may further include a portion between the top surface of the device isolation layer 712 and the source/drain region SD7.

As illustrated in FIG. 15, a portion of the source/drain region SD7 facing the sidewall of the gate line 760 may be exposed to the air gap AG7. As illustrated in FIGS. 18 and 19, a portion of the top surface of the device isolation layer 712 may be exposed to the air gap AG7 between two of the fin-type active region F7 adjacent to each other. As illustrated in FIG. 18, portions of the source/drain region SD7 facing the device isolation layer 712 may be exposed to the air gap AG7. As illustrated in FIG. 19, a lower portion region of the insulating spacer SP7 may be in contact with the device isolation layer 112 and the source/drain region SD7. The lower portion region of the insulating spacer SP7 and an upper portion region of the insulating spacer SP7, which covers the sidewall of the gate line 760, may each be exposed to the air gap AG7. The insulating liner 742 may include a portion that vertically overlaps the lower portion region of the insulating spacer SP7. As illustrated in FIG. 19, the size and shape of a cross-section of a portion of the air gap AG7, which is adjacent to the source/drain region SD7 in the second horizontal direction (Y direction), may correspond to the size and shape of a cross-section of the source/drain region SD7 adjacent to the air gap AG7 in the second horizontal direction (Y direction). However, embodiments of the present disclosure are not limited to that illustrated in FIG. 19. For example, similar to the first air gap AG21 and the second air gap AG22 of the integrated circuit device 200 described with reference to FIG. 9, the size of a cross-section of a portion of the air gap AG7 in the second horizontal direction (Y direction), the portion being adjacent to the source/drain region SD7, may be less than the size of a cross-section of the source/drain region SD7 adjacent to the air gap AG7 in the second horizontal direction (Y direction).

In example embodiments, similar to the insulating spacer connection portion SP3A described with reference to FIG. 11, the insulating spacer SP7 of the integrated circuit device 700 may further include an insulating spacer connection portion in contact with the top surface of a device isolation layer 712 and in contact with a portion of each of two of the source/drain region SD7 adjacent to each other.

In other example embodiments, the integrated circuit device 700 may further include a residual insulating layer (not shown) between the device isolation layer 712 and the air gap AG7. The residual insulating layer may have a structure that is the same as or similar to that of the residual insulating layer 314 described with reference to FIG. 11.

As illustrated in FIGS. 16 and 18, the plurality of the source/drain region SD7 may be covered with an inter-gate insulating layer 144. The insulating liner 742 may be between the plurality of the source/drain region SD7 and the inter-gate insulating layer 144.

A plurality of the capping insulating pattern 164, the insulating spacer SP7, the insulating liner 742, and the inter-gate insulating layer 144 may be covered with an interlayer insulating layer 190. More detailed configurations of the inter-gate insulating layer 144, the capping insulating pattern 164, and the interlayer insulating layer 190 are the same as those described with reference to FIGS. 2A to 7B.

Although not shown in FIGS. 15 to 20, a source/drain contact and a source/drain via contact respectively having structures similar to those of the source/drain contacts 174 and the source/drain via contacts 192, illustrated in FIGS. 2A to 3B, 5A, and 5B, may be arranged on the plurality of the source/drain region SD7 in the integrated circuit device 700. Also, a gate contact and a gate via contact respectively having structures similar to those of the gate contact 184 and the gate via contact 194, illustrated in FIGS. 2A, 2B, 4A, and 4B, may be arranged on the gate line 760.

The integrated circuit device 700 illustrated in FIGS. 15 to 20 includes the insulating spacer SP7 covering the sidewall of the gate line 760, and the air gap AG7 is between the insulating spacer SP7 and the source/drain region SD7 adjacent thereto. Accordingly, parasitic capacitance caused by undesired coupling between the gate line 760 and the source/drain region SD7 arranged relatively adjacent thereto may be reduced. Accordingly, the ON current characteristic and OFF current characteristic of each of the plurality of the transistor TR7 may be improved, and thus, the performance of the plurality of the transistor TR7 may be improved and the reliability of the integrated circuit device 700 may be improved.

Figure 21A:
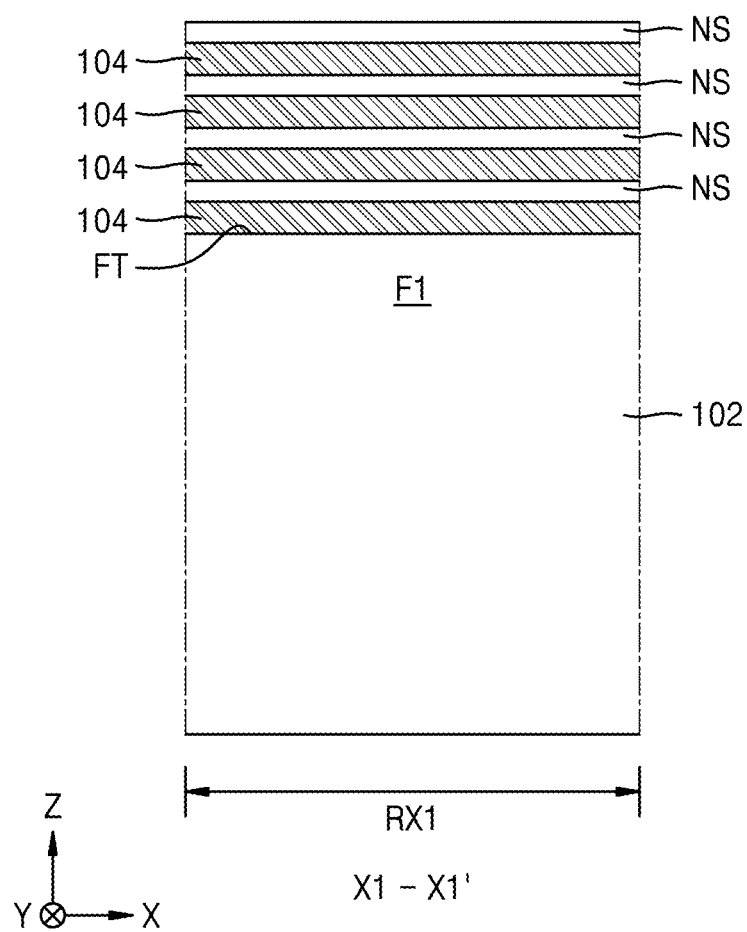
FIGS. 21A to 33D are cross-sectional views illustrating a process sequence in order to explain a method of manufacturing an integrated circuit device according to embodiments of the present disclosure, wherein FIGS. 21A, 22A, . . . , and 33A are cross-sectional views illustrating, according to a process sequence, a partial configuration of a region corresponding to a cross-section taken along the line X1-X1' of FIG. 2A, FIGS. 21B, 22B, . . . , and 33B are cross-sectional views illustrating, according to a process sequence, a partial configuration of a region corresponding to a cross-section taken along the line X2-X2' of FIG. 2B, FIGS. 21C, 22C, . . . , and 33C are cross-sectional views illustrating, according to a process sequence, a partial configuration of a region corresponding to a cross-section taken along the line Y1A-Y1A' of FIG. 2A, FIGS. 21D, 22D, . . . , and 33D are cross-sectional views illustrating, according to a process sequence, a partial configuration of a region corresponding to a cross-section taken along the line Y2A-Y2A' of FIG. 2B, FIGS. 22E, 23E, . . . , and 30E are cross-sectional views illustrating, according to a process sequence, a partial configuration of a portion corresponding to a cross-section taken along the line Y1B-Y1B' of FIG. 2A, FIGS. 22F, 23F, . . . , and 30F are cross-sectional views illustrating, according to a process sequence, a partial configuration of a portion corresponding to a cross-section taken along the line Y2B-Y2B' of FIG. 2B, FIGS. 26G, 27G, 28G, 29G, and 30G are cross-sectional views illustrating, according to a process sequence, a partial configuration of a portion corresponding to a cross-section taken along the line Y1C-Y1C' of FIG. 2A, and FIGS. 26H, 27H, 28H, 29H, and 30H are cross-sectional views illustrating, according to a process sequence, a partial configuration of a portion corresponding to a cross-section taken along the line Y2C-Y2C' of FIG. 2B.
Figure 21B:
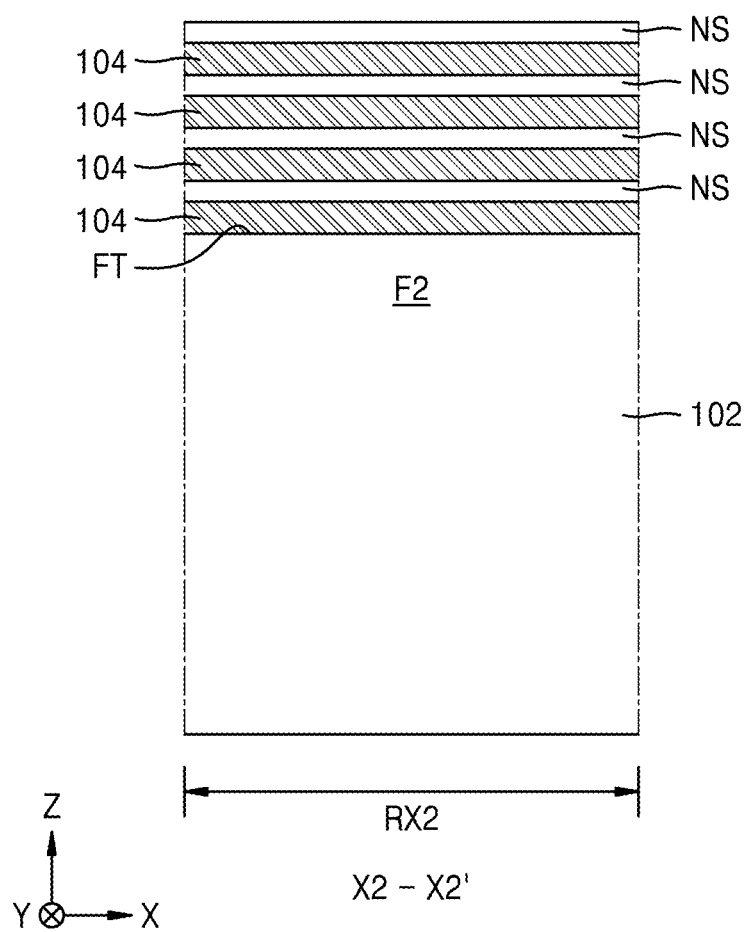
Figure 21C:
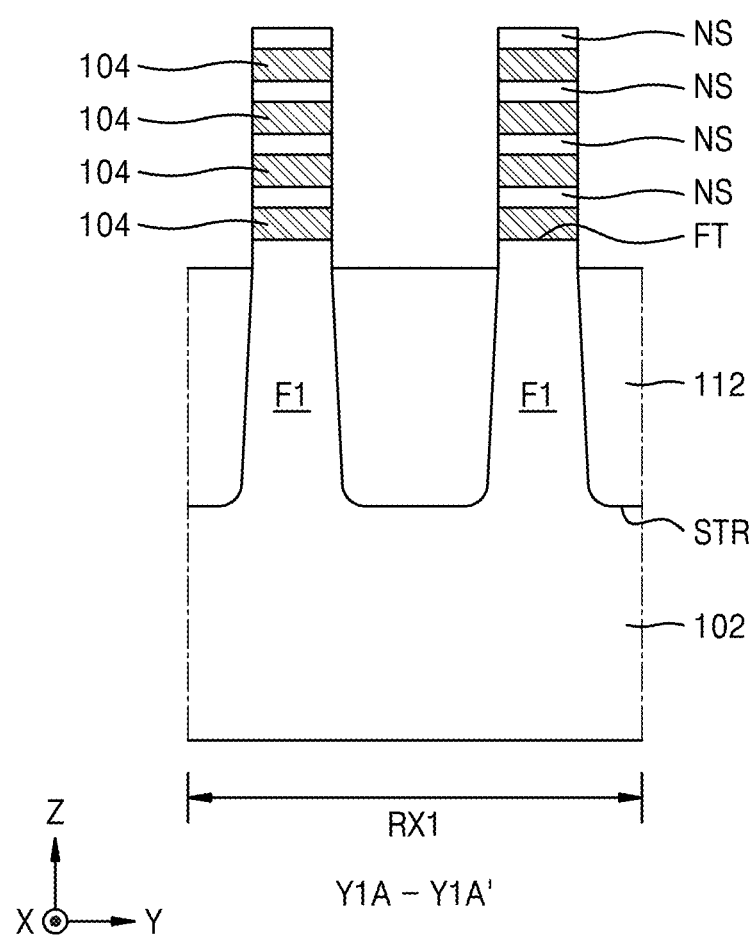
Figure 21D:
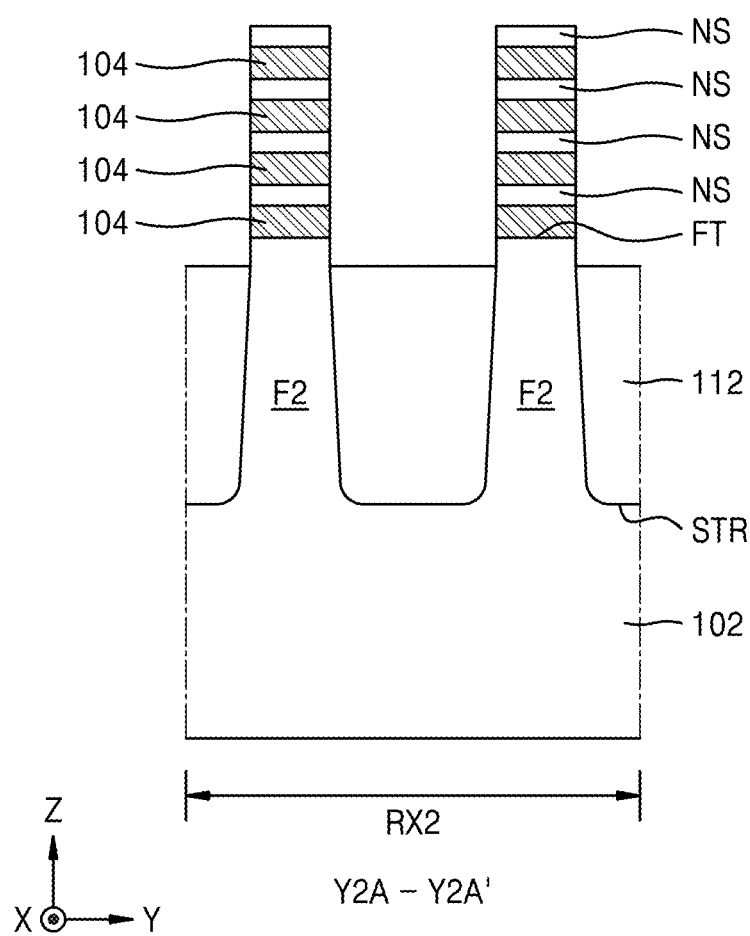
Figure 22A:
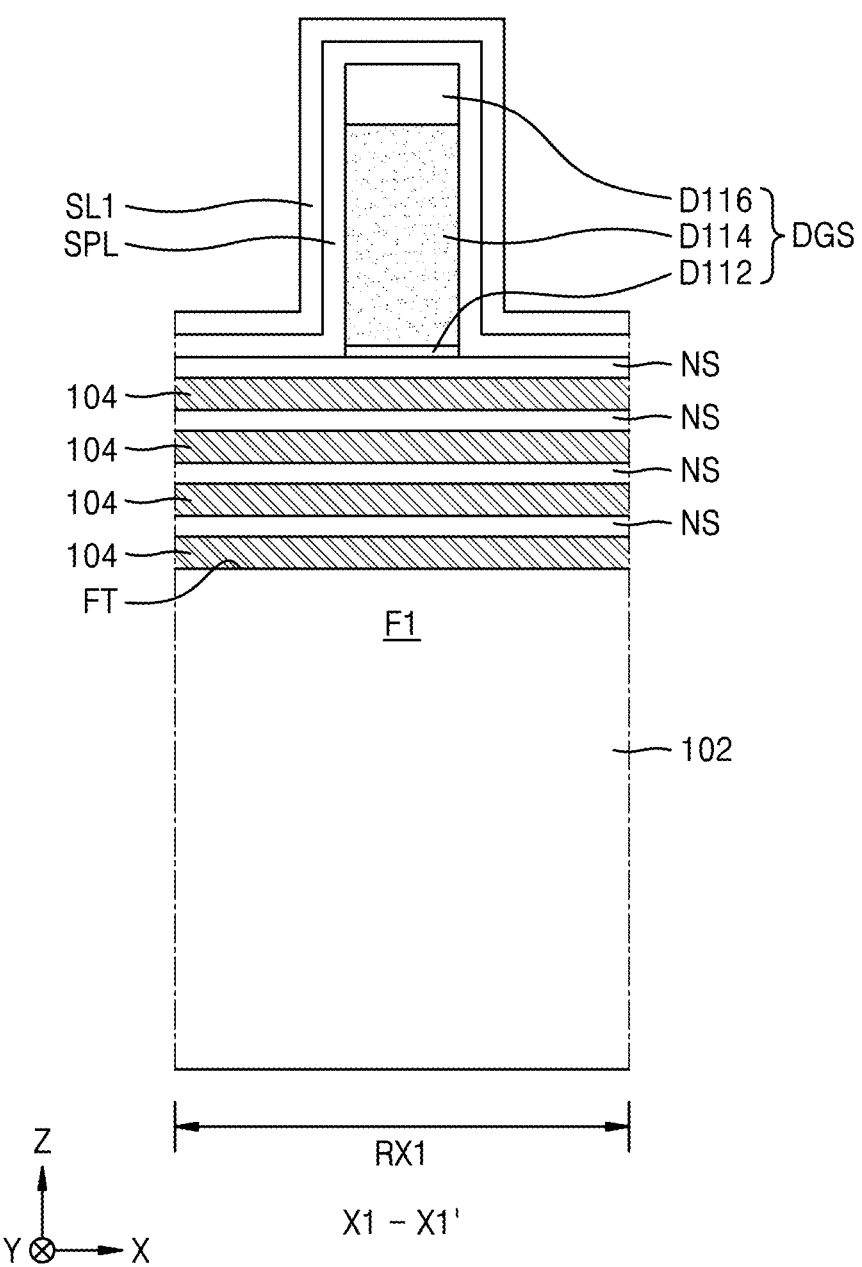
Figure 22B:
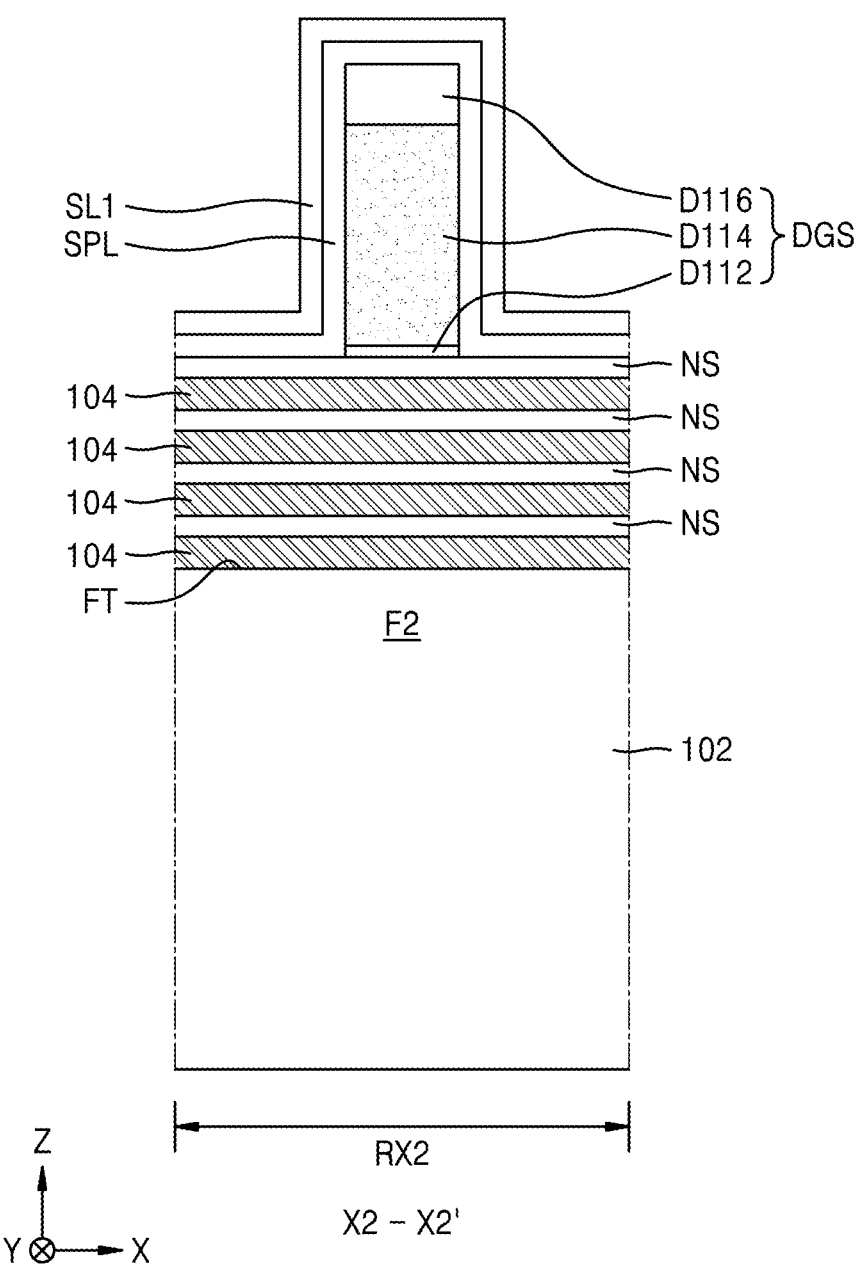
Figure 22C:
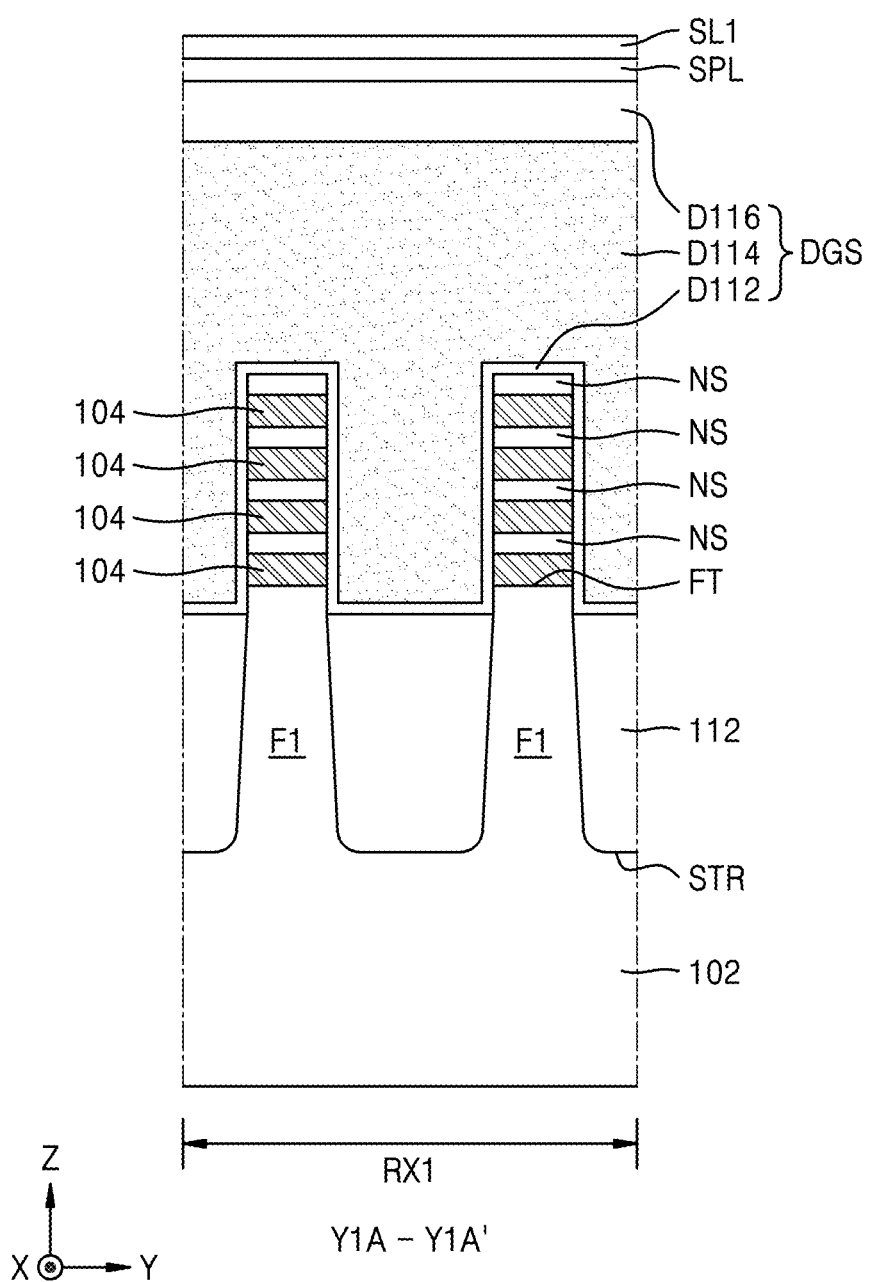
Figure 22D:
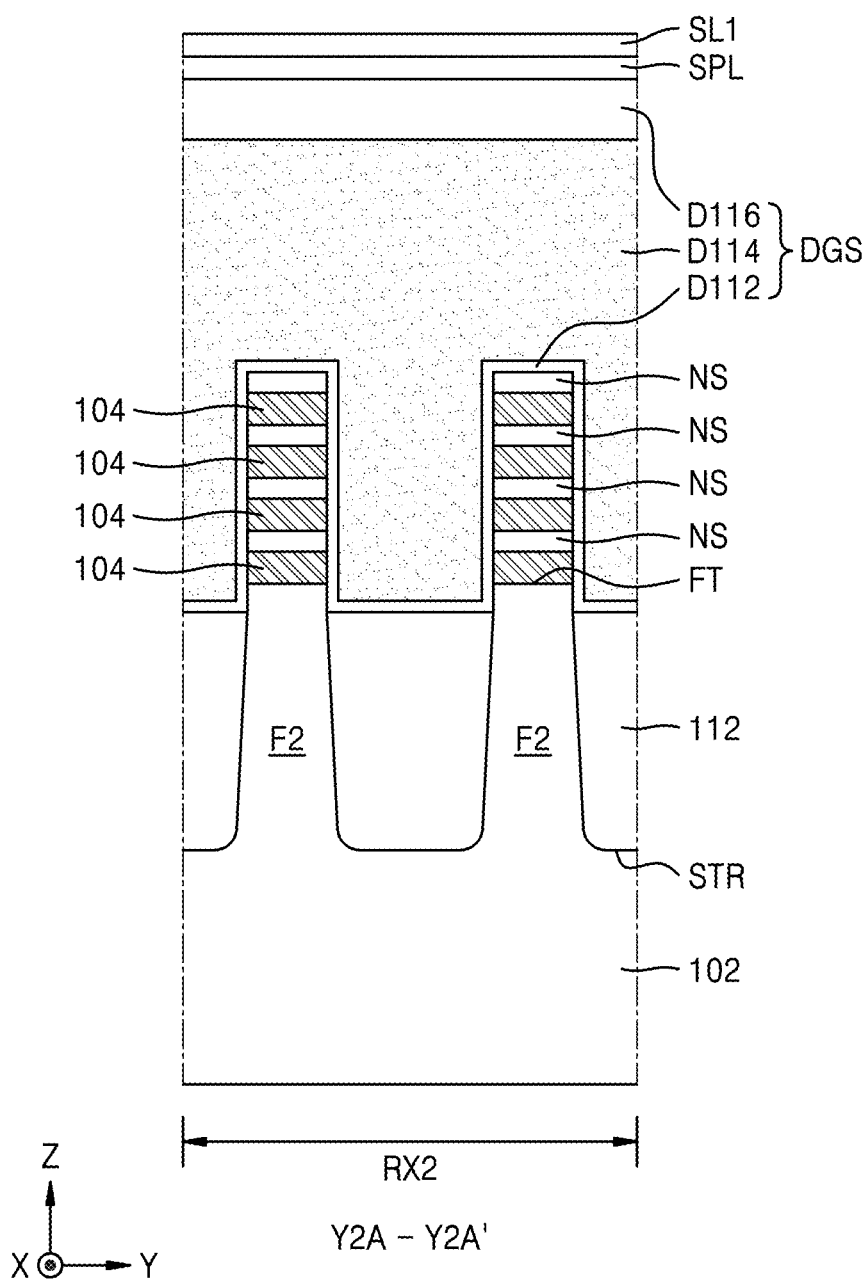
Figure 22E:
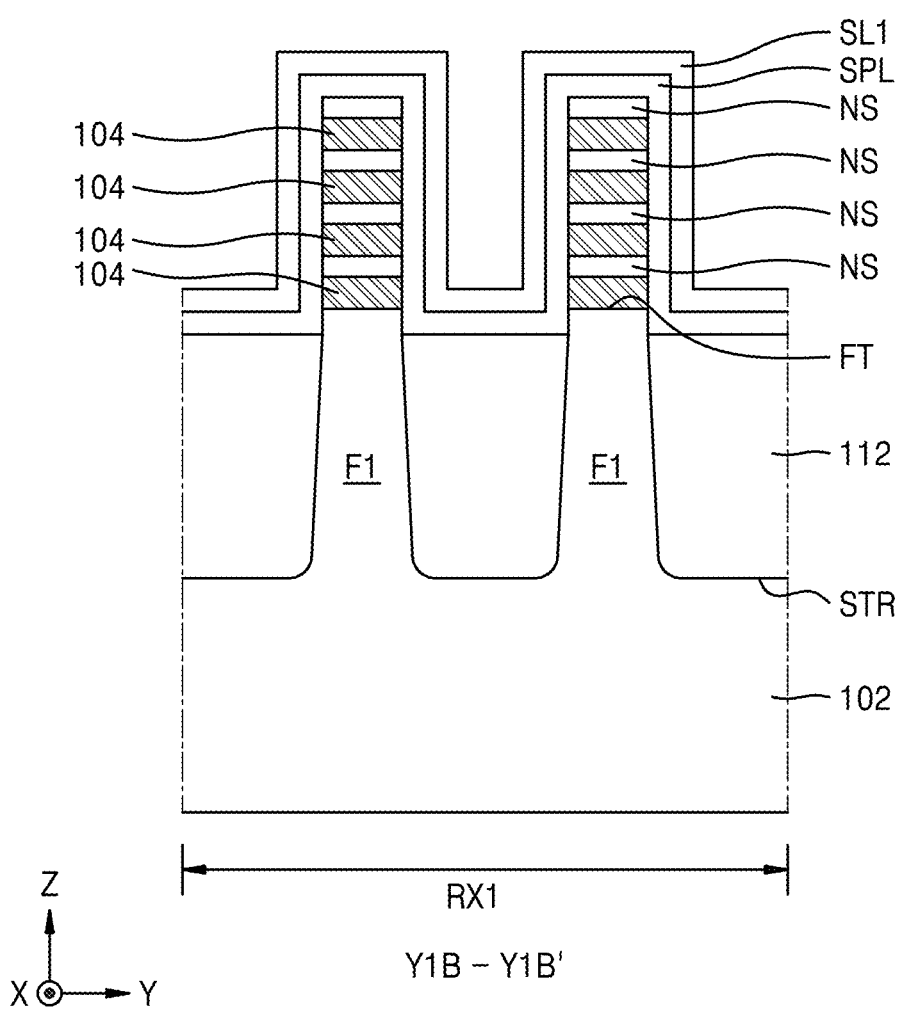
Figure 22F:
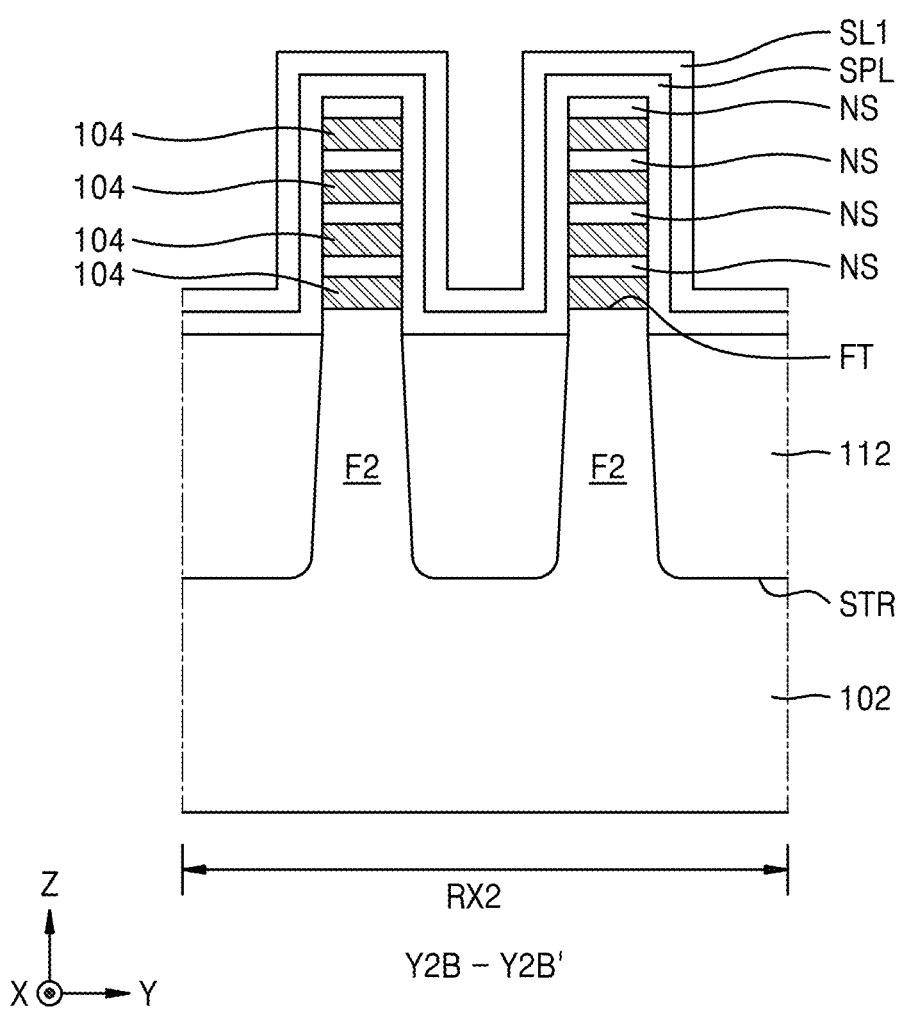
Figure 23A:
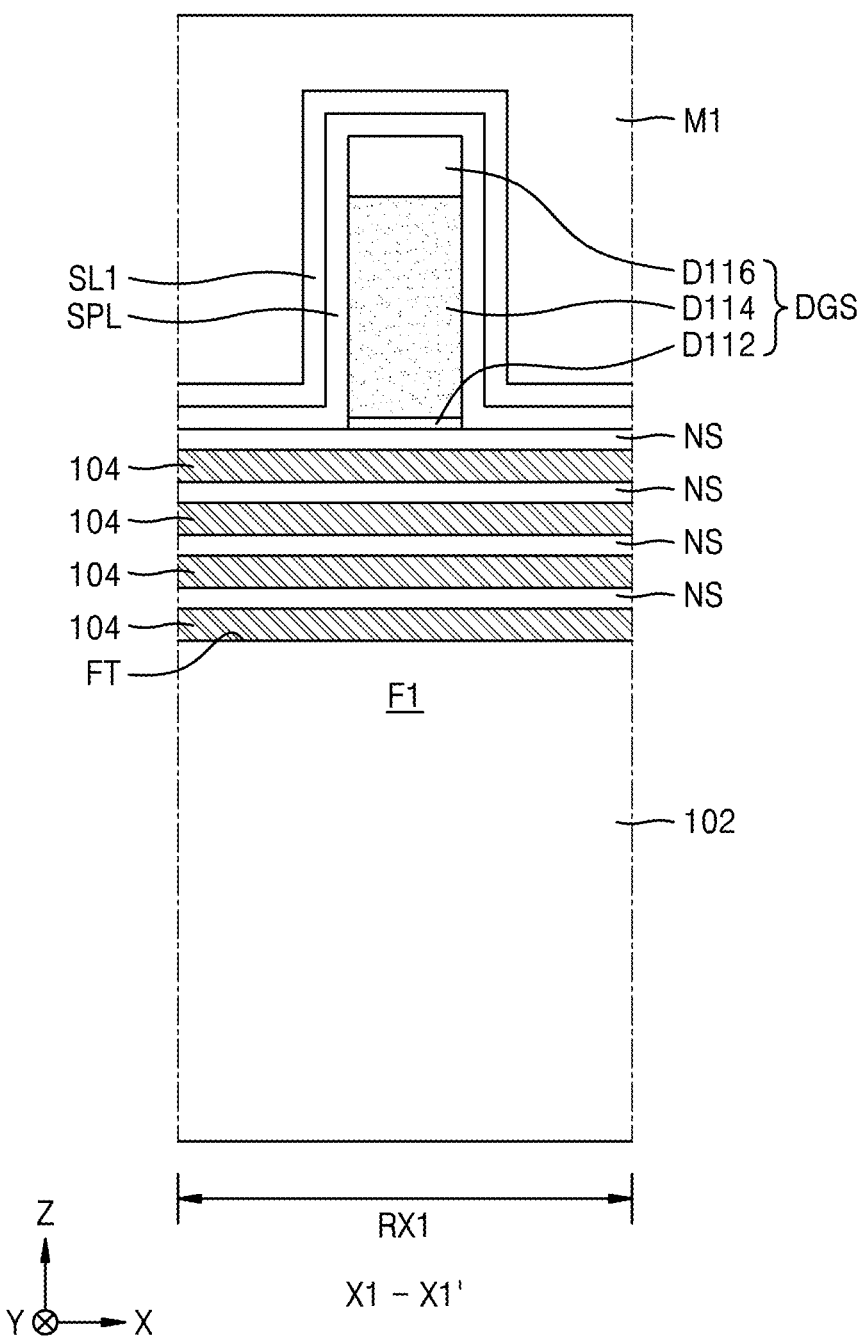
Figure 23B:
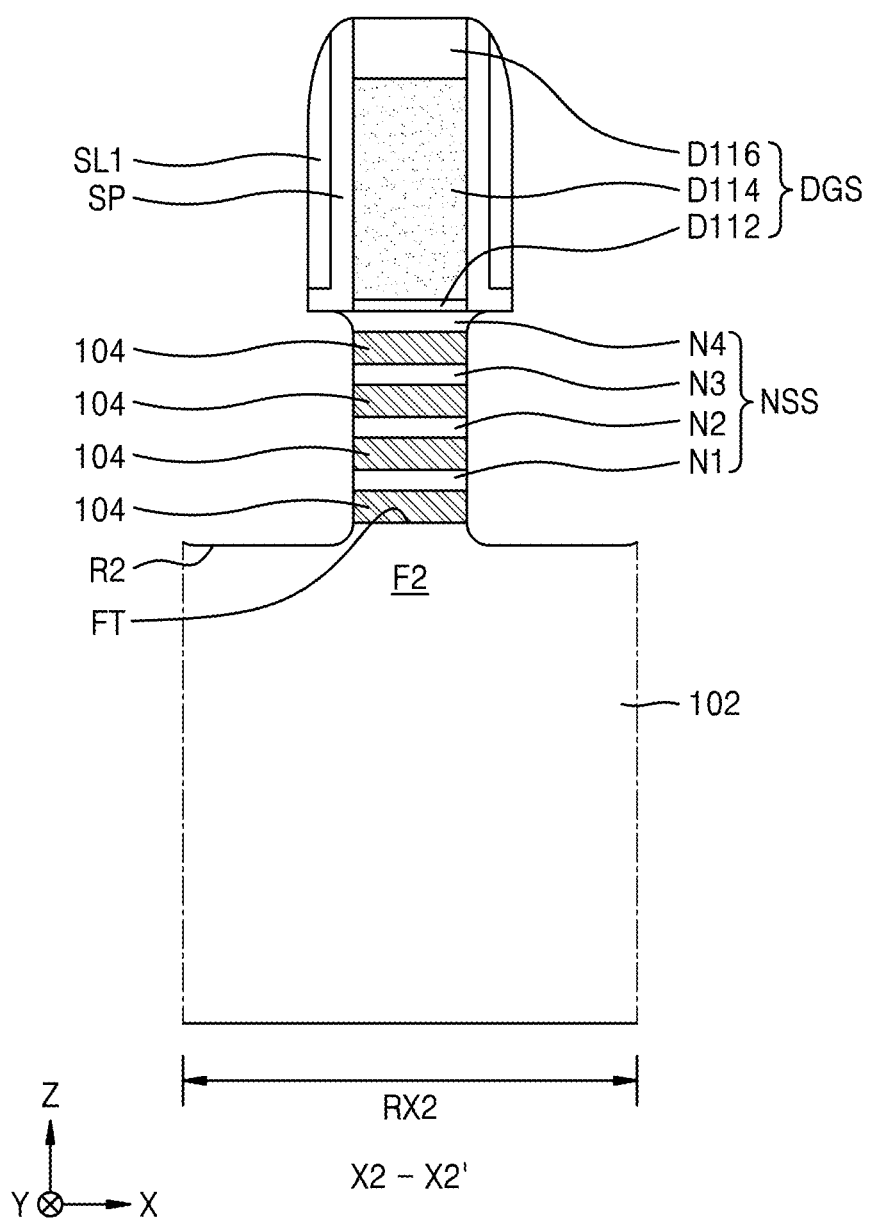
Figure 23C:
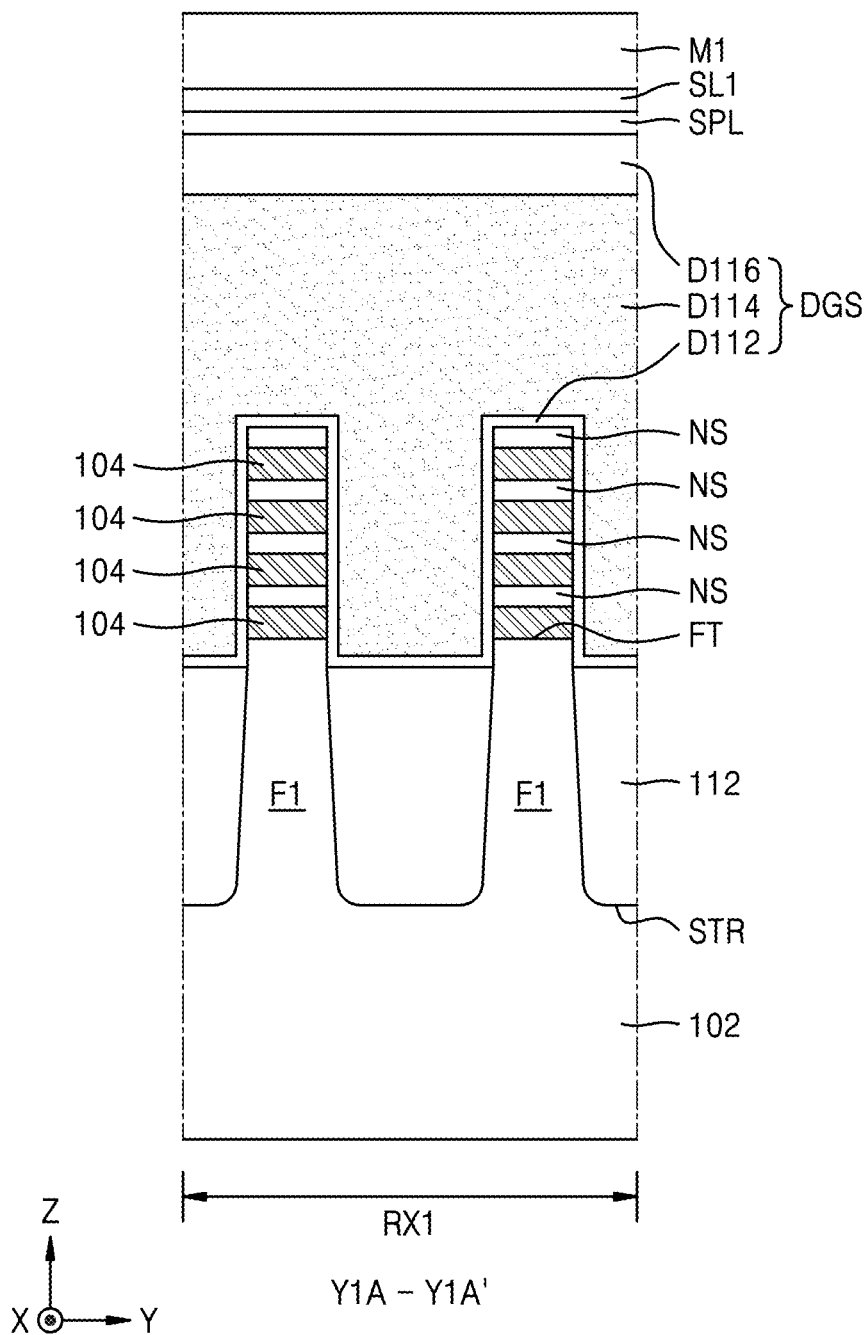
Figure 23D:
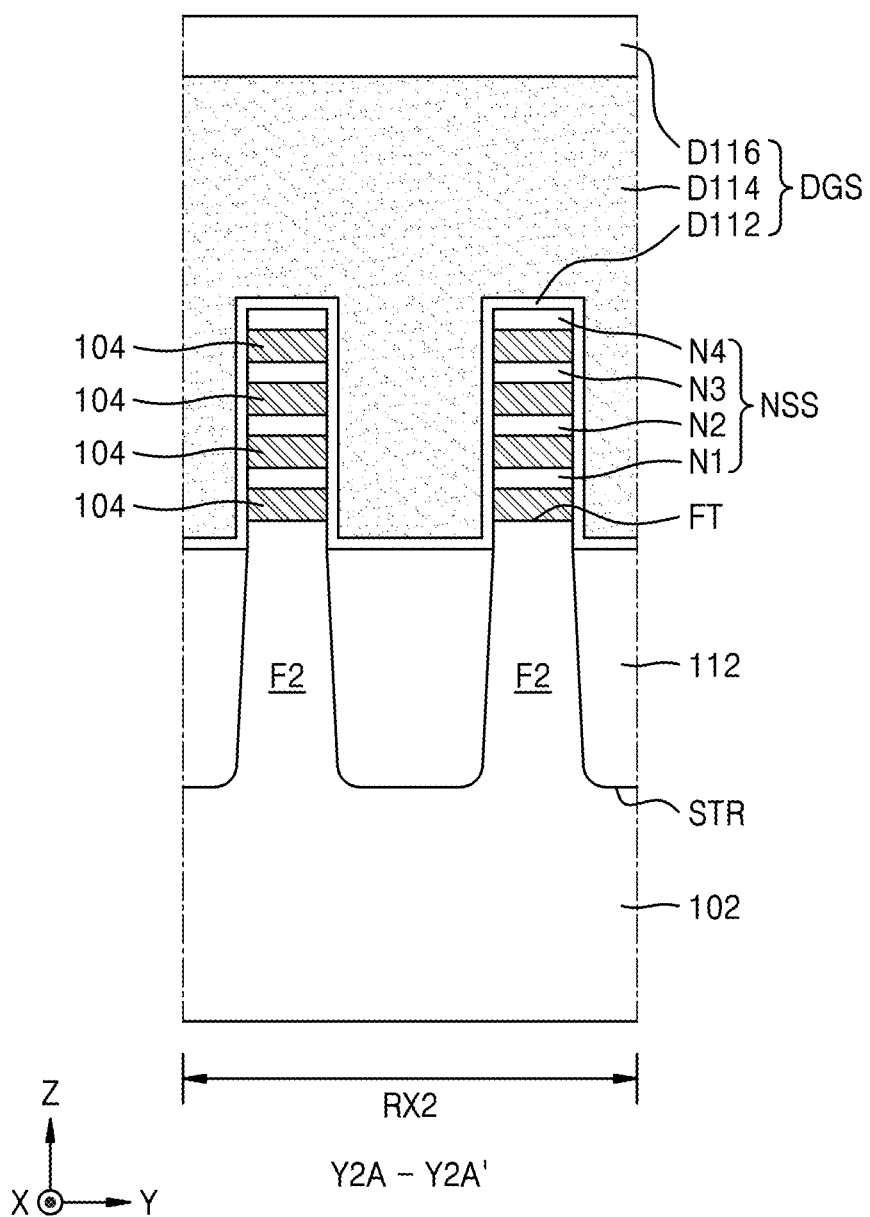
Figure 23E:
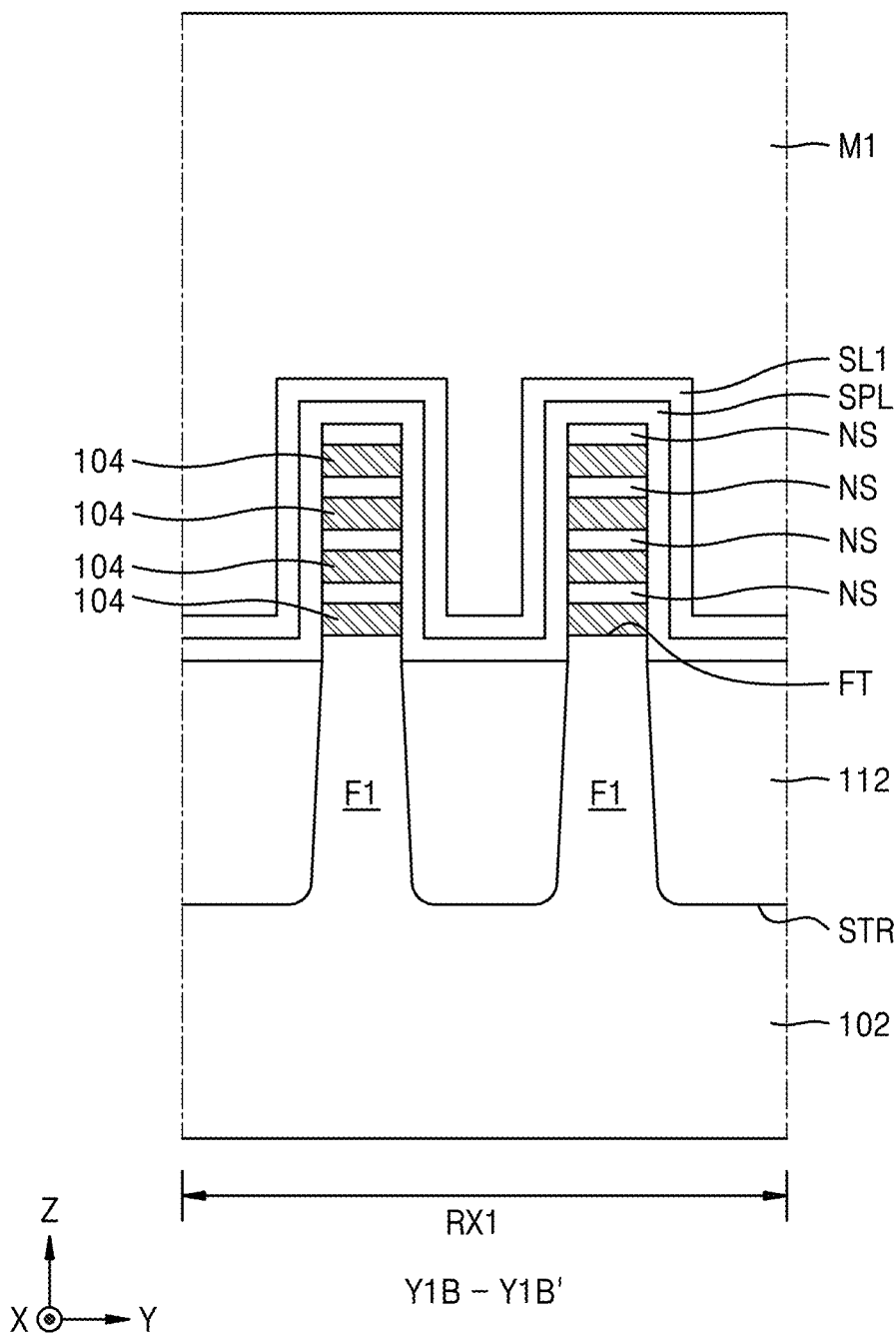
Figure 23F:
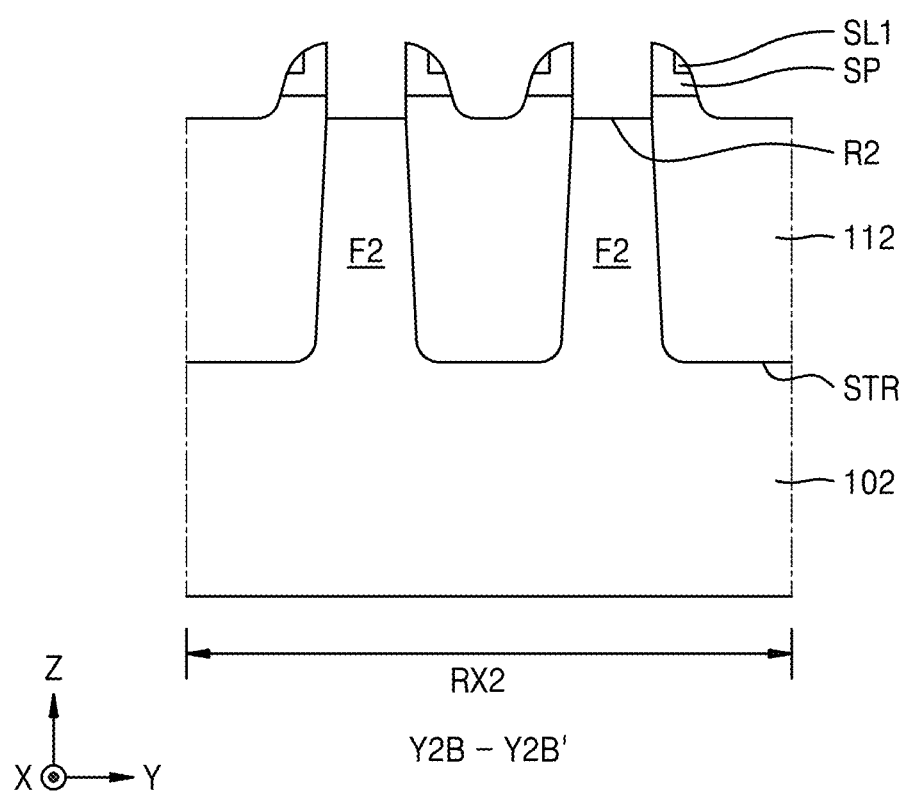
Figure 24A:
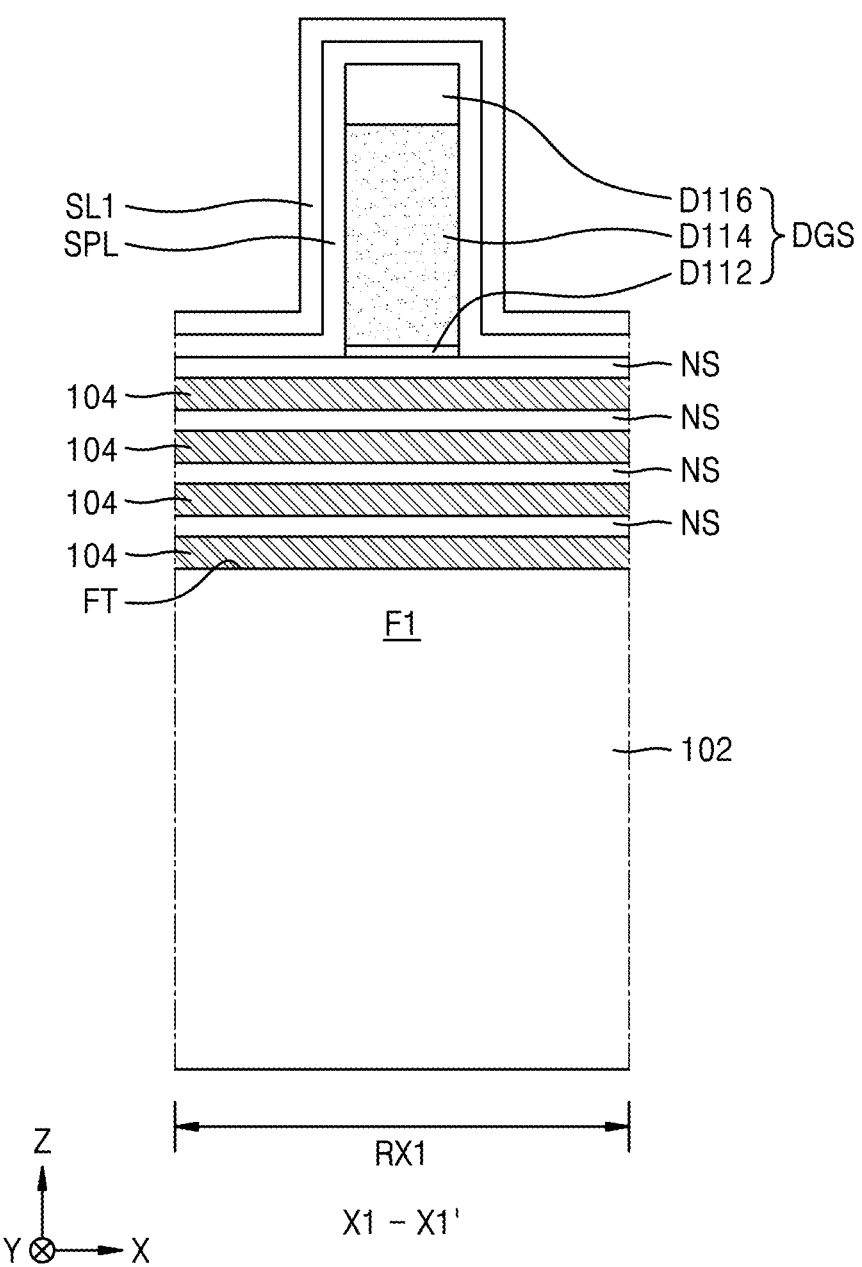
Figure 24B:
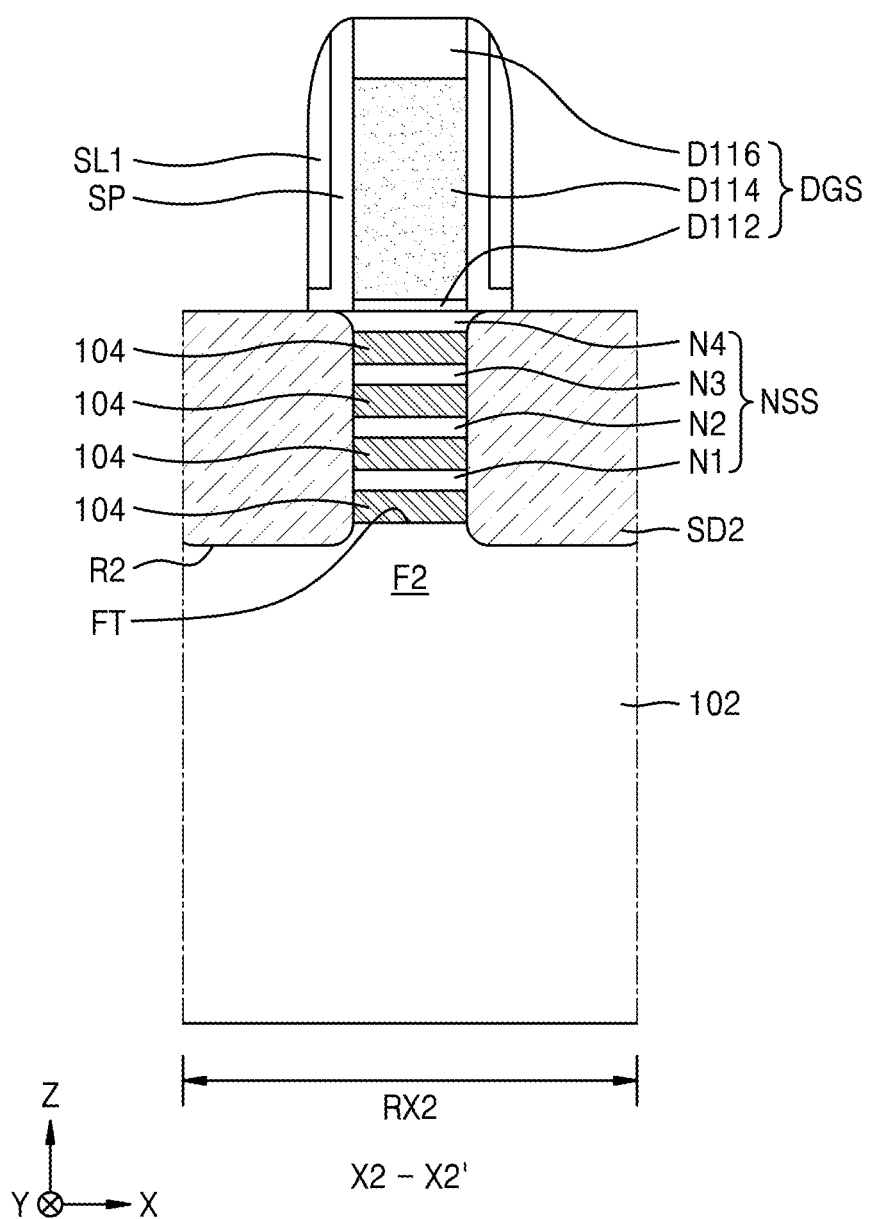
Figure 24C:
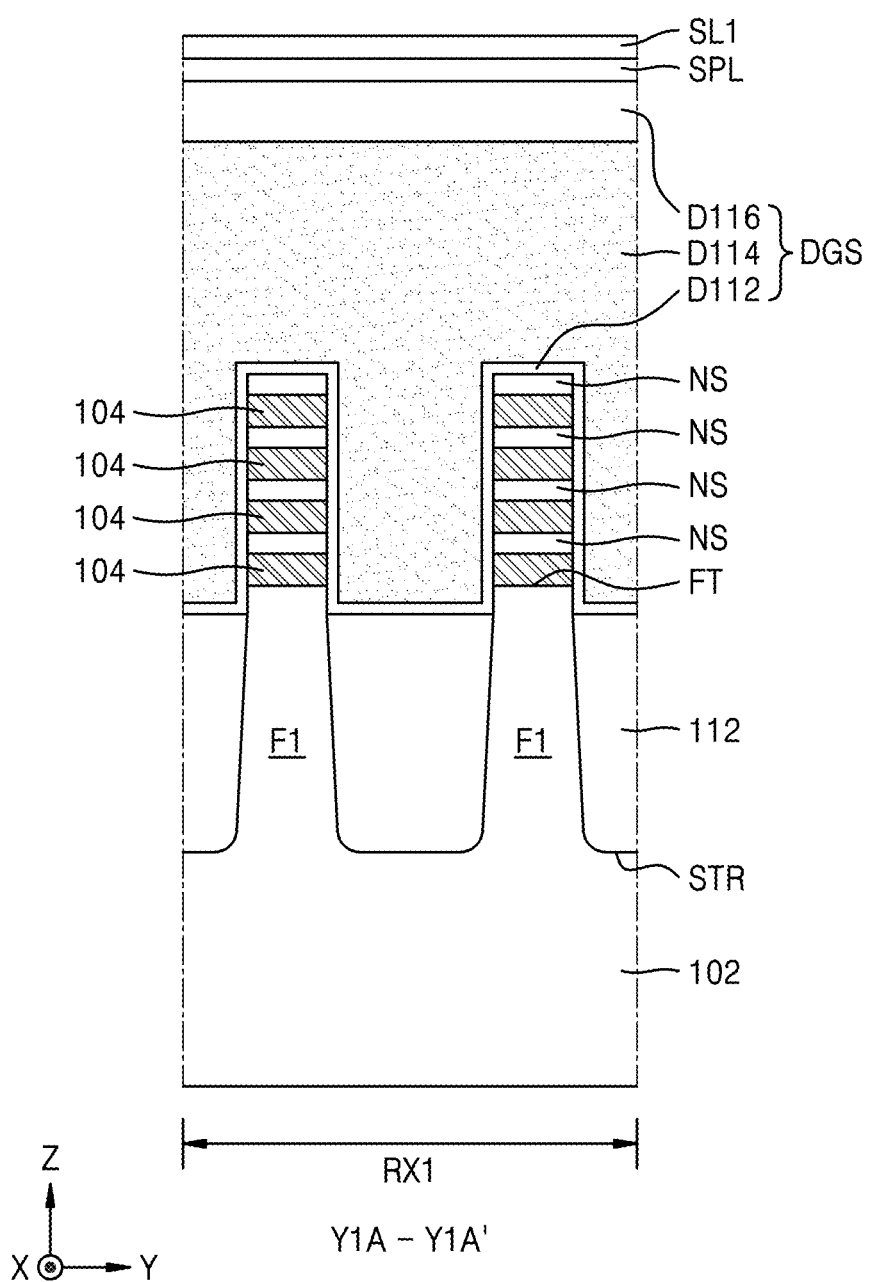
Figure 24D:
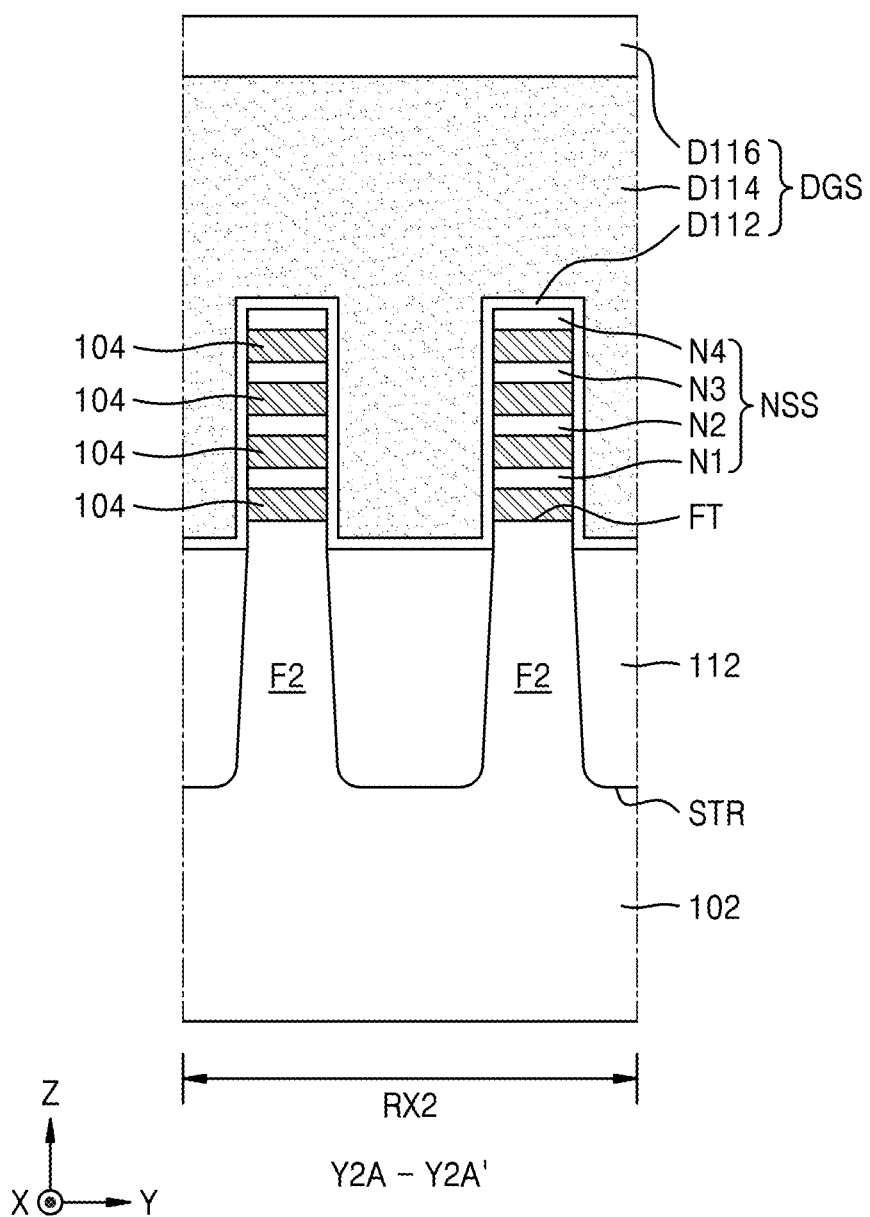
Figure 24E:
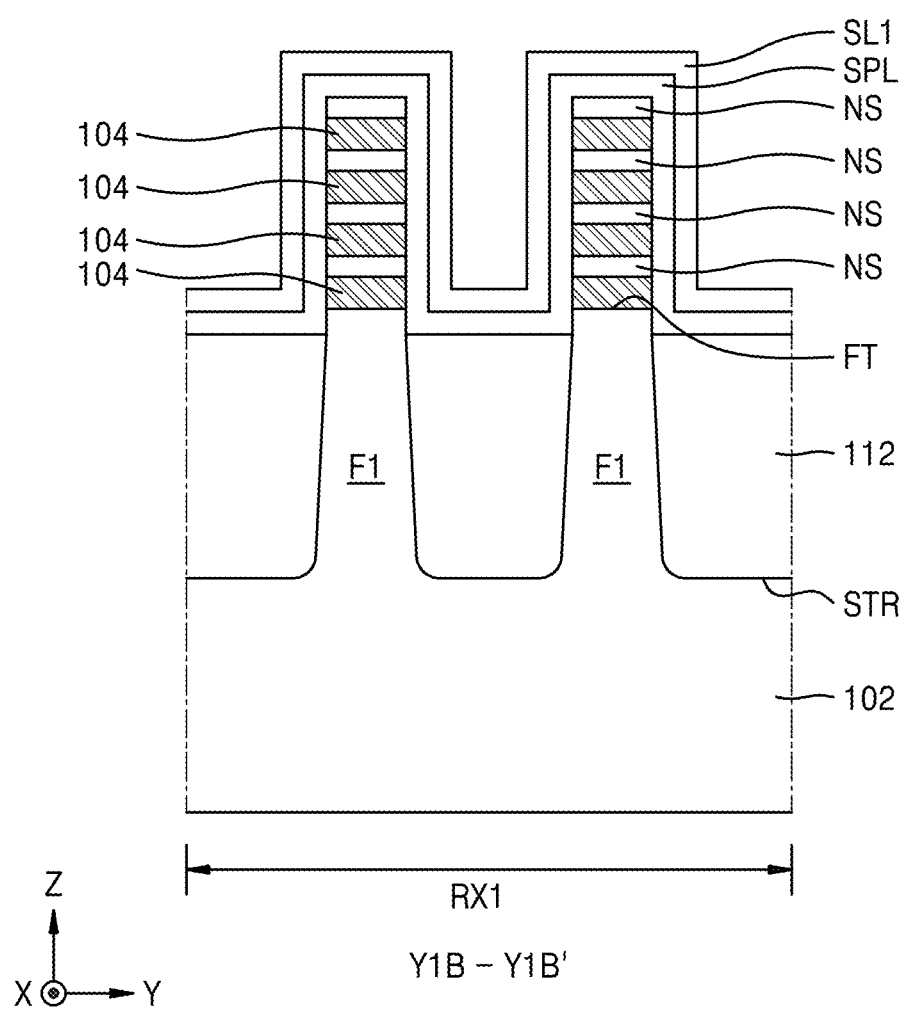
Figure 24F:
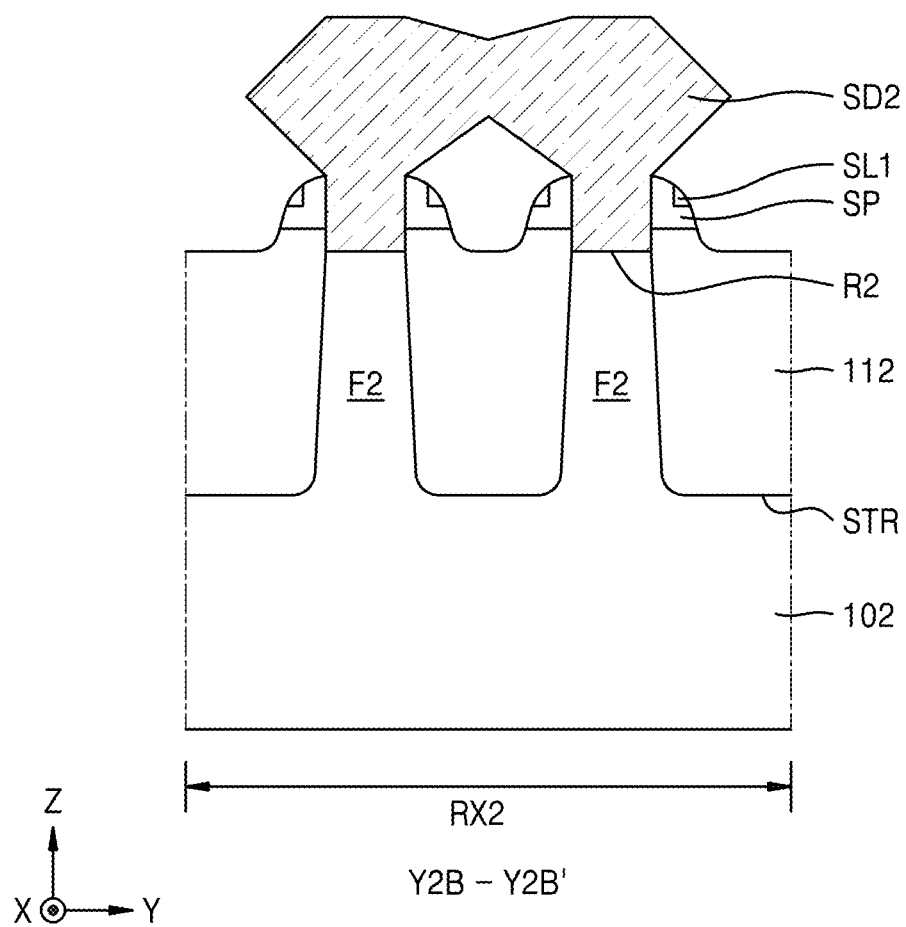
Figure 25A:
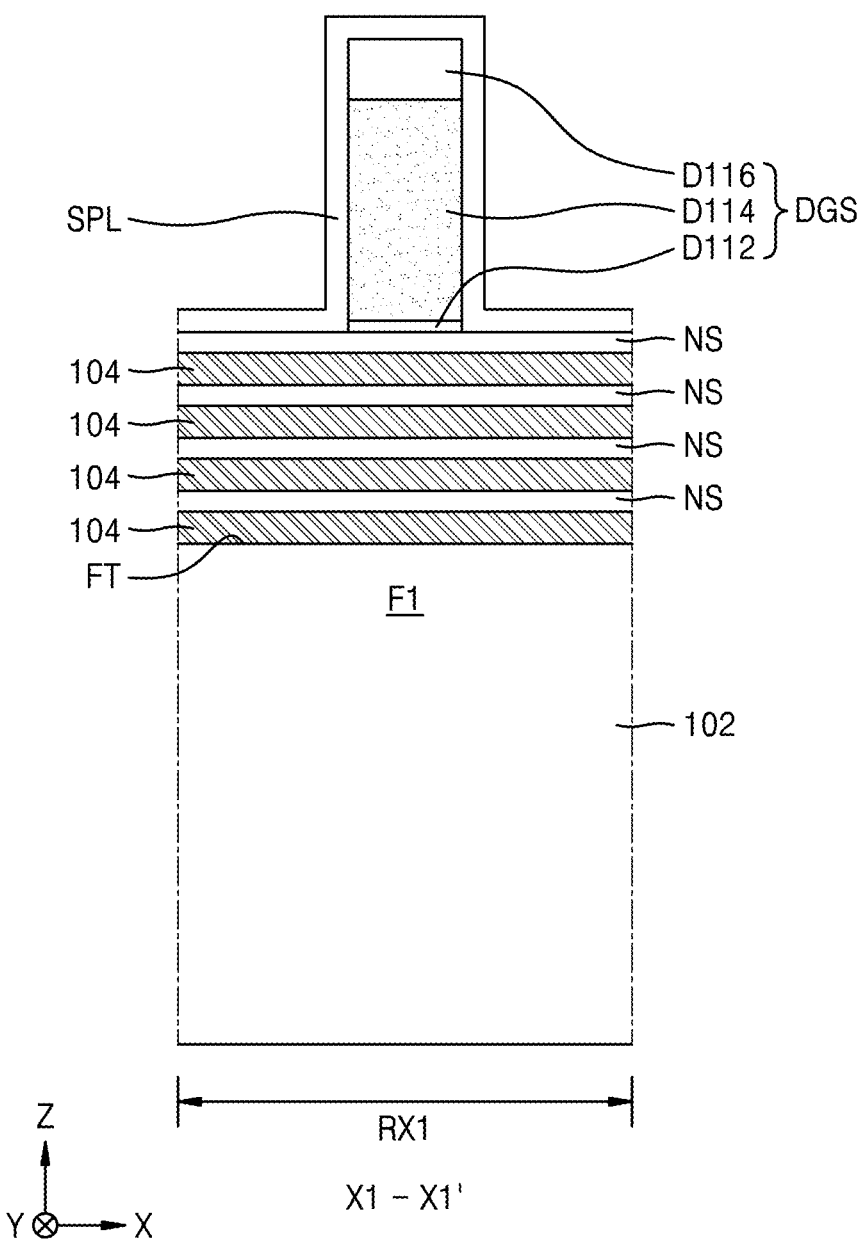
Figure 25B:
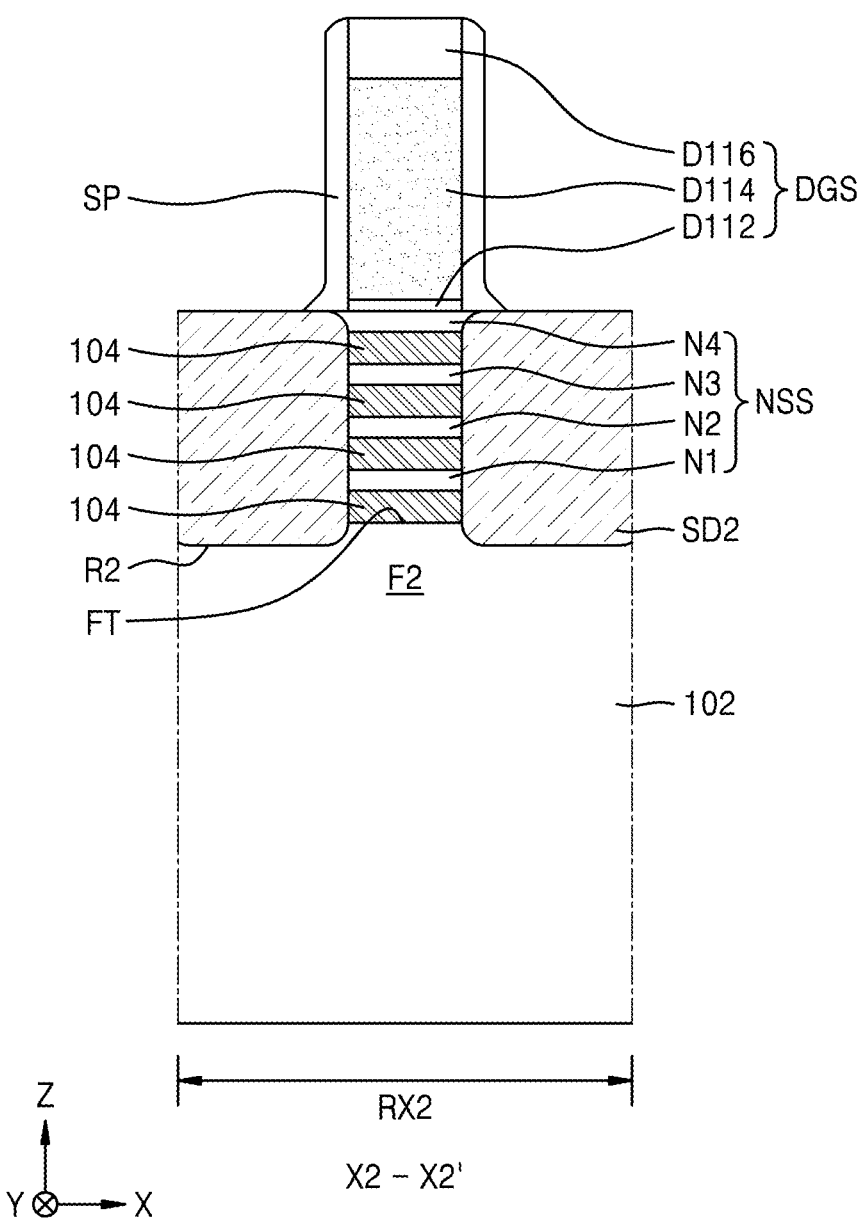
Figure 25C:
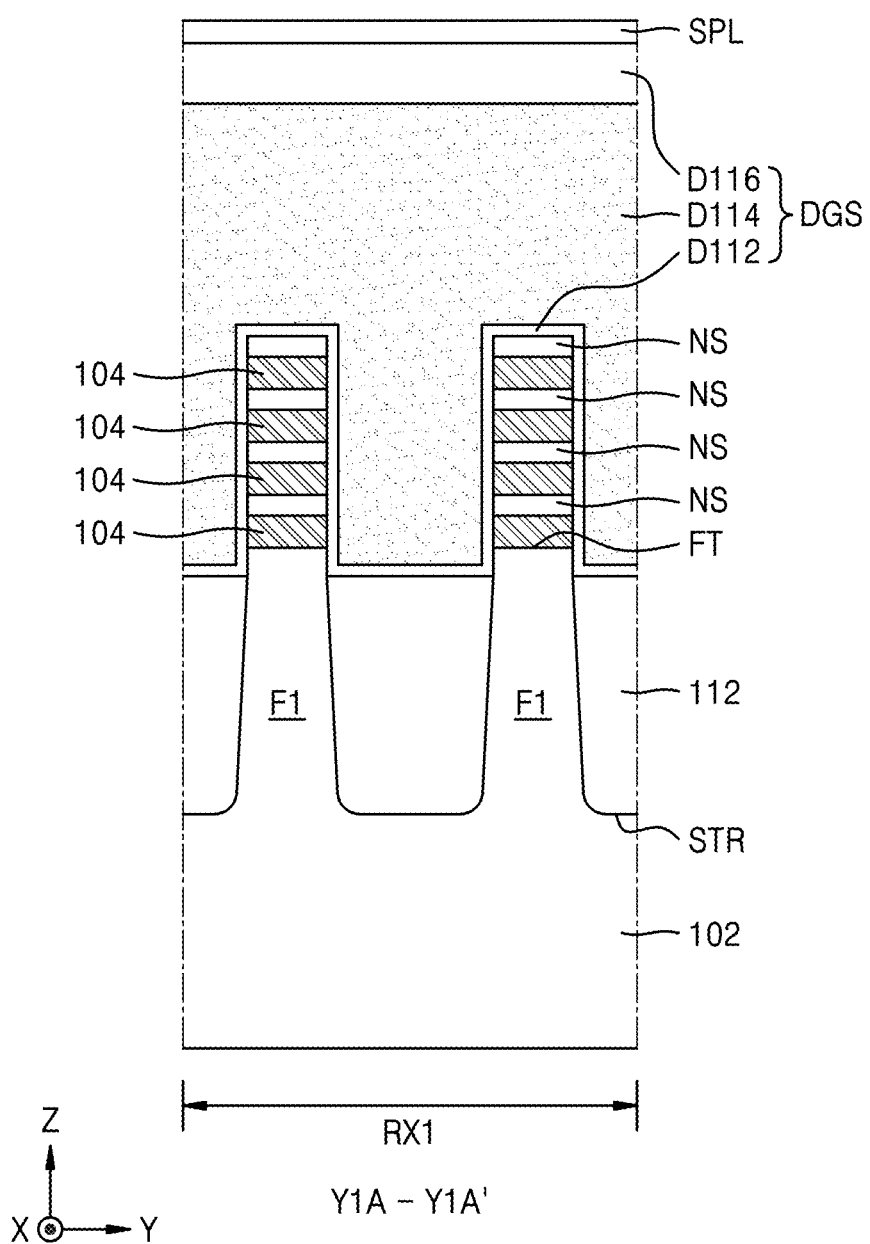
Figure 25D:
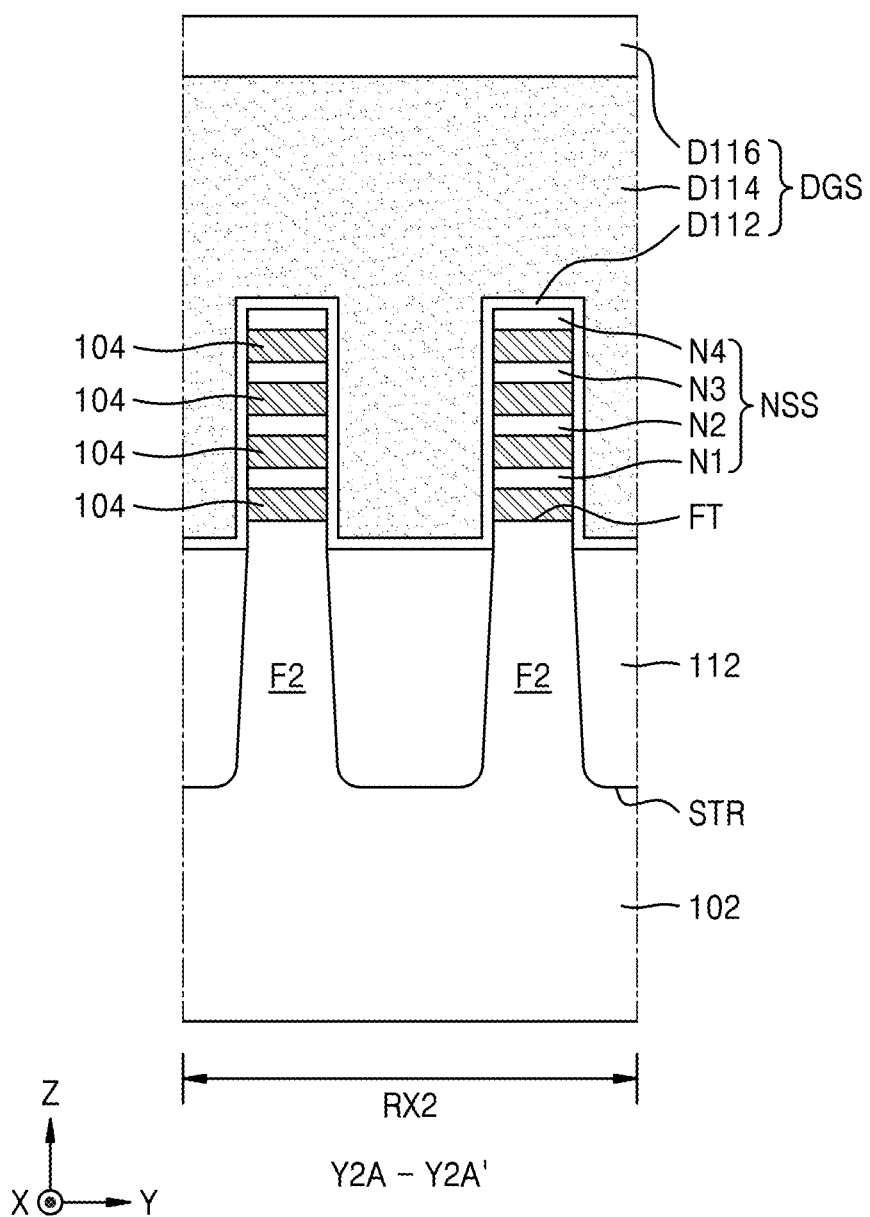
Figure 25E:
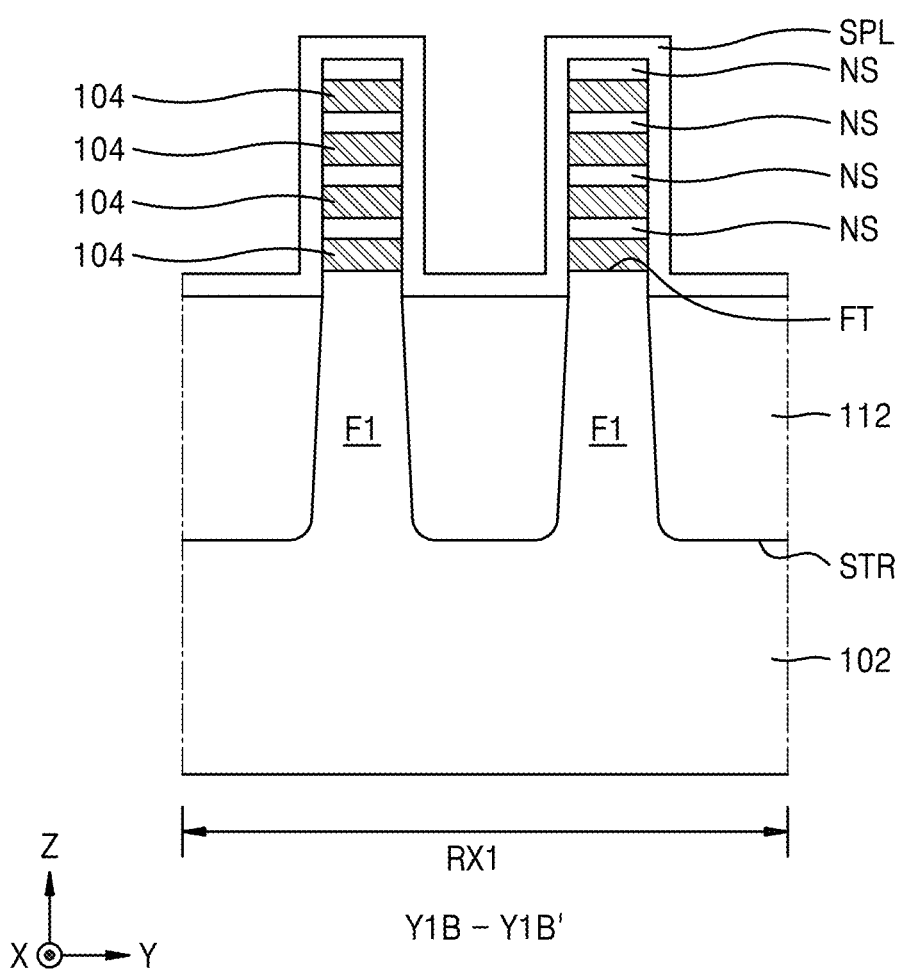
Figure 25F:
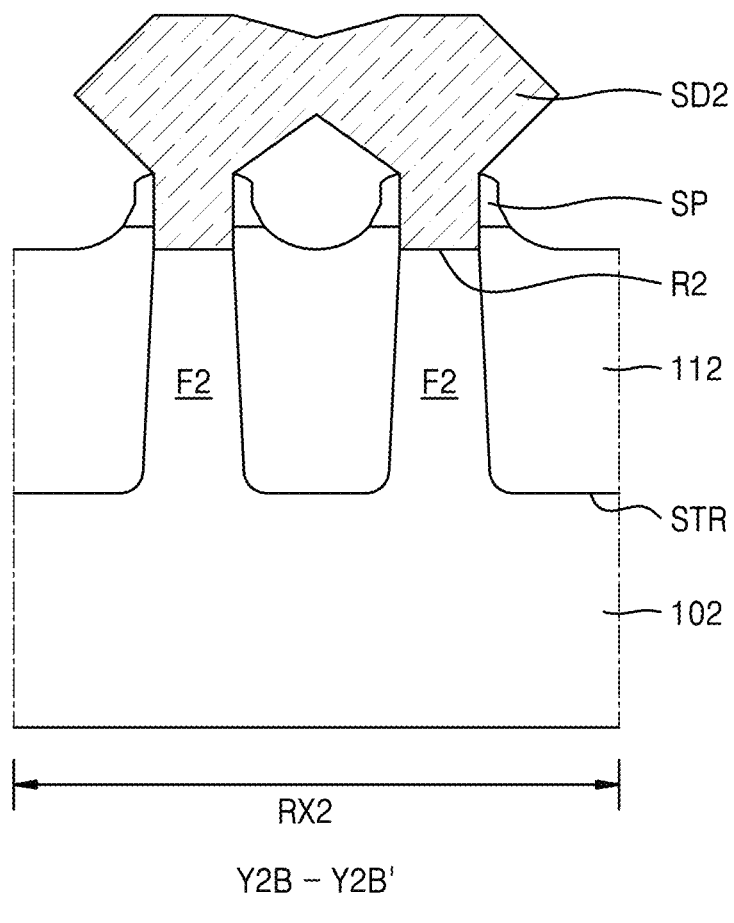
Figure 26A:
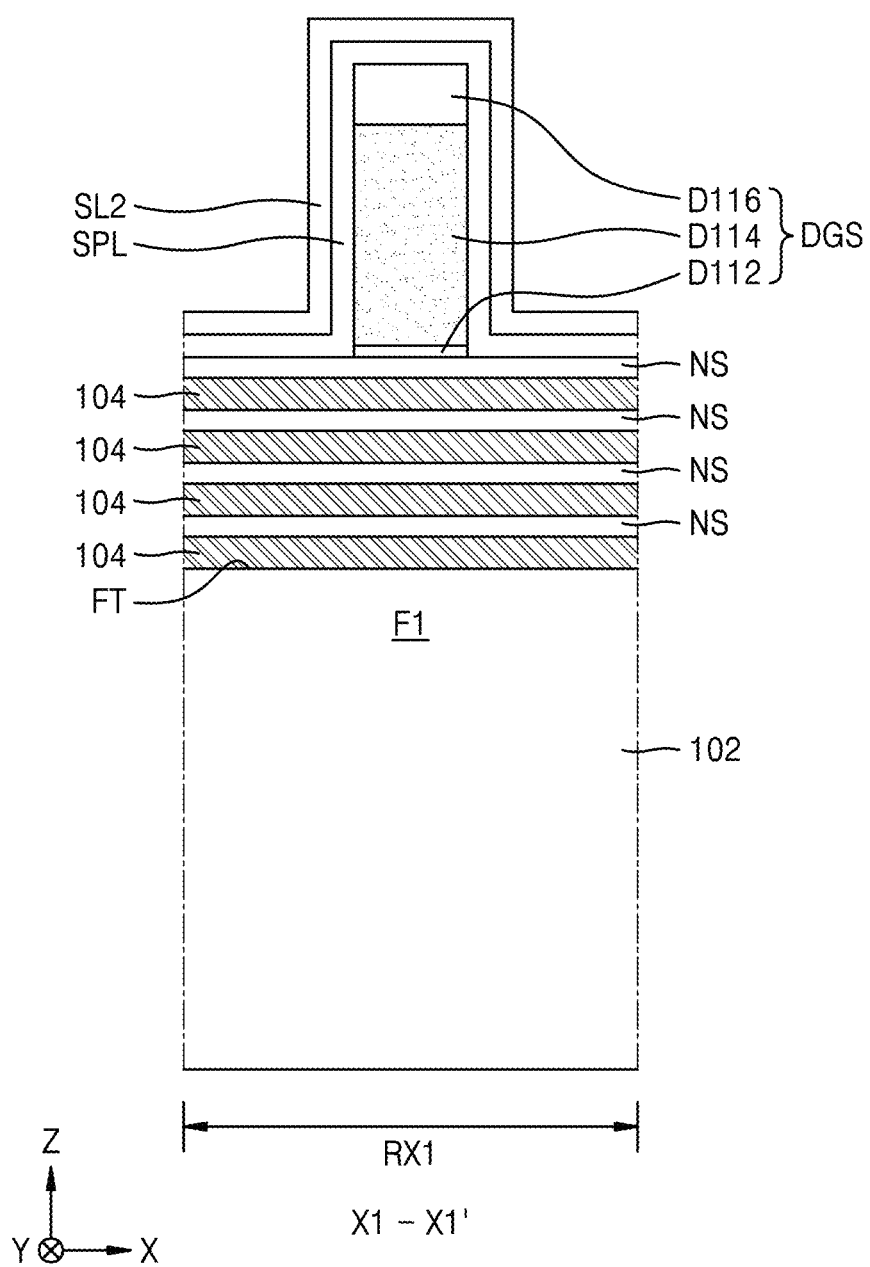
Figure 26B:
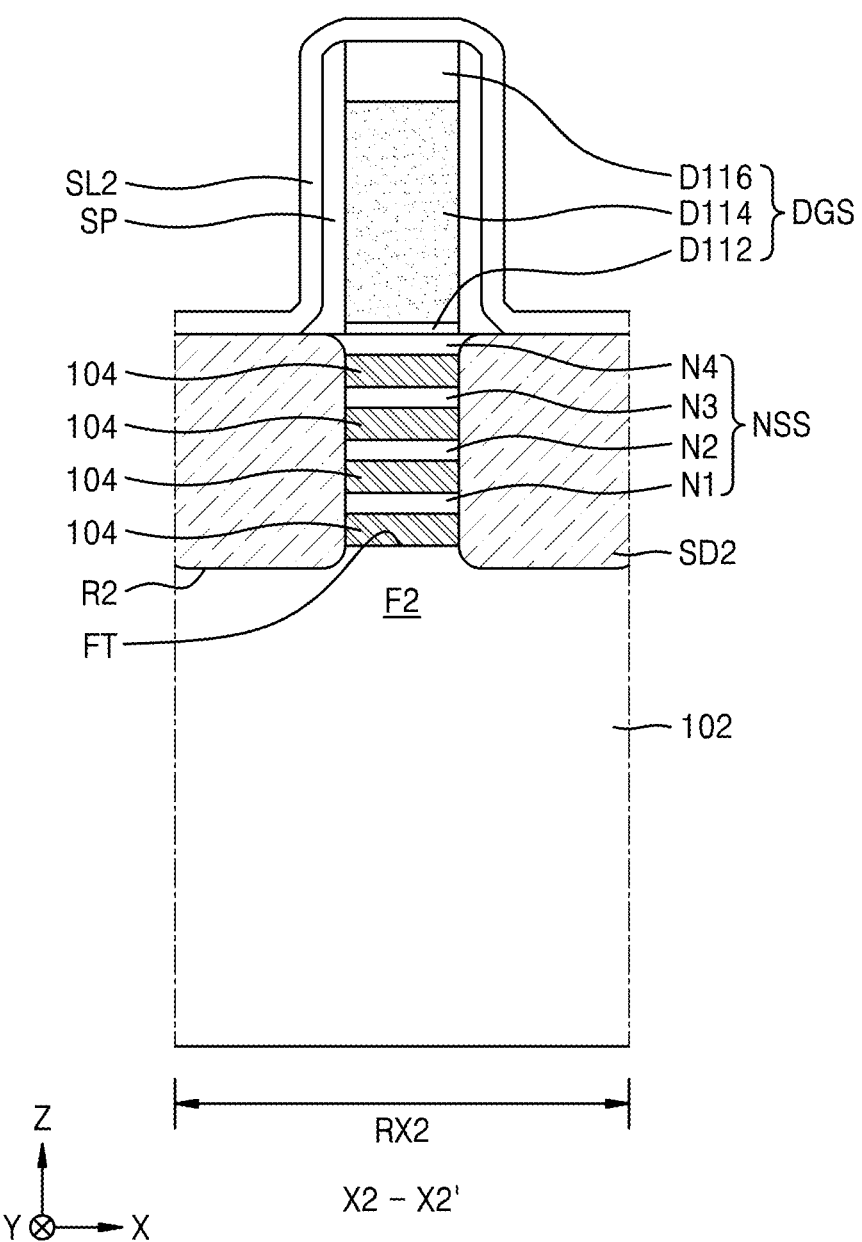
Figure 26C:
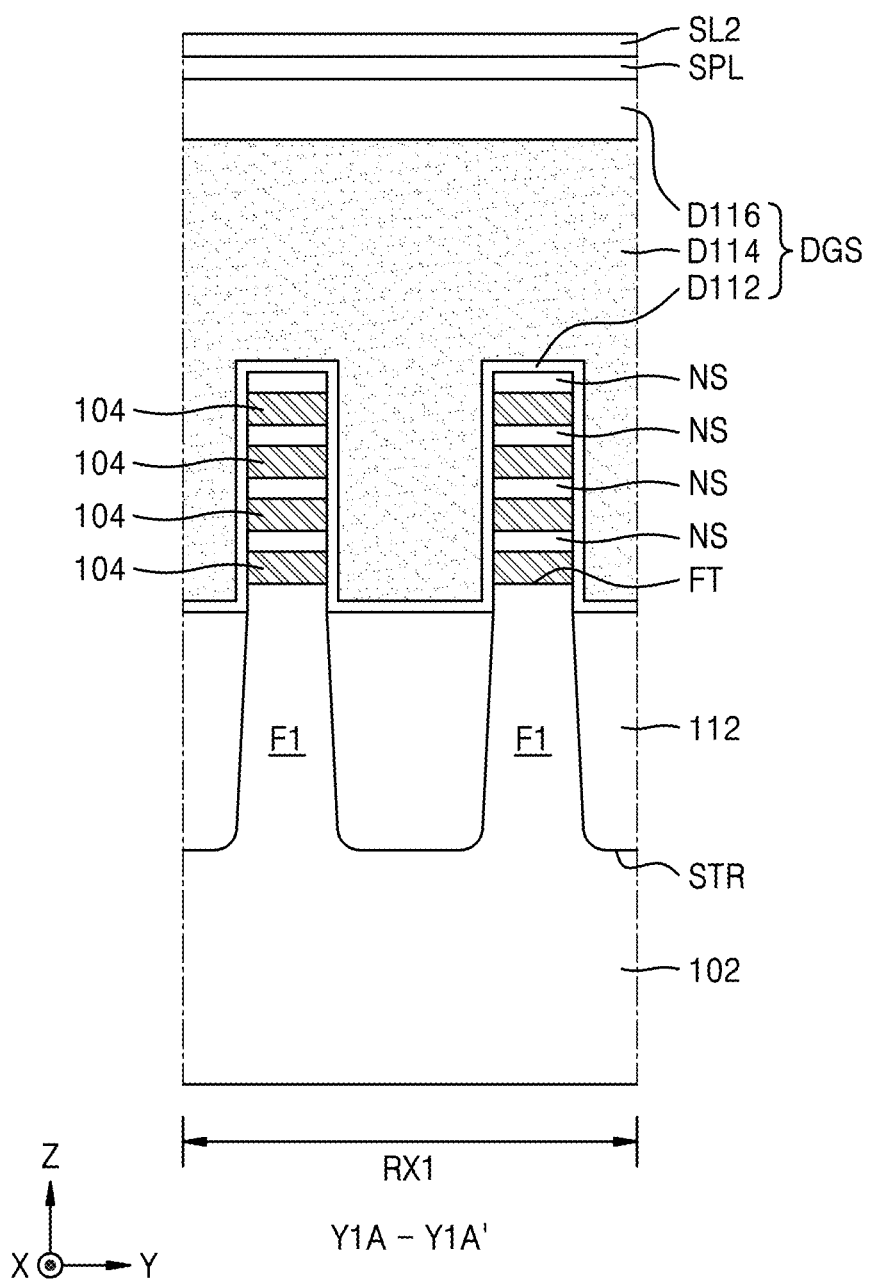
Figure 26D:
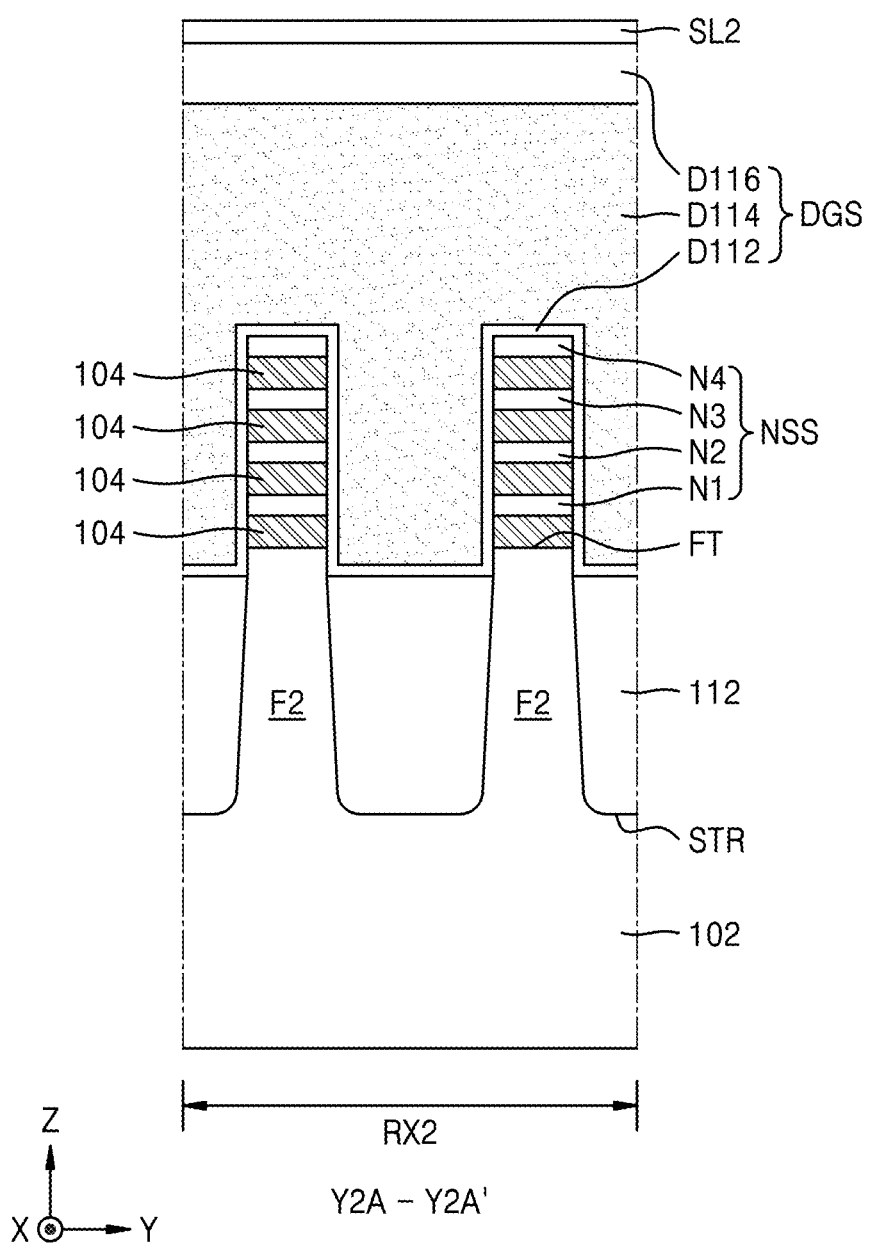
Figure 26E:
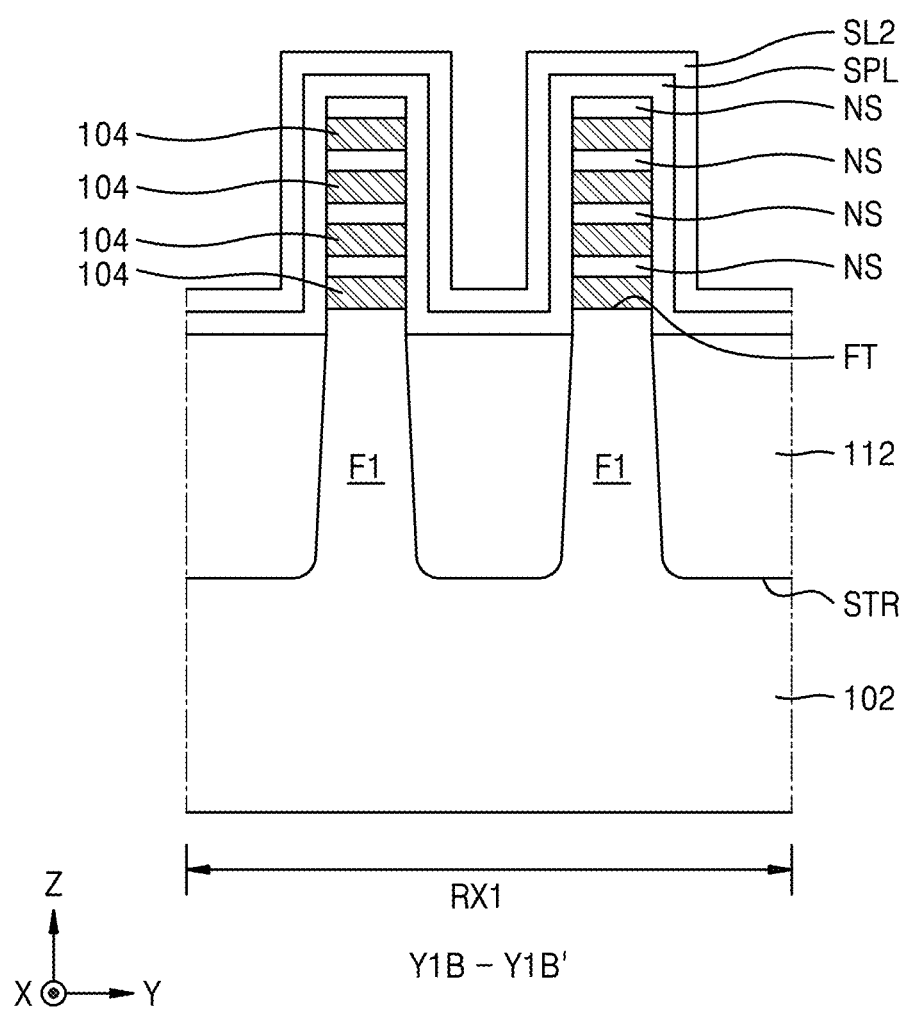
Figure 26F:
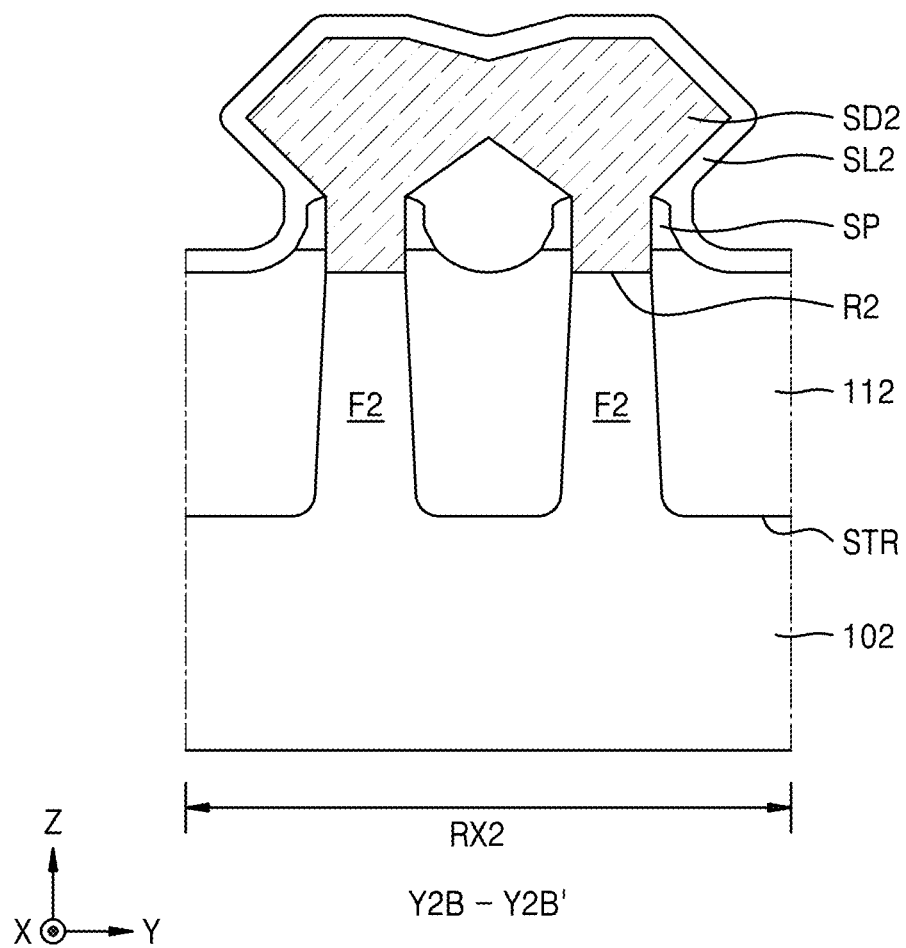
Figure 26G:
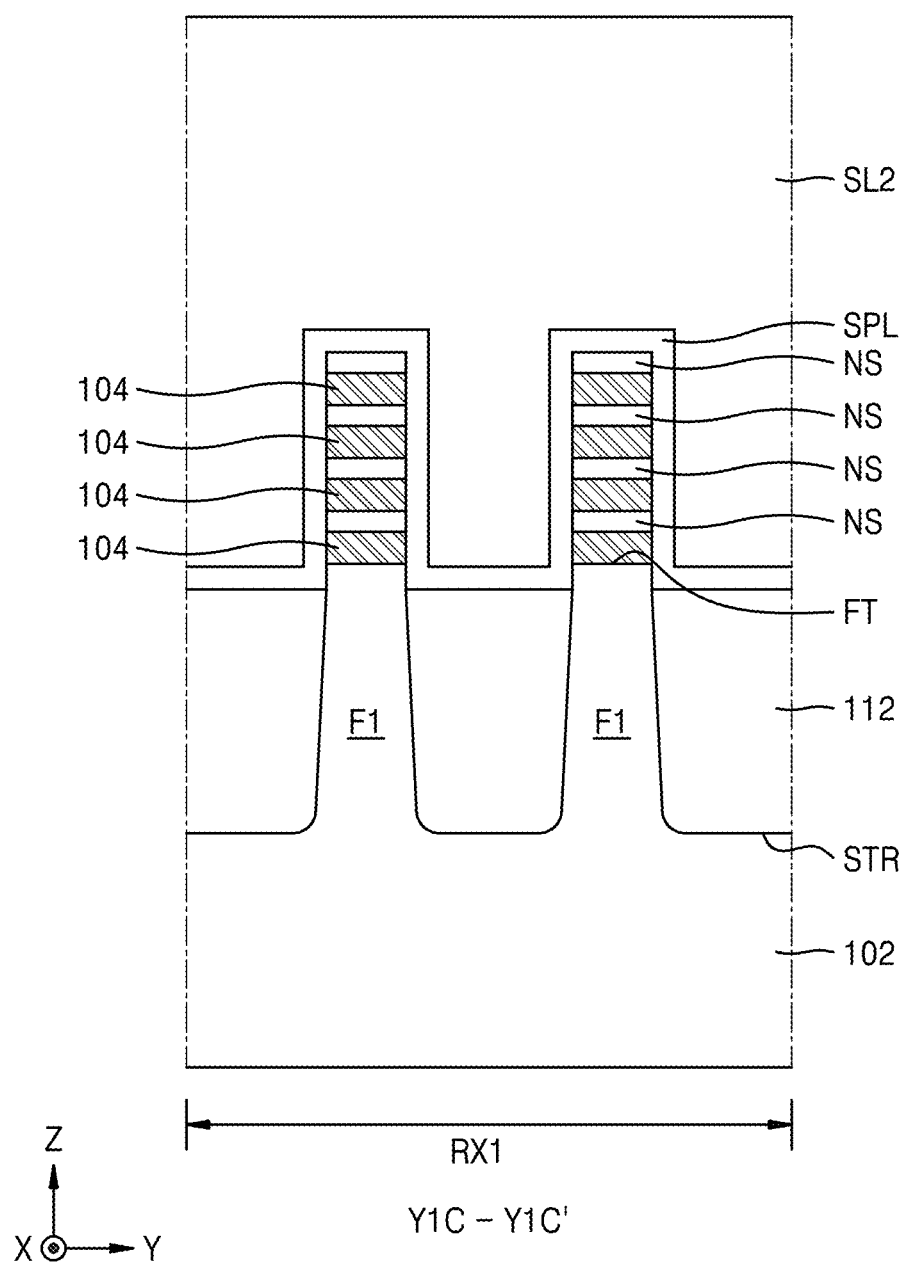
Figure 26H:
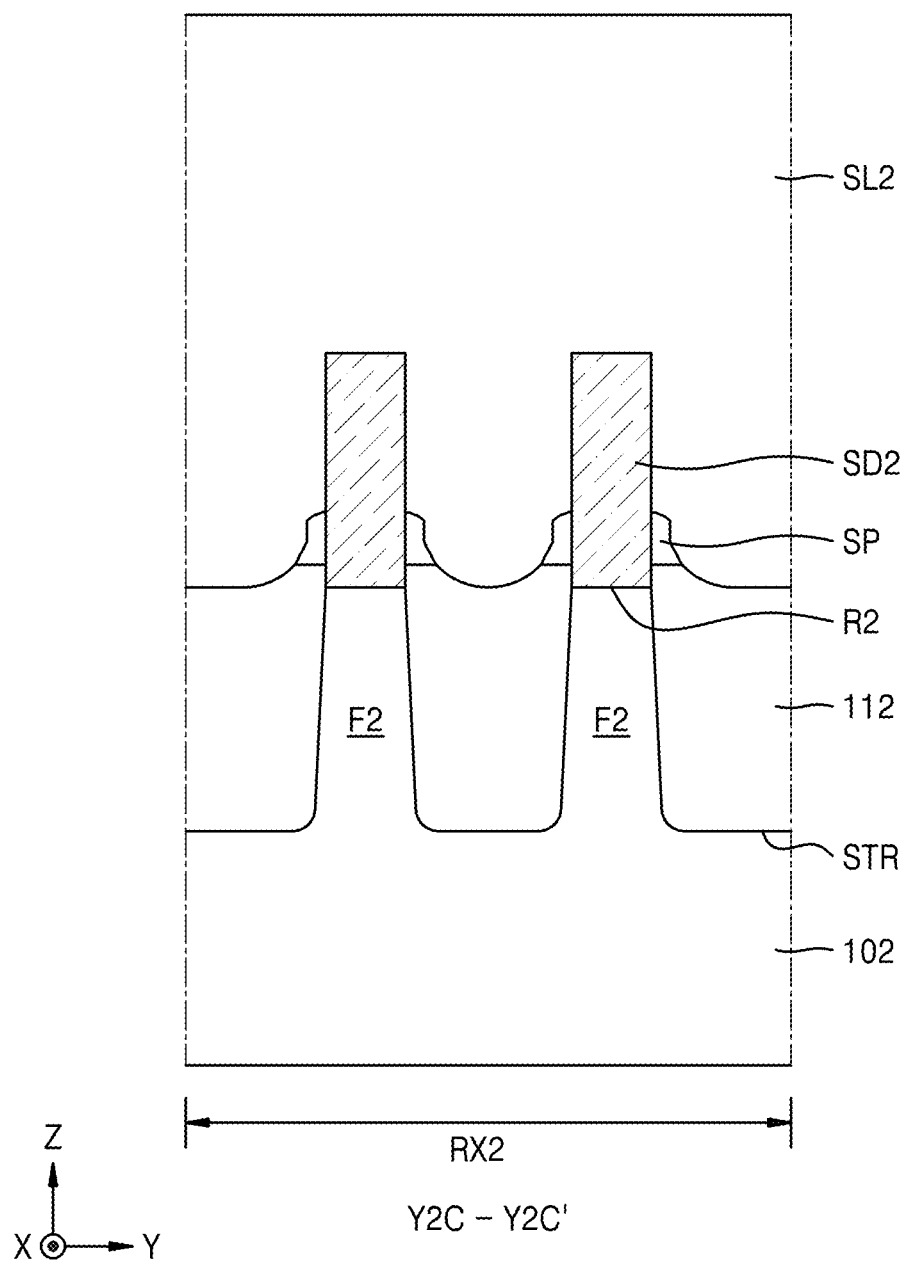

FIGS. 21A to 33D are cross-sectional views illustrating a process sequence in order to explain a method of manufacturing an integrated circuit device according to embodiments of the present disclosure. More specifically, FIGS. 21A, 22A, . . . , and 33A are cross-sectional views illustrating, according to a process sequence, a partial configuration of a region corresponding to a cross-section taken along the line X1-X1' of FIG. 2A. FIGS. 21B, 22B, . . . , and 33B are cross-sectional views illustrating, according to a process sequence, a partial configuration of a region corresponding to a cross-section taken along the line X2-X2' of FIG. 2B. FIGS. 21C, 22C, . . . , and 33C are cross-sectional views illustrating, according to a process sequence, a partial configuration of a region corresponding to a cross-section taken along the line Y1A-Y1A' of FIG. 2A. FIGS. 21D, 22D, ..., and 33D are cross-sectional views illustrating, according to a process sequence, a partial configuration of a region corresponding to a cross-section taken along the line Y2A-Y2A' of FIG. 2B. FIGS. 22E, 23E, ..., and 30E are cross-sectional views illustrating, according to a process sequence, a partial configuration of a portion corresponding to a cross-section taken along the line Y1B-Y1B' of FIG. 2A. FIGS. 22F, 23F, ..., and 30F are cross-sectional views illustrating, according to a process sequence, a partial configuration of a portion corresponding to a cross-section taken along the line Y2B-Y2B' of FIG. 2B. FIGS. 26G, 27G, 28G, 29G, and 30G are cross-sectional views illustrating, according to a process sequence, a partial configuration of a portion corresponding to a cross-section taken along the line Y1C-Y1C' of FIG. 2A. FIGS. 26H, 27H, 28H, 29H, and 30H are cross-sectional views illustrating, according to a process sequence, a partial configuration of a portion corresponding to a cross-section taken along the line Y2C-Y2C' of FIG. 2B.

An example method of manufacturing the integrated circuit device 100 described with reference to FIGS. 1 to 7B will be described with reference to FIGS. 21A to 33D. In FIGS. 21A to 33D, reference numerals that are the same as those in FIGS. 1 to 7B denote members that are the same as those in FIGS. 1 to 7B, and detailed descriptions thereof are omitted herein.

Referring to FIGS. 21A to 21D, a multilayer in which a plurality of a sacrificial semiconductor layers 104 and a plurality of nanosheet semiconductor layers NS are alternately stacked one by one may be formed on a first device region RX1 and a second device region RX2 of a substrate 102, and then, a portion of each of the multilayer and the substrate 102 may be etched to form a device isolation trench STR in the substrate 102. As a result, a plurality of a first fin-type active region F1 and a second fin-type active region F2 protruding upward from the substrate 102 in a vertical direction (Z direction) may be formed, and on a fin top surface FT of each of the plurality of the first fin-type active region F1 and the second fin-type active region F2, the plurality of sacrificial semiconductor layers 104 and the plurality of nanosheet semiconductor layers NS may remain long in the first horizontal direction (X direction).

The etch selectivities of materials of the plurality of sacrificial semiconductor layers 104 may differ from those of materials of the plurality of nanosheet semiconductor layers NS. In example embodiments, each of the plurality of nanosheet semiconductor layers NS may include a Si layer, and each of the plurality of sacrificial semiconductor layers 104 may include a SiGe layer. In example embodiments, the Ge content in the plurality of sacrificial semiconductor layers 104 may be constant. The SiGe layer constituting the plurality of sacrificial semiconductor layers 104 may have a constant Ge content selected within a range of about 5 atomic % to about 60 atomic %, for example, about 10 atomic % to about 40 atomic %. The Ge content in the SiGe layer constituting the plurality of sacrificial semiconductor layers 104 may be variously selected as necessary.

Thereafter, a device isolation layer 112 filling the device isolation trench STR may be formed in the first device region RX1 and the second device region RX2. After the device isolation layer 112 is formed, the level of the top surface of the device isolation layer 112 may be lower than the level of the fin top surface FT of each of the plurality of the first fin-type active region F1 and the second fin-type active region F2. However, embodiments of the present disclosure are not limited thereto.

Referring to FIGS. 22A to 22F, in a resultant product of FIGS. 21A to 21D, a plurality of a dummy gate structure DGS may be formed on a stacked structure of the plurality of sacrificial semiconductor layers 104 and the plurality of nanosheet semiconductor layers NS.

The plurality of the dummy gate structure DGS may extend long on the substrate 102 in the second horizontal direction (Y direction) crossing the plurality of the first fin-type active region F1 and the second fin-type active region F2. Each of the plurality of the dummy gate structure DGS may have a structure in which an oxide layer D112, a dummy gate layer D114, and a capping layer D116 are sequentially stacked. In example embodiments, the dummy gate layer D114 may include polysilicon, and the capping layer D116 may include a silicon nitride layer.

An insulating spacer layer SPL and a first sacrificial insulating layer SL1, which sequentially cover the top surface of a resultant product in which the plurality of the dummy gate structure DGS are formed, may be formed. The insulating spacer layer SPL and the first sacrificial insulating layer SL1 may be formed to conformally cover the top surface of the resultant product in which the plurality of the dummy gate structure DGS are formed.

In example embodiments, the insulating spacer layer SPL may include a nitride layer containing oxygen atoms, for example, at least one of a SiOCN layer and a SiON layer. The first sacrificial insulating layer SL1 may include a SiN layer that does not contain an oxygen atom, for example, a $Si_3N_4$ layer.

Referring to FIGS. 23A to 23F, a first mask pattern M1 covering the first device region RX1 and exposing the second device region RX2 may be formed on a resultant product of FIGS. 22A to 22F, and an insulating spacer SP covering both sidewalls of the dummy gate structure DGS may be formed by selectively etching the first sacrificial insulating layer SL1 and the insulating spacer layer SPL in the second device region RX2 while the first device region RX1 is covered with the first mask pattern M1. A portion of the first sacrificial insulating layer SL1 may remain on the insulating spacer SP.

Thereafter, in the second device region RX2, a portion of each of the plurality of sacrificial semiconductor layers 104 and a portion of each of the plurality of nanosheet semiconductor layers NS may be removed at both sides of the dummy gate structure DGS by using the dummy gate structure DGS, the insulating spacer SP, and the first sacrificial insulating layer SL1 as an etch mask, and thus, the plurality of nanosheet semiconductor layers NS may be divided into a plurality of nanosheet stacks NSS. Each of the plurality of nanosheet stacks NSS may include a plurality of nanosheets N1, N2, N3, and N4. In the second device region RX2, a second fin-type active region F2 exposed between each two of the plurality of nanosheet stacks NSS may be etched to form a plurality of a second recess R2 on the second fin-type active region F2. The plurality of nanosheets N1, N2, N3, and N4 may be exposed through the plurality of the second recess R2. To form the plurality of the second recess R2, the second fin-type active region F2 may be etched using dry etching, wet etching, or a combination thereof.

As illustrated in FIG. 23F, in the second device region RX2 in which the plurality of the second recess R2 are formed, the insulating spacer SP may include lower portion regions adjacent to the bottoms of the plurality of the second recess R2 and covering the device isolation layer 112 on both sides of each of the second recess R2, and upper portion regions covering a sidewall of the dummy gate structure DGS. The term "second recess" as used herein may also be referred to as a second area recess. Herein, the insulating spacer SP formed in the second device region RX2 may be referred to as a second region insulating spacer.

Referring to FIGS. 24A to 24F, after the first mask pattern M1 is removed from a resultant product of FIGS. 23A to 23F to expose the first sacrificial insulating layer SL1 in the first device region RX1, a plurality of the second source/drain region SD2 may be formed in the second device region RX2 to fill the plurality of the second recess R2.

To form the plurality of the second source/drain region SD2, a semiconductor material may be epitaxially grown from the surface of the second fin-type active region F2, which is exposed from the bottoms of the plurality of second the recess R2, and the sidewall of each of the plurality of nanosheets N1, N2, N3 and N4. In example embodiments, to form the plurality of the second source/drain region SD2, a low-pressure chemical vapor deposition (LPCVD) process, a selective epitaxial growth (SEG) process, or a cyclic deposition and etching (CDE) process may be performed using raw materials including an elemental semiconductor precursor. In example embodiments, the plurality of the second source/drain region SD2 may include a SiGe layer doped with a p-type dopant. A Si source and a Ge source may be used to form the plurality of the second source/drain region SD2. As the Si source, silane ($SiH_4$), disilane ($Si_2H_6$), trisilane ($Si_3H_8$), dichlorosilane ($SiH_2Cl_2$), or the like may be used. As the Ge source, germane ($GeH_4$), digermain ($Ge_2H_6$), trigermain ($Ge_3H_8$), tetragermain ($Ge_4H_{10}$), dichlorogermaine ($Ge_2H_2Cl_2$), or the like may be used. The p-type dopant may be selected from boron (B) and gallium (Ga). While the plurality of the second source/drain region SD2 are formed, a plurality of the second source/drain region SD2 adjacent to each other may be connected to each other. Herein, the second source/drain region SD2 may be referred to as first conductivity-type source/drain region.

Referring to FIGS. 25A to 25F, the first sacrificial insulating layer SL1 remaining in the first device region RX1 and the second device region RX2 may be removed from a resultant product of FIGS. 24A to 24F to expose the insulating spacer layer SPL in the first device region RX1 and the dummy gate structure DGS and the insulating spacer SP in the second device region RX2.

After the first sacrificial insulating layer SL1 is removed from the second device region RX2, a plurality of spaces exposing the second source/drain region SD2 and the insulating spacer SP may remain empty between the second source/drain region SD2 and the dummy gate structure DGS.

A wet etching process may be used to remove the first sacrificial insulating layer SL1 from the first device region RX1 and the second device region RX2, but is not limited thereto. In example embodiments, while the first sacrificial insulating layer SL1 is selectively removed, a portion of the insulating spacer layer SPL in the first device region RX1 and a portion of each of the insulating spacer SP and the device isolation layer 112 in the second device region RX2 may be consumed, but the consumption amount may be little.

Referring to FIGS. 26A to 26H, in a resultant product of FIGS. 25A to 25F, a second sacrificial insulating layer SL2 conformally covering an exposed surface of each of the first device region RX1 and the second device region RX2 may be formed. The second sacrificial insulating layer SL2 may include a SiN layer that does not contain an oxygen atom, for example, a $Si_3N_4$ layer.

Referring to FIGS. 27A to 27H, a second mask pattern M2 covering the second device region RX2 and exposing the first device region RX1 may be formed on a resultant product of FIGS. 26A to 26H, and an insulating spacer SP covering both sidewalls of the dummy gate structure DGS may be formed by selectively etching the second sacrificial insulating layer SL2 and the insulating spacer layer SPL in the first device region RX1 while the second device region RX2 is covered with the second mask pattern M2. A portion of the second sacrificial insulating layer SL2 may remain on the insulating spacer SP.

Thereafter, in the first device region RX1, a portion of each of the plurality of sacrificial semiconductor layers 104 and a portion of each of the plurality of nanosheet semiconductor layers NS may be removed at both sides of the dummy gate structure DGS by using the dummy gate structure DGS, the insulating spacer SP, and the second sacrificial insulating layer SL2 as an etch mask, and thus, the plurality of nanosheet semiconductor layers NS may be divided into a plurality of nanosheet stacks NSS. Each of the plurality of nanosheet stacks NSS may include a plurality of nanosheets N1, N2, N3, and N4. In the first device region RX1, a first fin-type active region F1 exposed between each two of the plurality of nanosheet stacks NSS may be etched to form a plurality of a first recess R1 on the first fin-type active region F1. The plurality of nanosheets N1, N2, N3, and N4 may be exposed through the plurality of the first recess R1. To form the plurality of the first recess R1, the first fin-type active region F1 may be etched using dry etching, wet etching, or a combination thereof.

Thereafter, in the first device region RX1, portions of the plurality of sacrificial semiconductor layers 104 exposed from both sides of the nanosheet stack NSS through the plurality of the first recess R1 may be selectively removed to thereby form a plurality of indent spaces ID between each two of the nanosheets N1, N2, N3, and N4 and between a lowermost nanosheet N1 and a fin top surface FT, and a plurality of an inner insulating spacer 120 filling the plurality of indent spaces ID may be formed.

Figure 27A:
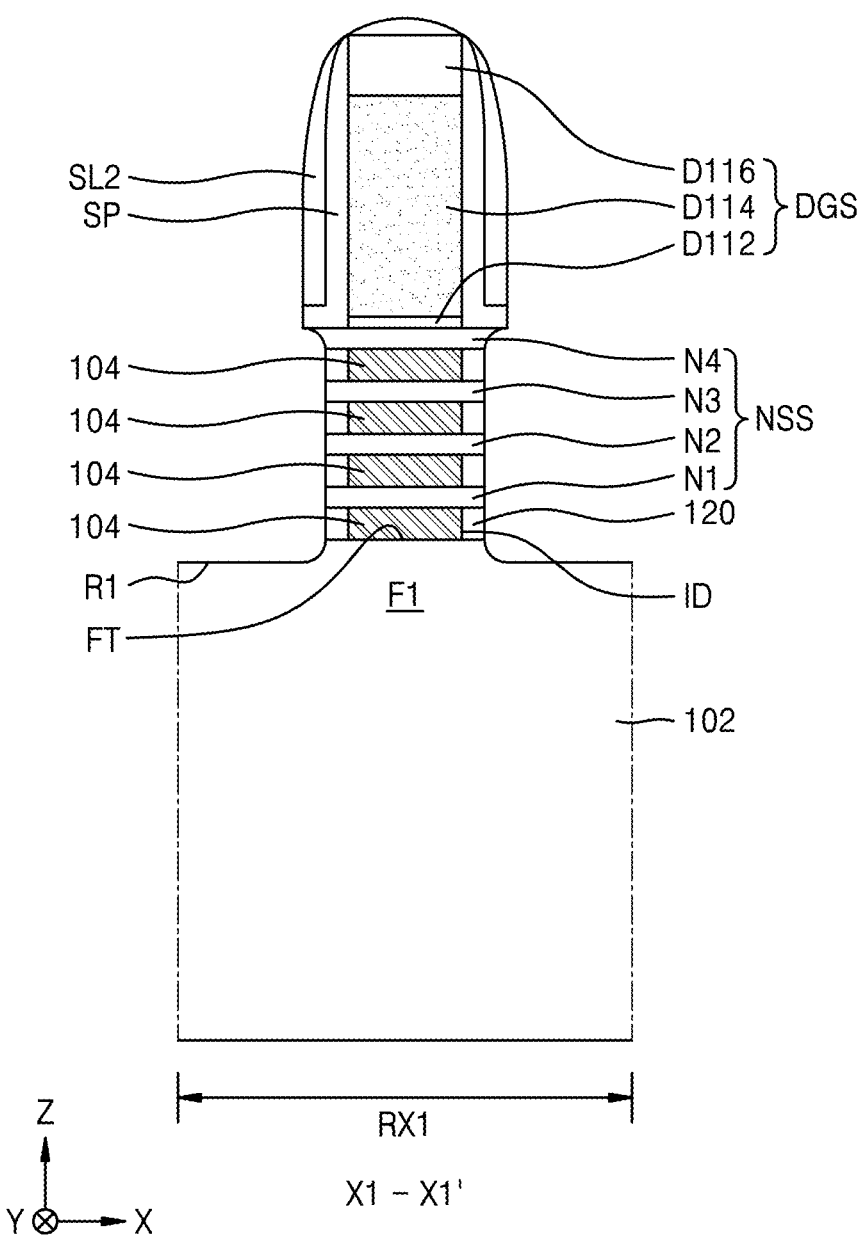
Figure 27B:
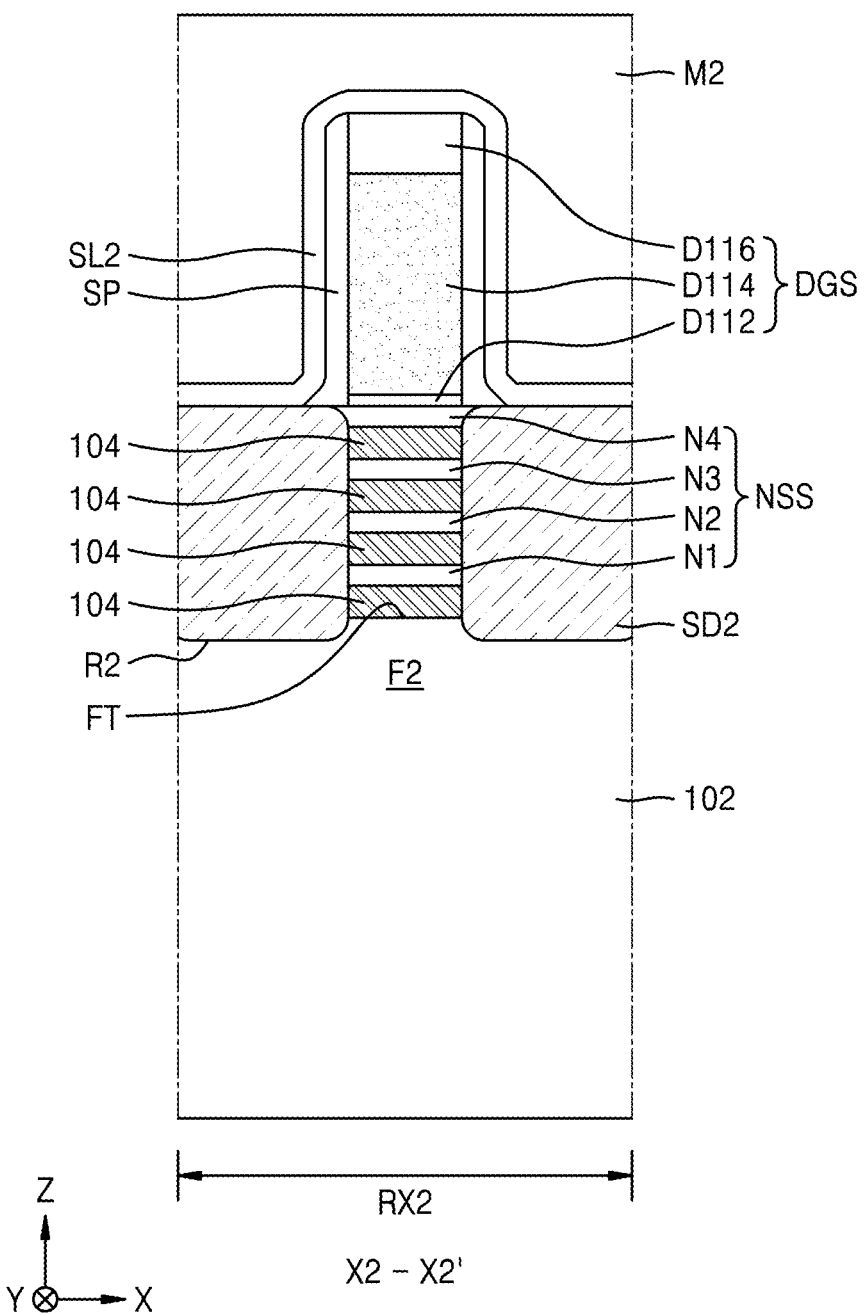
Figure 27C:
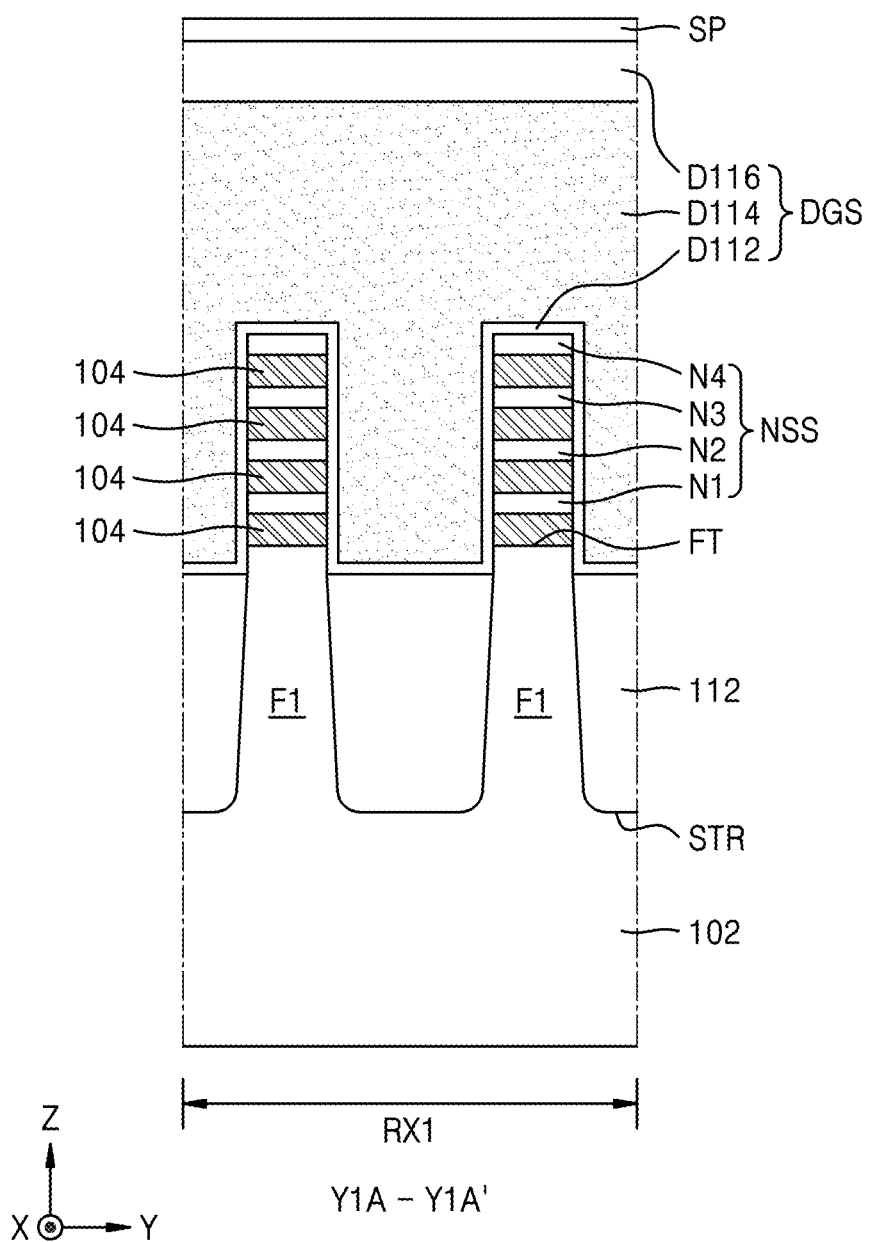
Figure 27D:
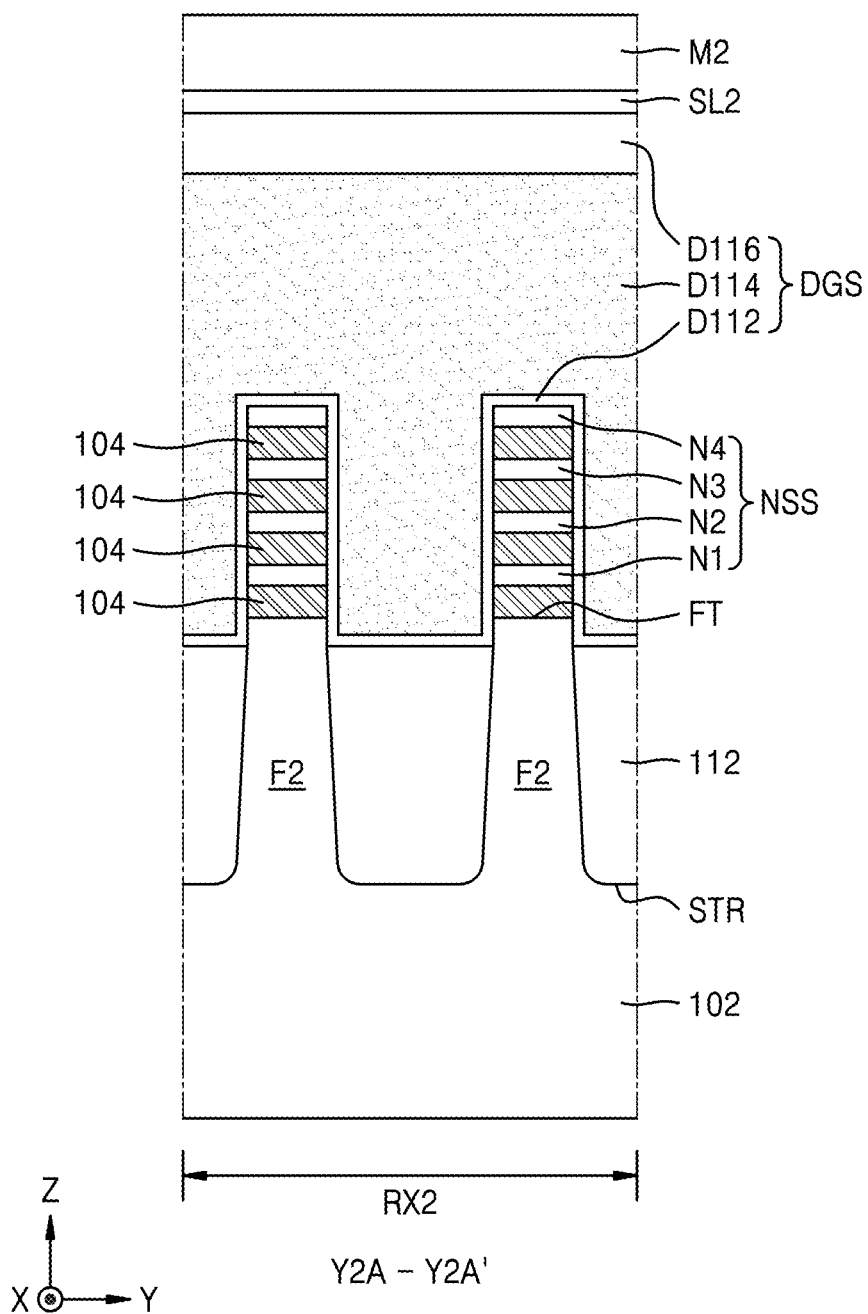
Figure 27E:
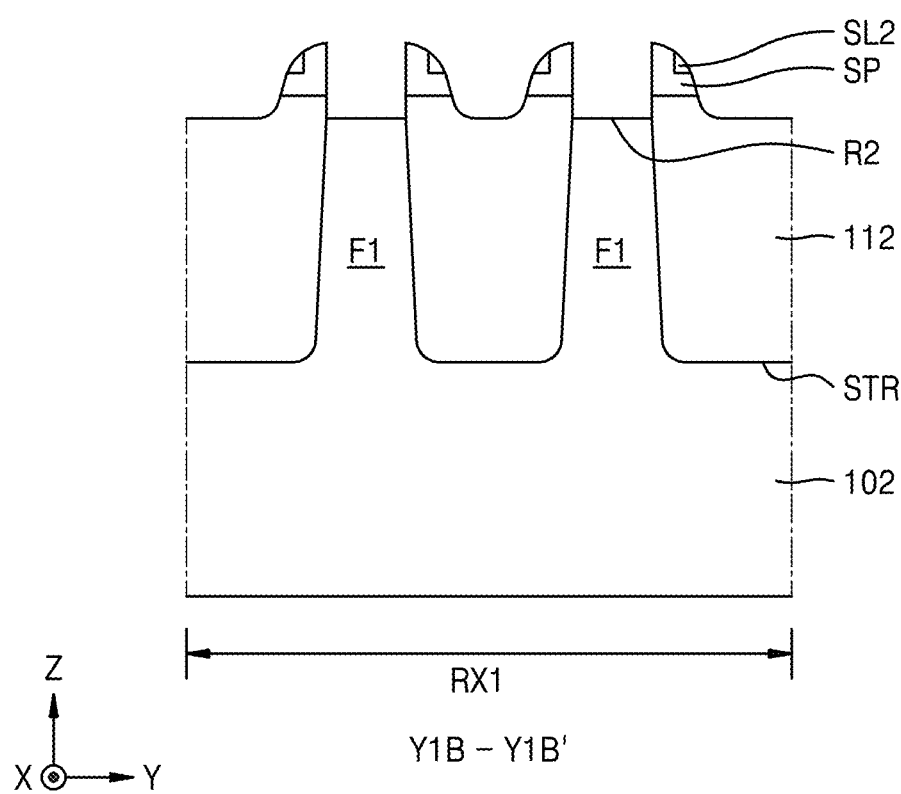
Figure 27F:
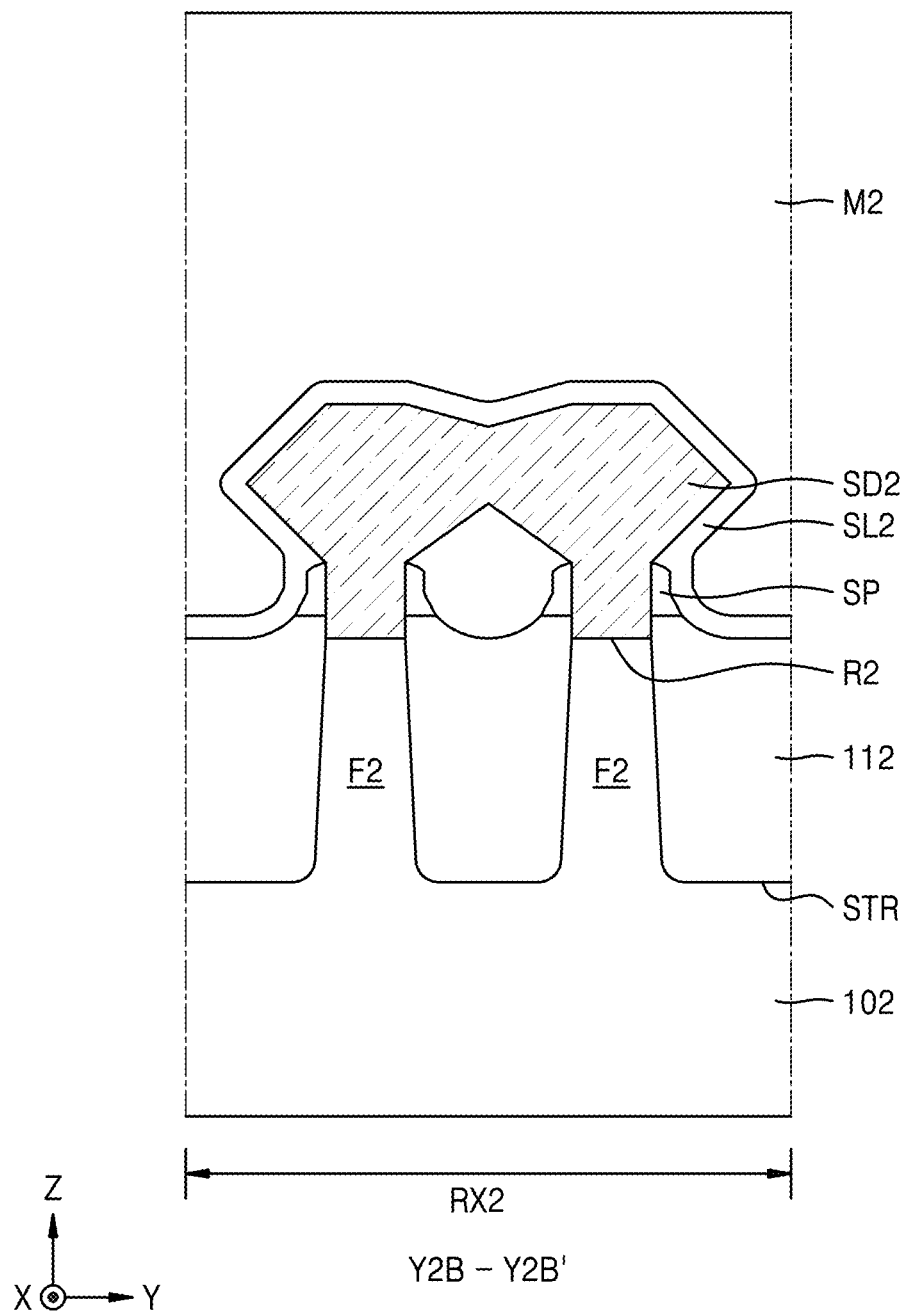
Figure 27G:
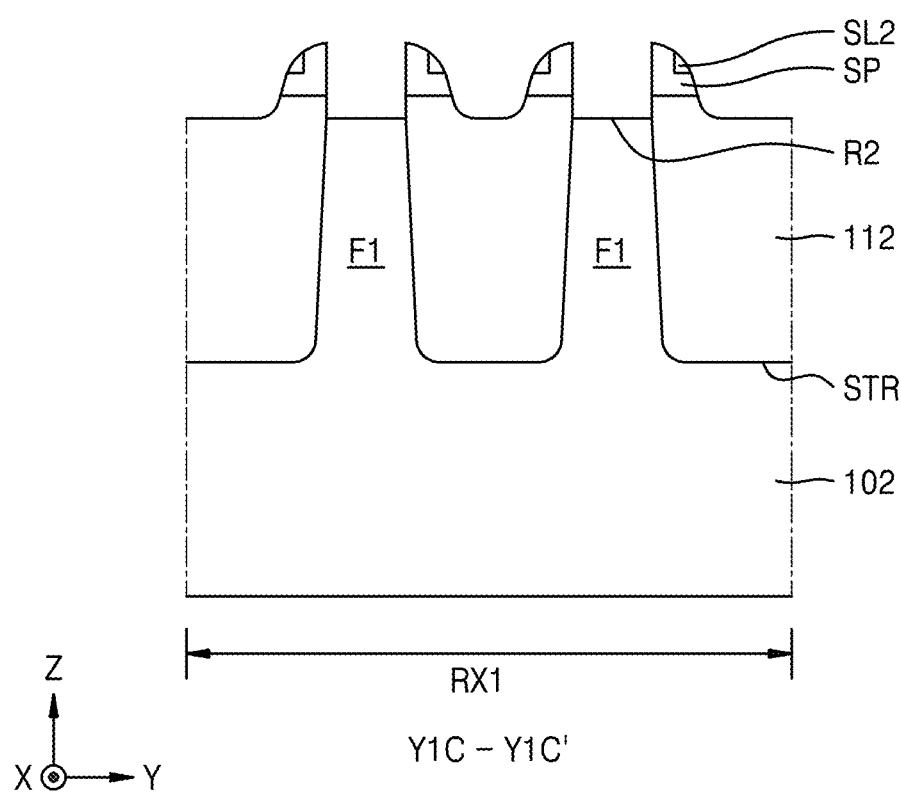
Figure 27H:
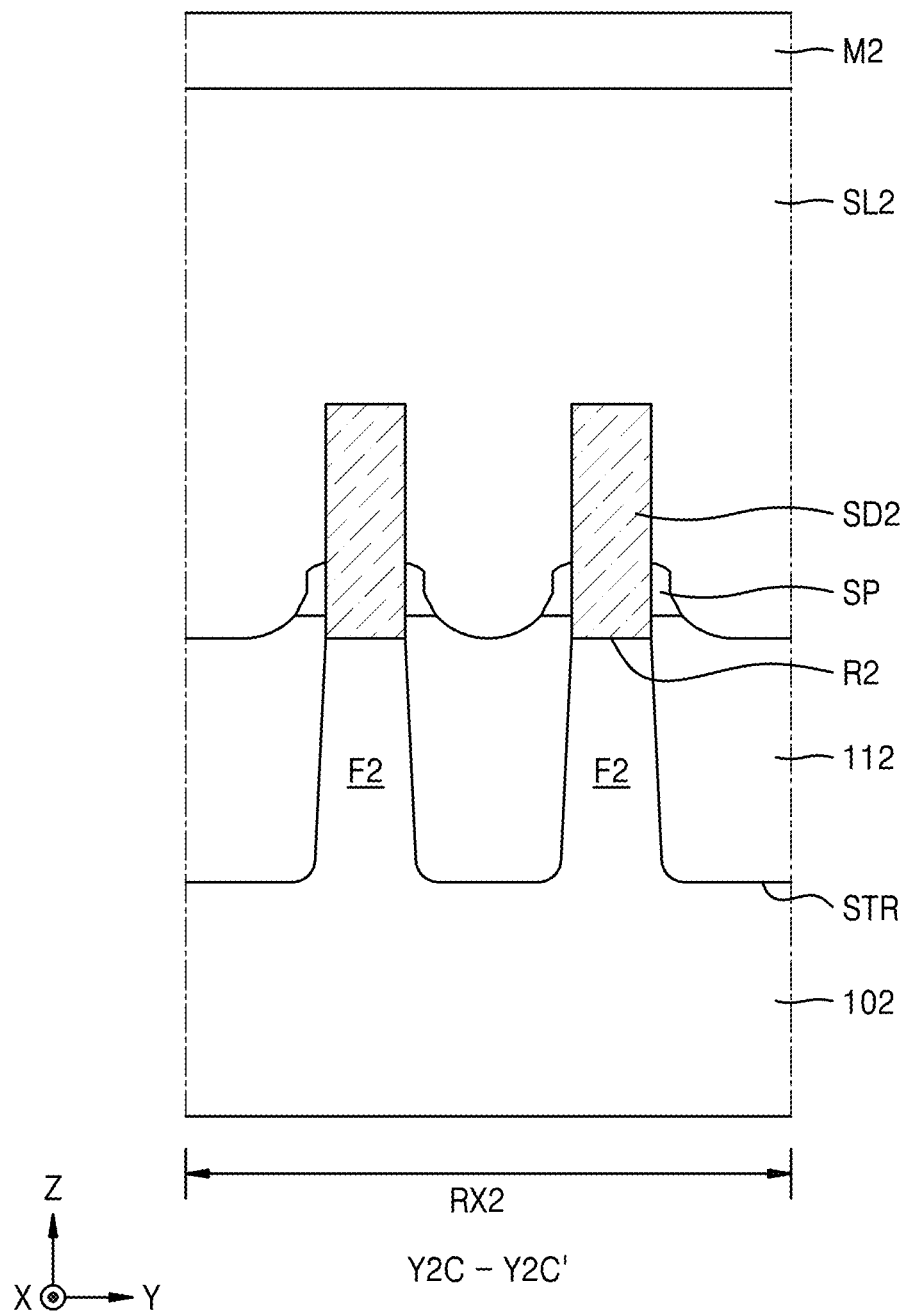
Figure 28A:
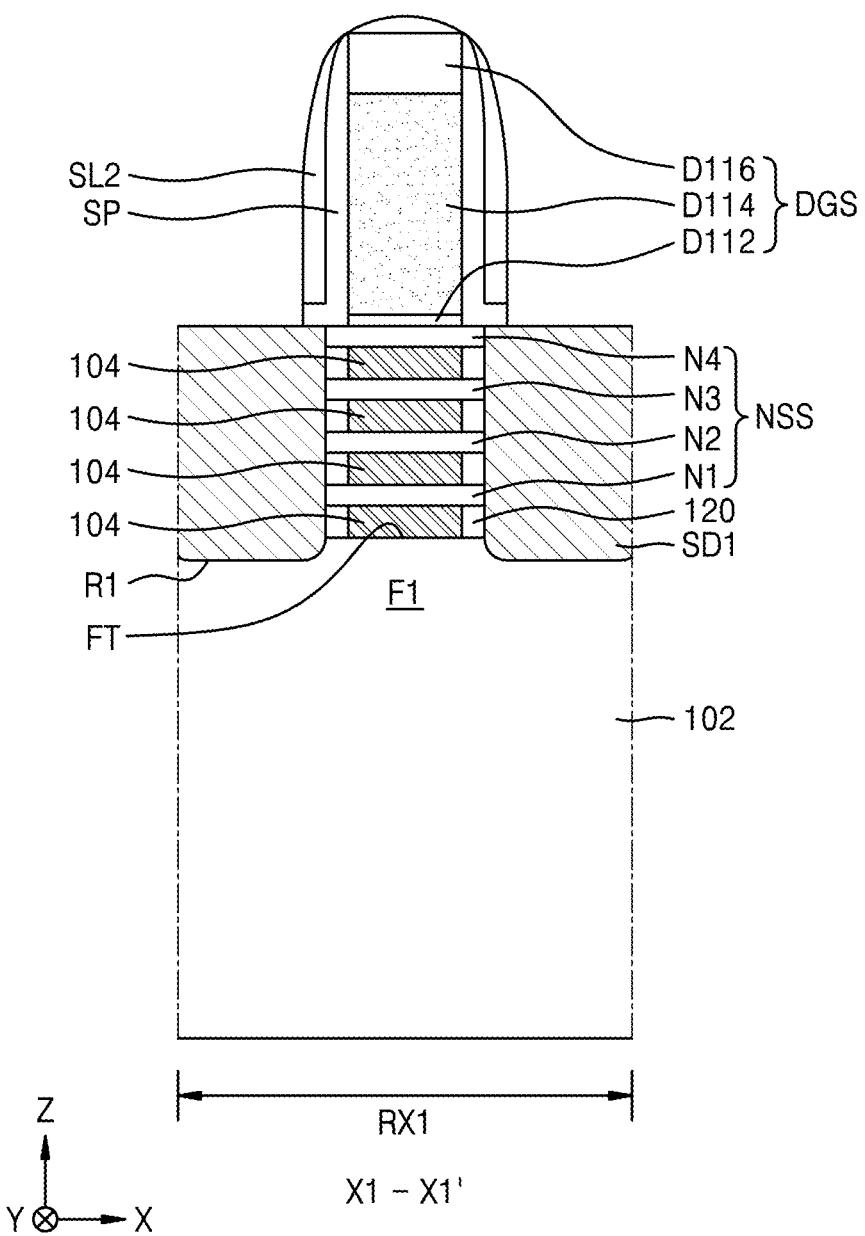
Figure 28B:
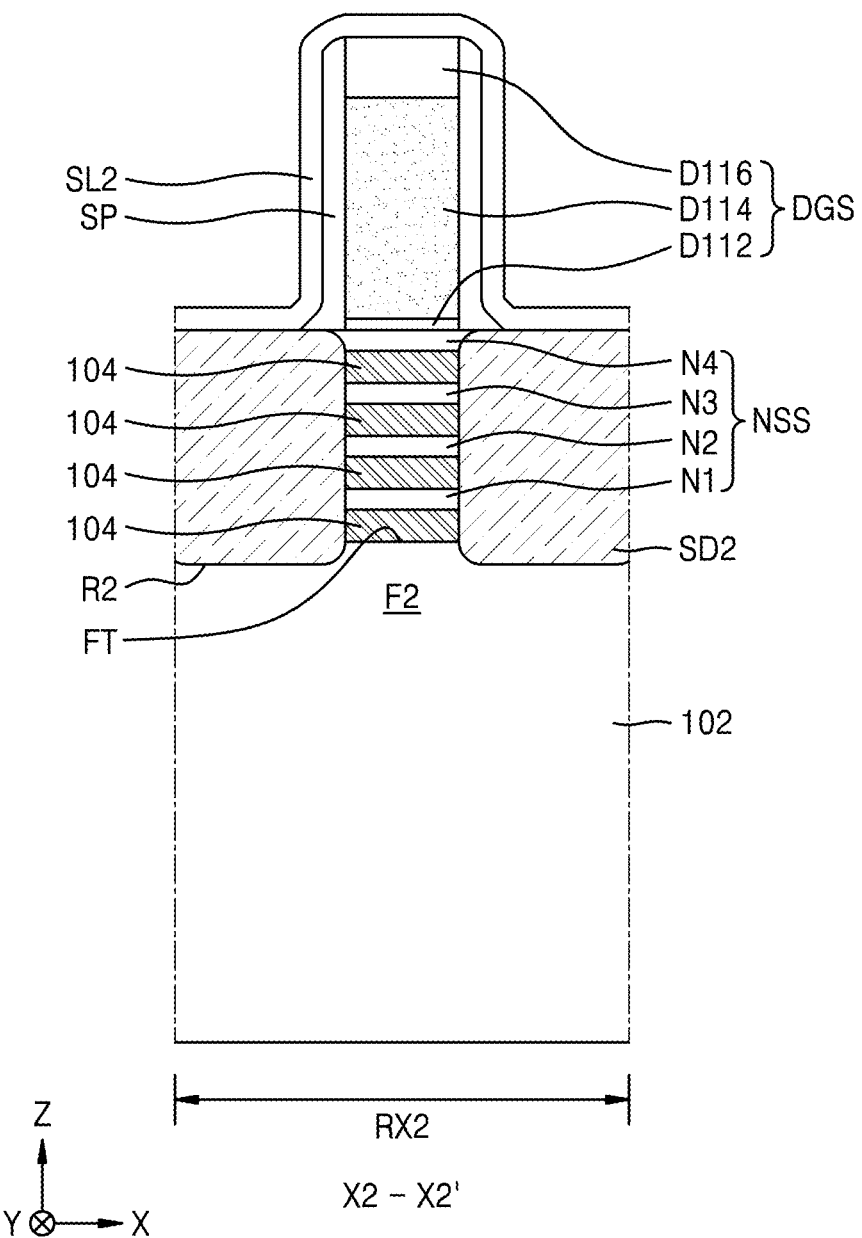
Figure 28C:
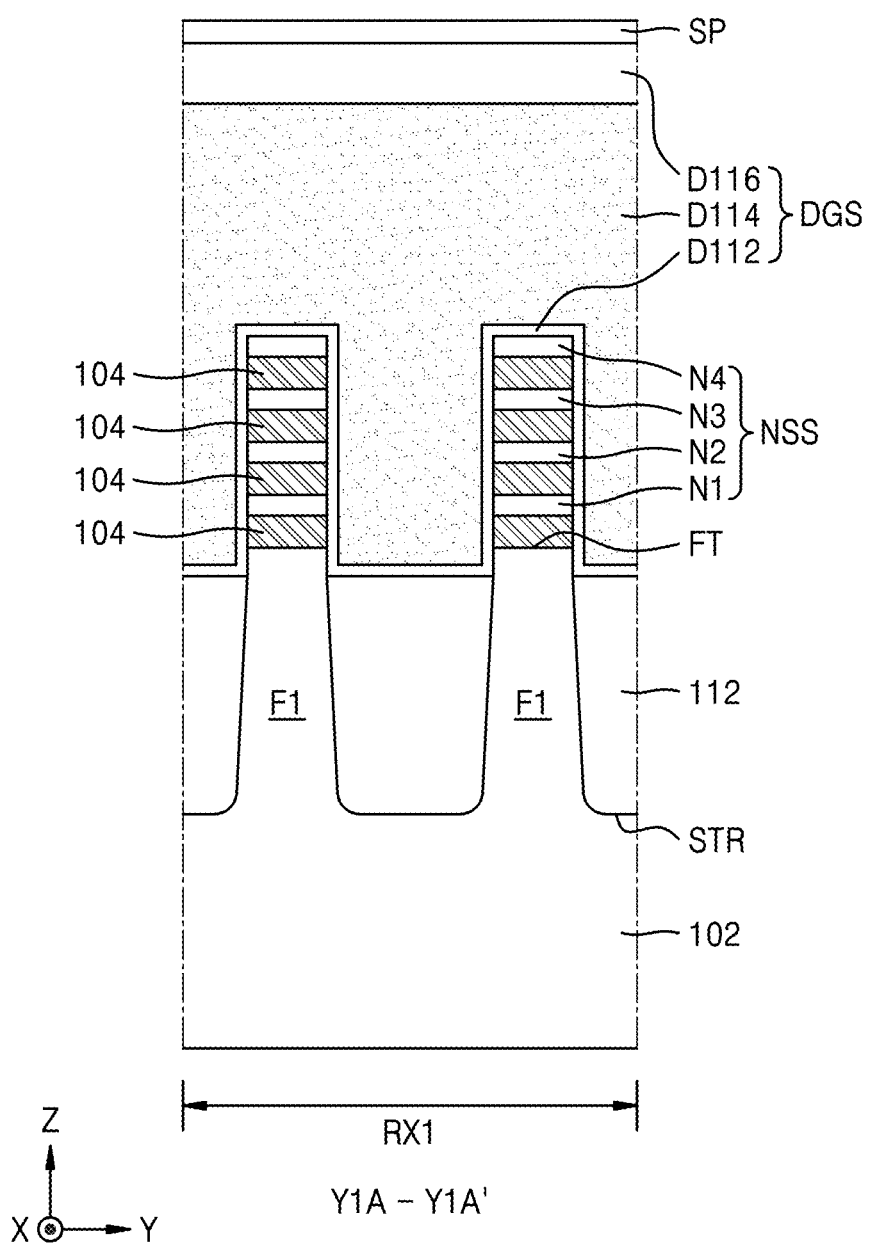
Figure 28D:
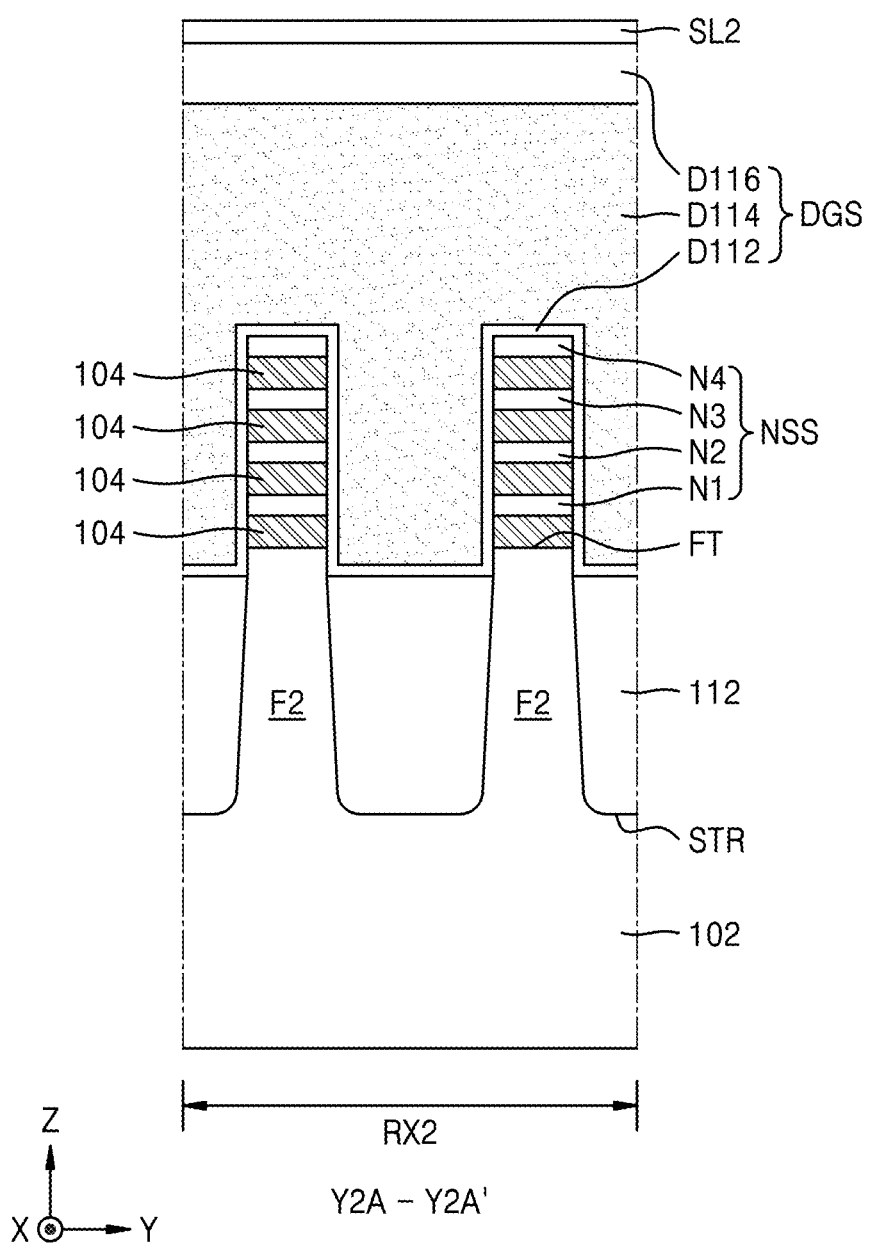
Figure 28E:
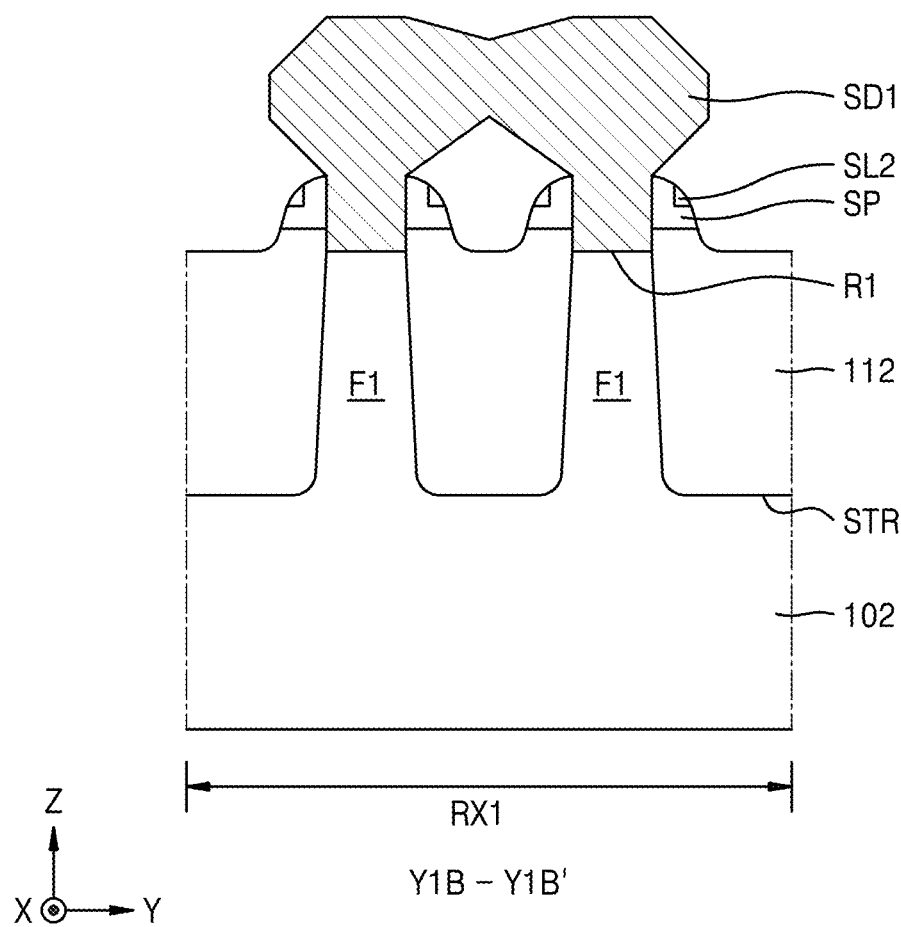
Figure 28F:
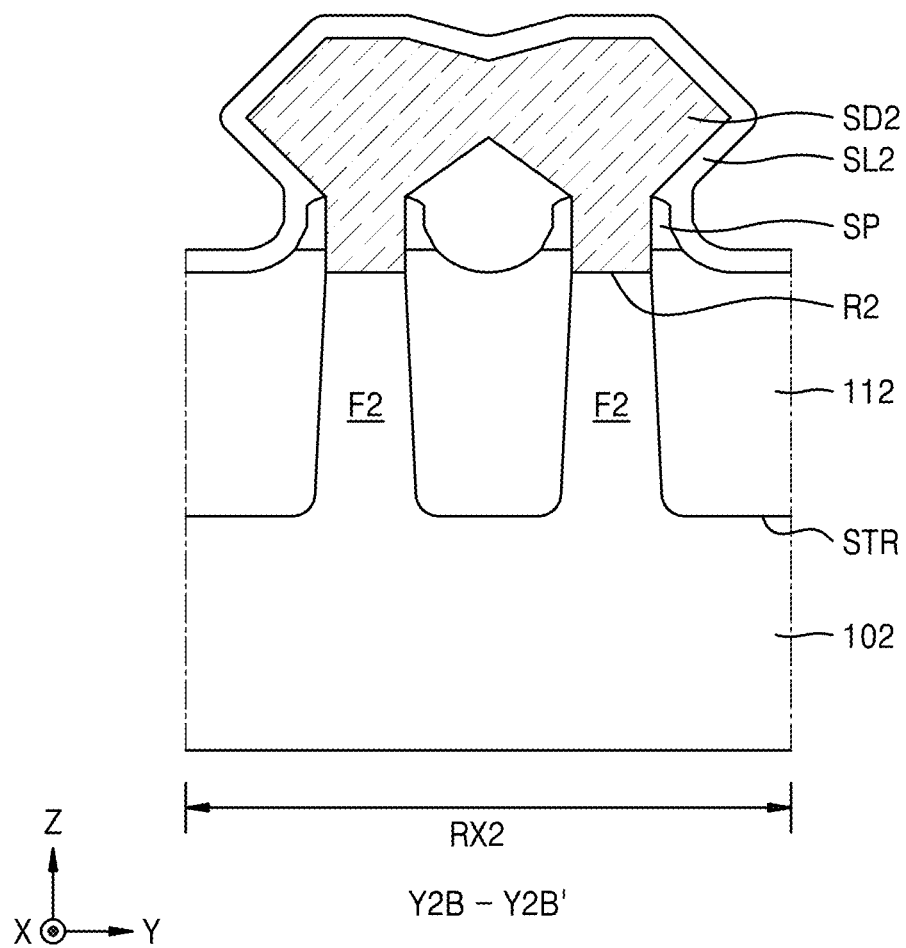
Figure 28G:
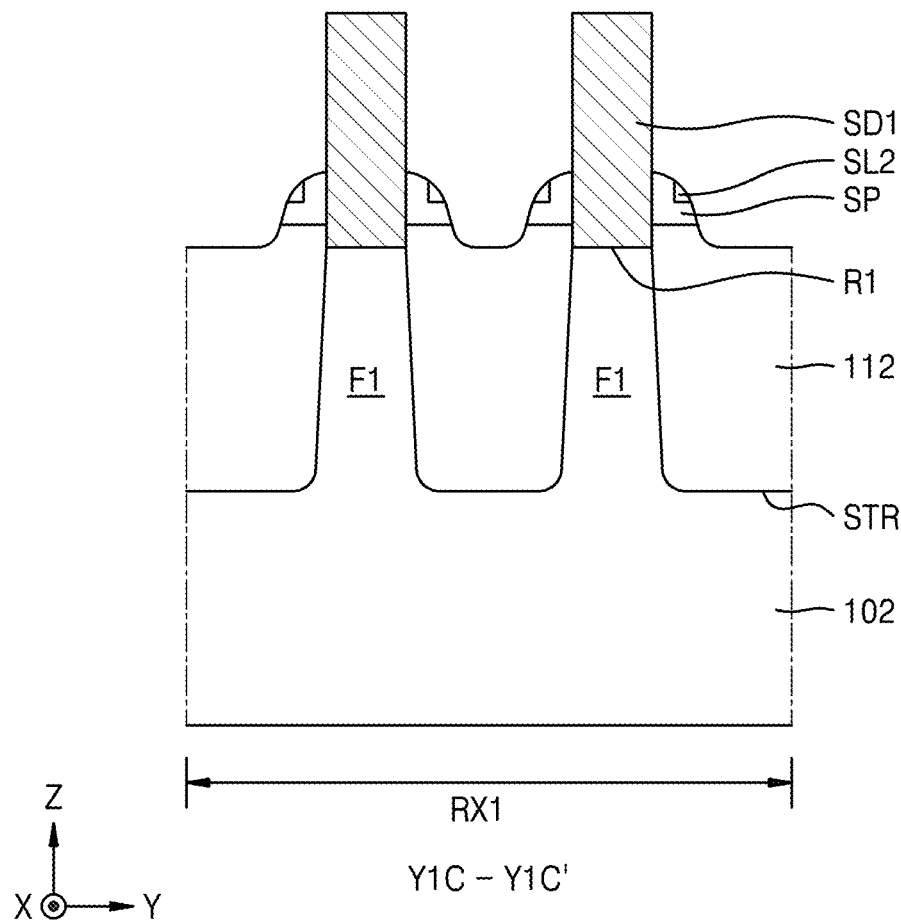
Figure 28H:
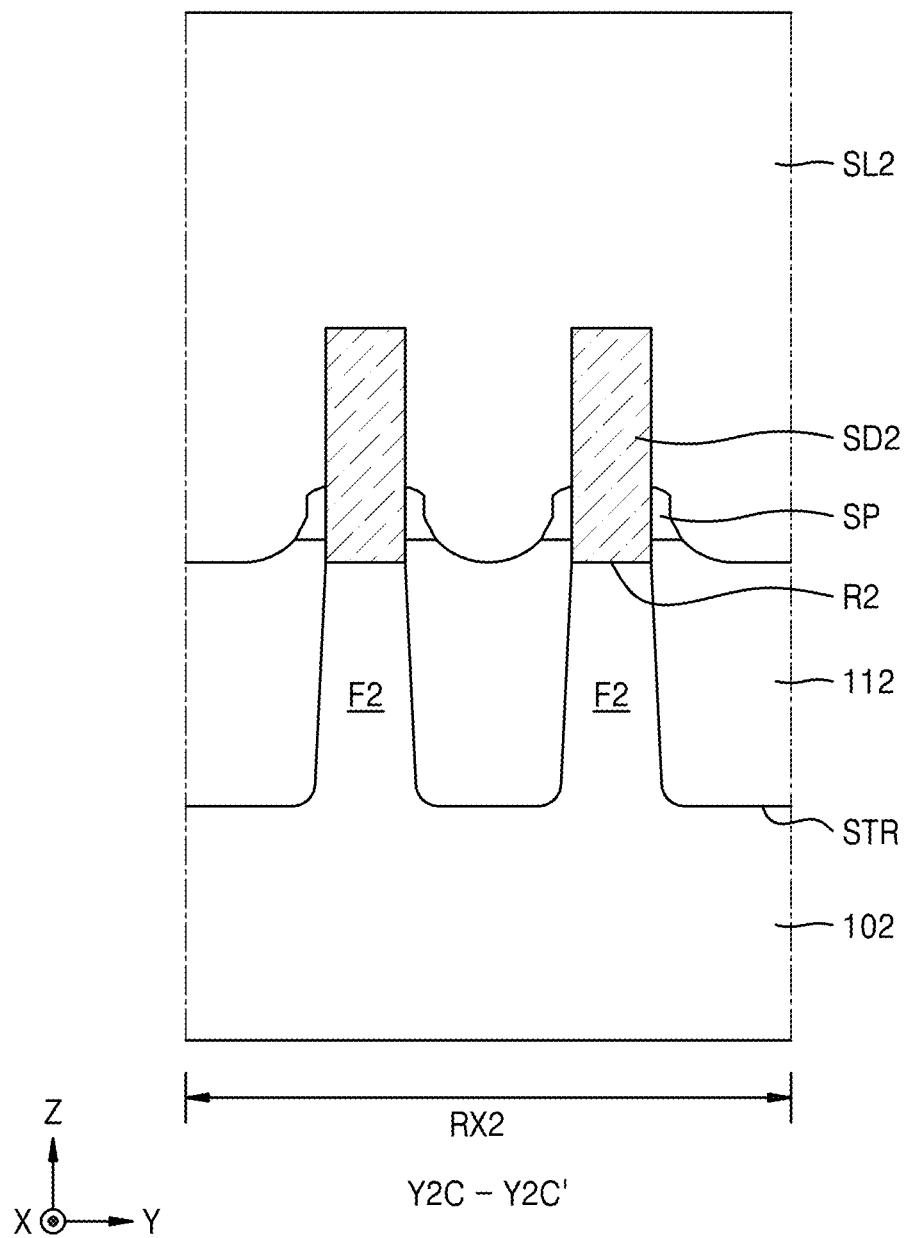
Figure 29A:
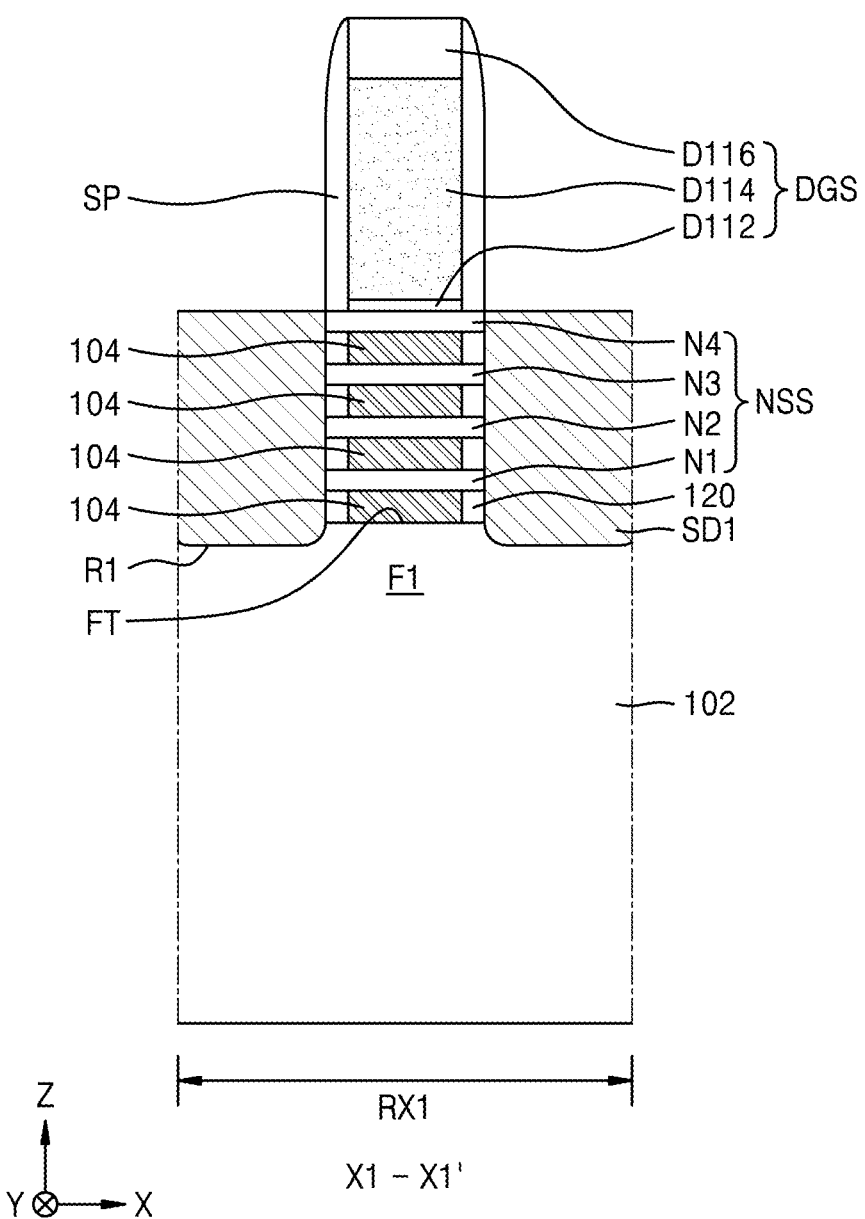
Figure 29B:
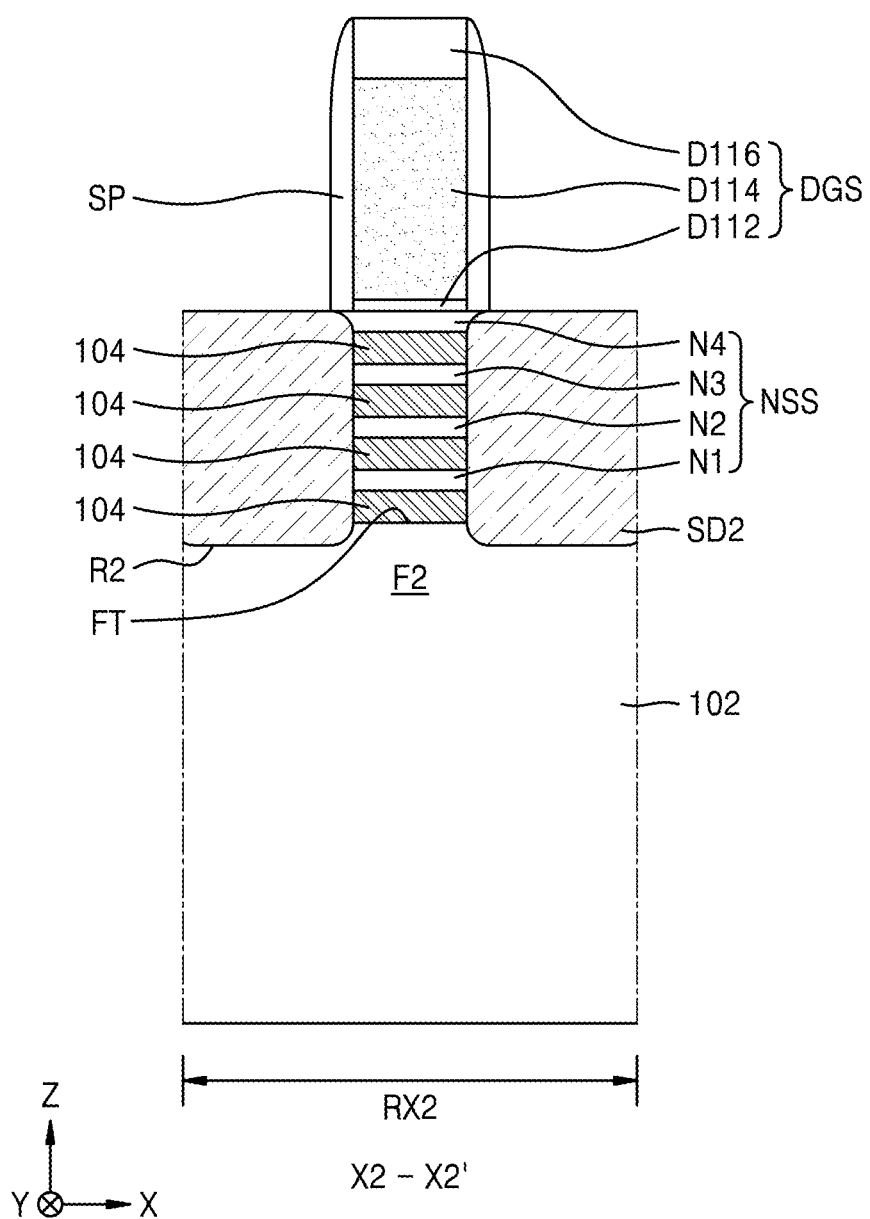
Figure 29C:
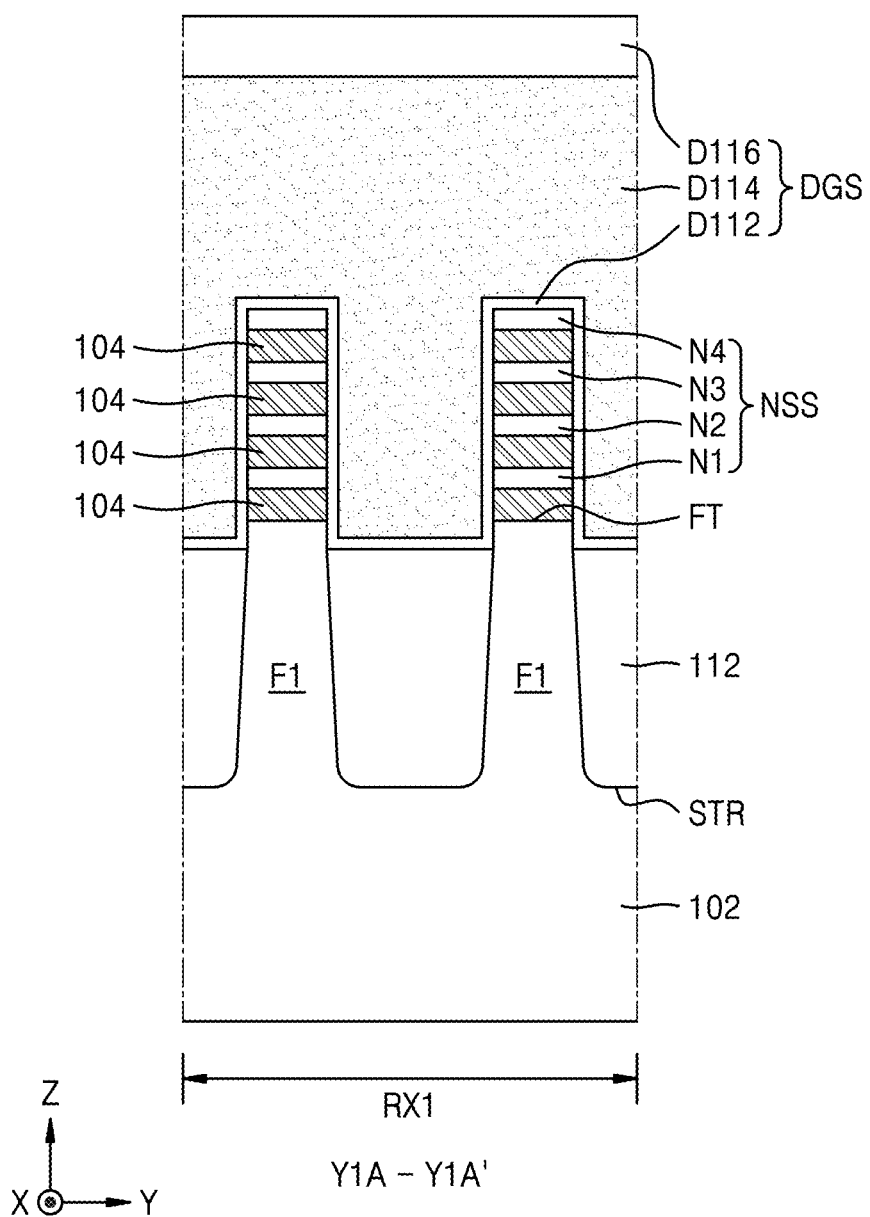
Figure 29D:
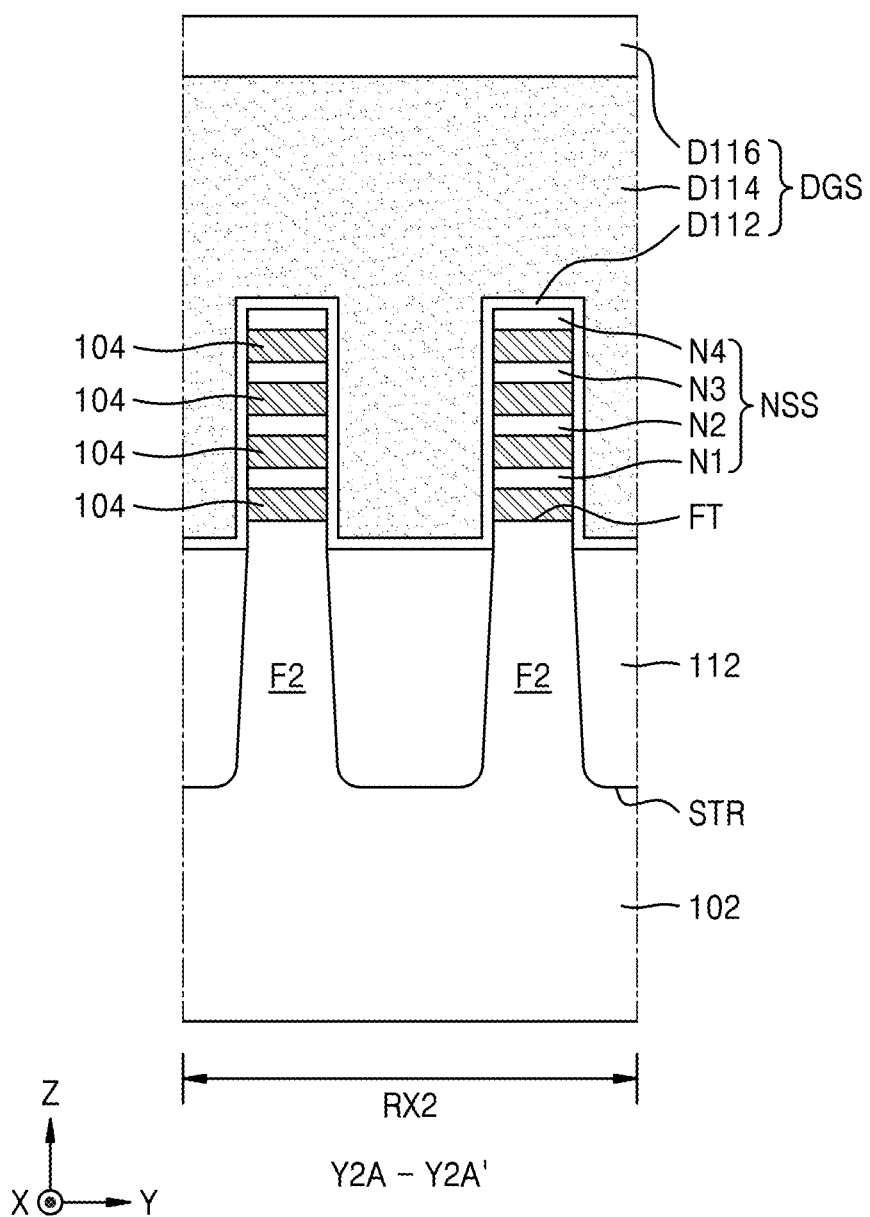
Figure 29E:
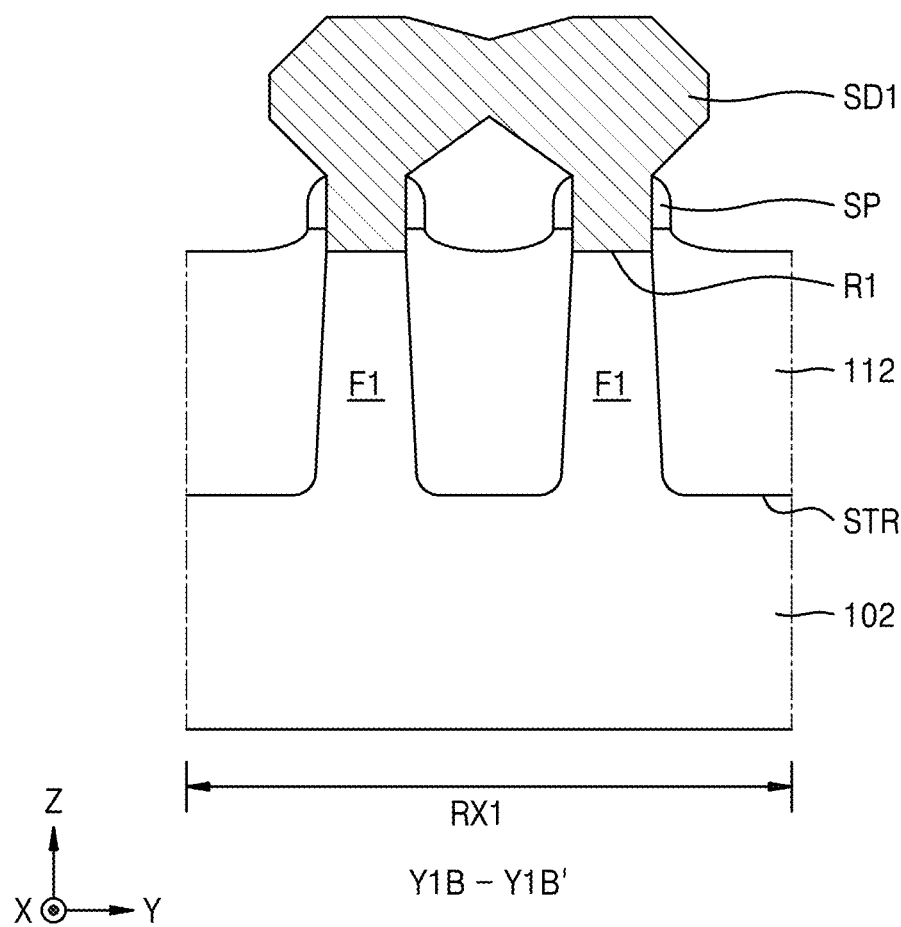
Figure 29F:
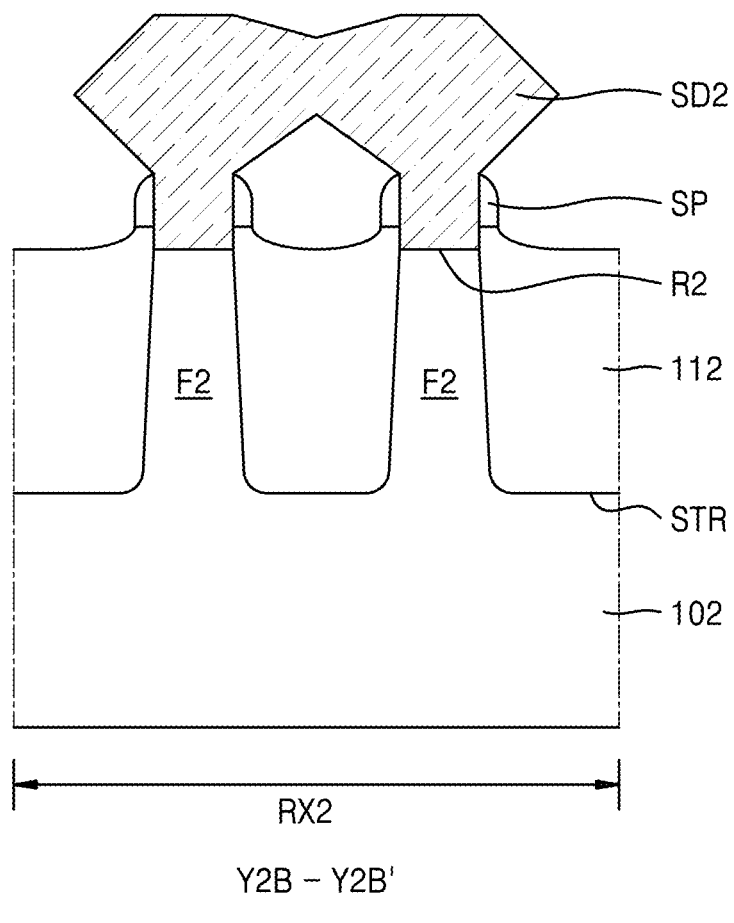
Figure 29G:
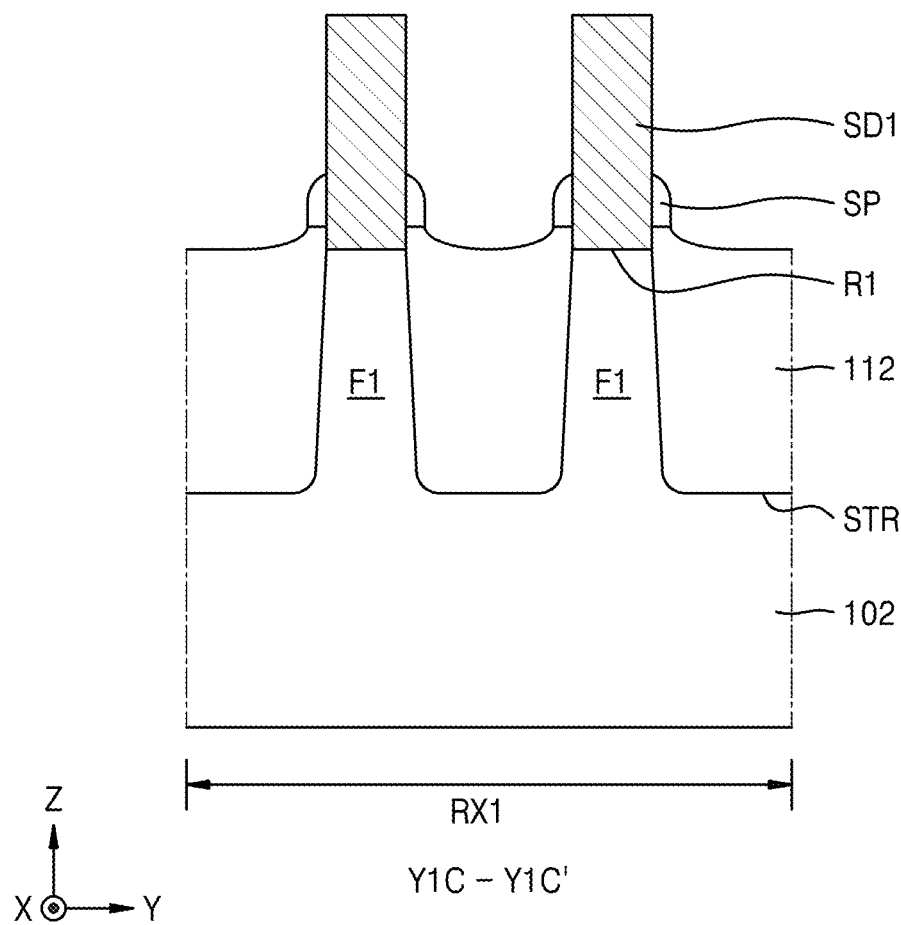
Figure 29H:
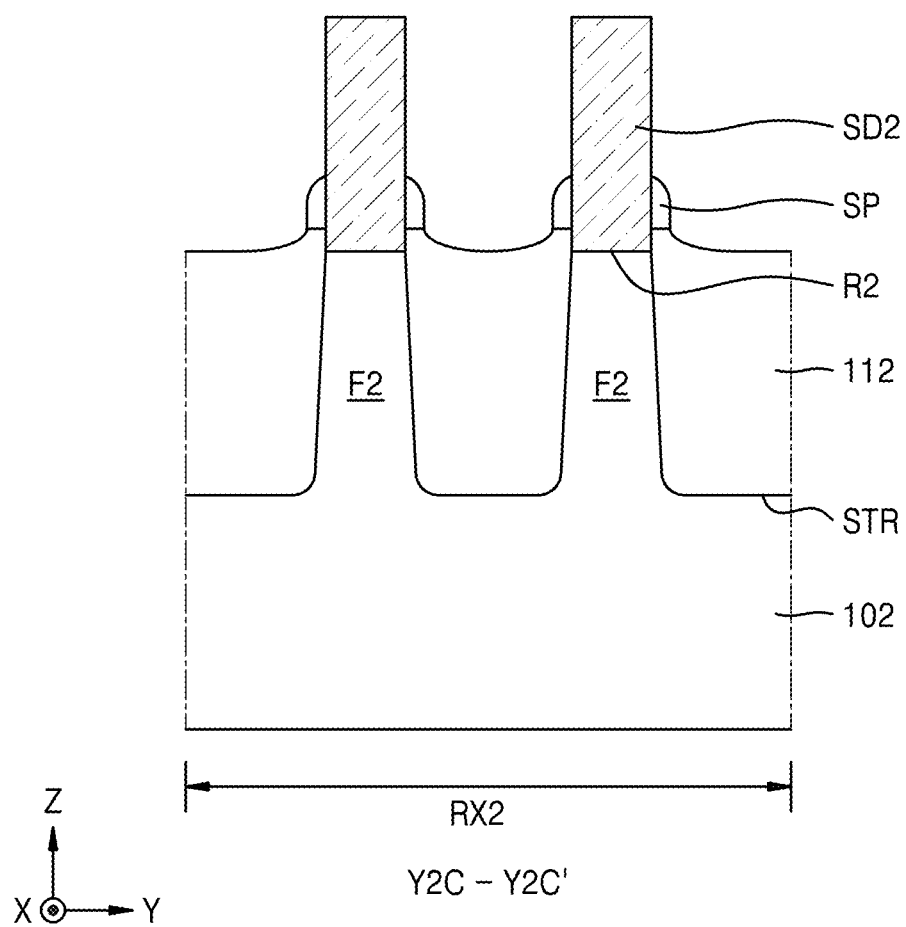
Figure 30A:
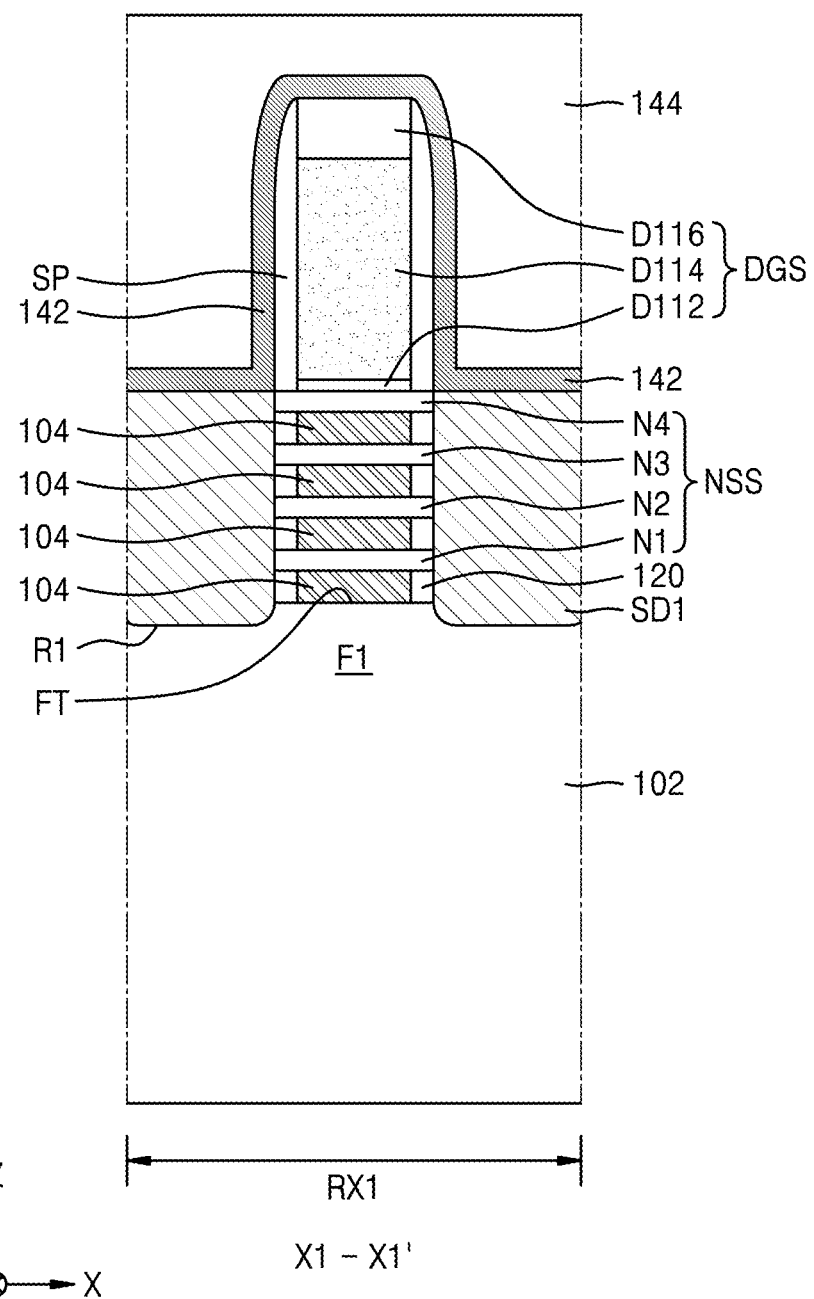
Figure 30B:
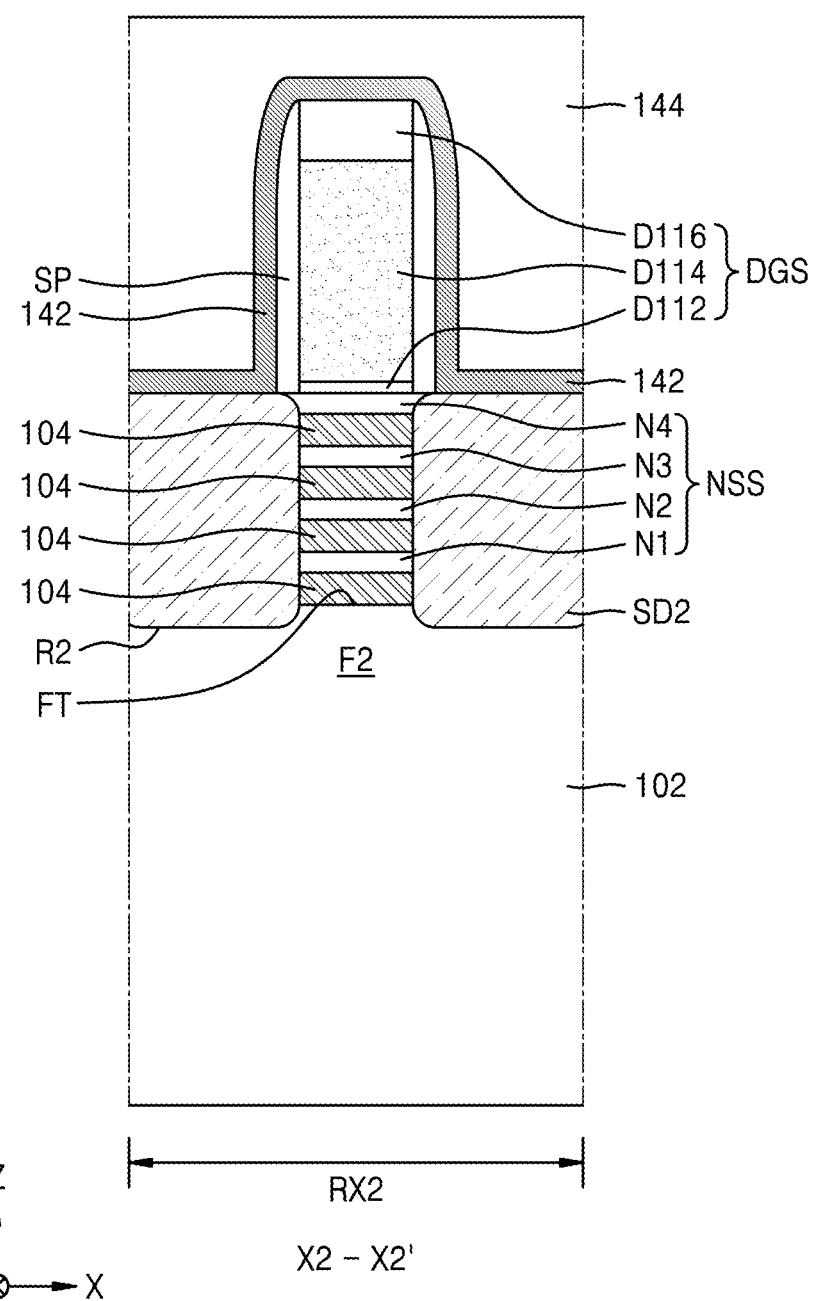
Figure 30C:
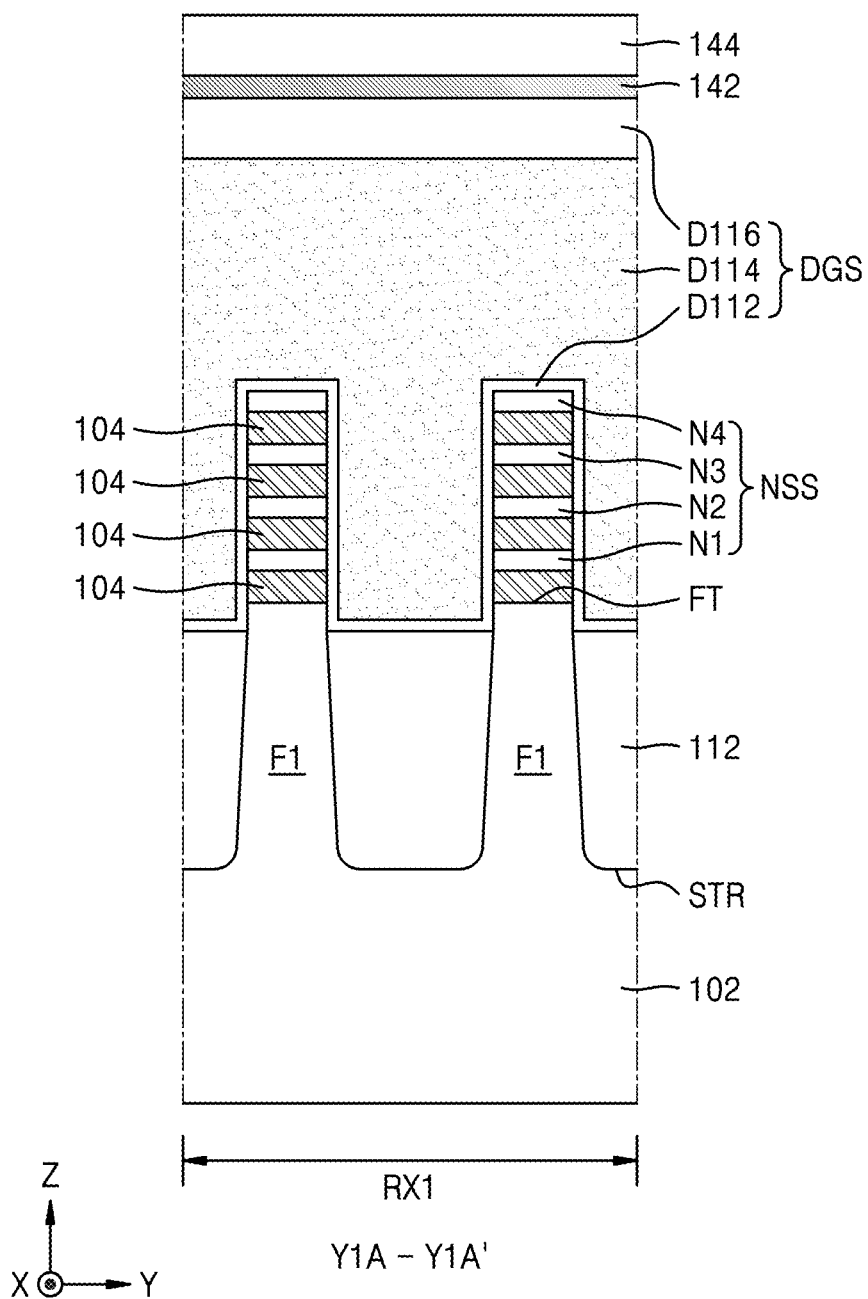
Figure 30D:
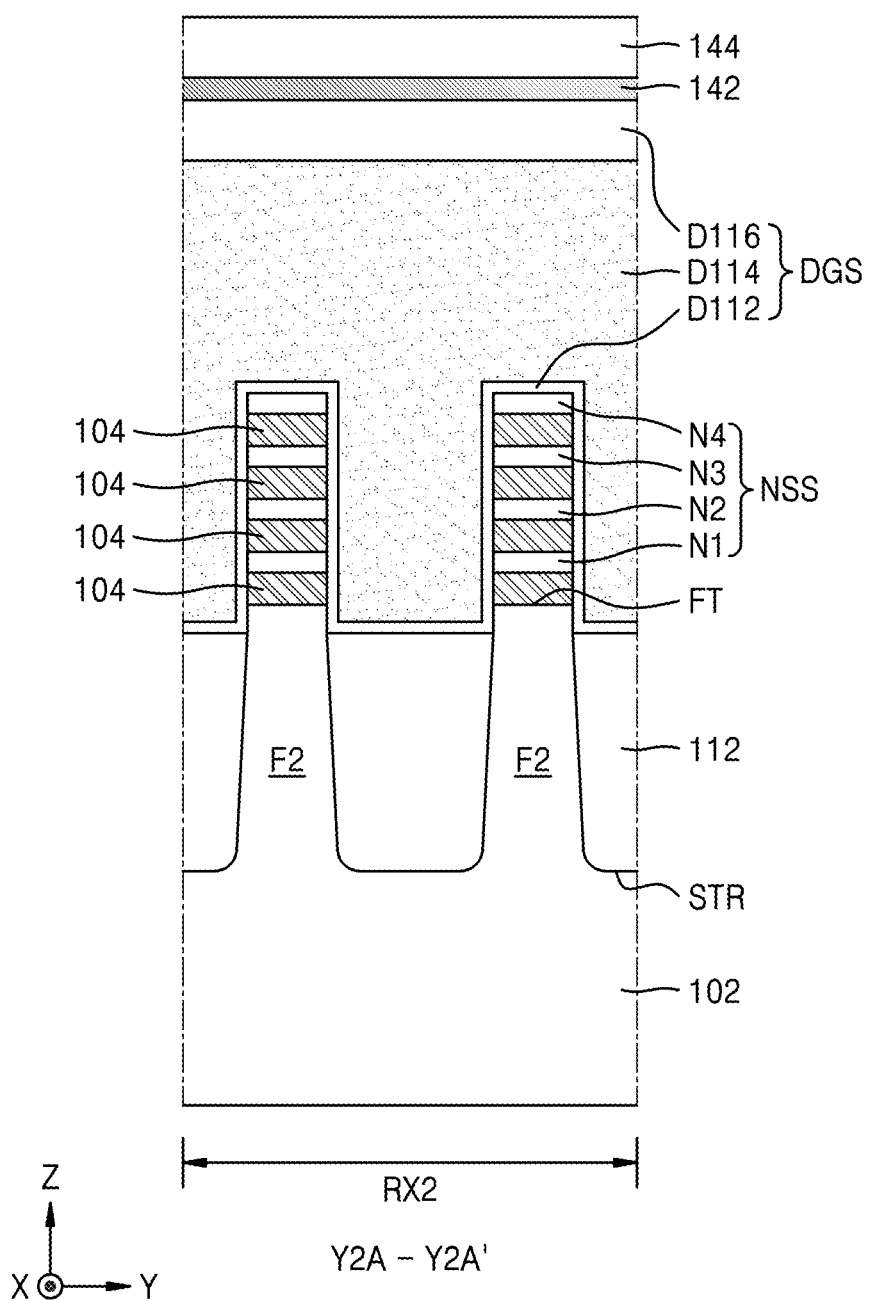
Figure 30E:
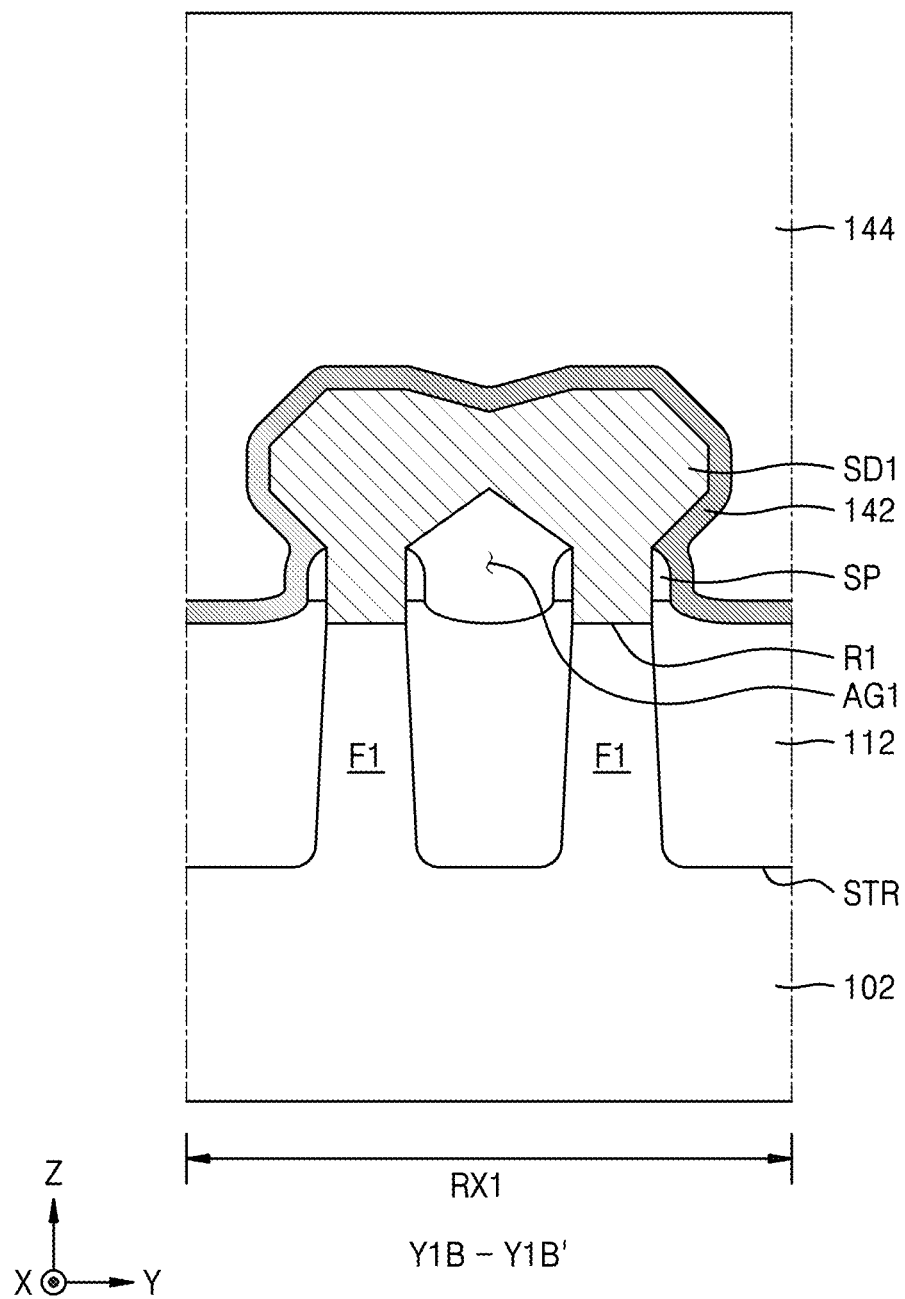
Figure 30F:
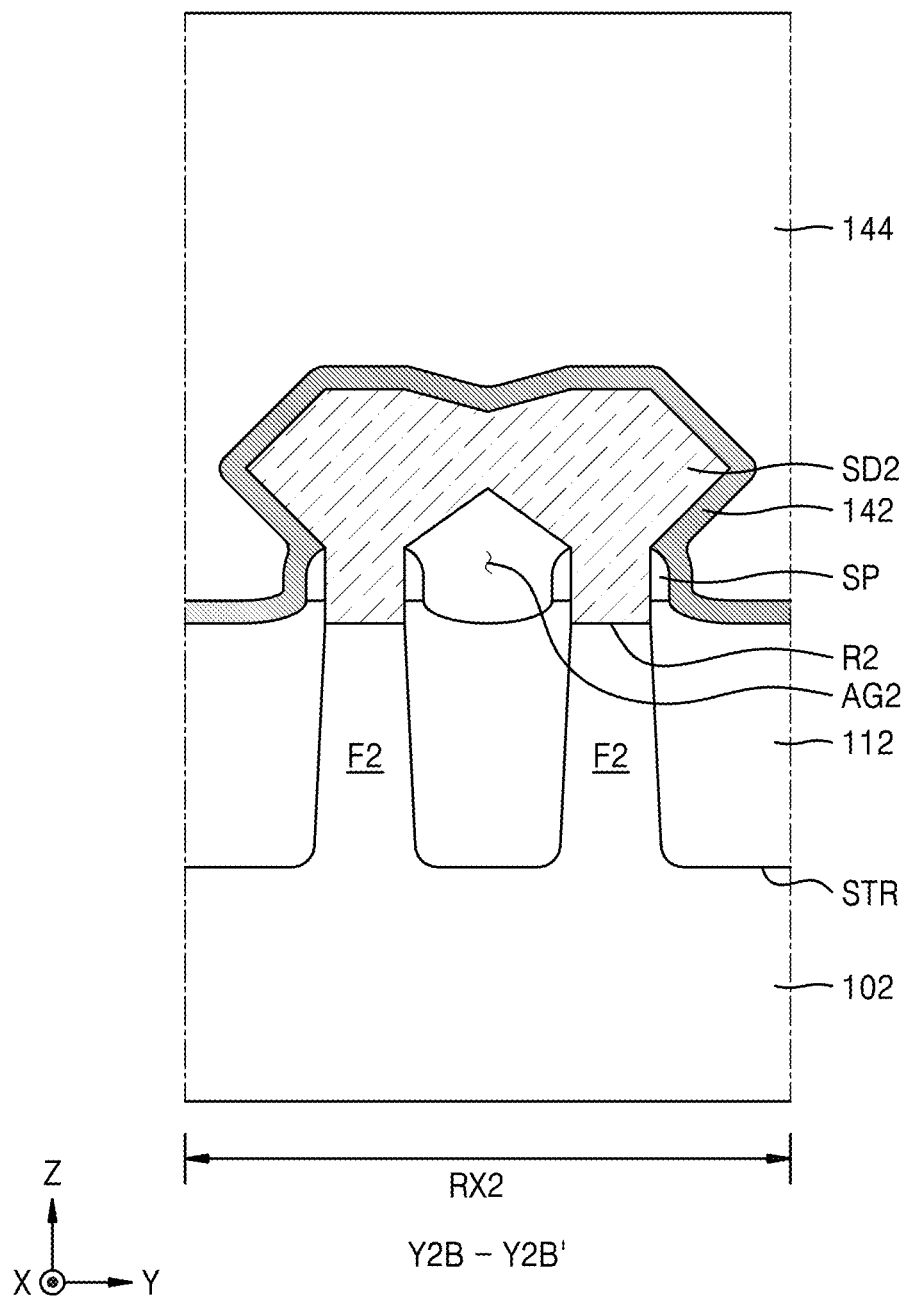
Figure 30G:
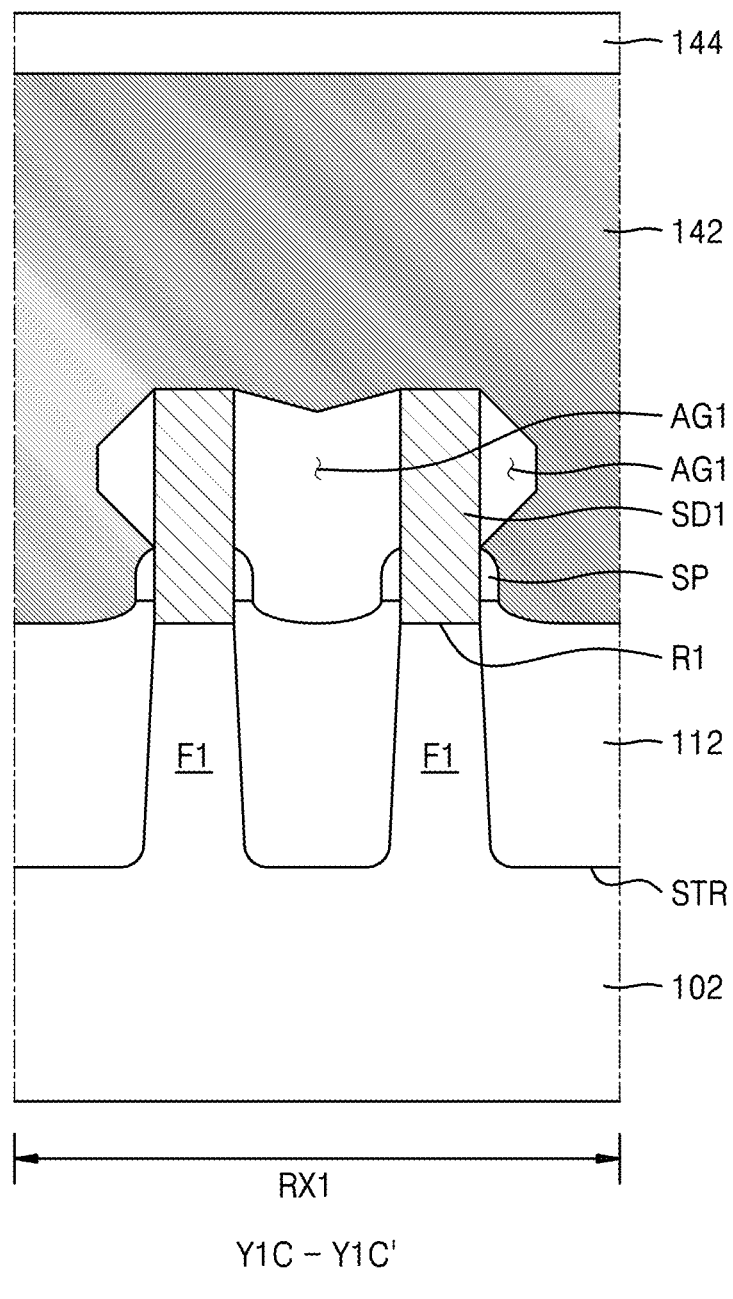
Figure 30H:
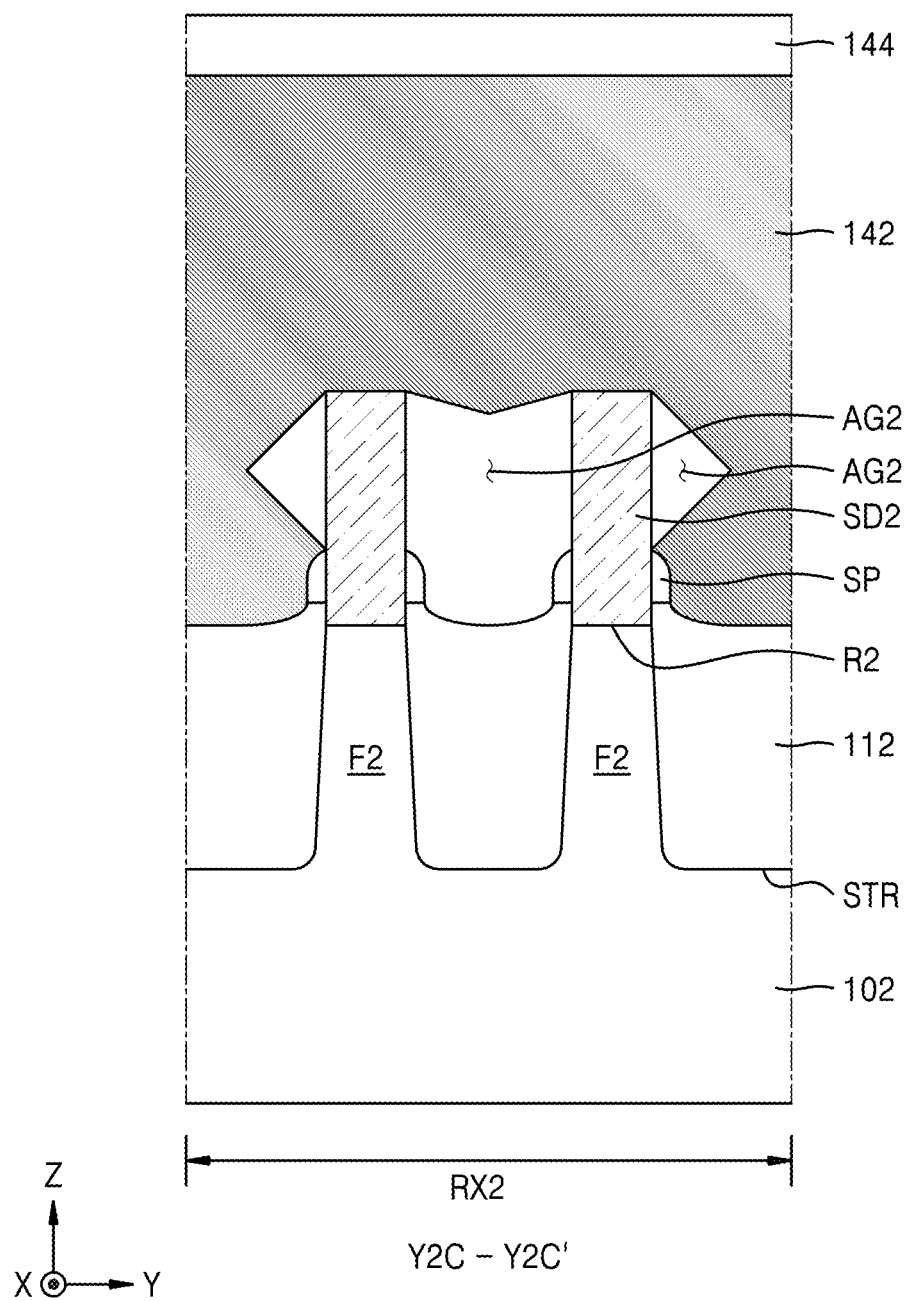
Figure 31A:
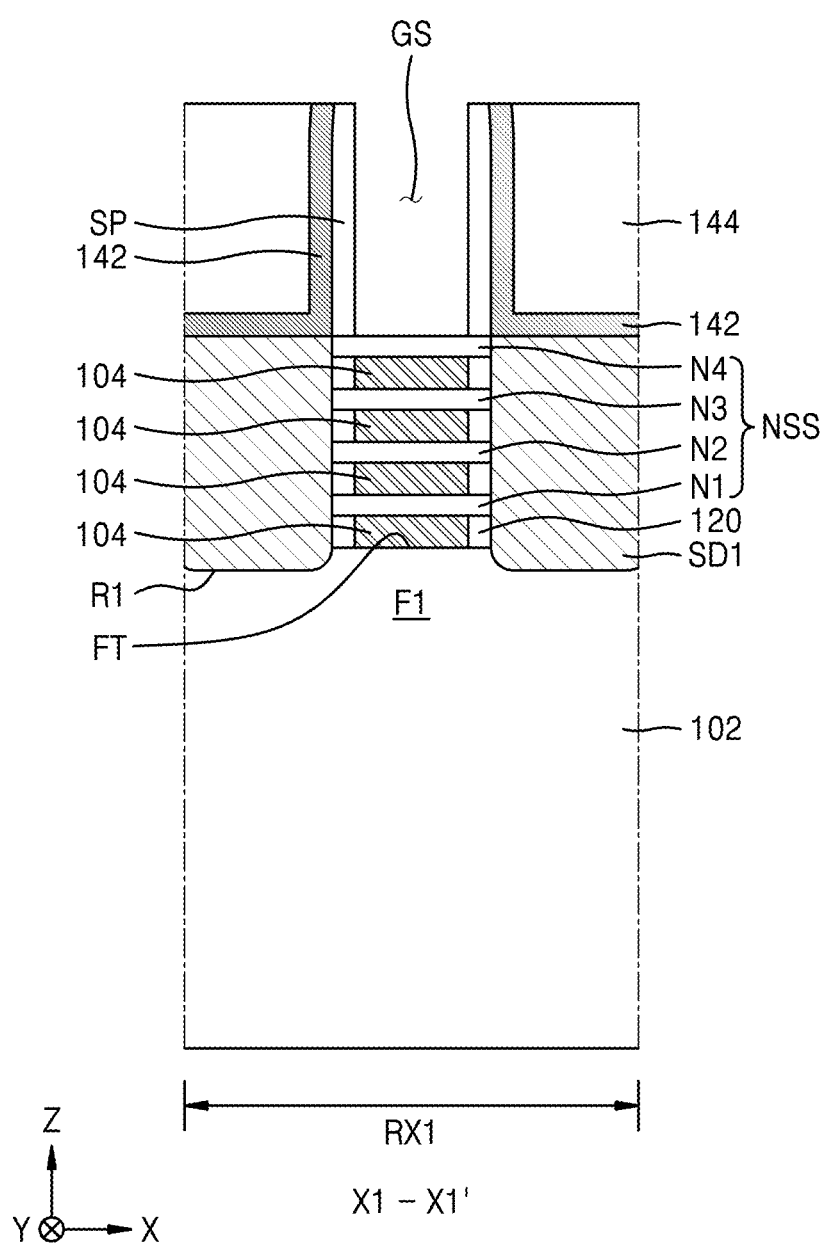
Figure 31B:
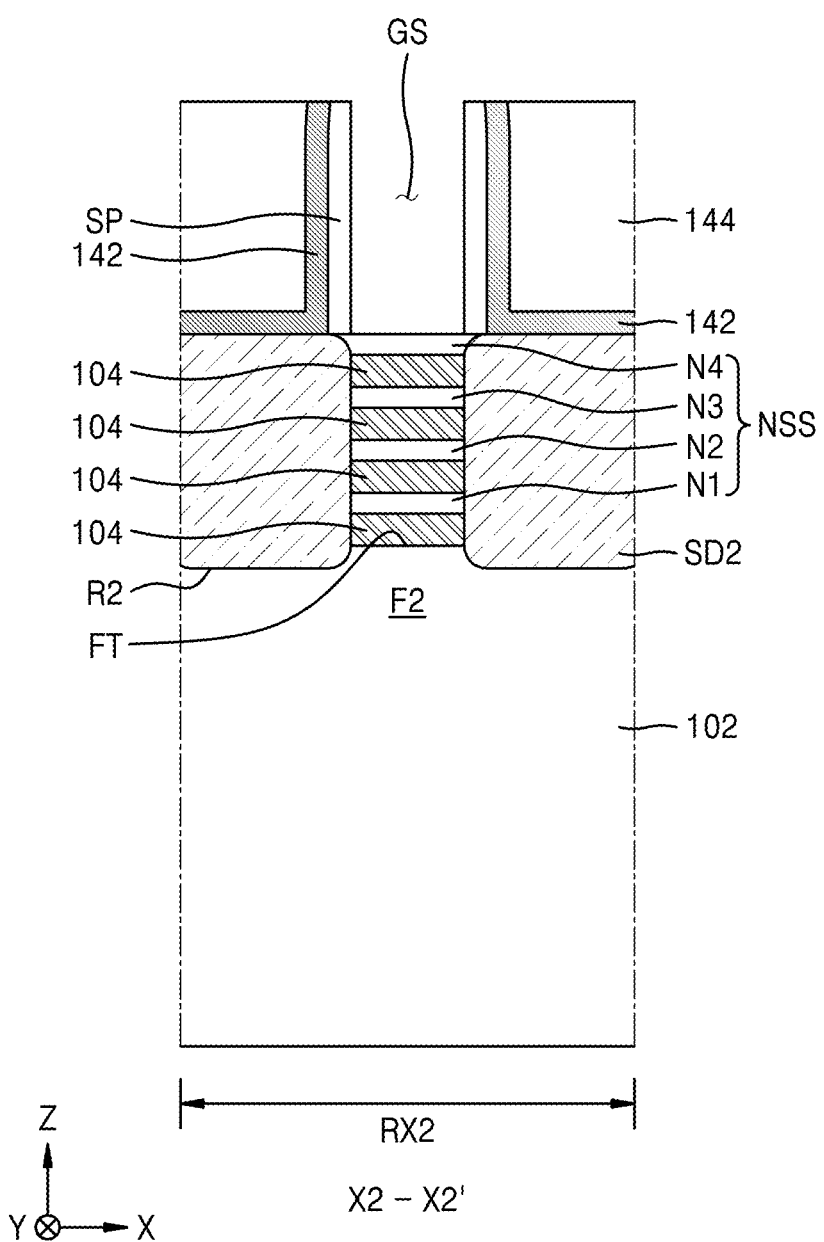
Figure 31C:
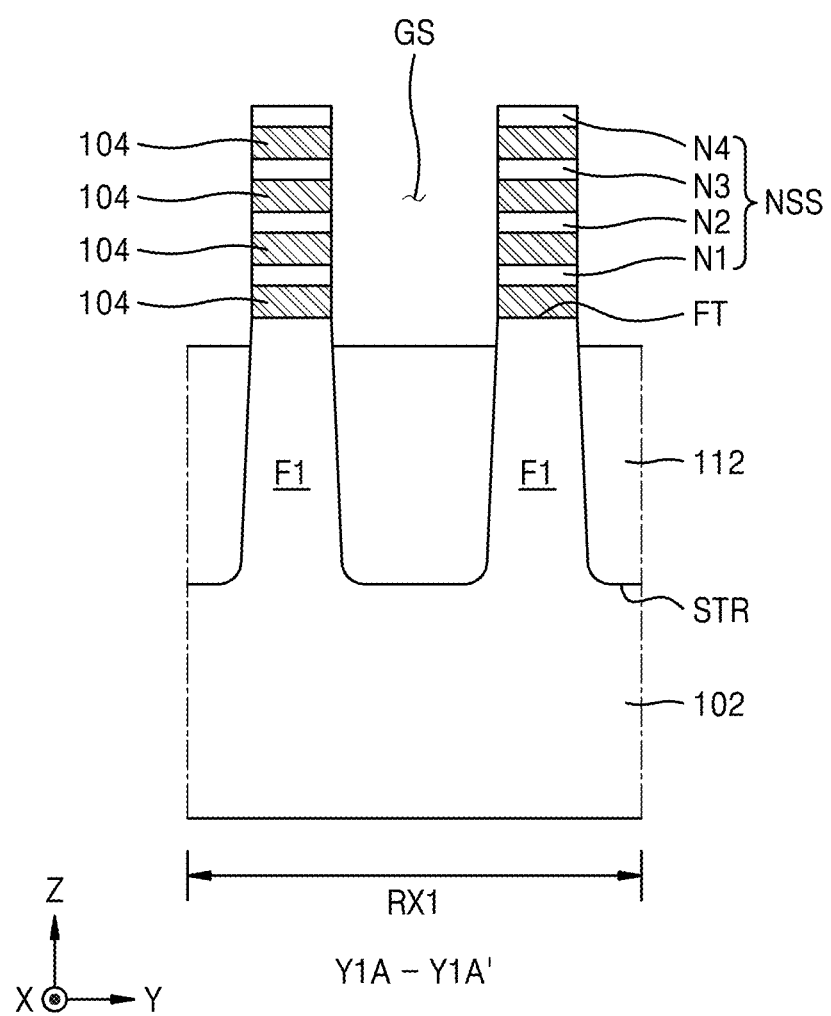
Figure 31D:
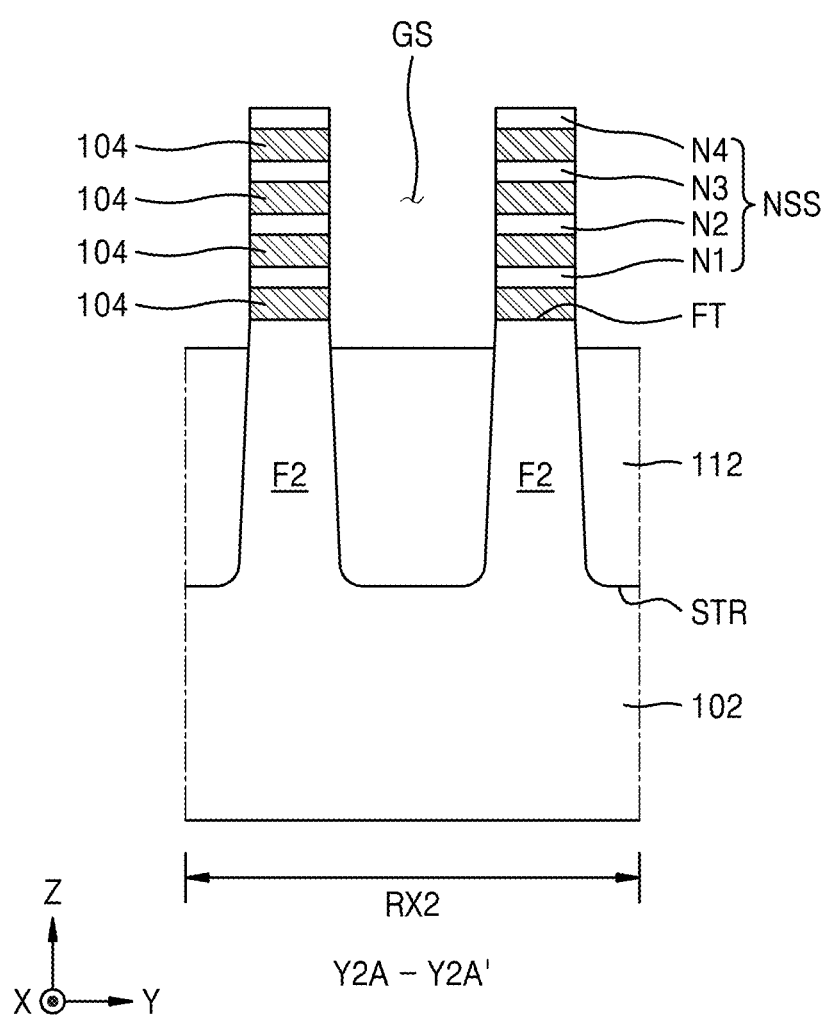
Figure 32A:
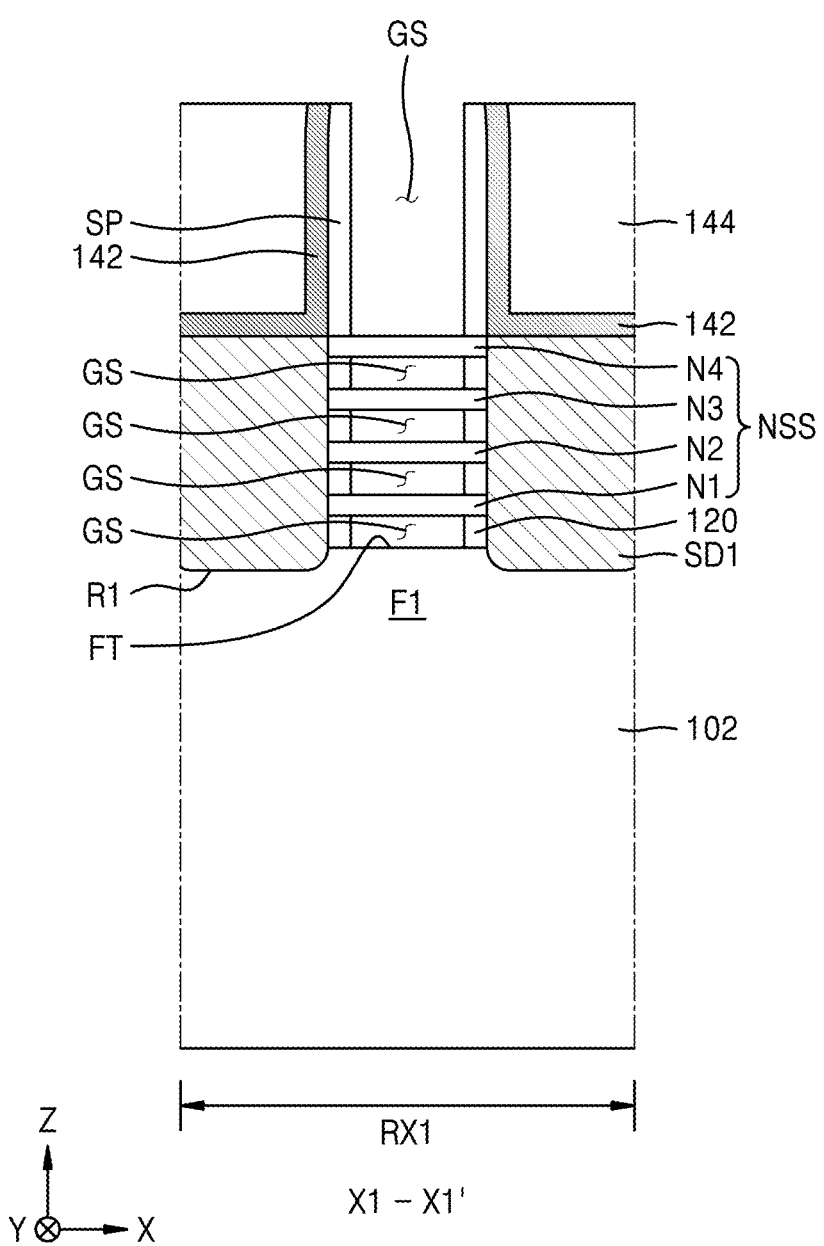
Figure 32B:
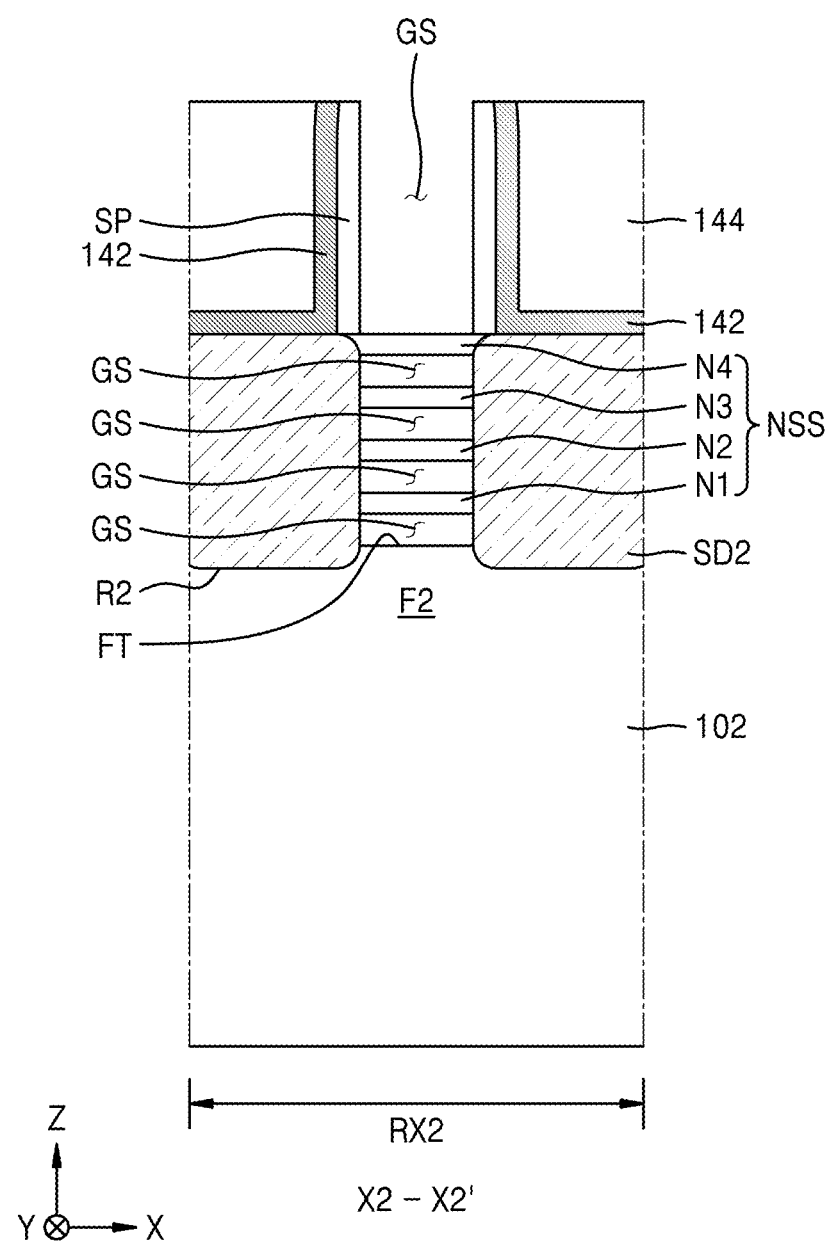
Figure 32C:
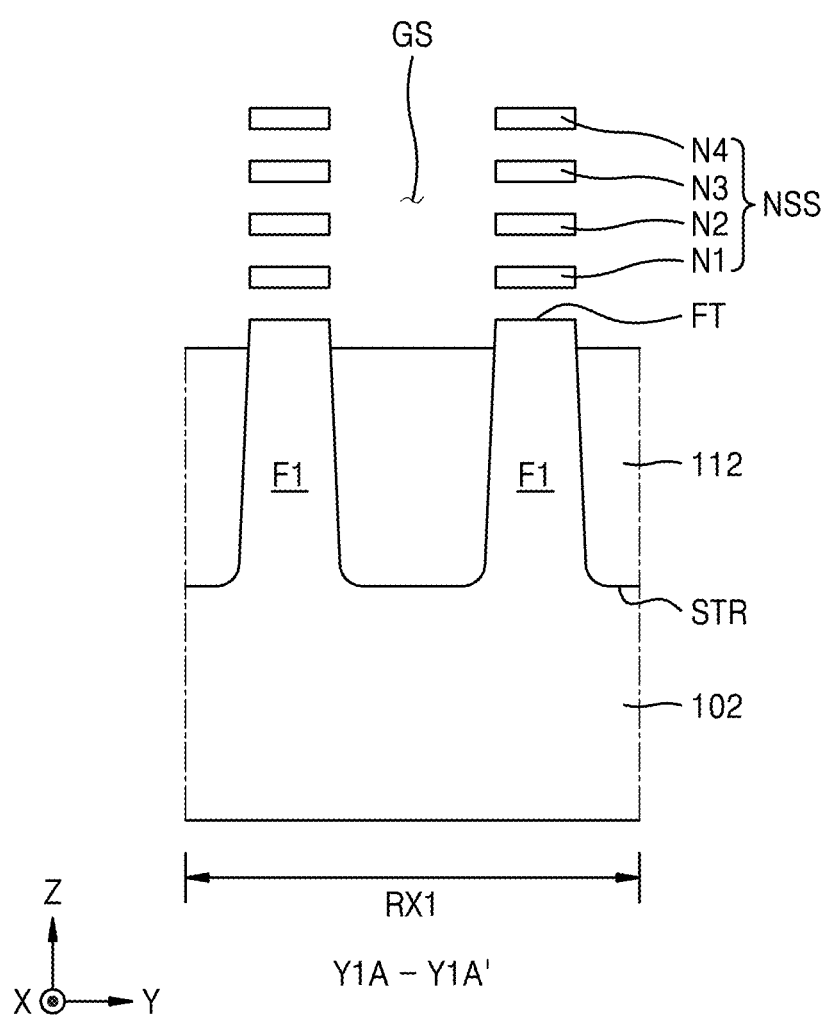
Figure 32D:
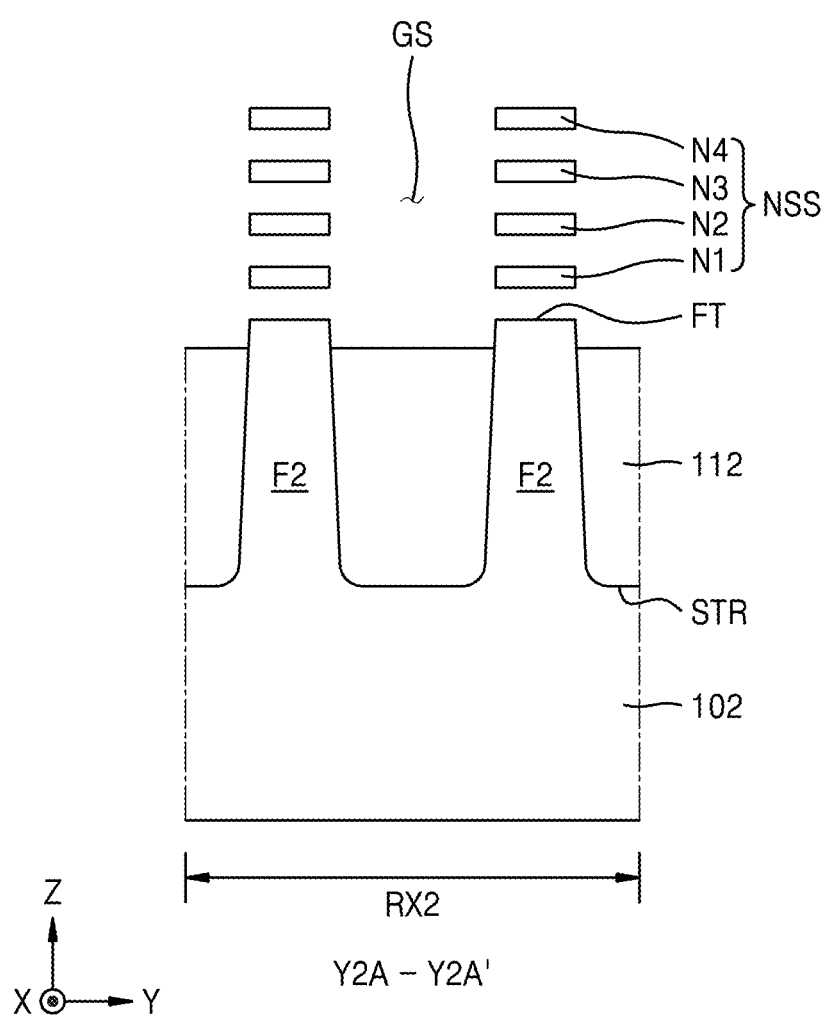
Figure 33A:
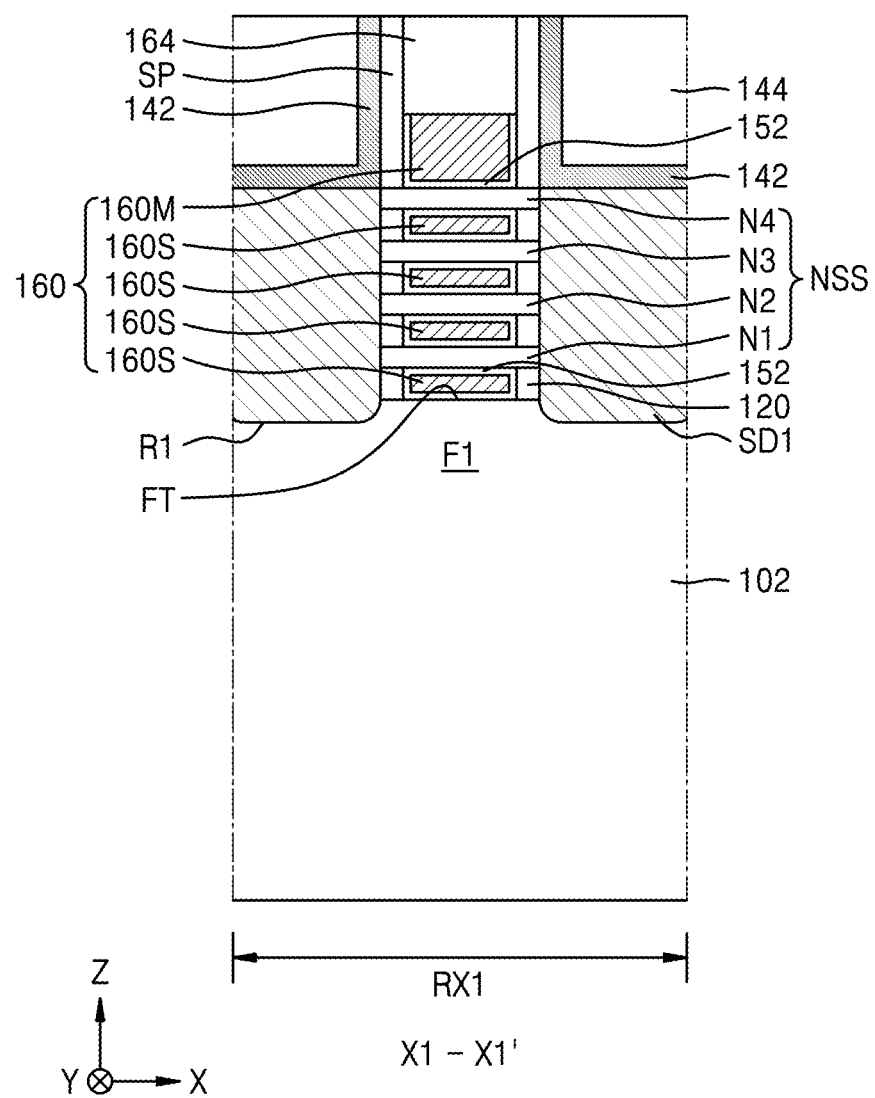
Figure 33B:
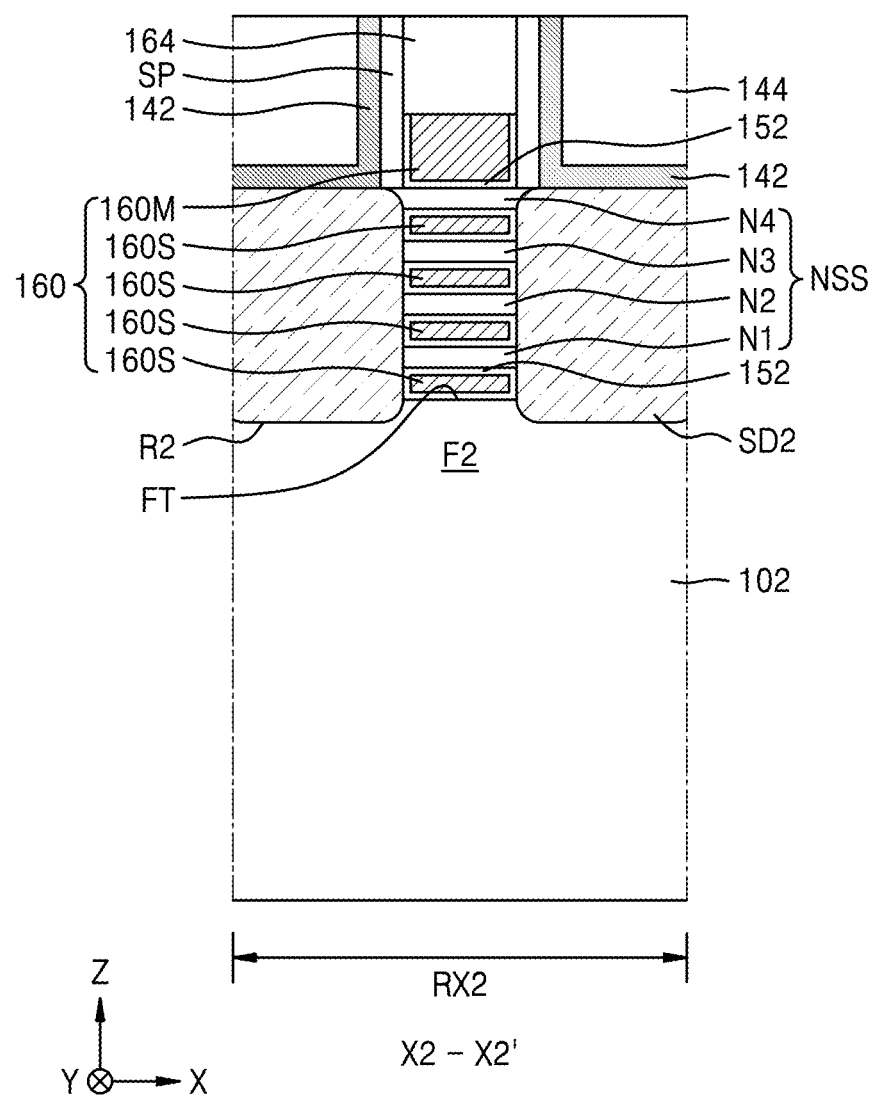
Figure 33C:
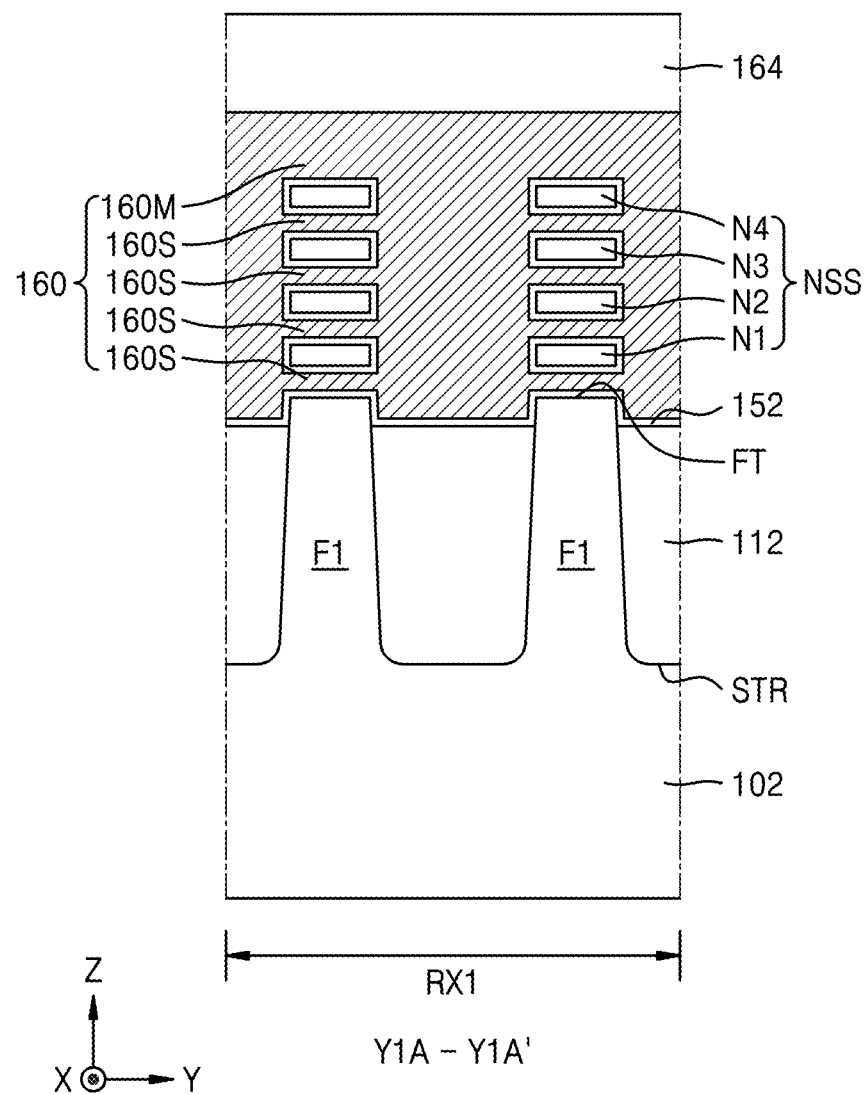
Figure 33D:
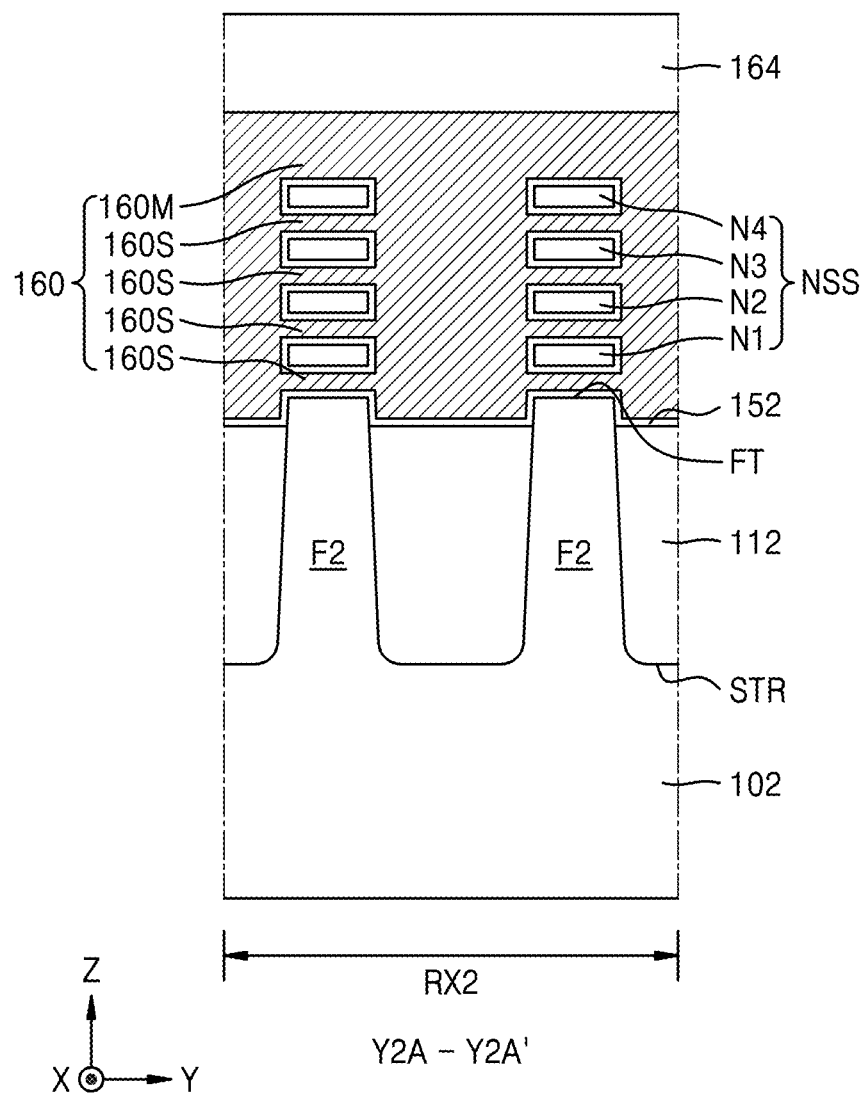

As illustrated in FIGS. 27E and 27G, in the first device region RX1, the insulating spacer SP may include lower portion regions adjacent to the bottoms of the plurality of the first recess R1 and covering the device isolation layer 112 on both sides of each of the plurality of the first recess R1, and upper portion regions covering a sidewall of the dummy gate structure DGS. The term "first recess" as used herein may also be referred to as a first area recess. Herein, the insulating spacer SP formed in the first device region RX1 may be referred to as a first region insulating spacer.

Referring to FIGS. 28A to 28H, after the second sacrificial insulating layer SL2 is exposed to the second device region RX2 by removing the second mask pattern M2 from a resultant product of FIGS. 27E and 27G, a plurality of a first source/drain region SD1 may be formed in the first device region RX1 to fill the plurality of the first recess R1.

To form the plurality of the first source/drain region SD1, a semiconductor material may be epitaxially grown from the surface of the first fin-type active region F1, which is exposed from the bottoms of the plurality of the first recess R1, and the sidewall of each of the plurality of nanosheets N1, N2, N3 and N4. In example embodiments, an LPCVD process, an SEG process, or a CDE process may be performed to form the plurality of the first source/drain region SD1. In example embodiments, the plurality of the first source/drain region SD1 may include a Si layer doped with an n-type dopant. To form the plurality of the first source/drain region SD1, $SiH_4$, $Si_2H_6$, $Si_3H_8$, $SiH_2Cl_2$, or the like may be used as the Si source. The n-type dopant may be selected from phosphorus (P), arsenic (As), and antimony (Sb). While the plurality of the first source/drain region SD1 are formed, a plurality of a first source/drain region SD1 adjacent to each other may be connected to each other. Herein, the first source/drain region SD1 may be referred to as a second conductivity-type source/drain region.

Referring to FIGS. 29A to 29H, in the results of FIGS. 28A to 28H, the second sacrificial insulating layer SL2 remaining in the first device region RX1 and the second device region RX2 may be selectively etched.

A wet etching process may be used to selectively etch the second sacrificial insulating layer SL2 in the first device region RX1 and the second device region RX2, but is not limited thereto. In example embodiments, while the second sacrificial insulating layer SL2 is selectively etched, a portion of each of the insulating spacer SP and the device isolation layer 112 in the first device region RX1 and the second device region RX2 may be consumed, but the consumption amount may be little.

After the second sacrificial insulating layer SL2 is removed, in the first device region RX1 and the second device region RX2, the surface of the capping layer D116 of each of the plurality of the dummy gate structure DGS, the surface of the insulating spacer SP, the surface of the device isolation layer 112, the surface of each of the plurality of the first source/drain region SD1, and the surface of each of the plurality of the second source/drain region SD2 may be exposed. In addition, in the first device region RX1, a plurality of spaces exposing the insulating spacer SP and the first source/drain region SD1 may remain empty between the plurality of the first source/drain region SD1 and the dummy gate structure DGS, and in the second device region RX2, a plurality of spaces exposing the insulating spacer SP and the second source/drain region SD2 may remain empty between the plurality of the second source/drain region SD2 and the dummy gate structure DGS.

Referring to FIGS. 30A to 30H, an insulating liner 142 that conformally covers exposed surfaces in a resultant product of FIGS. 29A to 29H may be formed, and an inter-gate insulating layer 144 may be formed on the insulating liner 142.

In a deposition process for forming the insulating liner 142, step coverage characteristics of insulating materials necessary for forming the insulating liner 142 may be controlled to suppress deposition of the insulating materials in a space between the first source/drain region SD1 and the insulating spacer SP and a space between the second source/drain region SD2 and the insulating spacer SP. Accordingly, after the insulating liner 142 is formed, a first air gap AG1 may be formed between the first source/drain region SD1 and the insulating spacer SP, and a second air gap AG2 may be formed between the second source/drain region SD2 and the insulating spacer SP. Herein, the first air gap AG1 may be referred to as a first region air gap, and the second air gap AG2 may be referred to as a second region air gap.

Referring to FIGS. 31A to 31D, the capping layer D116 of each of the plurality of dummy gate structures DGS in the first device region RX1 and the second device region RX2 may be exposed by planarizing the top surface of a resultant product of FIGS. 30A to 30H, and the top surface of the dummy gate layer D114 may be exposed by removing the capping layer D116. Thereafter, a gate space GS may be formed on the nanosheet stack NSS by removing the dummy gate layer D114 and the oxide layer D112 thereunder. The plurality of sacrificial semiconductor layers 104 may be exposed through the gate space GS.

Referring to FIGS. 32A to 32D, the gate space GS may be expanded to a space between each two of the plurality of nanosheets N1, N2, N3, and N4 and a space between the lowermost nanosheet N1 and the fin top surface FT by removing, in a resultant product of FIGS. 31A to 31D, the plurality of sacrificial semiconductor layers 104 through a plurality of the gate space GS.

In example embodiments, to selectively remove the plurality of sacrificial semiconductor layers 104, a difference in etch selectivity between the plurality of nanosheets N1, N2, N3, and N4 and the plurality of sacrificial semiconductor layers 104 may be used. A liquid or gaseous etchant may be used to selectively remove the plurality of sacrificial semiconductor layers 104. In example embodiments, a $CH_3COOH$-based etchant, for example, an etchant including a mixture of $CH_3COOH$, $HNO_3$, and HF or an etchant including a mixture of $CH_3COOH$, $H_2O_2$, and HF, may be used to selectively remove the plurality of sacrificial semiconductor layers 104. However, embodiments of the present disclosure are not limited thereto.

Referring to FIGS. 33A to 33D, a gate dielectric layer 152 may be formed to cover exposed surfaces of the plurality of nanosheets N1, N2, N3, and N4 and the plurality of the first fin-type active region F1 and second fin-type active region F2 in a resultant product of FIGS. 32A to 32D, and a conductive layer may be formed on the gate dielectric layer 152 to fill the gate space GS (refer to FIGS. 32A to 32D). Thereafter, the conductive layer and the gate dielectric layer 152 may be etched back to fill only a portion region of the gate space GS. As a result, a gate line 160 covering the gate dielectric layer 152 may be formed in the gate space GS. Thereafter, a capping insulating pattern 164 filling the gate space GS may be formed on the gate line 160.

Thereafter, as illustrated in FIGS. 2A to 7B, in the first device region RX1 and the second device region RX2, a plurality of source/drain contact holes for exposing the plurality of the first source/drain region SD1 and second source/drain region SD2 may be formed by penetrating the inter-gate insulating layer 144 and the insulating liner 142 in the vertical direction (Z direction), and then a plurality of a metal silicide layer 172 covering the plurality of the first source/drain region SD1 and second source/drain region SD2 under the plurality of source/drain contact holes, and a plurality of source/drain contacts 174 filling the plurality of source/drain contact holes may be formed. In addition, a plurality of a gate contact 184 connected to the gate line 160 may be formed by penetrating the capping insulating pattern 164 in the vertical direction (Z direction).

Thereafter, an interlayer insulating layer 190 may be formed to cover a resultant product in which the plurality of the source/drain contact 174 and the plurality of the gate contact 184 are formed in the first device region RX1 and the second device region RX2. In addition, as illustrated in FIGS. 2A to 7B, a plurality of source/drain via contacts 192 connected to the plurality of source/drain contacts 174 through the interlayer insulating layer 190, and a gate via contact 194 connected to the gate contact 184 through the interlayer insulating layer 190 may be formed.

In the above, example methods of manufacturing the integrated circuit device 100 illustrated in FIGS. 1 and 2A to 7B have been described with reference to FIGS. 21A to 33D. However, through various modifications and changes within the scope of the present disclosure from the descriptions given with reference to FIGS. 21a to 33d, the integrated circuit devices 100A, 100B, 200, 300, 400, 500, 600, and 700 described with reference to FIGS. 8A to 20 and integrated circuit devices having various structures modified and changed therefrom may be manufactured.

In example embodiments, in order to manufacture the integrated circuit device 100A illustrated in FIG. 8A, a single layer including the first silicon nitride layer 132 may be formed as the insulating spacer layer SPL in the process described with reference to FIGS. 22A to 22F.

In example embodiments, in order to manufacture the integrated circuit device 100B illustrated in FIG. 8B, a double layer including the first silicon nitride layer 134 and the second silicon nitride layer 136 may be formed as the insulating spacer layer SPL in the process described with reference to FIGS. 22A to 22F. In example embodiments, in order to manufacture the integrated circuit device 200 illustrated in FIGS. 9 and 10, step coverage characteristics of insulating materials for forming the insulating liner 142 may be controlled by appropriately controlling deposition process conditions, to obtain the first air gap AG21 and the second air gap AG22 instead of the first air gap AG1 and the second air gap AG2, when performing a deposition process for forming the insulating liner 142 in the process described with reference to FIGS. 30A to 30H.

In example embodiments, in order to manufacture the integrated circuit devices 300, 400, 500, and 600 illustrated in FIGS. 11 to 14, etching conditions such as an etching selectivity may be appropriately controlled during a process of etching the first sacrificial insulating layer SL1 and the insulating spacer layer SPL described with reference to FIGS. 23A to 23F, a process of etching the first sacrificial insulating layer SL1 described with reference to FIGS. 25A to 25F, a process of etching the second sacrificial insulating layer SL2 and the insulating spacer layer SPL described with reference to FIGS. 27A to 27H, and/or a process of etching the second sacrificial insulating layer SL2 described with reference to FIGS. 29A to 29H.

While non-limiting example embodiments of the present disclosure have been particularly shown and described, it will be understood that various changes in form and details may be made therein without departing from the spirit and scope of the present disclosure.

What is claimed is:

1. A method of manufacturing an integrated circuit device, the method comprising:
    forming a structure including a fin-type active region, extending in a first horizontal direction on a substrate, and a channel region on the fin-type active region;
    forming a dummy gate layer extending in a second horizontal direction crossing the first horizontal direction on the channel region;
    forming an insulating spacer layer covering a sidewall of the dummy gate layer;
    forming a sacrificial insulating layer conformally covering the insulating spacer layer;
    forming a recess exposing the channel region on the fin-type active region by removing a portion of each of the sacrificial insulating layer and the insulating spacer layer, and forming an insulating spacer including a portion covering the sidewall of the dummy gate layer;
    forming a source/drain region connected to the channel region in the recess and including a first portion facing the sidewall of the dummy gate layer with the sacrificial insulating layer and the insulating spacer therebetween;
    forming a first space between the insulating spacer and the first portion of the source/drain region by removing the sacrificial insulating layer;
    forming an insulating liner covering the insulating spacer and the source/drain region and defining an air gap including at least a portion of the first space;
    forming a gate space on the channel region by removing the dummy gate layer; and
    forming a gate line in the gate space.

2. The method of claim 1, wherein, in the forming of the insulating liner, the insulating liner is formed such that a size of the air gap in the first horizontal direction is equal to a size of the first space.

3. The method of claim 1, wherein, in the forming of the insulating liner, the insulating liner is formed such that a size of the air gap in the first horizontal direction is less than a size of the first space.

4. The method of claim 1, wherein the insulating spacer includes a SiOCN layer, a SiON layer, or a combination thereof, and the sacrificial insulating layer includes a SiN layer.

5. The method of claim 1, wherein, in the forming of the insulating liner, the insulating liner is formed using a material different from that of the insulating spacer.

6. The method of claim 1, wherein the forming of the insulating spacer includes etching a portion of the insulating spacer layer while forming the recess to thereby form the insulating spacer, including a lower portion region adjacent to a bottom of the recess from the insulating spacer layer, and further including an upper portion region covering the sidewall of the dummy gate layer,
    wherein, in the forming of the source/drain region, the source/drain region is formed to contact the lower portion region of the insulating spacer.

7. The method of claim 1, wherein the source/drain region includes a Si layer doped with an n-type dopant.

8. The method of claim 1, wherein the source/drain region includes a SiGe layer doped with a p-type dopant.

9. The method of claim 1, wherein the forming of the structure includes forming, on the substrate, the fin-type active region and a multilayer in which a plurality of sacrificial semiconductor layers and a plurality of nanosheet semiconductor layers are alternately stacked one by one,
    the forming of the recess and the insulating spacer comprises etching a portion of each of the plurality of sacrificial semiconductor layers and the plurality of nanosheet semiconductor layers in the multilayer to form a plurality of nanosheets constituting the channel region from the plurality of nanosheet semiconductor layers, and
    the forming of the gate space comprises removing the plurality of sacrificial semiconductor layers remaining on the substrate after removing the dummy gate layer.

10. The method of claim 9, further comprising:
    after the forming of the recess and the insulating spacer and before the forming of the source/drain region, removing a portion of each of the plurality of sacrificial semiconductor layers remaining on the substrate through the recess to form a plurality of indent spaces; and
    forming a plurality of inner insulating spacers filling the plurality of indent spaces.

11. A method of manufacturing an integrated circuit device, the method comprising:
    forming a plurality of structures, each of the plurality of structures including a fin-type active region extending in a first horizontal direction on a substrate and further including a channel region on the fin-type active region, the substrate including a first device region and a second device region;

forming a dummy gate layer extending in a second horizontal direction crossing the first horizontal direction on the channel region in each of the first device region and the second device region;

forming an insulating spacer layer covering a sidewall of the dummy gate layer in each of the first device region and the second device region;

forming a first sacrificial insulating layer conformally covering the insulating spacer layer in each of the first device region and the second device region;

in a state in which the first device region is covered with a first mask pattern, forming a second region recess exposing the channel region on the fin-type active region by removing a portion of each of the first sacrificial insulating layer, the insulating spacer layer, and the fin-type active region in the second device region, and forming a second region insulating spacer covering the sidewall of the dummy gate layer in the second device region;

forming a first conductivity-type source/drain region connected to the channel region in the second region recess and including a first portion facing the sidewall of the dummy gate layer with the first sacrificial insulating layer and the second region insulating spacer therebetween in the second device region;

exposing the insulating spacer layer in the first device region and forming a first space between the first portion of the first conductivity-type source/drain region and the second region insulating spacer in the second device region by removing the first sacrificial insulating layer in each of the first device region and the second device region; and forming an insulating liner conformally covering the second region insulating spacer and the first conductivity-type source/drain region in the second device region and defining a second region air gap including at least a portion of the first space.

12. The method of claim 11, further comprising:
after the forming of the first space in the second device region and before the forming of the insulating liner:
forming a second sacrificial insulating layer covering the insulating spacer layer in the first device region and filling the first space in the second device region;
in a state in which the second device region is covered with a second mask pattern, forming a first region recess exposing the channel region on the fin-type active region by removing a portion of each of the second sacrificial insulating layer, the insulating spacer layer, and the fin-type active region in the first device region, and forming a first region insulating spacer covering the sidewall of the dummy gate layer in the first device region;
forming a second conductivity-type source/drain region connected to the channel region in the first region recess and including a second portion facing the sidewall of the dummy gate layer with a portion of the second sacrificial insulating layer and the first region insulating spacer therebetween in the first device region; and
forming a second space between the second portion of the second conductivity-type source/drain region and the first region insulating spacer by removing the second sacrificial insulating layer in the first device region,
wherein, in the forming of the insulating liner, the insulating liner is formed to conformally cover the first region insulating spacer and the second conductivity-type source/drain region in the first device region and define a first region air gap including at least a portion of the second space.

13. The method of claim 11, further comprising:
after the forming of the insulating liner:
forming a gate space on the channel region by removing the dummy gate layer in each of the first device region and the second device region; and
forming a gate line in the gate space in each of the first device region and the second device region.

14. The method of claim 11, wherein, in the forming of the insulating liner, a size of the second region air gap in the first horizontal direction is equal to or less than a size of the first space.

15. A method of manufacturing an integrated circuit device, the method comprising:
forming, on a substrate, a fin-type active region extending in a first horizontal direction, and a multilayer in which a plurality of sacrificial semiconductor layers and a plurality of nanosheet semiconductor layers are alternately stacked one by one;
forming a dummy gate layer extending in a second horizontal direction crossing the first horizontal direction on the multilayer;
forming an insulating spacer covering sidewalls of the dummy gate layer;
etching a portion of the multilayer on two sides of the dummy gate layer and the insulating spacer to thereby form a pair of recesses, arranged on the fin-type active region, and a plurality of nanosheets including remaining portions of the plurality of nanosheet semiconductor layers;
forming a pair of source/drain regions connected to the plurality of nanosheets in the pair of recesses, the pair of source/drain regions including a first portion facing sidewalls of the dummy gate layer with a first space and the insulating spacer therebetween on two sides of the dummy gate layer;
forming an insulating liner covering the insulating spacer and the pair of source/drain regions and defining a pair of air gaps including at least a portion of the first space;
removing the dummy gate layer and the plurality of sacrificial semiconductor layers remaining on the fin-type active region to thereby form a gate space between each two of the plurality of nanosheet semiconductor layers and above the plurality of nanosheet semiconductor layers; and
forming a gate line in the gate space.

16. The method of claim 15, further comprising:
forming a sacrificial insulating layer filling the first space and including a material different from that of the insulating spacer during the forming of the insulating spacer; and
after the forming of the pair of source/drain regions and before the forming of the insulating liner, removing the sacrificial insulating layer to empty at least a portion of the first space.

17. The method of claim 15, further comprising:
after the forming of the pair of source/drain regions and before the forming of the insulating liner:
forming a sacrificial insulating layer including portions filling the first space; and
removing the sacrificial insulating layer to empty at least a portion of the first space.

18. The method of claim 15, wherein the insulating spacer includes a SiOCN layer, a SiON layer, or a combination thereof, and the insulating liner includes a SiN layer.

19. The method of claim 15, wherein the pair of source/drain regions include a Si layer doped with an n-type dopant.

20. The method of claim 15, wherein the pair of source/drain regions include a SiGe layer doped with a p-type dopant.

* * * * *